US011726822B2

(12) United States Patent
Brebner

(10) Patent No.: US 11,726,822 B2
(45) Date of Patent: Aug. 15, 2023

(54) SYSTEMS AND METHODS FOR PROVIDING DIGITAL TWIN-ENABLED APPLICATIONS

(71) Applicant: Umajin Inc., Woburn, MA (US)

(72) Inventor: David Brebner, Palmerston North (NZ)

(73) Assignee: Umajin Inc., Woburn, MA (US)

( * ) Notice: Subject to any disclaimer, the term of this patent is extended or adjusted under 35 U.S.C. 154(b) by 351 days.

(21) Appl. No.: 16/818,505

(22) Filed: Mar. 13, 2020

(65) Prior Publication Data
US 2020/0285788 A1 Sep. 10, 2020

Related U.S. Application Data

(63) Continuation-in-part of application No. PCT/US2018/063849, filed on Dec. 4, 2018, which is
(Continued)

(51) Int. Cl.
*G06F 8/77* (2018.01)
*G06F 21/44* (2013.01)
*G06F 9/445* (2018.01)
*G06F 9/455* (2018.01)
*G06F 9/50* (2006.01)
*G06F 30/20* (2020.01)
(Continued)

(52) U.S. Cl.
CPC .......... *G06F 9/5027* (2013.01); *G06F 9/547* (2013.01); *G06F 18/2431* (2023.01); *G06F 18/254* (2023.01); *G06F 30/13* (2020.01); *G06F 30/20* (2020.01); *G06V 10/803* (2022.01); *G06V 10/95* (2022.01); *G06V 20/62* (2022.01); *G06V 30/10* (2022.01); *G06V 40/113* (2022.01)

(58) Field of Classification Search
CPC .......... G06F 30/20; G06F 30/13; G06F 9/547; G06F 9/5027; G06F 18/254; G06F 18/2431; G06K 9/628; G06K 9/6292; G06V 10/803; G06V 10/95
See application file for complete search history.

(56) References Cited

U.S. PATENT DOCUMENTS 5,673,331 A 9/1997 Lewis et al.
5,706,364 A 1/1998 Kopec et al.
(Continued)

FOREIGN PATENT DOCUMENTS

KR 20100055993 A 5/2010
WO 2016063022 A1 4/2016

OTHER PUBLICATIONS

Yun et al., Data-centric middleware based digital twin platform for dependable cyber-physical systems, 5 pages (Year: 2017).*
(Continued)

*Primary Examiner* — Thuy Dao
(74) *Attorney, Agent, or Firm* — RMCK Law Group, PLC

(57) ABSTRACT

According to some embodiments of the present disclosure, the disclosure relates to an application system and server kit that create and serve digital twin-enabled applications. This disclosure also relates to a hub-and-spoke classification system. This disclosure also relates to a location-based services framework that leverages a generative content process to improve location prediction. This disclosure also relates to virtual reality and augmented reality applications, as well as digital agents that support various types of applications.

20 Claims, 49 Drawing Sheets

Related U.S. Application Data a continuation-in-part of application No. 16/047,553, filed on Jul. 27, 2018, now Pat. No. 10,620,948, which is a continuation of application No. PCT/US2018/035953, filed on Jun. 5, 2018.

(60) Provisional application No. 62/886,916, filed on Jun. 26, 2019, provisional application No. 62/692,109, filed on Jun. 29, 2018, provisional application No. 62/619,348, filed on Jan. 19, 2018, provisional application No. 62/559,940, filed on Sep. 18, 2017, provisional application No. 62/515,277, filed on Jun. 5, 2017.

(51) Int. Cl.
*G06F 30/13* (2020.01)
*G06F 9/54* (2006.01)
*G06F 18/25* (2023.01)
*G06F 18/2431* (2023.01)
*G06V 10/80* (2022.01)
*G06V 10/94* (2022.01)
G06V 30/10 (2022.01)
G06V 20/62 (2022.01)
G06V 40/10 (2022.01)

(56) References Cited

U.S. PATENT DOCUMENTS

| | | |
|---|---|---|
| 5,760,788 A | 6/1998 | Chainini et al. |
| 5,764,241 A | 6/1998 | Elliott et al. |
| 5,911,070 A | 6/1999 | Solton et al. |
| 6,047,129 A | 4/2000 | Frye |
| 6,145,120 A | 11/2000 | Highland |
| 6,167,563 A | 12/2000 | Fontana et al. |
| 6,282,699 B1 | 8/2001 | Zhang et al. |
| 6,286,138 B1 | 9/2001 | Purcell |
| 6,425,120 B1 | 7/2002 | Morganelli et al. |
| 6,438,594 B1 | 8/2002 | Bowman-Amuah |
| 6,456,308 B1 | 9/2002 | Agranat et al. |
| 6,496,850 B1 | 12/2002 | Bowman-Amuah |
| 6,519,767 B1 | 2/2003 | Carter et al. |
| 6,637,020 B1 | 10/2003 | Hammond |
| 6,654,950 B1 | 11/2003 | Barnishan |
| 6,823,495 B1 | 11/2004 | Vedula et al. |
| 6,836,884 B1 | 12/2004 | Evans et al. |
| 7,020,662 B2 | 3/2006 | Boreham et al. |
| 7,043,696 B2 | 5/2006 | Santori et al. |
| 7,054,901 B2 | 5/2006 | Shafer |
| 7,096,248 B2 | 8/2006 | Masters et al. |
| 7,149,770 B1 | 12/2006 | Kalva et al. |
| 7,152,229 B2 | 12/2006 | Chong et al. |
| 7,246,315 B1 | 7/2007 | Andrieu et al. |
| 7,316,003 B1 | 1/2008 | Dulepet et al. |
| 7,353,502 B2 | 4/2008 | Stewart et al. |
| 7,382,248 B2 | 6/2008 | Black et al. |
| 7,451,432 B2 | 11/2008 | Shukla et al. |
| 7,464,373 B1 | 12/2008 | Yunt et al. |
| 7,478,381 B2 | 1/2009 | Roberts et al. |
| 7,483,984 B1 | 1/2009 | Jonker et al. |
| 7,512,937 B2 | 3/2009 | Chari et al. |
| 7,548,237 B2 | 6/2009 | David et al. |
| 7,565,640 B2 | 7/2009 | Shukla et al. |
| 7,574,692 B2 | 8/2009 | Herscu |
| 7,617,289 B2 | 11/2009 | Srinivasan et al. |
| 7,627,860 B2 | 12/2009 | Kodosky et al. |
| 7,685,577 B2 | 3/2010 | Pace et al. |
| 7,698,398 B1 | 4/2010 | Lai |
| 7,707,547 B2 | 4/2010 | Colton et al. |
| 7,760,134 B2 | 7/2010 | Morinaga et al. |
| 7,765,529 B1 | 7/2010 | Singh et al. |
| 7,865,888 B1 | 1/2011 | Qureshi et al. |
| 7,917,888 B2 | 3/2011 | Chong et al. |
| 7,971,194 B1 | 6/2011 | Gilboa |
| 7,974,825 B2 | 7/2011 | Linebarger et al. |
| 8,010,783 B1 | 8/2011 | Cahill |
| 8,019,725 B1 | 9/2011 | Mulligan et al. |
| 8,060,400 B2 | 11/2011 | Wellman |
| 8,060,864 B1 | 11/2011 | Michelsen |
| 8,239,824 B2 | 8/2012 | Cifra et al. |
| 8,301,994 B1 | 10/2012 | Shah et al. |
| 8,347,276 B2 | 1/2013 | Schadow |
| 8,352,903 B1 | 1/2013 | Friedman |
| 8,417,728 B1 | 4/2013 | Anders et al. |
| 8,468,535 B1 | 6/2013 | Keagy et al. |
| 8,677,318 B2 | 3/2014 | Mohindra et al. |
| 8,688,676 B2 | 4/2014 | Rush et al. |
| 8,713,530 B2 | 4/2014 | Waite et al. |
| 8,726,264 B1 | 5/2014 | Allen et al. |
| 8,788,569 B2 | 7/2014 | Griffiths et al. |
| 8,825,750 B2 | 9/2014 | Shimamoto |
| 8,930,881 B1 | 1/2015 | Eddins et al. |
| 8,935,660 B2 | 1/2015 | Aman et al. |
| 8,970,598 B1 | 3/2015 | Li et al. |
| 9,021,428 B2 | 4/2015 | Kumar et al. |
| 9,032,378 B2 | 5/2015 | Jazdzewski et al. |
| 9,118,598 B2 | 8/2015 | Li et al. |
| 9,134,962 B1 | 9/2015 | Stephens et al. |
| 9,141,365 B1 | 9/2015 | Zander et al. |
| 9,298,479 B2 | 3/2016 | Anson |
| 9,338,609 B2 | 5/2016 | Heydlauf |
| 9,350,864 B1 | 5/2016 | Brezinsky et al. |
| 9,414,416 B2 | 8/2016 | Adarapu et al. |
| 9,460,109 B1 | 10/2016 | Hagerman |
| 9,584,318 B1 | 2/2017 | Fang et al. |
| 9,584,965 B2 | 2/2017 | Good et al. |
| 9,645,814 B1 * | 5/2017 | Roque .................. G06F 8/71 |
| 9,823,906 B2 | 11/2017 | Holzleitner et al. |
| 9,864,405 B2 | 1/2018 | Trachtenberg et al. |
| 9,891,910 B1 | 2/2018 | Cumming |
| 9,910,640 B2 | 3/2018 | Magalhaes |
| 10,063,999 B2 | 8/2018 | Cherry et al. |
| 10,068,116 B2 | 9/2018 | Good et al. |
| 10,109,230 B2 | 10/2018 | Trachtenberg et al. |
| 10,120,397 B1 | 11/2018 | Zakhor et al. |
| 10,296,303 B2 | 5/2019 | Laethem et al. |
| 10,341,818 B2 | 7/2019 | Vutukuri et al. |
| 10,382,897 B1 | 8/2019 | Lanes et al. |
| 10,417,355 B1 | 9/2019 | Torgerson et al. |
| 10,540,423 B2 | 1/2020 | Osindero et al. |
| 10,542,382 B2 | 1/2020 | Good et al. |
| 10,600,256 B2 | 3/2020 | Ziegler et al. |
| 10,674,320 B2 | 6/2020 | Vutukuri et al. |
| 10,735,907 B2 | 8/2020 | Lanes et al. |
| 10,789,716 B2 | 9/2020 | Mikawa et al. |
| 10,877,470 B2 * | 12/2020 | Burd .................. G05B 23/0294 |
| 10,908,666 B2 | 2/2021 | Wang et al. |
| 10,962,655 B2 | 3/2021 | Pan |
| 11,228,645 B2 * | 1/2022 | Mukhopadhyay et al. .................. H04L 43/50 |
| 2001/0055425 A1 | 12/2001 | Chiu |
| 2002/0078255 A1 | 6/2002 | Narayan |
| 2003/0011601 A1 | 1/2003 | Itoh et al. |
| 2004/0143822 A1 | 7/2004 | Jager et al. |
| 2005/0131924 A1 | 6/2005 | Jones |
| 2005/0188080 A1 | 8/2005 | Motsinger et al. |
| 2005/0268280 A1 | 12/2005 | Fildebrandt |
| 2006/0010215 A1 | 1/2006 | Clegg et al. |
| 2006/0031359 A1 | 2/2006 | Clegg et al. |
| 2006/0122972 A1 | 6/2006 | Keohane et al. |
| 2006/0174233 A1 | 8/2006 | Minadakis |
| 2006/0189326 A1 | 8/2006 | Black et al. |
| 2006/0248112 A1 | 11/2006 | Williams et al. |
| 2007/0250819 A1 | 10/2007 | Fjeldstad et al. |
| 2007/0285241 A1 | 12/2007 | Griebenow et al. |
| 2008/0048879 A1 | 2/2008 | Lipman |
| 2008/0057936 A1 | 3/2008 | Oosawa |
| 2008/0126426 A1 | 5/2008 | Manas et al. |
| 2008/0127303 A1 | 5/2008 | Wrighton et al. |
| 2008/0154691 A1 | 6/2008 | Wellman et al. |
| 2008/0154712 A1 | 6/2008 | Wellman |
| 2009/0007253 A1 | 1/2009 | Chung et al. |
| 2009/0031281 A1 | 1/2009 | Zhang et al. |

(56) References Cited

U.S. PATENT DOCUMENTS

| | | |
|---|---|---|
| 2009/0094688 A1 | 4/2009 | Roy |
| 2010/0039247 A1 | 2/2010 | Ziegler et al. |
| 2010/0083287 A1 | 4/2010 | Maximilien et al. |
| 2010/0151943 A1 | 6/2010 | Johnson et al. |
| 2010/0251155 A1 | 9/2010 | Shah et al. |
| 2011/0072376 A1 | 3/2011 | Moore et al. |
| 2011/0206023 A1 | 8/2011 | Cohn et al. |
| 2012/0131660 A1 | 5/2012 | Dalzell et al. |
| 2012/0260329 A1 | 10/2012 | Suffling |
| 2012/0291006 A1 | 11/2012 | Quine |
| 2013/0152041 A1 | 6/2013 | Hatfield et al. |
| 2013/0160099 A1 | 6/2013 | Fitzpatrick, III |
| 2013/0165143 A1 | 6/2013 | Ziskind et al. |
| 2013/0219036 A1 | 8/2013 | Gusev et al. |
| 2014/0033219 A1 | 1/2014 | Gao et al. |
| 2014/0143252 A1 | 5/2014 | Silverstein et al. |
| 2014/0195487 A1 | 7/2014 | Behuria et al. |
| 2014/0207506 A1 | 7/2014 | Palmert et al. |
| 2014/0207601 A1 | 7/2014 | Soorianarayanan et al. |
| 2014/0280254 A1 | 9/2014 | Feichtner et al. |
| 2014/0280493 A1 | 9/2014 | Rodriguez et al. |
| 2014/0289700 A1 | 9/2014 | Srinivasaraghavan et al. |
| 2015/0089615 A1 | 3/2015 | Krawczyk et al. |
| 2015/0128104 A1 | 5/2015 | Rath et al. |
| 2015/0193512 A1 | 7/2015 | No et al. |
| 2015/0227406 A1 | 8/2015 | Jan et al. |
| 2015/0286495 A1 | 10/2015 | Lee |
| 2015/0301824 A1 | 10/2015 | Patton et al. |
| 2015/0309770 A1 | 10/2015 | Findlay et al. |
| 2015/0379257 A1 | 12/2015 | Ahmed et al. |
| 2016/0026837 A1 | 1/2016 | Good et al. |
| 2016/0094483 A1 | 3/2016 | Johnston et al. |
| 2016/0132774 A1 | 5/2016 | Prieditis |
| 2016/0142517 A1 | 5/2016 | Chor |
| 2016/0295360 A1 | 10/2016 | Jones et al. |
| 2016/0301769 A1 | 10/2016 | Trost et al. |
| 2016/0381118 A1 | 12/2016 | Andrews et al. |
| 2017/0006135 A1 | 1/2017 | Siebel et al. |
| 2017/0034292 A1 | 2/2017 | George |
| 2017/0118268 A1 | 4/2017 | Wu et al. |
| 2017/0124366 A1 | 5/2017 | Good et al. |
| 2017/0171024 A1 | 6/2017 | Anerousis et al. |
| 2017/0223057 A1 | 8/2017 | Amiri |
| 2017/0228447 A1 | 8/2017 | Catania et al. |
| 2017/0243533 A1 | 8/2017 | Trachtenberg et al. |
| 2017/0289293 A1 | 10/2017 | Rubtsov et al. |
| 2017/0308856 A1 | 10/2017 | Bursey |
| 2017/0315787 A1 | 11/2017 | Waggoner et al. |
| 2018/0157384 A1 | 6/2018 | Baneva et al. |
| 2018/0160271 A1 | 6/2018 | Vutukuri et al. |
| 2018/0176097 A1 | 6/2018 | Russell et al. |
| 2018/0284293 A1 | 10/2018 | Pan |
| 2019/0042555 A1 | 2/2019 | Jandhyala et al. |
| 2019/0082298 A1 | 3/2019 | Good et al. |
| 2019/0132419 A1 | 5/2019 | Wang et al. |
| 2019/0230474 A1 | 7/2019 | Lanes et al. |
| 2019/0253843 A1 | 8/2019 | Lanes et al. |
| 2019/0349714 A1 | 11/2019 | Vutukuri et al. |
| 2020/0004598 A1 | 1/2020 | Brebner |
| 2020/0175778 A1 | 6/2020 | Ziegler et al. |
| 2020/0228928 A1 | 7/2020 | Good et al. |
| 2020/0285464 A1 | 9/2020 | Brebner |
| 2020/0374391 A1 | 11/2020 | Murgrabia et al. |
| 2021/0293977 A1 | 9/2021 | Pan |
| 2022/0044055 A1 | 2/2022 | Jean et al. |

OTHER PUBLICATIONS

Autiosalo et al., Twinbase: Open-Source Server Software for the Digital Twin Web, 20 pages (Year: 2021).*

Brenna, L. et al., "Configuring Push-Based Web Services," IEEE, 2005, 6 pages.

Fitzgerald, S. et al., "A Directory Service for Configuring High-Performance Distributed Computations," IEEE, 1997, pp. 365-375.

Hou, K. et al., "Indoor Location Based on WiFi," Proceedings of the 2015 IEEE 19th International Conference on Computer Supported Cooperative Work in Design (CSCWD), 2015, pp. 331-336.

Yalagandula, P. et al., "A Scalable Distributed Information Management System," ACM, 2004, pp. 379-390.

Extended European Search Report dated Feb. 9, 2021 for EP Application No. 18812640.3, 6 pages.

Kim, S. et al., "A Configuration Management System for Multi-Hop Zigbee Networks," IEEE, 2009, 2 pages.

Liu, L. et al., "Cloud Service Portal for Mobile Device Management," IEEE International Conference on E-Business Engineering, 2010, pp. 474-478.

Petrucci, V. et al., "Optimized Management of Power and Performance for Virtualized Heterogenous Server Clusters," 2011 11th IEEE/ACM International Symposium on Cluster, Cloud and Grid Computing, 2011, pp. 23-32.

Sinz, C. et al., "Verifying CIM Models of Apache Web-Server Configurations," Proceedings of the Third International Conference on Quality Software (QSIC '03), IEEE, 2003, 8 pages.

Totok, A. et al., "Exploiting Service Usage Information for Optimizing Server Resource Management," ACM Transactions on Internet Technology, vol. 11, No. 1, Article 1, Jul. 2011, pp. 1-26.

U.S. Appl. No. 16/825,798, filed Mar. 20, 2020, Brebner.
U.S. Appl. No. 16/566,024, filed Sep. 10, 2019, Brebner.
U.S. Appl. No. 16/566,078, filed Sep. 10, 2019, Brebner.
U.S. Appl. No. 16/566,134, filed Sep. 10, 2019, Brebner.
U.S. Appl. No. 16/566,196, filed Sep. 10, 2019, Brebner.
U.S. Appl. No. 16/566,281, filed Sep. 10, 2019, Brebner.
U.S. Appl. No. 16/818,269, filed Mar. 13, 2020, Brebner.
U.S. Appl. No. 16/818,326, filed Mar. 13, 2020, Brebner.
U.S. Appl. No. 16/818,370, filed Mar. 13, 2020, Brebner.
U.S. Appl. No. 16/818,411, filed Mar. 13, 2020, Brebner.

Brown, D.K. et al., "JMS: An Open Source Workflow Management System and Web-Based Cluster Front-End for High Performance Computing," PLOS ONE, Aug. 17, 2015, pp. 1-25.

Chan, M. et al., "Extracting Web Design Knowledge: The Web De-Compiler," IEEE, 1999, pp. 547-552.

Ehrig, K. et al., "Generation of Visual Editors as Eclipse Plug-Ins," ACM, 2005, pp. 134-143.

Gallego-Carrillo, M. et al., "SOTA: a Visualization Tool for Symbol Tables," ACM, 2005, p. 385.

Gotz, D. et al., "Interactive Visual Synthesis of Analytic Knowledge," IEEE Symposium on Visual Analytics Science and Technology, 2006, pp. 51-58.

International Search Report and Written Opinion dated Oct. 30, 2018 for PCT International Application No. PCT/US2018/035953, 16 pages.

Kannan et al., "Digital Library for Mulsemedia Content Management," ACM, pp. 275-276 (Year: 2010).

Key, A. et al., "VizDeck: Self-Organizing Dashboards for Visual Analytics," ACM, 2012, pp. 681-684.

Li, Y. et al., "Consistency Aware Update Schedule in Multi-Server Distributed Virtual Environments," ACM, 2010, pp. 1-8.

Luo et al., "Application of Digital Content Management System Based on Data Warehouse and Data Mining Technology," IEEE, pp. 988-992 (Year: 2012).

Lyu, M.R. et al., "A Wireless Handheld Multi-modal Digital Video Library Client System," ACM, 2003, pp. 231-238.

Mancini, R., "Interacting with a Visual Editor," ACM, 1996, pp. 125-131.

Matsubara et al., "Managing a Media Server Content Directory in Absence of Reliable Metadata," IEEE, pp. 873-877 (Year: 2009).

Meibner, M. et al., "Enabling Classification and Shading for 3D Texture Mapping Based Volume Rendering Using OpenGL and Extensions," ACM, 1999, retrieved online on Nov. 24, 2019, pp. 201-214 and 256. Retrieved from the Internet.

Nam, B. et al., "Mobile Based Digital Contents Conversion Service Implementation," ACM, 2009, pp. 1432-1436.

Pan, H. et al., "Design and Implementation of Server Management System Based on Docker," 2019 14th IEEE Conference on Industrial Electronics and Applications (ICIEA), 2019, pp. 48-52.

Park, J.G. et al., "Cluster Management in a Virtualized Server Environment," ACM, 2008, pp. 2211-2214.

(56) References Cited

OTHER PUBLICATIONS

PCT International Search Report and Written Opinion dated Jun. 12, 2019 for International Application No. PCT/US2018/063849, 21 pages.
Pop et al., "On Cloud Development for Digital Preservation Environments," IEEE, pp. 443-444 (Year: 2014).
Raschke, M. et al., "Annotation of Graphical Elements in Visualizations for an Efficient Analysis of Visual Tasks," ACM, 2014, pp. 1387-1392.
Stanchev, P. et al., "Enhanced User Experience and Behavioral Patterns for Digital Cultural Ecosystems," ACM, 2017, retrieved online on Nov. 8, 2019, pp. 287-292, http://delivery.acm.org/10.1145/3170000/3167063/p287-stanchev.pdf.
Vollebregt, T. et al., "Declarative Specification of Template-Based Textual Editors," ACM, 2012, retrieved online on Nov. 9, 2019, 7 pages, http://delivery.acm.org/10.1145/2430000/2427056/a8-vollebregt.pdf.
Wenjun, Z. et al., "Study on SaaS Architecture of Web3D Scene Content Management Platform and Method of Editing and Browsing," IEEE 2012, https://ieeexplore.ieee.org/stamp/stamp.jsp?tp=&arnumber=6272825, pp. 514-517.
Haque, I.T. et al., "Profiling-Based Indoor Localization Schemes," IEEE Systems Journal, vol. 9, No. 1, Mar. 2015, pp. 76-85.
Xiao, T.T. et al., "Study of Fingerprint Location Algorithm Based on WiFi Technology for Indoor Localization," IEEE, Sep. 2014, pp. 604-608.
Yassin, M. et al., "A Survey of Positioning Techniques and Location Based Services in Wireless Networks," IEEE, 2015, 5 pages.

\* cited by examiner

```
instance image apple
    .filename='apple.png'
end
```

FIG. 2A

```
instance image apple
    .filename='apple.png'
instance image worm
    .filename='worm.png'
end
```

FIG. 2B

```
define image button
    .filename='button.png'
end
```

FIG. 3A

```
define image button
    .filename='button.png'
    event on_release()
    method on_mouse_down(int x, int y, int mod)
        raise .on_release()
    end
end
instance button mybutton
    method on_release()
    end
end
```

FIG. 3B

```
Real velocity = 2.3     (2.3 is the expression, the = is the
assignment)
Real speed = velocity * 1.87    (velocity * 1.87 is the
expression)
Int length = sqrt((x1-x2)^2+(y1-y2)^2)(sqrt is a method inside
the expression)
```

FIG. 4

```
if velocity>2.1
    //place code here
end
```

FIG. 5A

```
if velocity>2.1
    //place code here
elseif velocity==1.5
    //place code here
else
    //place code here
end
```

FIG. 5B

```
int a=0
loop a<100
    //do something many times...
    a++
end
```

FIG. 6A

```
int a=0
loop
    //do something many times...
    a++
end a>100
```

FIG. 6B

```
loop int i=0, i<5, i++
    print(i)
end
```

FIG. 6C

```
map m
m['b']='beta'
m[0]='zero'
m['a']='alpha'
m[1]='one'
//loop forward
loop var k=m.first_key(), k.is_valid(), k=m.next_key(k)
    print (k'->'+m[k])
end
```

FIG. 6D

```
string my_big_array[][]
my_array[1]["name"]="cow"
my_array[1]["age"]="13"
my_array[2]["name"]="sheep"
my_array[2]["age"]="3"
```

FIG. 7A

```
int my_array[]
int a=0
loop a<100
    my_array[a]=rnd(100)
    a++
end
```

FIG. 7B

```
int my_array[]
```

FIG. 7C

```
string my_array[]
my_array[1]="cow"
my_array[2]="sheep"
```

FIG. 7D

```
instance button add_button
    .x=20
    .y=100
    .width=200
    .height=50
    .caption="add"

method on_mouse_down(int x, int y, int mod)
    do_add()
end state language_german
    .width=300
    .x=5
    .caption="hinzufugen"
    method on_mouse_down(int x, int y, int mod)
        check_region()
        do_add()
    end
end state orientation_landscape
    .width=400
end end
```

FIG. 8A

| Rule | Target | Variation |
|---|---|---|
| OS=iOS | Page1: Object: Toolbar | Hide |
| Region=NZ | Page2: Object: BuyButton | tax=15.0 |
| Region=NZ | Page2: Object: Buybutton | Custom Actions |
| Orientation=Portrait | Masterpage1: Region: column4 | Hide |
| Orientation=Landscape | Masterpage: Region: toolbar | Height=10mm |

```
instance form myform
    instance button mybutton
        .caption='scale and rotate'
        method on_release()
            myform.scale=0.5 in 1000 tween linear
            myform.rotate=20 in 1000 tween linear
        end
    end
end
```

FIG. 10

```
instance image button
    .caption='OK'
    .width=100
end
...
if language ='german'
    button.caption='Ordnung'
    button.width=200
end
```

FIG. 11A

```
instance image button
    .caption='OK'
    .width=100
    stat lang German
        .caption='Ordnung'
        .width=200
    end
end
```

FIG. 11B

```
instance image tree
    instance image apple1
        .x=0
        .y=0
    end
    instance image apple2
        .x=100
        .y=200
    end
end
```

FIG. 12

```
instance image tree
    method on click()
        .apple1.state=picked
    end
    instance image apple1
        .x=0
        .y=0
        .filename="apple.png"
        state picked
            .x=100
            .filename="applecore.png"
        end
    end
end
```

FIG. 13

```
instance image tree
    method on click()
        .apple.x=100
    end
    instance image apple1
        .x=0
        .y=0
    end
end
```

FIG. 14

```
{
  "format":"Umajin Capabilities",
  "version":"1.0",
  "title":"Nero's Palace",
  "start":"Home",
  "background":"capabilities_resort/bkg.png",
  "bubble":"capabilities_resort/images/bubble2.png",
  "mic_on":"capabilities_resort/mic_on.png",
  "mic_off":"capabilities_resort/mic_off.png",
  "3dmodel":"",
  "2danimation":"capabilities_resort/roman_demo/skeleton.json",
  "idle":"Idle1",
  "phoneme":"capabilities_health/th3/phoneme.json",
  "mouth_slotname":"a",
  "voice":"flite_voices/cmu_us_slt.flitevox",
  "voice_pitch":"1.0",
```

FIG. 42

SYSTEMS AND METHODS FOR PROVIDING DIGITAL TWIN-ENABLED APPLICATIONS

PRIORITY CLAIM

This application is a continuation-in-part of PCT International Application No. PCT/US2018/063849, filed on Dec. 4, 2018, which claims priority to: (i) U.S. Provisional Patent Application Ser. No. 62/692,109, filed on Jun. 29, 2018, entitled GENERATIVE CONTENT SYSTEM; and (ii) U.S. Provisional Patent Application Ser. No. 62/619,348, filed Jan. 19, 2018, entitled METHODS AND SYSTEMS FOR A CONTENT AND DEVELOPMENT MANAGEMENT PLATFORM; and is a continuation-in-part of U.S. patent application Ser. No. 16/047,553, filed Jul. 27, 2018, entitled APPLICATION SYSTEM FOR MULTIUSER CREATING AND EDITING OF APPLICATIONS, which is a continuation of PCT International Application No. PCT/US2018/035953, filed Jun. 5, 2018, entitled METHODS AND SYSTEMS FOR AN APPLICATION SYSTEM, which claims priority to U.S. Provisional Patent Application Ser. No. 62/515,277, filed Jun. 5, 2017, entitled METHODS AND SYSTEMS FOR A CONTENT AND DEVELOPMENT MANAGEMENT PLATFORM, U.S. Provisional Patent Application Ser. No. 62/559,940, filed Sep. 18, 2017, entitled METHODS AND SYSTEMS FOR A CONTENT AND DEVELOPMENT MANAGEMENT PLATFORM, and U.S. Provisional Patent Application Ser. No. 62/619,348, filed Jan. 19, 2018, entitled METHODS AND SYSTEMS FOR A CONTENT AND DEVELOPMENT MANAGEMENT PLATFORM. All of the above recited applications are incorporated by reference as if fully set forth herein in their entirety. This application also claims priority to U.S. Provisional Patent Application Ser. No. 62/866,916 filed Jun. 26, 2019, entitled HUB AND SPOKE IMAGE CLASSIFICATION SYSTEM.

BACKGROUND

1. Field

According to some embodiments of the present disclosure, the disclosure relates to an application system and server kit that create and serve digital twin-enabled applications. This disclosure also relates to a hub-and-spoke classification system. This disclosure also relates to a location-based services framework that leverages a generative content process to improve location prediction. This disclosure also relates to virtual reality and augmented reality applications, as well as digital agents that support various types of applications.

2. Description of the Related Art

Mobile apps have become central to how enterprises and other organizations engage with both customers and employees, but many apps fall well short of customer expectations. Poor design, slow performance, inconsistent experiences across devices, and the long-time cycles and cost required in the specification, development, testing and deployment of updates requested by users are among the reasons that apps fail to engage the user or meet organizational requirements. Each type of end point device typically requires its own development effort (even with tools promising "multiplatform" support there is often the requirement for platform-specific design and coding), and relatively few app platforms can target both mobile devices and PCs while providing deep support for device capabilities like 3D, mapping, Internet of Things (IoT) integration, augmented reality (AR), and virtual reality (VR). The fact that existing app development platforms are limited in scope and require technical expertise increases time and cost while also restricting both the capability of the apps and the devices on which they can be used.

Creation, deployment and management of software applications and content that use digital content assets may be complicated, particularly when a user desires to use such applications across multiple platform types, such as involving different device types and operating systems. Software application development typically requires extensive computer coding, device and domain expertise, including knowledge of operating system behavior, knowledge of device behavior (such as how applications impact chip-level performance, battery usage, and the like) and knowledge of domain-specific languages, such that many programmers work primarily with a given operating system type, with a given type of device, or in a given domain, and application development projects often require separate efforts, by different programmers, to port a given application from one computing environment, operating system, device type, or domain to another. While many enterprises have existing enterprise cloud systems and extensive libraries of digital content assets, such as documents, websites, logos, artwork, photographs, videos, animations, characters, music files, and many others, development projects for front end, media-rich applications that could use the assets are often highly constrained, in particular by the lack of sufficient resources that have the necessary expertise across the operating systems, devices and domains that may be involved in a given use case. As a result, most enterprises have long queues for this rich front end application development, and many applications that could serve valuable business functions are never developed because development cannot occur within the business time frame required. A need exists for methods and systems that enable rapid development of digital-content-rich applications, without requiring deep expertise in operating system behavior, device characteristics, or domain-specific programming languages. Another bottleneck is server side workflow, additional data stores and brokering of API's between existing systems.

Some efforts have been made to establish simplified programming environments that allow less sophisticated programmers to develop simple applications. The PowerApps™ service from Microsoft™ allows users within a company (with support from an IT department) to build basic mobile and web-based applications. App Maker™ by Google™ and Mobile App Builder™ from IBM™ also enable development of basic mobile and web applications. However, these platforms enable only very basic application behavior and enable development of applications for a given operating system and domain. There remains a need for a platform for developing media-rich content and applications with a simple architecture that is also comprehensive and extensible, enabling rich application behavior, low-level device control, and extensive application features, without requiring expertise in operating system behavior, expertise in device behavior, or expertise in multiple languages.

Also, it is exceedingly frustrating for a user (e.g., a developer) to continually purchase and learn multiple new development tools. A user may experience needs or requirements for debugging, error reporting, database features, image processing, handling audio or voice information, managing Internet information and search features, document viewing, localization, source code management, team management and collaboration, platform porting requirements, data transformation requirements, security requirements, and more. It may be even more difficult for a user when deploying content assets over the web or to multiple operating systems, which may generate many testing complications and difficulties. For these reasons, an application system is needed for the client that provides a full ecosystem for development and deployment of applications that work across various types of operating systems and devices without requiring platform-specific coding skills and allows for workflow, additional datastores, and API brokering on the server side.

Furthermore, in some scenarios, modeling real world systems and environments can be a difficult task, given the amounts of data that are needed to generate such rich models. Modeling a real world system may require many disparate data sources, many of which may be incompatible with one another. Furthermore, raw data collected from those data sources may be incorrect or incomplete. This may lead to inaccurate models.

SUMMARY

According to some embodiments of the present disclosure, a method for determining a location of a user device in a building is disclosed. The method includes presenting, by a user interface of the user device executing an application, a graphical user interface the application, the graphical user interface including a selectable alert user interface element. The method further includes receiving, by the user interface of the user device, a selection of the selectable alert user interface element. In response to receiving the selection of the selectable user interface element, the method also includes detecting, by one or more processors, a set of network signals that are in a communication range of the user device at a current location of the user device. The method further includes, for each detected network signal in the detected set of network signals: determining, by the one or more processors, a respective network identifier of the detected network signal and determining, by the one or more processors, a respective signal strength of the detected network signal at the current location of the user device. The method also includes transmitting, by the one or more processors, a signal profile to a backend server of the application, the signal profile indicating, for each detected network signal, the respective network identifier of the detected network signal detected and the respective signal strength of the detected network signal. The method further includes receiving, by a backend server of the application, the signal profile from the user device. The method also includes determining a location estimate of the user device within the building based on the signal profile and a machine-learned location classification model that is trained using training signal profiles collected throughout the building by one or more training devices.

In some embodiments, the user device includes the one or more processors. In some embodiments, a server kit includes the one or more processors.

In some embodiments, the method further includes outputting the location estimate of the user device to a second user device. In some of these embodiments, the method the second user device is associated with a security provider of the building.

In some embodiments, the building is one of a hotel, a prison, a parking structure, a hospital, a dormitory, an apartment building, a school, an office building, a department store, a mall, a warehouse, a factory, and a ship.

In some embodiments, determining the location estimate includes: inputting the detected network identifiers and the detected signal strengths contained in the signal profile into the machine-learned location classification model; receiving a set of candidate locations and, for each candidate location, a respective confidence score of the candidate location from the machine-learned location classification model; and determining the location estimate of the user device based on the set of candidate locations and the respective confidence scores. In some of these embodiments, determining the location estimate of the user device based on the set of candidate locations includes: identifying one or more candidate locations having a respective confidence score that exceeds a threshold; in response to determining that only one candidate location has a respective confidence score that exceeds the threshold, setting the location estimate based on the only one candidate location; and in response to determining that none of the candidate locations have a respective confidence score that exceeds the threshold or more than one candidate location have respective confidence scores that exceed the threshold: generating a simulated data point based on the signal profile, the simulated data point indicating a simulated signal strength corresponding to a known network that is detectable within the building; inputting the detected network identifiers, the detected signal strengths, a network identifier of the known network, and the simulated signal strength into the machine-learned classification model; and determining the estimated location of the user device based on the output of the machine-learned classification model. In some of these embodiments, the machine-learned location classification model is partitioned into a plurality of partitions, each partition corresponding to a different segment of the building. In some of these embodiments, determining the location estimate includes: clustering the signal profile with the training data to obtain a plurality of clusters, each cluster corresponding to a respective segment of the building, wherein the signal profile is clustered into one of the clusters; selecting a selected partition from the plurality of partitions based on the cluster of the signal profile; and determining the location estimate based on the selected partition of the machine-learned classification model. In some of these embodiments, the signal profile further includes a device type of the user device and each training signal profile used to train the machine-learned location classification model further includes a respective device type of the training device that generated the training signal profile.

In some embodiments, detecting the set of network signals includes detecting any WIFI signals within a WIFI communication range of the user device, detecting any Bluetooth signals within a Bluetooth communication range of the user device, and detecting any GPS signals that are readable by the user device.

In some embodiments, the backend server of the application is a server kit.

In some embodiments, transmitting the signal profile includes generating the signal profile based on each respective network identifier and the respective signal strength corresponding to each respective network identifier. In some of these embodiments, the signal profile further includes a time of day at which the network signals were detected, and each training signal profile used to train the machine-learned location classification model further includes a respective time of day when the training signal profile was generated. In some embodiments, the signal profile further includes a device MAC address of the user device, and each training signal profile used to train the machine-learned location classification model further includes a respective MAC address of the training device that generated the training signal profile. In some embodiments, the signal profile further includes a measured temperature at the current location as measured by the user device, and each training signal profile used to train the machine-learned location classification model further includes a respective measured temperature that was measured by the training device at a time that the training signal profile was generated. In some embodiments, the signal profile further includes a measured humidity at the current location as measured by the user device, and each training signal profile used to train the machine-learned location classification model further includes a respective measured humidity that was measured by the training device at a time that the training signal profile was generated.

According to some embodiments, a method for determining a location of a user device in a building is disclosed. The method includes presenting, by a user interface of the user device executing an application, a graphical user interface the application, the graphical user interface including a selectable alert user interface element. The method also includes receiving, by the user interface of the user device, a selection of the selectable alert user interface element. The method also includes, in response to receiving the selection of the selectable user interface element, detecting, by one or more processors, a set of network signals that are in a communication range of the user device at a current location of the user device. The method also includes, for each detected network signal in the detected set of network signals: determining, by the one or more processors, a respective network identifier of the detected network signal; and determining, by the one or more processors, a respective signal strength of the detected network signal at the current location of the user device. The method also includes transmitting, by the one or more processors, a signal profile to a backend server of the application, the signal profile indicating, for each detected network signal, the respective network identifier of the detected network signal detected and the respective signal strength of the detected network signal, wherein the backend server determines a location estimate of the user device within the building based on the signal profile and a machine-learned location classification model that is trained using training signal profiles collected throughout the building by one or more training devices.

In some embodiments, the user device includes the one or more processors.

In some embodiments, a server kit includes the one or more processors.

In some embodiments, the building is one of a hotel, a prison, a parking structure, a hospital, a dormitory, an apartment building, a school, an office building, a department store, a mall, a warehouse, a factory, and a ship.

In some embodiments, the machine-learned location classification model is partitioned into a plurality of partitions, each partition corresponding to a different segment of the building.

In some embodiments, detecting the set of network signals includes detecting any WIFI signals within a WIFI communication range of the user device, detecting any Bluetooth signals within a Bluetooth communication range of the user device, and detecting any GPS signals that are readable by the user device.

In some embodiments, transmitting the signal profile includes generating the signal profile based on each respective network identifier and the respective signal strength corresponding to each respective network identifier. In some of these embodiments, the signal profile further includes a device type of the user device and each training signal profile used to train the machine-learned location classification model further includes a respective device type of the training device that generated the training signal profile. In some of these embodiments, the signal profile further includes a time of day at which the network signals were detected, and each training signal profile used to train the machine-learned location classification model further includes a respective time of day when the training signal profile was generated. In some embodiments, the signal profile further includes a device MAC address of the user device, and each training signal profile used to train the machine-learned location classification model further includes a respective MAC address of the training device that generated the training signal profile. In some embodiments, the signal profile further includes a measured temperature at the current location as measured by the user device, and each training signal profile used to train the machine-learned location classification model further includes a respective measured temperature that was measured by the training device at a time that the training signal profile was generated. In some embodiments, the signal profile further includes a measured humidity at the current location as measured by the user device, and each training signal profile used to train the machine-learned location classification model further includes a respective measured humidity that was measured by the training device at a time that the training signal profile was generated.

In some embodiments, the user device is a smartphone. In some embodiments, the user device is a smart key card. In some embodiments, the user device is a tablet. In some embodiments, the user device is a personal computer.

According to some embodiments of the present disclosure, a method for determining a location in a building of one or more physical assets using a tracking device that executes a tracking application is disclosed. The method includes detecting, by a processing device of the tracking device, a set of network signals that are in a communication range of the tracking device at a current location of the tracking device, wherein the tracking device scans for at least two different types of network signals. The method further includes for each detected network signal in the detected set of network signals: determining, by the processing device of the tracking device, a respective network identifier of the detected network signal and determining, by the processing device of the tracking device, a respective signal strength of the detected network signal at the current location of the tracking device. The method also includes transmitting, by the processing device of the tracking device, a device identifier of the tracking device and a signal profile to a backend server of the application, the signal profile indicating, for each detected network signal, the respective network identifier of the detected network signal detected and the respective signal strength of the detected network signal. The method also includes receiving, by a backend server of the tracking application, the signal profile and the device identifier from the tracking device. The method further includes determining a location estimate of the tracking device within the building based on the signal profile and a machine-learned location classification model that is trained using training signal profiles collected throughout the building by one or more training devices. The method also includes determining an asset location estimate of the one or more physical assets based on the location estimate of the tracking device and the device identifier of the tracking device.

In some embodiments, determining an asset location estimate of the one or more physical assets includes looking up an asset identifier of the one or more physical assets from a lookup table that associates respective tracking devices with respective physical assets tracked by the respective tracking devices.

In some embodiments, detecting the set of network signals is performed in response to the tracking device receiving an instruction from the backend of the tracking application.

In some embodiments, the building is one of a hospital, warehouse, hotel, a prison, a school, or an office building.

In some embodiments, determining the location estimate includes: inputting the detected network identifiers and the detected signal strengths contained in the signal profile into the machine-learned location classification model; receiving a set of candidate locations and, for each candidate location, a respective confidence score of the candidate location from the machine-learned location classification model; and determining the location estimate of the tracking device based on the set of candidate locations and the respective confidence scores. In some of these embodiments, wherein determining the location estimate of the tracking device based on the set of candidate locations includes: identifying one or more candidate locations having a respective confidence score that exceeds a threshold; and setting the location estimate based on the only one candidate location in response to determining that only one candidate location has a respective confidence score that exceeds the threshold; in response to determining that none of the candidate locations have a respective confidence score that exceeds the threshold or more than one candidate location have respective confidence scores that exceed the threshold: generating a simulated data point based on the signal profile, the simulated data point indicating a simulated signal strength corresponding to a known network that is detectable within the building; inputting the detected network identifiers, the detected signal strengths, a network identifier of the known network, and the simulated signal strength into the machine-learned classification model; and determining the estimated location of the tracking device based on the output of the machine-learned classification model. In some embodiments, the machine-learned location classification model is partitioned into a plurality of partitions, each partition corresponding to a different segment of the building. In some of these embodiments, determining the location estimate includes: clustering the signal profile with the training data to obtain a plurality of clusters, each cluster corresponding to a respective segment of the building, wherein the signal profile is clustered into one of the clusters; selecting a selected partition from the plurality of partitions based on the cluster of the signal profile; and determining the location estimate based on the selected partition of the machine-learned classification model. In some of these embodiments, the signal profile further includes a device type of the tracking device and each training signal profile used to train the machine-learned location classification model further includes a respective device type of the training device that generated the training signal profile.

In some embodiments, detecting the set of network signals includes detecting any WIFI signals within a WIFI communication range of the tracking device, detecting any Bluetooth signals within a Bluetooth communication range of the tracking device, and detecting any GPS signals that are readable by the tracking device.

In some embodiments, the backend server of the application is a server kit.

In some embodiments, transmitting the signal profile includes generating the signal profile based on each respective network identifier and the respective signal strength corresponding to each respective network identifier. In some of these embodiments, the signal profile further includes a time of day at which the network signals were detected, and each training signal profile used to train the machine-learned location classification model further includes a respective time of day when the training signal profile was generated. In some embodiments, the signal profile further includes a device MAC address of the tracking device, and each training signal profile used to train the machine-learned location classification model further includes a respective MAC address of the training device that generated the training signal profile. In some embodiments, the signal profile further includes a measured temperature at the current location as measured by the tracking device, and each training signal profile used to train the machine-learned location classification model further includes a respective measured temperature that was measured by the training device at a time that the training signal profile was generated. In some embodiments, the signal profile further includes a measured humidity at the current location as measured by the tracking device, and each training signal profile used to train the machine-learned location classification model further includes a respective measured humidity that was measured by the training device at a time that the training signal profile was generated.

According to some embodiments of the present disclosure, a method for determining a location in a building of one or more physical assets using a tracking device that executes a tracking application is disclosed. The method includes detecting, by a processing device of the tracking device, a set of network signals that are in a communication range of the tracking device at a current location of the tracking device, wherein the tracking device scans for at least two different types of network signals. The method also includes, for each detected network signal in the detected set of network signals: determining, by the processing device of the tracking device, a respective network identifier of the detected network signal; and determining, by the processing device of the tracking device, a respective signal strength of the detected network signal at the current location of the tracking device. The method also includes transmitting, by the processing device of the tracking device, a device identifier of the tracking device and a signal profile to a backend server of the application, the signal profile indicating, for each detected network signal, the respective network identifier of the detected network signal detected and the respective signal strength of the detected network signal, wherein the backend server of the application determines a location of the one or more physical assets based on the signal profile, the device identifier of the tracking device, and a machine-learned location classification model that is trained using training signal profiles collected throughout the building by one or more training devices.

In some embodiments, detecting the set of network signals is performed in response to the tracking device receiving an instruction from the backend of the tracking application.

In some embodiments, the building is one of a hospital, warehouse, hotel, a prison, a school, or an office building.

In some embodiments, the machine-learned location classification model is partitioned into a plurality of partitions, each partition corresponding to a different segment of the building.

In some embodiments, detecting the set of network signals includes detecting any WIFI signals within a WIFI communication range of the tracking device, detecting any Bluetooth signals within a Bluetooth communication range of the tracking device, and detecting any GPS signals that are readable by the tracking device.

In some embodiments, the backend server of the application is a server kit. In some embodiments, transmitting the signal profile includes generating the signal profile based on each respective network identifier and the respective signal strength corresponding to each respective network identifier. In some embodiments, the signal profile further includes a time of day at which the network signals were detected, and each training signal profile used to train the machine-learned location classification model further includes a respective time of day when the training signal profile was generated. In some embodiments, the signal profile further includes a device MAC address of the tracking device, and each training signal profile used to train the machine-learned location classification model further includes a respective MAC address of the training device that generated the training signal profile. In some embodiments, the signal profile further includes a measured temperature at the current location as measured by the tracking device, and each training signal profile used to train the machine-learned location classification model further includes a respective measured temperature that was measured by the training device at a time that the training signal profile was generated. In some embodiments, the signal profile further includes a measured humidity at the current location as measured by the tracking device, and each training signal profile used to train the machine-learned location classification model further includes a respective measured humidity that was measured by the training device at a time that the training signal profile was generated.

According to some embodiments, a system for classifying images is disclosed. The system includes a hub device and one or more image classification devices. A hub device includes a short-range communication device; a memory device that stores a template datastore; and a hub processing device. The template datastore stores a plurality of templates, each template including a respective image and a respective image classification of the respective image. The hub processing device that executes computer-executable instructions that cause the hub processing device to perform image classifications on behalf of requesting image classification devices based on the plurality of templates. Each classification device is affixed to a surface in relation to a respective object being monitored and includes a local short-range communication device in communication with the hub device; a low-resolution camera; a local memory device that stores a set of local templates, each local template including a respective image and a respective image classification of the respective image, wherein the set of local templates is at least one order of magnitude smaller than the plurality of templates; and a local processing device that executes computer-readable instructions. The instructions cause the local processing device to capture an image of the respective object being monitored from the low-resolution camera and extract one or more image subsections from the image, each image subsection being extracted from within an area being monitored within the image. The instructions further cause the local processing device to, for each image subsection of the one or more image subsections: attempt to match the image subsection to one of the local templates and in response to matching the image subsection to a matching local template of the local templates: associate the local classification defined in the matching local template to the image subsection; and add the local classification to a reporting string. The instructions further cause the local processing device to, for each image subsection: in response to being unable to match the image subsection to any of the local templates: request classification of the image subsection from the hub device; receive a requested classification of the image subsection from the hub device; associate the requested classification to the image subsection; and update the local templates based on the requested classification and the image subsection. The instruction also cause the local processing device to add the requested classification to the reporting string and transmit the reporting string to the hub device after each image subsection is classified.

In embodiments, the system further includes a configuration device that executes a configuration application that configures the one or more image classification devices. In configuring an image classification device of the one or more image classification devices, the configuration application: receives a first image of a field of view of the camera of the image classification device from the image classification device; displays the first image via a user interface of the configuration device; receives a bounding box from a user via the user interface, the bounding box being defined with respect to the first image and defining the area being monitored; provides the bounding box to the image classification device; receives a second image of the field of view of the camera of the image classification device, the second image being bounded by the bounding box and depicting the area being monitored; determines one or more bounding box segments based on the second image, each bounding box segment corresponding to a respective subsection of the area being monitored that contains a classifiable element; and provides the bounding box segments to the image classification device. In some embodiments, the configuration application receives additional configuration parameters with respect to the image classification device being configured and provides the configuration parameters to the image classification device.

In embodiments, updating the local templates includes: generating a new local template based on the requested classification and the image subsection; and storing the new local template on the local memory device with the set of local templates.

In embodiments, updating the local templates includes: receiving a template of the plurality of templates from the hub device, wherein the template was determined to match the image subsection by the hub device; and storing the template on the local memory device with the set of local templates.

In embodiments, the hub device trains each of the one or more classification devices in an unsupervised manner.

In embodiments, the object being monitored by the image classification device is a meter. In some embodiments, the meter is a wheel counter meter. In some embodiments, the meter is an LED meter. In some embodiments, the hub device is a mobile device.

In embodiments, the low-resolution camera is less than two mega-pixel resolution.

In embodiments, the hub device trains a plurality of image classification devices.

According to some embodiments of the present disclosure, a method for classifying images is disclosed. The method includes communicating, by an image classification device, with a hub device that stores a plurality of templates, each template including a respective image and a respective image classification of the respective image. The method also includes maintaining, by an image classification device of the one or more image classification devices, a set of local templates, wherein the set of local templates is a subset of the plurality of templates stored by the hub device and wherein the set of local templates is at least one order of magnitude smaller than the plurality of templates. The method further includes capturing, by an image classification device having a camera, an image of an object being monitored by a camera of the image classification device. The method also includes extracting, by the image classification device, one or more image subsections from the image, each image subsection being extracted from within an area being monitored within the image. For each image subsection of the one or more image subsections, the method includes attempting, by the image classification device, to match the image subsection to one of the local templates of the set of local templates and, in response to matching the image subsection to a matching local template of the local templates: associating, by the image classification device, the local classification defined in the matching local template to the image subsection; and adding, by the image classification device, the local classification to a reporting string. In response to being unable to match the image subsection to any of the local templates, the method includes requesting, by the image classification device, classification of the image subsection from the hub device; receiving, by the image classification device, a requested classification of the image subsection from the hub device; associating, by the image classification device, the requested classification to the image subsection; updating, by the image classification device, the set of local templates based on the requested classification and the image subsection; and adding, by the image classification device, the requested classification to the reporting string. The method also includes transmitting, by the image classification device, the reporting string to the hub device after each image subsection is classified.

In some embodiments, the method further includes: receiving, by a configuration device executing a configuration application, a first image of a field of view of the camera of the image classification device from the image classification device; displaying, by the configuration device, the first image via a user interface of the configuration device; receiving, by the configuration device, a bounding box from a user via the user interface, the bounding box being defined with respect to the first image and defining the area being monitored; providing, by the configuration device, the bounding box to the image classification device; receiving, by the configuration device, a second image of the field of view of the camera of the image classification device, the second image being bounded by the bounding box and depicting the area being monitored; determining, by the configuration device, one or more bounding box segments based on the second image, each bounding box segment corresponding to a respective subsection of the area being monitored that contains a classifiable element; and providing, by the configuration device, the bounding box segments to the image classification device. In some of these embodiments, the method further includes receiving, by the configuration device, additional configuration parameters with respect to the image classification device being configured and provides the configuration parameters to the image classification device.

In some embodiments, updating the local templates includes: generating a new local template based on the requested classification and the image subsection; and storing the new local template on the local memory device with the set of local templates.

In some embodiments, updating the local templates includes: receiving a template of the plurality of templates from the hub device, wherein the template was determined to match the image subsection by the hub device; and storing the template on the local memory device with the set of local templates.

In some embodiments, the hub device trains multiple image classification devices in an unsupervised manner.

In some embodiments, the object being monitored by the image classification device is a meter. In some of these embodiments, the meter is a wheel counter meter. In other embodiments, the meter is an LED meter.

In some embodiments, the hub device is a mobile device.

In some embodiments, the camera is less than two megapixel resolution.

According to some embodiments of the present disclosure, a method for training a classification device is disclosed. The method includes receiving, by one or more processors of a hub device, a plurality of images of an object being monitored by the classification device; extracting, by the one or more processors, a set of image subsections from the plurality of images; and determining, by the one or more processors, a set of potential templates from the set of image subsections. For each potential template of the set of potential templates, the method includes: determining, by the one or more processors, a set of weighted match scores for the potential template, wherein each of the weighted match scores corresponds to a respective classification and indicates a degree of confidence in the respective classification; determining, by the one or more processors, a set of similarity scores for the potential template, wherein each of the similarity scores corresponds to another respective image subsection from the set of image subsections and indicates a degree of similarity between the potential template and the other respective image subsection; and in response to determining one of the weighted match scores exceeds a match score threshold and at least one of the similarity scores exceeds a first similarity threshold: assigning, by the one or more processors, the respective classification corresponding to the weighted match score that exceeded the match score threshold to the potential template; and including, by the one or more processors, the potential template in a set of classifiable templates corresponding to the classification device. For each potential template of the set of potential templates, the method includes: in response to determining one of the weighted match scores exceeds a match score threshold and a plurality of the similarity scores are less than the first similarity threshold and greater than a second similarity threshold: assigning, by the one or more processors, the respective classification corresponding to the weighted match score that exceeded the match score threshold to the potential template; and including, by the one or more processors, the potential template in a set of alternative templates corresponding to the classification device. The method also includes providing the set of alternative templates and the set of classifiable templates to the classification device.

In embodiments, the method further includes in response to determining none of the similarity scores are greater than a second similarity threshold: generating a set of synthesized templates based on the set of classifiable templates, wherein each synthesized template includes a synthesized image containing two or more character fragments from two or more respective classifiable templates and a synthesized classification that indicates a character represented by the synthesized template. In these embodiments, the method further includes, for each synthesized template in the set of synthesized templates: determining a synthesized template similarity score between the synthesized template and the potential template, and in response to determining that the synthesized template similarity score of the synthesized template exceeds a synthesized template threshold: assigning the synthesized classification to the potential template and including the potential template in a set of character fragment templates. The method also includes providing the set of character fragment templates to the image classification device. In some embodiments, each synthesized template of the set of synthesized templates represents a respective transition between two characters. In some embodiments, each respective transition between two characters is a transition between the two characters on a wheel counter meter.

In embodiments, determining the set of weighted match scores for each potential template includes performing optical character recognition on the image subsection corresponding to the potential template, wherein the optical character recognition provides a set of potential matches and, for each potential match, a weighted match score of the potential match with respect to the image subsection.

In embodiments, determining the set of similarity scores for the potential template includes, for each of the other respective image subsections, calculating a ratio of matching pixels between the image subsection corresponding to the potential template and the other respective image subsections.

In embodiments, the plurality of images are received in response to commanding the classification device to capture the plurality of images.

In embodiments, extracting the set of image subsections includes, for each image in the plurality of images extracting a predefined region of the image corresponding to the object being monitored and extracting one or more image subsections from the predefined region of the image.

In some embodiments, the predefined region is defined by a bounding box defined by a human using a configuration device. In some embodiments, the image subsections extracted from the predefined region are extracted from predefined subsections of the predefined region.

In embodiments, determining the set of potential templates based on the set of image subsections includes identifying any subsets of matching image subsections from the set of image subsections, wherein only one image subsection from each subset of matching images is included in the set of potential templates. In some embodiments, each potential template is initially unclassified.

In embodiments, the object being monitored by the image classification device is a meter. In embodiments, the meter is a wheel counter meter. In embodiments, the meter is an LED meter.

In embodiments, hub device trains multiple classification devices. In embodiments, the hub device is connected to a continuous power supply and the classification device is powered by a battery.

According to some embodiments of the present disclosure, a system for providing digital twin enabled applications is disclosed. The system includes an application system executed by a first set of processors. The processors cause the application system to: receive first digital twin data from a first digital twin data source, the first digital twin data pertaining to a first aspect of an environment to be represented by a digital twin; receive second digital twin data from a second digital twin data source, the second digital twin data pertaining to a second aspect of the environment; and generate the digital twin representing the environment based on the first digital twin data and the second digital twin data. The processors further cause the application system to receive coding statements via a user interface of the application system from one or more developers, wherein the coding statements define one or more actions to be performed with respect to the digital twin; generate an application that leverages the digital twin based on the coding statements; and publish the application.

In some embodiments, the system further includes a server kit executed by a second set of processors that cause the server kit to: receive real-time data from one or more real-time data sources, wherein the real-time data source corresponds to the environment represented by the digital twin; and provide an instance of the application with the real-time data, wherein the instance of the application receives the real-time data and updates an instance of the digital twin with the real-time data. In some embodiments, providing the instance of the application with the real-time data includes: receiving a nested API request from the instance of the application; retrieving the real-time data from a cache of the server kit; and providing the real-time data to the instance of the application. In some embodiments, providing the instance of the application with the real-time data includes: receiving a nested API request from the instance of the application; retrieving the real-time data from a cache of the server kit; and providing the real-time data to the instance of the application. In some embodiments, receiving the real-time data includes receiving a data stream containing the real-time data from the real-time data source; and providing the instance of the application with the real-time data includes streaming the real-time data to the instance of the application via a socket to which the instance of the application is subscribed. In some embodiments, generating the application includes: generating a set of objects representing the environment; and generating a scene tree based on the set of objects. In some of these embodiments, the instance of the application updates one or more objects of the scene tree based on the real-time data. In some of these embodiments, the second set of processors further cause the server kit to execute a digital twin workflow with respect to an instance of the digital twin. In some embodiments, the digital twin workflow defines a data fusion process that produces fused data based on the real-time data. In some embodiments, the server kit executes the data fusion process and provides the fused data to the instance of the application in response to the digital twin workflow being triggered. In some embodiments, the real-time data source is a set of Internet of Things sensors. In some embodiments, the real-time data source is a hub-and-spoke classification system. In some embodiments, the real-time data source is a location-based services application.

In embodiments, generating the application includes: generating a set of objects representing the environment based on the first digital twin data, the second digital twin data, and the coding statements; and generating a scene tree based on the set of objects.

In embodiments, the first set of processors further cause the application system to: receive third digital twin data from a third digital twin data source, the third digital twin data pertaining to an item within the environment; and generate an embedded digital twin based on the third digital twin data. In some embodiments, the environment is a city and the item is a building located in the city, and wherein the digital twin represents the city and the embedded digital twin represents the building in the city. In some embodiments, the environment is a building and a subsection of the building, and wherein the digital twin represents the building and the embedded digital twin represents the subsection of the building.

BRIEF DESCRIPTION OF THE FIGURES

FIG. 2A depicts an instance example of an application system in accordance with the many embodiments of the present disclosure.

FIG. 2B depicts a nested instance example of an application system in accordance with the many embodiments of the present disclosure.

FIG. 3A and FIG. 3B depict a define-and-raise function example of an application system in accordance with the many embodiments of the present disclosure.

FIG. 4 depicts an expression example of an application system in accordance with the many embodiments of the present disclosure.

FIG. 5A depicts a simple "if" block condition example of an application system in accordance with the many embodiments of the present disclosure.

FIG. 5B depicts an "if/else if/else" block condition example of an application system in accordance with the many embodiments of the present disclosure.

FIG. 6A depicts a simple "loop if" pre-tested loop example of an application system in accordance with the many embodiments of the present disclosure.

FIG. 6B depicts a simple "end if" posted test loop example of an application system in accordance with the many embodiments of the present disclosure.

FIG. 6C depicts an iterator-style "for loop" example of an application system in accordance with the many embodiments of the present disclosure.

FIG. 6D depicts an array/list or map iterator-style "collection" loop example of an application system in accordance with the many embodiments of the present disclosure.

FIGS. 7A-7D depict array examples of an application system in accordance with the many embodiments of the present disclosure.

FIGS. 8A and 8B depict variation and state examples of an application system in accordance with the many embodiments of the present disclosure.

FIG. 9 depicts example variation rules of an application system in accordance with the many embodiments of the present disclosure.

FIG. 10 depicts the declarative language scene tree description of an application system in accordance with the many embodiments of the present disclosure.

FIGS. 11A and 11B depict an example of a button specified using conditional logic of an application system in accordance with the many embodiments of the present disclosure.

FIG. 12 depicts a scene tree description example of an SGML element nesting example of an application system in accordance with the many embodiments of the present disclosure.

FIG. 13 depicts an example of logic placement inside a method of an application system in accordance with the many embodiments of the present disclosure.

FIG. 14 depicts an example of how statically declared states may be used to determine unpicked and picked visualizations of an application system in accordance with the many embodiments of the present disclosure.

FIG. 42 depicts a capability tree representation example of an application system in accordance with the many embodiments of the present disclosure.

DETAILED DESCRIPTION

Figure 1A:
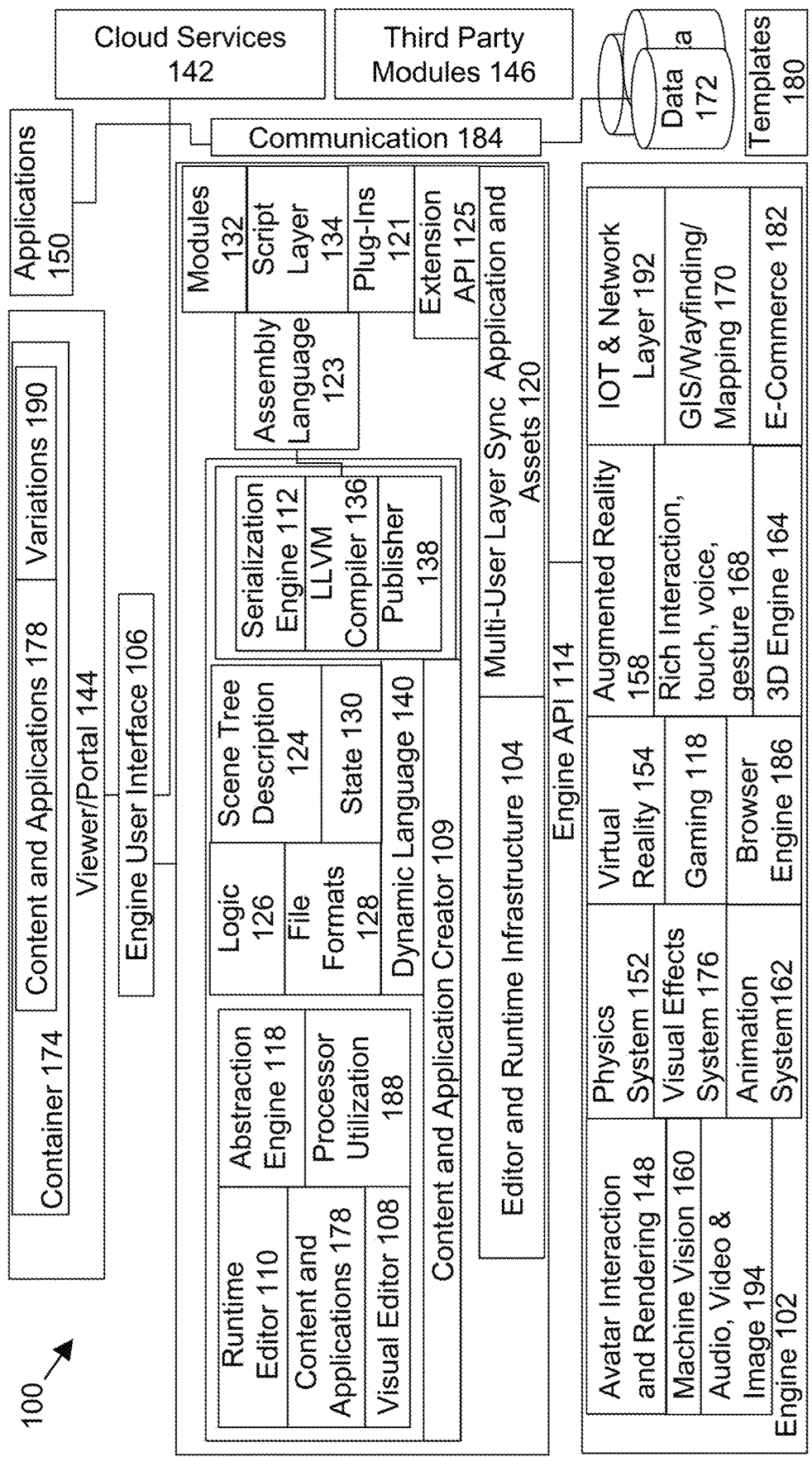
FIG. 1A depicts a schematic diagram of the main components of an application system and interactions among the components in accordance with the many embodiments of the present disclosure.

FIG. 1 depicts embodiments of an application system 100 (also referred to as a "content and development management platform" or "platform 100" in the incorporated materials) according to exemplary and non-limiting embodiments. In embodiments, the application system 100 may include an engine 102 and an editor and runtime infrastructure 104 that includes various associated components, services, systems, and the like for creating and publishing content and applications 178. These may include a content and application creator 109 (referred to in some cases herein for simplicity of reference as the app creator 109). In embodiments, the app creator 109 may include a visual editor 108 and other components for creating content and applications 178 and a declarative language 140 which has hierarchical properties, layout properties, static language properties (such as properties found in strongly typed and fully compiled languages) and dynamic language properties (e.g., in embodiments including runtime introspection, scripting properties and other properties typically found in non-compiled languages like JavaScript™). In embodiments, the declarative language 140 is a language with simple syntax but very powerful capabilities as described elsewhere in this disclosure and is provided as part of a stack of components for coding, compiling and publishing applications and content. In embodiments the declarative language has a syntax that is configured to be parsed linearly (i.e., without loops), such as taking the form of a directed acyclic graph. Also included is a publisher 138, which in embodiments includes a compiler 136. In embodiments, the compiler is an LLVM compiler 136. The publisher 138 may further include other components for compiling and publishing content and applications. Various components of the editor and runtime infrastructure 104 may use the same engine 102, such as by integrating directly with engine components or by accessing one or more application programming interfaces, collectively referred to herein as the engine API 114.

The application system 100 may be designed to support the development of media-rich content and applications. The application system 100 is intended to have a simple architecture, while providing comprehensive and extensible functionality.

The language used by the application system 100 may, in embodiments, have a limited degree of flexibility and few layers of abstraction, while still providing a broad and powerful set of functions to a user. In embodiments, characteristics of the application system 100 with limited flexibility may include minimizing syntax requirements, such as by excluding case sensitivity, supporting a single way of completing tasks, without exceptions, supporting a limited number of media formats, helping keep the runtime small, sharing code and using a common language for editor, viewer and portal.

While an application system 100 may have a limited degree of flexibility and few layers of abstraction, it may provide a comprehensive range of capabilities required to build and deploy solutions. This comprehensive range of capabilities may be provided and performed while maintaining an integrated and simple, i.e., straightforward, mode of operation for a user.

In embodiments, the engine 102 may include a wide range of features, components and capabilities that are typical of engines normally used for high performance video games, including, but not limited to, an avatar interaction and rendering engine 148 (referred to for simplicity in some cases as simply the avatar engine 148), a gaming engine 119, a physics engine 152, a virtual reality (VR) engine 154, an augmented reality (AR) engine 158, a machine vision engine 160, an animation engine 162, a 3D engine 164, a rich user interaction engine 168 (such as for handling gesture, touch, and voice interaction), a geographic information system (GIS) way-finding and map engine 170, audio, video and image effects engine 194, and/or e-commerce engine 182. These may be distinct components or systems that interact with or connect to each other and to other system components, or they may be integrated with each other. For example, in embodiments, the animation engine 162 may include capabilities for handling 3D visual effects, physics and geometry of objects, or those elements may be handled by a separate system or engine.

The engine 102 may also include a browser engine 186. In embodiments, the browser engine 186 may be a lightweight JavaScript implementation of a subset of the engine 102. The browser engine 186 may render on a per-frame basis inside a web browser, using WebGL 2.0, for example, to render without restrictions, such as restrictions that may be imposed by rendering in HTML 5.0.

In embodiments, rendering may be a two-step process. A first step may use asm.js, a subset of JavaScript that is designed to execute quickly, without using dynamic features of JavaScript. Asm.js may be targeted by an LLVM compiler 136 of the application system 100. This may allow an application of the application system 100 to be compiled in asm.js.

In a second step, a C++ engine and OS level wrappers may be created to target web browser capabilities and also use WebGL 2.0 for rendering. This subset may significantly reduce the libraries required to render, as they may be replaced with equivalent capabilities, such as those provided by a modern browser with network and sound support. The target may be a small set of C++ engine code, which may also be compiled by the application system 100, for example by the LLVM compiler 136, to target asm.js and become the engine that applications of the application system 100 may run against.

The two-step process may produce high performance, sovereign applications rendered in WebGL that can operate inside a browser window. Because the asm.js files of application system 100 may be the same for all applications of this type, they may be cached, allowing improved startup times across multiple applications of the application system 100. This approach may remove the limitations caused by HTML and CSS, as well as memory usage and rendering performance issues that are experienced by current state-of-the-art websites.

The application system 100 may include various internal and external communication facilities 184, such as using various networking and software communication protocols (including network interfaces, application programming interfaces, database interfaces, search capabilities, and the like). The application system 100 may include tools for encryption, security, access control and the like. The application system 100 may consume and use data from various data sources 172, such as from enterprise databases, such that applications and content provided by the system may dynamically change in response to changes in the data sources 172. Data sources 172 may include documents, enterprise databases, media files, Internet feeds, data from devices (such as within the Internet of Things), cloud databases, and many others. The application system 100 may connect to and interact with and various cloud services 142, third party modules 146, and applications (including content and applications 178 developed with the application system 100 and other applications 150 that may provide content to or consume content from the application system 100). Within the editor 108 and language 140, and enabled by the engine 102, the application system 100 may allow for control of low level device behavior, such for how an endpoint device will render or execute an application, such as providing control of processor utilization 188 (e.g., CPU and or GPU utilization). The application system 100 may have one or more plug-in systems, such as a JavaScript plug-in system, for using plug-ins or taking input from external systems.

The application system 100 may be used to develop content and applications 178, such as ones that have animated, cinematic visual effects and that reflect, such as in application behavior, dynamic changes in the data sources 172. The content and applications 178 may be deployed in the viewer/portal 144 that enables viewing and interaction, with a consistent user experience, upon various endpoint devices (such as mobile phones, tablets, personal computers, and the like). The application system 100 may enable creation of variations 190 of a given content item or application 178, such as for localization of content to a particular geographic region, customization to a particular domain, user group, or the like. Content and applications 178 (referred to for simplicity in some cases herein as simply applications 178), including any applicable variations 190, may be deployed in a container 174 that can run in the viewer and that allows them to be published, such as to the cloud (such as through a cloud platform like Amazon Web Services™) or via any private or public app store.

A user interface 106 may provide access, such as by a developer, to the functionality of the various components of the application system 100, including via the visual editor 108. In embodiments, the user interface 106 may be a unified interface providing access to all elements of the system 100, or it may comprise a set of user interfaces 106, each of which provides access to one or more elements of the engine 102 and other elements of the application system 100.

In embodiments, the application system 100 may support the novel declarative language 140 discussed herein. The application system 100 may support additional or alternative programming languages as well, including other declarative languages. A cluster of technologies around the declarative language 140 may include a publisher 138 for publishing content and applications (such as in the container 174) and a compiler (e.g., an LLVM compiler 136). The LLVM compiler 136 may comprise one or more libraries that may be used to construct, optimize and produce intermediate and/or binary machine code from the front-end code developed using the declarative language 140. The declarative language 140 may include various features, classes, objects, functions and parameters that enable simple, powerful creation of applications that render assets with powerful visual effects. These may include domain-specific scripts 134, a scene tree description system 124, logic 126, a file format system 128 for handling various file formats, and/or an object state information system 130 (also referred to as "state" in this disclosure). The application system 100 may include various other components, features, services, plug-ins and modules (collectively referred to herein as modules 132), such as for engaging the various capabilities of the engine 102 or other capabilities of the application system 100. The declarative language 140 and surrounding cluster of technologies may connect to and operate with various application system 100, such as the engine 102, third party modules 146, cloud services 142 and the visual editor 108.

The visual editor 108 of the application system 100 may be designed to facilitate rapid creation of content, optionally allowing users to draw from an extensive set of templates and blueprints 180 (which may be stored in the data store 172) that allow non-technical users to create simple apps and content, much as they would create a slide show or presentation, such as using a desktop application like Microsoft™ PowerPoint™.

In embodiments, the visual editor 108 may interact with the engine 102, (e.g., via an engine application programming interface (API) 114), and may include, connect to, or integrate with an abstraction engine 118, a runtime editor 110, a serialization engine 112, and/or a capability for collaboration and synchronization of applications and assets in a multi-user development environment 120 (referred to for simplicity in some cases as "multi-user sync"). The multi-user sync system 120 may operate as part of the editor and runtime infrastructure 104 to allow simultaneous editing by multiple users, such as through multiple instances of the visual editor 108. In this way, multiple users may contribute to an application coextensively and/or, as discussed below, may view a simulation of the application in real time, without a need for compilation and deployment of the application.

In embodiments, the visual editor 108 may allow editing of code written in the declarative language 140 while displaying visual content that reflects the current state of the application or content being edited 116 in the user interface 106 (such as visual effects). In this way, a user can undertake coding and immediately see the effects of such coding on the same screen. This may include simultaneous viewing by multiple users, who may see edits made by other users and see the effects created by the edits in real time. The visual editor 108 may connect to and enable elements from cloud services 142, third party modules 146, and the engine 102. The visual editor 108 may include an abstraction engine 118, such as for handling abstraction of lower-level code to higher-level objects and functions.

In embodiments, the visual editor 108 may provide a full 3D rendering engine for text, images, animation, maps, models and other similar content types. In embodiments, a full 3D rendering engine may allow a user (e.g., developer) to create, preview, and test 3D content (e.g., a virtual reality application or 3D video game) in real time. The visual editor 108 may also decompose traditional code driven elements, which may comprise simplified procedural logic presented as a simple list of actions, instead of converting them into a user interface, which may comprise simplified conditional logic presented as a visual checklist of exceptions called variations.

In embodiments, editing code in the declarative language 140 within the visual editor 108 may enable capabilities of the various engines, components, features, capabilities and systems of the engine 102, such as gaming engine features, avatar features, gestural interface features, realistic, animated behavior of objects (such as following rules of physics and geometry within 2D and 3D environments), AR and VR features, map-based features, and many others.

The elements of the application system 100 described in the foregoing paragraphs and the other elements described throughout this disclosure may connect to or be integrated with each other in various configurations to enable the capabilities described herein.

As noted above, the application system 100 may include a number of elements, including the engine 102, a viewer 144 (and/or portal), an application creator (e.g., using the visual editor 108 and declarative language 140), and various other elements, including cloud services 142.

In embodiments, the engine 102 may be a C++ engine, which may be compiled and may provide an operating system (OS) layer and core hardware accelerated functionality. The engine 102 may be bound with LLVM to provide just-in-time (JIT) compiling of a domain-specific script 134. In embodiments, the LLVM compiler 136 may be configured to fully pre-compile the application to intermediate 'bytecodes' or to binary code on-demand. In embodiments, the LLVM compiler 136 may be configured to activate when a method is called and may compile bytecodes of just this method into native machine code, where the compiling occurs "just-in-time" to run on the applicable machine. When a method has been compiled, a machine (including a virtual machine) can call the compiled code of the method, rather than requiring it to be interpreted. The engine 102 may also be used as part of a tool chain along with the LLVM compiler 136, which may avoid the need to provide extra code with a final application.

In embodiments, the design of the underlying C++ engine of the application system 100 may be built around a multi-threaded game style engine. This multi-threaded game style engine may marshal resources, cache media and data, manage textures, and handle sound, network traffic, animation features, physics for moving objects and shaders.

At the center of these processes may be a high performance shared scene tree. Such a scene tree is non-trivial, such as for multi-threading, and it may be serialized into the language of the application system 100. Doing this may allow the scene tree to act as an object with properties and actions associated with events. There may then be modular layers for managing shared implementation information in C++, as well as platform-specific implementations for these objects in the appropriate language, such as objective C or Java and also allowing binding to the appropriate API's or SDK's or Libraries.

As well as serializing the project in the application system format, it may also be possible to export a scene tree as JSON or in a binary format. Additionally, only a subset of the full application system language may be required for the editor 108 and viewer/portal 144. Such a subset may support objects/components, properties, states and lists of method calls against events. The subset may also be suitable for exporting to JSON. The scene tree may also be provided as a low level binary format, which may explicitly define the structures, data types, and/or lengths of variable length data, of all records and values written out. This may provide extremely fast loading and saving, as there is no parsing phase at all. The ability to serialize to other formats may also make it more efficient for porting data to other operating systems and software containers, such as the Java Virtual Machine and Runtime (JVM) or an asm.js framework inside a WebGL capable browser.

In many cases the application system 100 may not have direct access to device hardware for devices running other operating systems or software containers, so various things may be unknown to the application system 100. For example, the application system 100 may not know what libraries are present on the devices, what filtering is used for rendering quads, what font rasterizer is used, and the like. However, the system's ability to produce or work with "compatible" viewers, which may exist inside another technology stack (e.g., in the Java runtime or a modern web browser), may allow users to experience the same project produced using the application system 100 on an alternative software platform of choice. This may also provide a developer of the viewer the same opportunity to build in similar game engine-style optimizations that may take effect under the hood, as may be possible within the application system 100 itself.

The viewer 144 (also referred to as a "portal" or "viewer/editor/portal" in this disclosure) may integrate with or be a companion application to a main content and application creator 109, such as one having the visual editor 108. The viewer 144 may be able to view applications created without the need to edit them. The ability to load these applications without the need for binary compilation (e.g., by LLVM) may allow applications to run with data supplied to them.

For example, objects may be serialized into memory, and built-in functions, along with any included JavaScript functions, may be triggered.

The app creator 109, also referred to in some cases as the visual editor 108 in this disclosure, may be built using the engine 102 of the application system 100 and may enable editing in the declarative language 140. An app creator may allow a user to take advantage of the power of an application system 100 engine 102.

The various editors of the application system 100 may allow a user to effectively edit live application system 100 objects inside of a sandbox (e.g., a contained environment). In embodiments, the editors (e.g., runtime editor 110 and/or visual editor 108) may take advantage of the application system 100 ability to be reflective and serialize objects to and from the sandbox. This may have huge benefits for simplicity and may allow users to experience the same behavior within the editor as they do when a project (e.g., an application) deploys because the same engine 102 hosts the editors, along with the project being developed 108 and the publisher 138 of the editor and runtime infrastructure 104.

In embodiments, the application system 100 may exploit several important concepts to make the process of development much easier and to move the partition where writing code would normally be required.

The application system 100 may provide a full layout with a powerful embedded animation system, which may have unique properties. The application system 100 may decompose traditional code driven elements using simple linear action sequences (simplified procedural logic), with the variations system 190 to create variations of an application 178, optionally using a visual checklist of exceptions (simplified conditional logic), and the like.

In embodiments, the application system 100 may break the creation of large applications into projects. Projects may include pages, components, actions and feeds. Pages may hold components. Components may be visual building blocks of a layout. Actions may be procedural logic commands which may be associated with component events. Feeds may be feeds of data associated with component properties. Projects may be extended by developers with JavaScript plugins. This may allow third party modules or plugins 146 to have access to all the power of the engine. The engine 102 may perform most of the compute-intensive processing, while JavaScript may be used to configure the behavior of the engine.

The engine 102 may provide an ability to both exploit the benefits of specific devices and provide an abstraction layer above both the hardware and differences among operating systems, including MS Windows, OX, iOS, Android and Linux operating systems.

The editor(s), viewers 144, and cloud services 142 may provide a full layout, design, deployment system, component framework, JS extension API and debugging system. Added to this the turnkey cloud middleware may prevent users from having to deal with hundreds of separate tools and libraries traditionally required to build complex applications. This may result in a very large reduction in time, learning, communication and cost to the user.

Unique to an application system 100 described in these exemplary and non-limiting embodiments, projects published using the application system 100 may be delivered in real time to devices with the viewers 144, including the preview viewer and portal viewer. This may make available totally new use cases, such as daily updates, where compiling and submitting an app store daily would not be feasible using currently available systems.

One aspect of the underlying engine architecture is that the application system 100 may easily be extended to support new hardware and software paradigms. It may also provide a simple model to stub devices that do not support these elements. For example, a smartphone does not have a mouse, but the pointer system could be driven by touch, mouse or gesture in this example. As a result, a user (e.g., developer) may rely on a pointer abstraction. In some scenarios, the pointer abstraction may work everywhere. In other scenarios, the abstraction may only work when required, using the underlying implementation, which may only work on specific devices.

The engine framework may be designed to operate online and offline, while also supporting the transition between states, for example by using caching, syncing and delayed updates.

The engine 102 may provide a choreography layer. A choreography layer may allow custom JavaScript (JS) code to be used to create central elements in the editor, including custom components, custom feeds, and custom actions. In some implementations, JavaScript may be a performance bottleneck, but this choreography approach means JS may be used to request the engine to download files, perform animations, and transform data and images. Because the engine 102 may handle a majority of the processing, the engine 102 may apply all of the platform-specific code, which is able to best exploit each device and manage low level resources, without requiring user involvement.

In embodiments, a domain-specific declarative language of the application system 100 may be important for internal application requirements. The domain-specific declarative language 140 may be used to develop the shared code for the editor, preview and portal applications. These applications may be fully-compiled with LLVM.

In embodiments, the visual editor 108 may be configured to also serialize code for the application system 100. Serializing content code may allow users to actually edit and load user projects into the engine 102 at runtime. In embodiments, serialization may refer to the process of translating data structures, objects, and/or content code into a format that can be stored (e.g., in a file or memory buffer file) or transmitted (e.g., across a network) and reconstructed later (possibly in a different computer environment). In embodiments, the ability of the domain-specific code to be both a statically compiled language and a dynamic style language capable of being modified at runtime enables the engine 102 to allow users to edit and load user projects at runtime.

In embodiments, the domain-specific language 140 may contain the 'physical hierarchical' information on how visual elements are geometrically nested, scaled and rotated, essentially describing a 'scene tree' and extending to another unique feature of the language, which is explicit state information. Explicit state information may declare different properties or method overrides, based on different states. Doing this is an example of how an application system 100 may be able to formalize what current state-of-the-art systems would formalize using IF-style constructs to implement and process conditional logic.

In embodiments, underlying rendering may be performed using a full 3D stack, allowing rendering to be easily pushed into stereo for supporting AR and VR displays.

In embodiments, debugging the state of the engine 102, its objects and their properties, as well as the details of the JavaScript execution, may be done via the network. This may allow a user of the visual editor 108 to debug sessions in the visual editor 108 or on devices running a viewer.

The networking stack, in conjunction with a server for handshaking, may allow the visual editor 108 to be run in multiuser mode, with multiple users (e.g., developers) contributing live edits to the same projects on the application system 100. Each edit may be broadcast to all user devices and synchronized across the user devices.

In embodiments, "copy and paste" may utilize the ability to serialize code for the application system 100. This may provide a user with the ability to simply select and copy an item (e.g., an image, video, text, animation, GUI element, or the like) in the visual editor 108 and paste that content into a different project. A user may also share the clipboard contents with another user, who can then paste the content into their own project. Because the clipboard may contain a comment on the first line containing the version number, it would not corrupt the project the content is being pasted into. The line may also have the project ID, allowing resources like images, that may be required, for example by being specified in a property, may actually be downloaded and added into a target project.

Applications may have the same optical result on any system, as the graphical rendering may be controlled down to low level OpenGL commands and font rasterization. This may allow designers to rely solely on the results of live editing on their computer, even when a smartphone device profile is selected. This unified rendering may provide a shared effects system. This may allow GPU shaders, such as vertex and pixel shaders, to be applied to any object or group of objects in a scene tree. This may allow tasks like realtime parameterized clipping, color correction, applying lighting, and/or transformation/distortions to be executed. As a result, users may rely on the environment to treat all media, GUI elements and even navigation elements like a toolbar, with the same processes. It is noted that in embodiments, the system 100 may implement a graphics API that may support various operating systems. For example, the graphics API may provide DirectX support on Windows and/or Vulkan support for Android, iOS and/or Windows.

Physics of momentum, friction and elasticity may be enabled in the physics engine 152 of the engine 102, such as to allow elements in an application to slide, bounce, roll, accelerate/decelerate, collide, etc., in the way users are used to seeing in the natural world (including representing apparent three-dimensional movement within a frame of reference despite the 2D nature of a screen).

Enveloping features may be provided, such as modulating an action based on a variable input such as pressure/angle of a pen input or the proximity/area of a finger. This may result in natural effects like line thickness while drawing or the volume of a virtual piano key. This may add significant richness to user interactions.

Ergonomics may also be important to applications being approachable. Similar to the process of designing physical products, the layout, size and interaction of elements/controls may be configured for ergonomic factors. With respect to ergonomic factors, each type of input sensor (including virtual inputs such as voice) that a user (e.g., developer) may choose to enable may have different trade-offs and limitations with the human body and the environment where the interaction occurs in. For example, requiring people to hold their arms up on a large wall mounted touch screen may cause fatigue. Requiring a user of a smartphone to pick out small areas on the screen can be frustrating and putting the save button right next to the new button may increase user frustration. Testing with external users can be very valuable. Testing internally is also important. It is even better when quality assurance, developers, designers and artists of content can be users of the content.

A big challenge in ergonomics is the increasing layout challenges of different resolutions and aspect ratios on smartphones, tablets, notebooks, desktops and consoles. It is a significant task to manage the laying out of content so that it is easily consumed and to make the interface handle these changes gracefully. A snap and reflow system along with content scaling, which can respond to physical display dimensions, is a critical tool. It may allow suitable designer control to make specific adjustments as required for the wide variety of devices now available.

In embodiments, the application system 100 may support performance of 60 fps frame rate and 0 fps idle frame rate. Content created by the application system 100 may enable fast and smooth performance when necessary and reduce performance and device resource consumption when possible.

Input, display, file, audio, network and memory latency are typically present. In embodiments, the application system 100 may be configured to understand and minimize these limitations within the engine 102 as much as possible, then to develop guidelines for app developers where performance gains can be made, such as within a database, image handling and http processing. Performance gains within a database may include use transaction and use in memory mode for inner loops, and streaming images and providing levels of detail within image handling. HTTP processing performance gains may include using asynchronous processing modes and showing users a progress indicator.

Among other features, the declarative language 140 may include capabilities for handling parameters relating to states 130, choices, and actions. In many applications, state 130 is an important parameter to communicate in some way to users. For example, in an application for painting, a relevant state 130 might be that a pen is selected with a clear highlight, and the state 130 may also include where the pen is in place. A choice may be presented to a user so that content created by the application system 100 may be required to refocus the user on the foreground and drop out the background. By making state 130, and the resulting choices or action options clear, intended users may find applications developed by the application system 100 more intuitive and less frustrating.

Actions are often how a user accomplishes tasks within applications. It may be important to show users these actions have been performed with direct feedback. This might include animating photos into a slideshow when a user moves them, having a photo disappear into particles when it is deleted, animation of photos going into a cloud when uploaded and the like. Making actions clear as to their behavior and their success makes users much more comfortable with an application. In embodiments, the aim is to make this action feedback fun rather than annoying and not to slow down the user. The declarative language 140 may be designed to allow a developer to provide users with clear definitions of actions and accompanying states 130.

Consistency is important for many applications. The application system 100 may make it easier for developers to share metaphors and components across families of applications. The application system 100 may provide a consistent mental model for developers and the intended users of their applications 178. For example, when a user reaches out and touches screen content created by an application system 100, the content is preferably configured to act as a user expects it to act.

Rich content is often appealing. The application system 100 may bring content created by or for an enterprise, third party content, and user content to the front and center. Examples may include full screen views of family videos, large thumbnails when browsing through files, movie trailer posters filling the screen, and the like.

Worlds are an important part of the human brain. Users may remember where their street is, where their home is, and where their room is. Thus, in embodiments, the application system 100 may be configured to render virtual 3D spaces where a user may navigate the virtual space. This does not necessarily imply that the application system 100 may render big villages to navigate. In embodiments, 2D planes may still be viewed as the favored interaction model with a 2D screen, and even in a 3D virtual world. In embodiments, the application system 100 may enable 2D workspaces to be laid out in a 3D space allowing transitions to be used to help the user build a mental model of where they are in the overall space. For example, as a user selects a sub folder, a previous folder animates past the camera and the user appears to drop one level deeper into the hierarchy. Then pressing up a level will animate back. This provides users with a strong mental model to understand they are going in and out of a file system.

The engine 102 of the application system 100 may draw on a range of programs, services, stacks, applications, libraries, and the like, collectively referred to herein as the third-party modules 146. Third-party modules 146 may include various high quality open libraries and/or specialized stacks for specific capabilities that enhance or enable content of applications 178, such as for scene management features, machine vision features, and other areas. In embodiments, without limitation, open libraries that can be used within, accessed by, or integrated with the application system 100 (such as through application programming interfaces, connectors, calls, and the like) may include, but are not limited to, the following sources:

Clipper: Angus Johnson, A generic solution to polygon clipping
Comptr: Microsoft Corporation
Exif: A simple ISO C++ library to parse JPEG data
hmac_sha1: Aaron D. Gifford, security hash
lodepng: Lode Vandevenne
md5: Alexander Peslyak
sha: Aaron D. Gifford
targa: Kuzma Shapran, TGA encoder/decoder
tracer: Rene Nyffenegger
utf8: text encoding, Nemanj a Trifunovic
xxhash: fast hash, Yann Collet
assimp: 3D model loader, assimp team
Poly2Tri: convert arbitrary polygons to triangles, google
box2d: 2D physics, Erin Catto
bullet: 3D physics, Erwin Coumans
bzlib: compression, Julian R Seward
c-ares: async DNS resolver, MIT
curl: network library, Daniel Stenberg
freetype: font rendering library
hss: Hekkus Sound System, licensed
libjpeg: jpeg group
json: cpp-json
litehtml: html5 & css3 parser, Yuri Kobets
openssl: openssl group
rapidjson: Milo Yip
rapidxml: Marcin Kalicinski
sgitess: tesselator, sgi graphics
spine runtime: Esoteric Software
sqlite: sql database engine
uriparser: Weijia Song & Sebastian Pipping
zlib: compression, Jean-loup Gailly and Mark Adler
zxing: 1D and 2D code generation & decoding
compiler_rt: LLVM compiler runtime
glew: OpenGL helper
gmock: testing, Google
googlemaps: OpenGL mapview, Google
gson: Java serialization library, Google
msinttypes: compliant ISO number types, Microsoft
plcrashreporter: crash reporter, plausible labs
realsense: realsense libraries, Intel
Eigen lib: linear algebra: matrices, vectors, numerical solvers
Boost: ADT's
Dukluv & Duktape: JavaScript runtime
Dyncall: Daniel Adler (we use this for dynamic function call dispatch mechanisms, closure implementations and to bridge different programming languages)
libffi: Foreign Function Interface (call any function specified by a call interface description at run-time), Anthony Green, Red Hat
llvm: re-targetable compiler
lua, lpeg, libuv: Lua options as alternative to JavaScript
dx11effect: helper for directx
fast_atof: parse float from a string quickly.

In embodiments, the engine 102 may be designed to allow libraries and operating system level capabilities to be added thereto.

Figure 1B:
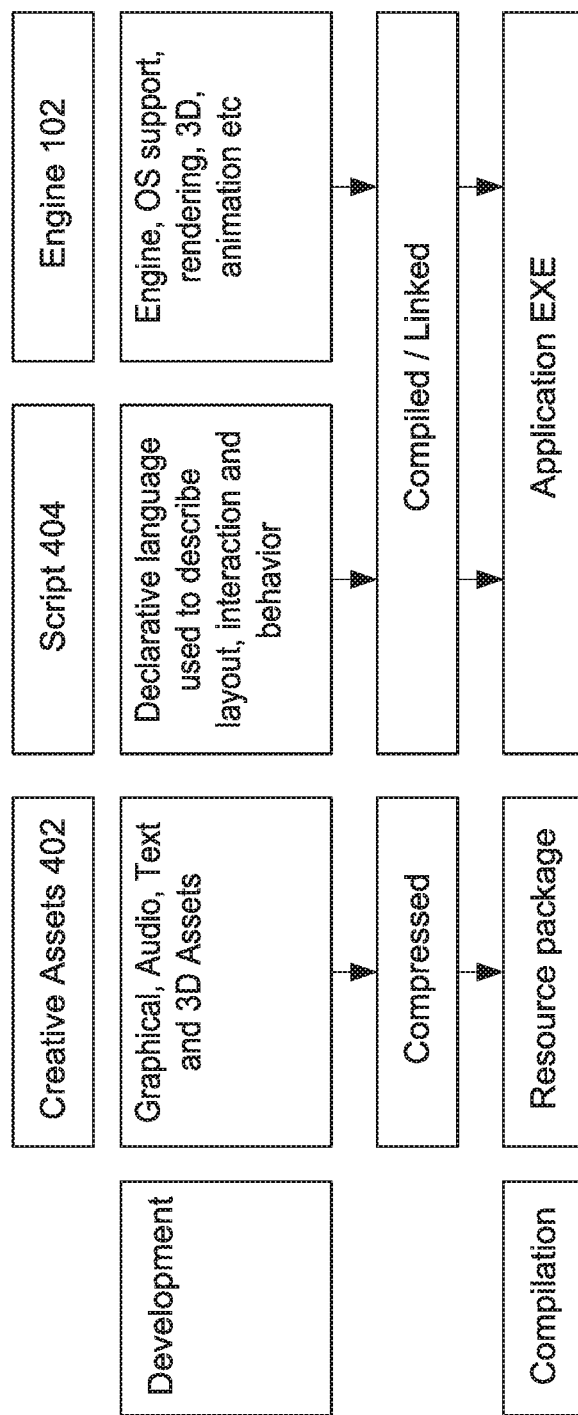
FIG. 1B depicts a project built by an app builder of an application system in accordance with the many embodiments of the present disclosure.

FIG. 1B depicts a basic architecture of a project built by a content and application creator 109 of the application system 100. A project built by the content and application creator 109 may use the capabilities of editor 108, the publisher 138, the language 140, and the engine 102 to create one or more items of content and applications 178. The project may access various creative assets 196, such as content of an enterprise, such as documents, websites, images, audio, video, characters, logos, maps, photographs, animated elements, marks, brands, music, and the like. The project may also include one or more scripts 504.

The application system 100 may be configured to load, play, and render a wide range of creative assets 196. Most common formats of creative content (e.g., images, audio, and video content) may be supported by the application system 100. The application system 100 may also include support for various fonts, 3D content, animation and Unicode text, etc. Support of these creative assets 196 may allow the application system 100 to support the creative efforts of designers to create the most rich and interactive applications possible.

The script 504 may be implemented in a language for describing objects and logic 126. The language may be designed with a straightforward syntax and object-oriented features for lightweight reuse of objects. This may allow the application system 100 to require relatively few keywords, and for the syntax to follow standard patterns. For example, a declare pattern may be: [keyword] [type] [name]. This pattern may be used to declare visible objects, abstract classes, properties or local variables such as:

instance image my_image end
define image my_imageclass
end
property int my_propint=5
int my_localint=5

The language 140 may be kept very simple for a user to master, such as with very few keywords. In embodiments, the language 140 may be fewer than thirty, fewer than twenty, fewer than 15, fewer than 12, or fewer than 10 keywords. In a specific example, the language 140 may use eleven core keywords, such as:
- Instance
- Define
- If
- Loop
- Method
- Raise
- Property
- End (ends all blocks)
- In (for time based method calls, or assignments)
- Tween (used for time based assignments which will be animated)
- State In embodiments, the language 140 uses one or more subsets, combinations or permutations of keywords selected from among the above-mentioned keywords. An object-oriented syntax may allow for very simple encapsulation of composite objects with custom methods and events to allow for lightweight reuse.

Base objects and composite objects built from base objects may support declarative programming. Support of declarative programming may allow other users, who may be using the GUI, to create functional visual programs by creating instances of a developer's objects, setting properties, and binding logic to events involving the objects.

In embodiments, the language may be strongly typed and may allow coercion.

In embodiments, the engine 102 may be or be accessed by or made part of the editor and runtime infrastructure 104, to which the language 140 is bound. The engine 102 may support the creation and management of visual objects and simulation, temporal assignments, animation, media and physics.

In embodiments, the engine 102 may include a rich object model and may include the capability of handling a wide range of object types, such as:
- Image
- Video
- Database
- http
- http_server
- Sound
- 3D
- Shapes
- Text
- Web
- I/O
- Timer
- Webcam In embodiments, the application system 100 may provide a consistent user experience across any type of device that enables applications, such as mobile applications and other applications with visual elements, among others. Device types may include iOS™, Windows™ and Android™ devices, as well as Windows™, Mac™ and Linux™ personal computers (PCs).

In embodiments, the engine 102 may include an engine network layer 192. The engine network layer 192 may include or support various networking protocols and capabilities, such as, without limitation, an HTTP/S layer and support secure socket connections, serial connections, Bluetooth connections, long polling HTTP and the like.

Through the multi-user sync capability 120, the application system 100 may support a multi-user infrastructure that may allow a developer or editor to edit a scene tree simultaneously with other users of the editor 108 and the editor and runtime infrastructure 104, yet all rendered simulations will look the same, as they share the same engine 102. In embodiments, a "scene tree" (also sometimes called a "scene graph") may refer to a hierarchical map of objects and their relationships, properties, and behaviors in an instantiation. A "visible scene tree" may refer to a representation of objects, and their relationships, properties, and behaviors, in a corresponding scene tree, that are simultaneously visible in a display. An "interactive scene tree" may refer to a representation of objects, and their relationships, properties, and behaviors, in a corresponding scene tree, that are simultaneously available for user interaction in a display.

In embodiments, code may be serialized, such as by a serialization engine 112. Serializing code may allow a user to create an application in the visual editor 108, save it, and make changes on the drive of the user, and the change may appear in the visual editor 108, or a runtime editor 110. Assets, such as maps, models, scripts, videos and fonts may be synchronized up to a bucket within the cloud associated with a server in a cloud services 142, such as an S3™ bucket. Modifications may be date stamped against the user who has made them. Modifications may be stored in an undo/commit history of a user, so the application system 100 can rollback changes or deal with versions specific to an individual user.

In embodiments, a frontend may use a real time network system, such as the COMET™ long polling system or a peer-to-peer socket connection, to support synchronization, to tell other computers that a change has happened on the server, which is then pushed down. If not synching with the server, then the network may send a compressed change down to a local machine. This may allow an application system 100 to work in a propagation mode or a local change mode. In embodiments, a peer-to-peer socket connection or a Raknet (gaming) layer may support faster, real-time synchronization.

In embodiments, the application system 100 may include an engine UI 106. The engine UI 106 may be built on top of the engine 102 and may provide an interface to the engine 102, the editor 108, the runtime infrastructure 104, and the like, as well as to individual components thereof. The engine UI 106 and visual editor 108 can, therefore, take advantage of all features of the engine. An application may be created in the visual editor 108 and may be hosted by the engine 102. In embodiments, the editor UI 106 may also run on the same engine 102 at the same time. This may be supported by introspective and container capabilities of the application system 100. This capability of the application system 100 may take advantage of an abstraction layer or the abstraction engine 118, such as for rendering abstractions of visual primitives and for input abstractions of any type of user input.

In embodiments, abstraction may take place over networking and may be an important requirement for simplifying the challenges users may face when creating mobile experiences. In embodiments, the application system 100 may provide simple, object-oriented wrappers for basic lower-level protocols such as http, sockets, serial, MIDI and Bluetooth to address the need for simplifying the challenges developers may face when creating mobile experiences. In embodiments, the application system 100 may also provide higher-level abstractions that may allow users to avoid having to interact with these lower-level protocols. The higher-level abstractions may remove the user from even having to understand which protocols are being used and why.

Examples of the kinds of critical high-level network behavior provided by an application system 100 may include syncing resources and assets; real-time sending and receiving of custom message; enumerating available data feeds and API services; high performance edge caching of data; and compressing data and assets so that networking speed is increased. In embodiments, the engine 102 may embody capabilities of a powerful game engine, which may provide cross-platform abstraction to enabling rendering of highly visual, animated applications, rather than just games. Abstraction and game engine capabilities may be tuned for the rendering of applications using, for example, the visual editor 108.

An editor and runtime infrastructure 104 may support the visual editor 108 and may provide the ability to have multi-user execution and serialization (rather than compilation) of applications. This capability means that the application system's declarative description of an app/project may be shared and synchronized between different users of the visual editor 108 and the engine 102. The engine 102 may support not just the reflective and introspective capabilities to make this possible, but the engine 102 may also support suitable object, network and file properties to make synchronization efficient.

The engine user interface 106 may support a UI layer and may provide an ability to create a common set of GUI elements, which may subclass the basic graphical primitives implemented by the engine 102. These GUI elements may also include all the behavior and uses of an abstraction layer of an engine for allowing handling of various input types. Input types may include touch, stylus, keyboard, mouse, gesture, voice and the like.

The application system 100 may support the declarative programming language 140, referred to herein in the alternative in some cases as the dynamic language or the declarative language. The declarative language 140 may include objects that may form the skeleton of declarative programs. A developer may create instances of the different classes of objects to form a visual basis of a document, an application, or other content. The developer can then set the properties of these objects to adjust the appearance or behavior of the objects in the document, application, or other content. The declarative programming language 140 may include objects, classes, properties and methods. Objects may be discrete bundles of components, often relating to a visual element (a button) or an abstract real world analogy (a customer). A keyword "INSTANCE" may be used to create an instance of a class, otherwise known as an object. A class may define a new type of object. A keyword "DEFINE" may be used to create a sub-class which may be based on an existing class. A property may be an attribute of an object represented by a value, which has one of the types defined for the application system 100. A method may be one or more actions that may be performed on an object. Such a method may take parameters (like a function) to help describe what the method should do. A method may contain code and may return values.

A class may raise an event, which may trigger a method in an instance of the class. A code may be an ordered list of instructions. A code may be performed (e.g., executed). A code may modify objects or properties and/or may call methods. Objects may be 'nested' into hierarchies. For example, a button may be placed inside a panel. As a result, visual properties such as position and scale may be inherited from the panel. When the panel is moved, the child button may move with it. Objects may include methods. Methods may contain code, which may perform operations. Methods may also bind to events, which may be raised by users. An example event may be a user clicking a mouse. In response to such an event, a method may perform a function tied to the event, as defined by the code.

The declarative programming language 140 may include sub-classing. Sub-classing may include creating a sub-class from a parent class. This is also referred to as a new class 'inheriting' from its parent class. This may be used to create new and more complex classes from the original object model, for example. New programmer-created classes may be used in the language 140 and may define custom properties, methods, and events.

A script 504 of the application system 100 may be made in declarative language. The declarative language 140 may allow a user to define the layout of the hierarchy of objects and their properties that the user wants the engine 102 to create. The declarative language 140 may include an instance. As depicted in FIG. 2A, an instance may make an object of class image, which may make an actual instance of an apple graphic.

An instance may be a nested instance. As depicted in FIG. 2B, a nested instance may make an object of class image, which may make another instance inside it. In the example of FIG. 2B, an object of class image corresponding to a worm is nested in the object definition of a class image corresponding to an apple.

In embodiments, the declarative language may include a "define" function. A define function may allow a user to define a new sub-class of image, which may not create an actual object. FIG. 3A depicts an example of a define function.

In embodiments, the declarative language 140 may include a "define-and-raise" function. The define and raise function may bind a new class to handle a mouse-down event and, in turn, raise a custom on-release event when an instance is created from this new class. FIG. 3B depicts an example of a define-and-raise function. The declarative language 140 may also support overriding a base method in a sub-defined class. This allows for compile time checking of a method called in this manner and is equivalent in most cases to using raise. Raise still has the benefit of finding a method when called on an unknown class, but has the disadvantage of needing a runtime type check, so it is marginally slower.

The declarative language 140 may include a logic function 126 (also referred to as logic 126). A logic function 126 may be a series of instructions (e.g., code) that may each perform basic tasks, which when combined, may create complex behaviors.

The declarative language 140 may include types. A type may apply to the type of an object (e.g., an image), a basic variable (e.g., string, int, real) and the like. Types may be basic types. Several basic types may be available. Basic types may be simpler than full objects and may include:

Int (int8, uint8, int16, uint16, int32, uint32, int64, uint64)
Real (Real32, Real64)
String
Bool
Vec2, vec3, Mat4
Color
Datetime
Var The declarative language 140 may include expressions and assignments. An expression may be a combination of numbers, variables, methods and operators, which evaluate to a value. An assignment may include setting a property or variable to a new value (potentially from an expression).

Expressions and assignments may allow a variable or property to be assigned a value. The value may be an expression as simple as a single number or contain operators like addition, or calls to methods, which return values. FIG. 4 depicts examples of an expression.

The declarative language 140 may include conditions. A condition may be based on a comparison succeeding or failing branch the flow of the program. Conditions may be decisions where code may be branched based on the success or failure of a comparison. If, else, and elseif may be the structures provided. The condition may need to evaluate to nonzero to be true and succeed. Comparison operators may be used to test values. Comparison operators may include: == (equal), != (not equal), > (greater), >= (greater or equal), < (less than), <= (less than or equal). FIG. 5A depicts a simple "If block" condition. FIG. 5B depicts and "If/Elseif/Else block" condition.

The declarative language 140 may include loops. A loop may repeat instructions until a condition is met. Loops may allow repeating of a block of logic/code multiple times. A loop may instruct code to run until a condition is met. Loops may be pre-tested and post-tested. FIG. 6A depicts a simple pre-tested loop or "(Loop if)". FIG. 6B depicts a posted test loop or "(End if)". FIG. 6C shows an iterator style loop, and FIG. 6D shows looping over a map or list.

The declarative language 140 may include arrays. An array may be a variable that holds more than one value declared by adding square brackets. Arrays may be used with loops and may process lists or maps of data. The application system 100 may support numeric and string indexes. To access the specific item in a condition, expression, or assignment, an index may simply be specified between square brackets. Note that the underlying data structure of the array as a list (such as involving a numeric index) or map (such as involving a string index) can be selected for capability and performance purposes. Multi-dimensional arrays may also be declared and used by having multiple sets of square brackets. FIG. 7A depicts an example of declaring a basic array. FIG. 7B depicts an example of accessing an array. FIG. 7C depicts an example of using an array in a loop. FIG. 7D depicts an example of declaring a two-dimensional array.

The declarative language 140 may include the capabilities for creating variations 190 and for managing states 130. A state 130 may provide a state dependent scope (e.g., one can override properties or methods based on a current state 130). A variation 190 may be a mechanism that allows a developer to override one or more properties, or methods in an object given a state 130. A variation may be used, for example, to change a style, a layout, a background, a font, displayed text, images, interface elements, and the like.

Figures 8B, 9:
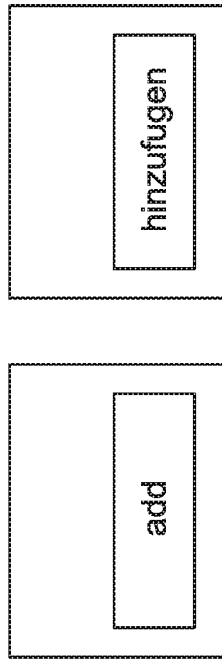

To ensure that variations 190 may be statically declared, a language feature may be introduced to provide a "conditional scope." Objects may have multiple pre-declared named states 130, where in a particular state one or more properties or actions may be overridden. This may allow the application system 100 to handle state-dependent capabilities, such as for localization. It may also be used to handle any condition where a different presentation or behavior may be required or desired. FIG. 8A depicts an example of a variation 190 and state 130. FIG. 8B depicts how the "language_german" overrides the "width" property and the "caption", while also adding a new behavior for the actions. FIG. 8B also depicts the revised behavior of the engine 102 in a situation involving a variation 190 or a dependence on state 130. In this example, the "add_button" object starts with initial properties and methods. Setting the state 130 property of "add_button" to "language_german" applies new properties and methods, without resetting any properties that are not specified as being dependent on the state 130. States 130 may be added to definitions and instances and around methods.

The variations engine 190 may use variation rules to apply changes to the layout of a page or a master page (which multiple pages can be sub-classed from). The variations engine 190 may enable modifications to control regions and other objects or master objects (which multiple objects can be sub-classed from) contained on these pages. In embodiments, the types of variations that may be possible may include, without limitation, to hide or show an item, to set a property, to request a custom action for this object, or the like. This may be visualized as a checklist by the designer, such as by using the visual editor 108 of the application system 100, for example. FIG. 9 depicts a list of some example variation rules. In addition to the exemplary rules shown in FIG. 9, variations 190 may be triggered based on the presence of various combinations or permutations of features of the runtime environment or device on which content or applications 178 will run or be rendered (e.g., combinations operating system, region, manufacturer, orientation, pixel density, device and/or language). For example, a variation 190 may be triggered based on the recognition that a mobile app created by the application system 100 is running in an iPhone™ located in Germany, or that an animation is being rendered on a Samsung™ display, etc. The item to which a variation 190 is applied is referred to herein in some cases as the target. The target may be a page, a master page, or the like and may refer to any item contained therein.

States 130 can be established by checking the rules upon startup and after changes to any of these attributes. The rules may be evaluated in order and each rule may maintain a state 130 of how it has been applied so that when it is applied the first time, the rule matches and is correctly reset when the rule stops matching, for example. The result is that designers may simply create lists of variations (and the states these apply to) to specify the detailed design, layout, or behavioral changes. This list may easily be reviewed and discussed within teams of non-technical staff.

The application system 100 may include a visual code editing environment or the visual editor 108, as depicted in FIG. 1. A visual code editing environment may allow a developer to work at a high level while an underlying engine 102 has full control of CPU/GPU utilization to the lowest level for best performance.

In embodiments, the visual editor 108 may allow the application system 100 to produce detailed analysis at the CPU level and analyze assembly level instructions to maximize thermal performance of applications (at the level of individual instructions), enabling full control of an entire stack of resources down to the lowest level, including CPU utilization and instructions generated by a compiler.

The application system 100 fundamentally may change the process of delivering information to endpoint devices and create an engaging interactive experience. The visual editor 108 may allow multiple groups to access simultaneous layout and structure information that is packaged into the container 174 for publication. This may be done in minutes for simple projects, and in no more than a few days for projects that draw extensively from external information feeds or that use complex graphics. The container 174 may be instantly published to a computing cloud, such as an AWS™ computing cloud, where it may then be immediately accessed by authorized users, on any device, with an identical experience, or with an experience that reflects desired variations 190 that are particular to the situation of the user. The container 174 may also be published to a private or public app store, in which case it may be subject to the standard approval process and other requirements of the app store.

The application system 100 may include a gaming engine 119 and other capabilities for handling machine code across platforms. The gaming engine 119 may be implemented with a low-level device (e.g., a chip, ASIC, FPGA, or the like), performance-based approach on the machine side and a gaming engine approach for visual elements, such as using the abstraction engine 118, to marry visual behavior to a machine environment. The gaming engine 119 may be highly optimized for applications which have a large number of GUI elements. These elements may be 2D, 3D, or a mixture of both. The gaming engine 119 may also be able to manage transitions and animations very efficiently. The gaming engine 119 may provide capabilities that may have been 'hard-coded', which with the gaming engine 119 is parameterized, such that it can be varied for execution as desired according to the capabilities, state, or the like of an execution environment for content or applications 178 created using the application system 100. This allows content or applications 178 in a project to be serialized, without needing to be compiled when it is distributed to the viewer/portal 144 or the editor 108.

The application system 100 may include a platform for code development. The application system 100 for code development may include a plug-in system 121, such as a JavaScript plug-in system, the content and application creator 109 (including the editor 108), the script layer 134, and the engine 102. The plug-in system 121 may orchestrate components, feed events, and trigger behavior. The content and application creator 109, including the editor 108, may integrate with or connect to the script layer 134. The script layer 134 may be bound to an assembly language 123 that may be bound to the high-performance engine 102. The LLVM compiler 136 may compile code to communicate with the engine 102.

The engine 102 may use JavaScript to trigger behavior or respond to an event. The editor 108 may have rich function components. The script layer 134, such as using JavaScript, may orchestrate those components while rendering at native speed. New behavior may be rendered in an application without changing a binary; that is, what was compiled from the editor 108 and downloaded, may remain unchanged, while only the script, e.g., JavaScript, changes.

The engine 102 may include low level engine features like the animation and simulation. In an example, the following JavaScript call is equivalent to the internal application system 100 "tween" statement:

setPropertyInTween(apple, "alpha", 1.0, 1000, 5)

The foregoing "tween" statement is equivalent to the statement:

apple.alpha=1.0 in 1000 tween ease_both so the component apple has its alpha property changed to 1.0 over 1000 milliseconds using the ease_both tween.

The application system 100 may provide an extension API 125, such as for allowing actions to be extended, such as using a scripting language like JavaScript. This may allow new classes of components and data feeds to be created, such as in JavaScript.

The following example depicts how JavaScript is used for creating one of the basic components and then adjusting its properties. The result of this example is the full 60 fps hardware accelerated performance of the base component, as well as the custom behavior the following JavaScript provides:

```
registerComponent("toggleButton", "", "toggleButton", "", "toggleButton_init", "",
"toggleButton_refresh",
"imagepicker:default_image,imagepicker:down_image,imagepicker:disabled_image,
imagepicker:toggled_default image,imagepicker:toggled_down_image,
imagepicker:toggled_disabled_image,bool:show
text:0,string:default_text:on,string:toggled_text:off,bool:toggle_state:0", "")
function toggleButton_init(width, height){
        var toggleButton = createComponent(self, "button", 0, 0, 100, 100);
     var overlay = createComponent(self, "image", 0, 0, 100, 100);
          bindEvent(overlay,"on_press","togglePress");
}
function togglePress( ){
  var button = getComponentChild(self,0);
  var toggleState = getData(self, "toggle state");
  if(!toggleState){
    setProperty(button,"default_filename",getData(self, "toggled_default image"));
    setProperty(button,"down_filename",getData(self, "toggled_down image"));
    setProperty(button,"disabled filename",getData(self, "toggled_disabled_image"));
    setData(self,"toggle_state", 1);
  }
  else{
    setProperty(button,"default_filename",getData(self, "default_image"));
    setProperty(button,"down_filename",getData(self, "down_image"));
    setProperty(button,"disabled_filename",getData(self, "disabled_image"));
    setData(self,"toggle_state", 0);
  }
}
```

In addition, specific capabilities of the engine 102, such as animation and simulation, are exposed to the JavaScript API just as they are exposed to the declarative language 140 of the application system 100. Hence a statement like setPropertyInTween (apple, "alpha", 1.0, 1000, 5) will execute very efficiently, as it is only called once and, subsequently, the hardware accelerated animation system inside the engine 102 takes over and performs all the animation and rendering of the transition of this single (or many) property change, including multiple tweens inserted in the timeline for this (or many) other objects simultaneously.

In embodiments, the application system 100 may allow serialization of the content from an editor, which may allow a user to use the full power of the underlying engine 102 and its gaming engine features (without the need to compile anything on the client).

In embodiments, the engine 102 may allow a user to better abstract from the underlying operating system. Traditional, native development environments bind to the native GUI library provided by Apple, Google, Microsoft, etc. This results in very different behavior, look and feel, and programming models on each native device. The application system 100 may avoid all of that by creating all GUI elements out of visual primitives fully controlled by the engine 102. This makes the pixel level designer control and cross-platform performance very effective in the application system 100. For example, a toggle switch in iOS™ looks like a white circle in a green oval, which slides left/right. Yet in Android™, it is a box within a rectangle, which slides up and down. In Windows™, this is often a 'check' icon in a box which is present or not. In application system 100, the visual designer may pick and customize their own pixel perfect look, which works on all devices.

In embodiments, the visual editor 108 may use the same core engine 102 of the application system 100 for editing, previewing, and running at runtime. This may ensure that there is no difference and that the experience for the user is completely WYSIWYG ("what you see is what you get"), which may reduce testing.

In embodiments, the visual editor 108 may use the same engine 102 while editing and while running. This may be powered by the LLVM compilation technology of the engine 102 that may allow a user to pre-compile the editor code and the engine editor and runtime infrastructure 104 code using a shared code base which then is bound to the engine 102. An example implementation of an LLVM compiler is provided in Appendix A.

In embodiments, the application system 100 may share the same core code shared among editing, previewing and runtime environments. This may allow the application system 100 to draw on the same code base for the hosting and bootstrapping of script applications created by the end user, which may not need compilation with LLVM.

In embodiments, the visual editor 108 may allow real-time, multi-user, simultaneous development by allowing a shared understanding and shared simulation of what is being created. In embodiments, the visual editor 108 may include an optimistic locking system. In an optimistic locking system, the last commit may win. An optimistic locking system may restrict, so that only a master user can do some tasks, such as destructive editing when someone is working on it.

Multi-user development may include a parallel process between users. Optimistic locking may allow the application system 100 to make almost everything multi-user. Optimistic locking may be used to manage updates to a central representation of the current project/application. Importantly, this may be able to interact in a transactional model with all parts of the system so that if it is an asset in the folder, an image or change to a JavaScript file, for example, a new component being added to a page, or a change to a property on an existing component. These can all be kept in-synch between users. Importantly, if a user joins the session late or drops off the connection periodically, the user may get caught up with a list of all transactions that have occurred.

When one of the users manually chooses to save (e.g., publish to the viewer), this may act as a sync point and may collapse the delta/transaction log so it does not become unwieldy.

In embodiments, the engine 102 of the application system 100 may be designed to support the visual editor 108, which is both an application itself and can inspect and edit another running application that a user is working on.

In embodiments, the visual editor 108 may include a JavaScript API. A JavaScript API may be designed to enable very light configuration work, leaving the engine 102 of the application system 100 to do the bulk of the processing. This may prevent runtime JavaScript from becoming a bottleneck, and instead may take full advantage of a hardware-accelerated engine.

In embodiments, a further network layer via cloud services 142 may provide real time synchronization of assets and changes to the application being edited between multiple users.

In embodiments, the engine 102 may utilize a LLVM compiler 136, either integrated with or as part of the engine 102, to act in a just-in-time compilation mode for developers, or without LLVM where it may simply be part of the toolchain to generate a finally compiled application.

The visual editor 108 and viewer/portal 144 both may use the engine 102 as a fully compiled application. This may allow applications developed using the application system 100 to run on systems like tablets or phones, which may not allow runtime compilation.

Both the editor 108 and the viewer/portal 144 may be created using script 504 made and handled by the script layer 134, which may be compiled using the LLVM compiler on a build wall (cloud hosted CPU's with specific hardware, OS and toolchain configurations dedicated to compiling OS specific executables), which may then be linked with the engine 102 to create final static binaries, which can be installed on devices. A user may synch one of their projects with an editor/viewer/portal 144 and the following things may happen. First, the assets (images, scripts, sounds etc.) may be copied into a cache folder specific to this project. Second, the project file (in compressed script 504) may be copied into the same cache folder. Third, the engine 102 may parse this high-speed file, thereby creating all the required components and storing lists of required built-in engine actions, or links, to JavaScript actions. Fourth, content or application 178 may now be used interactively; it may be effectively hosted and bootstrapped by the editor/viewer/portal 144.

The editor 108 and other elements of the editor and runtime infrastructure 104 (such as for preview and portal features) may be written in the declarative language 140 and may be compiled with LLVM 136 and bound to a C++ engine for maximum native performance.

As referenced elsewhere in this specification, the application system 100 may include the declarative language 140 (rather than just using an API). The declarative language 140 may support LLVM as the main compiler. The declarative language 140 may include an LLVM front-end. The use of LLVM in the application system 100 may increase the efficiency and speed of an LLVM front-end.

The same language 140 may be used to build an editor and an application. It may also be the file format/language which is interpreted, from which the runtime behavior is edited and transmitted and then executed by the engine 102 as a simulation.

The declarative language 140 may be used to describe not just the objects, but their relationship within a scene tree. This may include a hierarchy and nesting of objects (and their properties and methods). This may allow building the full detail of the page layout. Properties may also be inherited so that a form that contains a button, when rotated or scaled, will appropriately rotate and scale its children (in this case the button). The declarative language may be interpreted and executed by engine simulation. FIG. 10 depicts the declarative language scene tree description 124.

In embodiments, the ability to express both the logic layer and layout/presentation layer within the same declarative language 140 is provided, which may reduce complexity and make separation of logic and presentation optional, rather than requiring developers to handle them separately, which consumes time and can result in errors or unintended effects of the logic upon the presentation layer.

The same domain-specific declarative language 140 may be used to create the editor 108 and runtimes (such as runtimes for a preview of content or application behavior and runtimes that are accessed by users, such as through the portal 144). That same domain-specific language 140 may also be used to create the content and applications 178. This may utilize the introspection and container capabilities in the way that the language 140 is implemented by the engine 102.

The file format 128 may be where a script 504 of the application system 100 may be serialized or de-serialized, such as without the need for compiling. This may be how an app is 'loaded' inside the host environment, such as for preview, in the portal 144, or in a host environment for editing.

Tokens may be turned into bytecodes and literals (e.g., strings, numbers, and/or object names), and may be stored following a bytecode and length as appropriate. This serialization may be designed to be smaller to transmit and faster to encode/decode without the need for parsing.

A restriction applied to the serialized applications is the logic inside objects. Events may be limited to a list of parameterized methods, to simplify the task of specifying a workflow for the user. With states, users may also have access to the equivalent to conditional logic.

The declarative language may be designed to be extended with new object classes with methods, properties and events which may expose cross-platform device features. This may allow very simple expressions. The declarative language may grant access to logic 126, databases, animation, 3D, and documents. Language features may have animation, time and multiple states for an object. The declarative language may have a scene underneath, where all properties may be synchronized and run as a simulation.

In embodiments, objects may inherit properties. Examples of objects and properties may include buttons on forms, rotating forms, making elements transparent, and the like. Unlimited named states may be added to an object or object class. Each state 130 may encapsulate properties or methods. This may make it possible to create a variations system. A state 130 may be like conditional logic.

FIG. 11A depicts a button in German specified using conditional logic. In this example, conditional code may end up anywhere in a program making it hard to find and debug. The compiler also may not be sure if the code inside the condition will ever be executed as the condition has variables in it. FIG. 11B also depicts a button in German specified using the declarative language. This may all be declarative and checkable at parse time. The states may be inside the object and may be fully resolvable. A user may declare a list of valid states that the object may be tagged with at the top of a program The declarative language 140 may include a domain-specific language. A domain-specific language may make it quick and easy to create visual experiences and may assume a user is going to use the framework of the application system 100.

The declarative language may be extremely fast to compile in a single pass. For example, an entire application using the LLVM compiler may compile in seconds. The declarative language may have the features of a strongly typed declarative language 140; it may, however, be fully statically compiled for maximum performance. In the declarative language, instead of writing C++ code to create the editor, the entire editor may be significantly smaller than the engine.

In embodiments, the application system 100 may publish apps through a private portal 144 and manage the ability for users to edit applications on the fly. The application system 100 may allow a user to deploy an app without having to go through an app store. A user may compile to the app store. A user may also publish natively to other platforms that anyone owns. Other platforms may include Windows, Android, iOS, Linux (Ubuntu), for digital signage content, for example, and the like. This may allow a user to publish to different platforms seamlessly. This may eliminate the need to put internal facing apps into an app-store or other application vending service. This may allow for development of company-specific portals, where customers may push apps into their own portal, allowing a company to serve content-driven experiences to customers.

In embodiments, the declarative language 140 may support multiple roles. The declarative language 140 may be a strongly typed declarative language for building binary applications, via the LLVM compiler 136, and for high-speed serialization for the viewer/portal/editor 144. As depicted in FIG. 1 the declarative language 140 may include a scene tree description 124, logic 126, file format 128, state information 130, modules, domain-specific script 134, LLVM compiler 136, and publisher 138. The LLVM compiler 136 may compile with LLVM to final binary code, or publish through a viewer/portal 144 to de-serialize content into a host application such as a portal (or for that matter the editor).

As depicted in FIG. 12, a scene tree description 124 may support an SGML style nesting of elements. Importantly, the elements may inherit visual and transformation properties from their parents. This is important as moving a panel in 3D space may move all the buttons and text elements pasted on a panel with it. This covers scaling, moving, rotation and changes in visual properties like transparency.

Logic 126 may be placed inside a method. The only distinction between standard methods and event handlers may be when methods using reserved names like on_click may receive the appropriate event if it is triggered on that object. Importantly logic 126 may be inherited and separated from presentation as required. The code may natively understand other components and their relationship to each other. This means that in code, a user may explicitly refer to children and their properties using, for example, a "." (period) to separate them. For example, clicking on a tree may perform an operation on another object using the dot syntax, each dot may then be another level lower.

As depicted in FIG. 13, at the global level, tree.apple1.x=100 is valid. At the level of the tree.apple1.x=100. At the level of the apple1 then .x=100 is valid. It may also possible to step backward using.parent( ).

File format 128 may allow the application system 100 languages to perform multiple duties. A sophisticated LLVM compiler 136 frontend may lex, parse, and compile the logic 126. The LLVM compiler 136 may also be designed to be serialized in text or binary format for high performance when used as a file format 128, so as to support publishing through a viewer/portal 144. A file format 128 may have a few specific restrictions like turning logic 126 into lists of parameterized method calls, but largely may be kept the same in terms of sub-classing, nesting, properties and state. The ability to be used as both a compiled and serialized description is part of the language's design and novelty.

The state 130 may be used for various purposes in the application system 100, including to drive the variation system. A state block may provide a scope where any properties or methods specified may override those at the default level. This may allow conditional logic 126 to be statically checked. The state block may check the Boolean state of a flag. This flag may be system derived (orientation_portrait) or user defined (user_platinum_member).

As depicted in FIG. 14, the example depicted in FIG. 13 is changed to show how statically declared states may now be used to determine the unpicked and picked visualization of the apple. Then the on_click method will set the apple to be picked, causing those affected properties to be updated.

Modules 132 may be a set of standard language features which may be found in most languages, e.g., objects, events, properties and sub classing, which may have specific engine level support for both abstracting OS level features implemented in the C++ layer and extending objects with synthetic JavaScript sub classing. Modules 132 may make it extremely quick to add support for new abstractions implemented at the lowest engine level or by third parties as synthetic sub-classes of one or more base classes using the JavaScript API. In embodiments, modules 132 may include novel elements of a python code generation layer, which may be used at the C++ end and more about the JavaScript API harness for registerComponent and how it may interact with the engine 102 and its ability to dynamically manage new classes.

A domain-specific script 504 of the application system 100 may be provided within a domain-specific language in the application system 100. The domain-specific script 504 may have multiple special properties. Multiple special properties may include:
1) Standard patterns for structures [keyword] [type] [name];
2) Simplified keywords;
3) Statically declared hierarchical structure like SGML;
4) Statically declared sub classing;
5) Statically declared conditional logic (state);
6) Statically declared animation and timing (In keyword);
7) Statically declared access to the components/objects using the dot syntax;
8) Serializable to a binary format;
9) Single pass lexing and parsing (no backtracking); and/or
10) High speed compiling.

An LLVM compiler 136 may cover the way a domain-specific application system 100 language may use a custom frontend to lex and parse, then may compile a script 504, which may define the GUI and behavior for both the editor/preview and portal from a shared source code base.

There may then be a set of different tool chains for each OS, which may link binary code with an engine, such as the C++ engine, and with OS-specific wrapper functions, as well as with platform-specific bootstrap code (e.g., for C++, Java, Objective C, etc.). This may allow a user of the application system 100 to build a fully compiled native application powered by the engine 102, the GUI and behavior defined in the application system 100 script 504, and the CPU/GPU architecture-specific tweaks present in LLVM backend.

Publishing through a viewer/editor may focus on how a host application works rather than the actual serialization and the benefits that may be provided to a user of the application system 100 (effectively code free development). A host application may be built in the domain-specific script 504 (such as within the editor/viewer/portal 144). This may be able to serialize/de-serialize all the objects/components from part of a tree structure that may make up the scene. This may be how a 'sub-application' is loaded and saved. It is noted that there may be several mechanisms that may make this process work, such as with the dynamic components, methods/actions, and events driven by an API such as a JavaScript API. In embodiments, the application system 100 may include the ability to enter an "edit mode," where component events may be intercepted, so as to allow components to be selected and highlighted. These reflective qualities may be built into an engine object model, and the domain-specific script 504 may exploit these reflective qualities so that once the selection event is intercepted, the positions of components can be interrogated, a highlight displayed around the component, and the properties of the components can be interrogated and displayed in the properties panel and made editable by the user. It is noted that there may be no compiling going on in the preview/portal. Simply the components may be re-established inside a 'sub-application' by de-serializing them, and the action lists may be bound to the events. This may mean the engine 102 may now run everything at full native performance with the existing binary functionality that the engine 102 provides.

A JavaScript API may add a 'choreography' layer where new functions may be deployed. This API may be designed to offload as much ongoing computation to the engine 102 as possible, keeping the JavaScript layer setting up behaviors or connecting processes like network calls and data processing.

In addition, the application system 100 may include another system that may manage the undo/redo and multi-user systems. This system may be a set of virtual properties and methods. Virtual properties and methods may be shadows of real properties and methods the component has and may not affect rendering activities of the engines. However, these virtual properties may hold the current serialization state and may allow the application system 100 to manage just saving non-default values, resolving changes in transactions during undo/redo or multi-user operations, and resetting components back to their virtual state after a user has tested an app in the editor.

The application system 100 may perform simulations. An application created by the application system 100 may create new objects, animate objects, change properties, and the like, during run mode. Being able to return an application back to its editing state using virtual properties may be useful in the application development process.

In embodiments, the application system 100 may include the engine 102. The engine 102 may connect to an editor and engine editor and runtime infrastructure 104, the declarative language 140, cloud services 142, third party modules 146, and the visual editor 108. The editor and engine editor and runtime infrastructure 104 may connect to the engine user interface (UI) 106. The engine UI 106 may connect to a viewer/portal 144 and an avatar interaction engine 148. As depicted throughout this disclosure and in some embodiments, the application system 100 may include the engine 102 that unifies the creation, editing and deployment of an application across endpoint devices, including endpoint devices that run heterogeneous operating systems. Thus, an app created in the application system 100 can automatically operate, without creation of separate versions, on different mobile operating platforms, such as Android™ and IOS™ platforms.

In embodiments, the engine 102 may be configured to support a multi-user infrastructure by which, for example, different users of the engine may edit a scene tree description 124 for an application 150 or otherwise collaborate to create an application. Each user may edit the scene tree description 124 for the application simultaneously with other users of the visual editor 108. In embodiments, a user may edit the scene tree description 124 for the application 150 simultaneously with other users of the visual editor 108 or users of the runtime of the application 150. Any rendered depictions (e.g., simulations) of the behavior of objects in the application 150 may appear the same to all users of the visual editor 108 and/or of the runtime infrastructure 104 of the application 150.

In embodiments, the engine 102 may share the editor and runtime infrastructure 104 for the code that implements the application 150. The same engine 102 may be used for both editing and running the application, using the same editor and runtime infrastructure 104.

In embodiments, the engine 102 may include a visual code editing environment, also referred to as a visual editor 108 throughout this disclosure. The visual editor 108 may allow a developer to code high-level application functions, including how an application 150 will use the CPU/GPU of an endpoint device that runs the application 150, to enable optimization of the performance of the application 150.

In embodiments, the engine 102 may include a gaming engine 119 to handle machine code across different operating system platforms, within the same editor interface. The engine 102 may include a plug-in system 121, such as a JavaScript plug-in system, a visual editor 108, a script layer 134 and additional engines, such as a serialization engine, browser engine 186 or 3D engine 164, to simulate and run of code developed using the application system 100. The engine 102 may include a shared simulation of the runtime behavior of the application 150 that is being edited by the visual editor 108.

In embodiments, the engine 102 may implement a declarative language (also referred to as a dynamic language 140 in this disclosure). In embodiments, the declarative language 140 may describe a scene tree. The declarative language may describe a scene tree using a scene tree description 124. The scene tree description 124 may specify the page layout of an application 150 and the structure of interactions among application elements in response to user input.

In embodiments, the engine 102 may include a coding environment, such as a content and application creator 109, that includes the dynamic language 140, in which the runtime and the editor for the application may be compiled by an LLVM compiler 136. The engine 102 may include the ability to express logic for application behavior, as well as presentation layer layouts of visual elements for the application 150, in the same declarative language 140. The declarative language 140 may include object classes and methods. Object classes and methods may allow a developer to specify conversational interfaces and natural language endpoints. Conversational interfaces and natural language endpoints may be used as inputs to create an emotionally responsive avatar for integration into a system that uses the avatar. The conversational interface and natural language endpoints may be received as inputs and the avatar may be created using an avatar interaction and rendering engine 148 of the engine 102.

In embodiments, the engine 102 may use or include a domain-specific language. The same domain-specific language may be used for the editor and runtime infrastructure 104 and file management for applications 150 developed using the application system 100.

In embodiments, the engine 102 may include an application development language. The application development language may include named states and support an unlimited number of named states. Named states may be added to an object or object class which may encapsulate properties or methods. The application development language may be extended with new object classes, methods, properties and events. Methods, properties and events may expose device features across devices. Devices may use the same or different operating system platforms. The application development language may include a domain-specific language for visual experience creation.

In embodiments, the engine 102 may include a development environment, such as a content and application creator 109. The content and application creator 109 may include or connect to a viewer/portal 144. A viewer/portal may be a private portal. The private portal may publish applications 150 from the development environment without requiring deployment through an app store, for example. The content and application creator 109 may connect to the engine 102 through an engine API 114.

In embodiments, the engine 102 may include or connect to an engine user interface 106. The engine user interface 106 may enable non-technical users to specify variations 190. Variations 190 may be variations of objects visually presented in applications 150.

In embodiments, the engine 102 user interface 106 may allow users to manage the state of one or more objects that may be used to create a visual presentation for an application 150. The engine user interface 106 may also include one or more interfaces for handling input parameters for 3D content and other input parameters. Other input parameters may include content density parameters, hand proximity display parameters, head proximity change density parameters, content as a virtual window parameter, hysteresis for content density parameters, content density parameters and the like. In embodiments, the engine user interface 106 may include support for 3D content generation. 3D content generation may be generated by a 3D engine 164. The engine user interface 106 may include support for 3D content generation may include the ability for a user of the engine user interface 106 to hot key, in order to identify the object and properties of a 3D object for the application. The 3D engine 164 may include an editor for handling 3D machine vision input. 3D machine vision input may manage color information and information relating to a distance from a defined point in space. The engine user interface 106 may also include an application simulation user interface. The application simulation user interface may share the infrastructure and engine for the code that implements an application 150. The application simulation interface may connect to the visual editor 108.

In embodiments, the editor and runtime infrastructure 104 and the engine 102 may allow for the creation, editing and running of an application 150 that includes both 2D and 3D elements. The editor and runtime infrastructure 104 may use a hybrid scene tree description 124 that includes 2D and 3D elements that may be rendered, composited and interacted within the same visual scene of an application 150.

The editor and runtime infrastructure 104 may allow for a scene tree description for an application 150 to be edited simultaneously by multiple users of the editor and runtime infrastructure 104 of the application 150, such that rendered simulations may appear the same to all users.

In embodiments, the editor and runtime infrastructure 104 may connect to the visual editor 108. The visual editor 108 may allow a developer to code high-level application functions and may define how an application 150 may use the CPU/GPU of an endpoint device that runs the application 150, to enable optimization of application performance.

In embodiments, the engine user interface 106 may include support for the simulation of an application 150. The engine user interface 106 may share the editor and runtime infrastructure 104 and engine 102 for the code that implements the application 150. The editor and runtime infrastructure 104 may include a visual editor 108 that may use the same engine 102 for editing and running the application 150.

In embodiments, the engine 102 may include a gaming engine 119. The gaming engine 119 may handle machine code across different operating system platforms within the same engine user interface 106. The editor and runtime infrastructure 104 may include a plug-in system 121, for example, a JavaScript plug-in system, a visual editor 108, a script layer 134 and an engine, such as a serialization engine 112, for simulation and running of code developed using the application system 100.

In embodiments, the visual editor 108 may include a shared editing environment. The shared editing environment may enable real time, multi-user, simultaneous development, including shared simulation of the runtime behavior of the application 150 that is being edited. The shared editing environment may be synchronized by a multi-user layer sync application and asset system 120. The visual editor 108 may include support for the dynamic language 140, private portal, editing engine, object classes, 3D content, 3D content generation user interface and hybrid 2D and 3D scene trees as described previously in this disclosure.

Figure 15A:
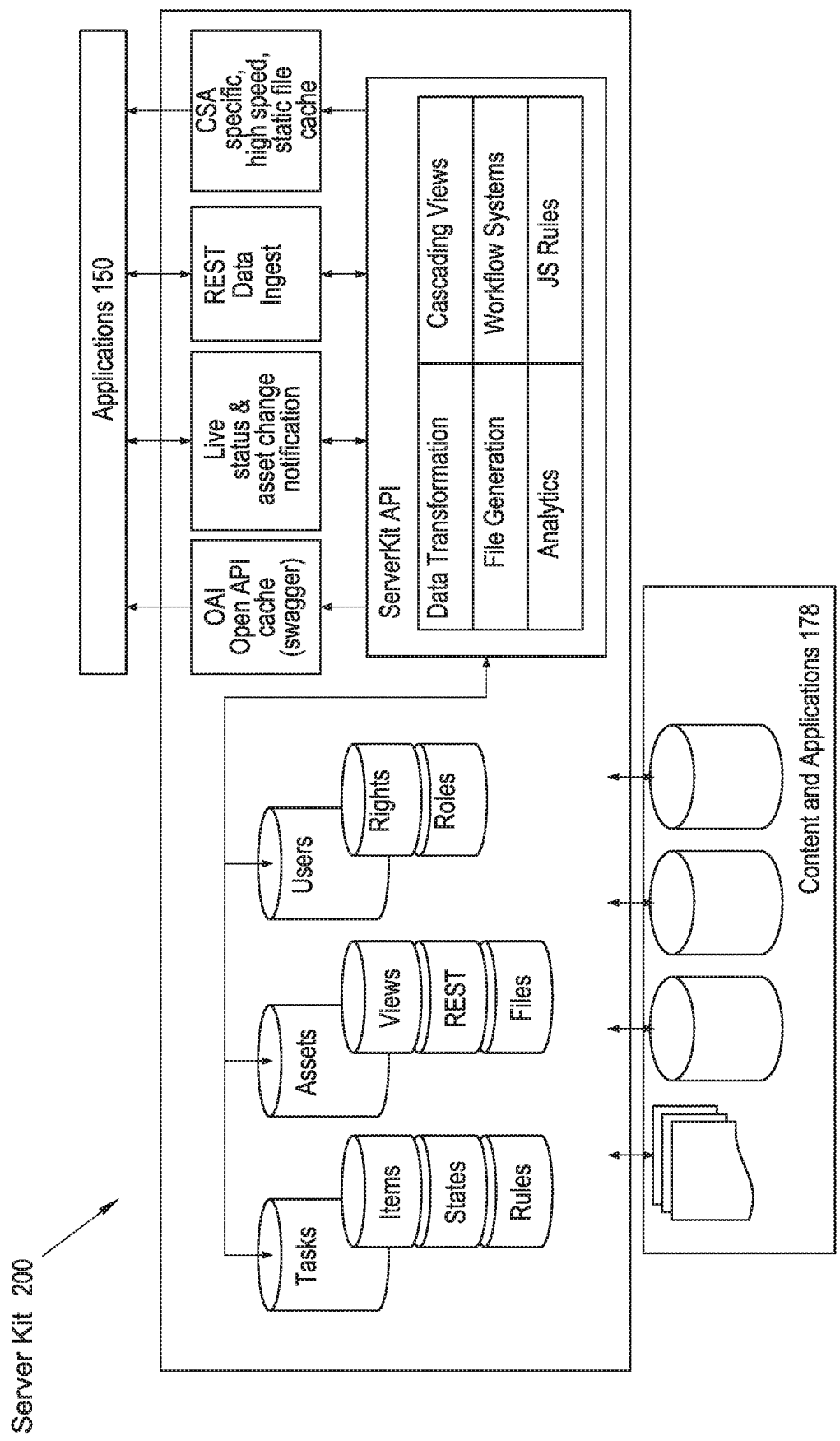
FIG. 15A depicts a schematic diagram of a server kit ecosystem of an application system in accordance with the many embodiments of the present disclosure.

Referring now to FIG. 15A, an ecosystem of a server kit server software appliance 200 (or "server kit" 200) is disclosed. In embodiments, a server kit 200 may be loaded onto a cloud services architecture 142 associated with one or more related client applications (e.g., a single client application or an application suite of a company), whereby the server kit 200 performs one or more middleware services to support the respective client applications, including handling application programming interface (API) marshalling on behalf of the respective applications. Cloud services 142 may refer to a computing environment where a collection of physical services host one or more virtual servers. Cloud services 142 may be provided by a third party (e.g., Amazon AWS™, Google Cloud™, Microsoft Azure™, and the like). In embodiments, the server kit 200 may be a software package that is provided by a cloud services 142 provider or by a third party to the cloud services 142 provider to work in connection with the cloud services 142. In other embodiments, the server kit 200 may be configured and deployed by an application maker to support their suite of applications. In embodiments, the server kit 200 may be installed on a dedicated server system (e.g., a traditional siloed data center or physical server cluster) of an organization. For example, a large software company that maintains its own data center that supports one or more respective applications that the large software company develops and/or distributes (e.g., a social networking application, a music streaming application, and a photo sharing application all provided by the large software company) may develop the server kit 200 and may deploy one or more instances of the server kit 200 to support its respective applications.

In embodiments, the cloud services 142 of the application system 100 may be a series of important server side elements that may include, but are not limited to, file versioning (e.g., by using an API similar to what is used with simplified, basic cloud storage systems, such as the Simple Storage Service (S3™) from Amazon™), analytics capture and display, API request marshalling, content editing and distribution, project distribution, real-time communications hubs, and/or other related server-side elements. As depicted in FIG. 15A, a cloud services architecture 142 may include a server kit 200 (also referred to as a "server kit software appliance"). The server kit 200 may be a software appliance that may be installed on a cloud services architecture 142 to aid in creating a turnkey secure and scalable backend REST and Real Time APIs. The server kit 200 may allow mobile apps or web apps to connect to required enterprise IT infrastructure elements, represented by content and applications 178, in a secure and system-agnostic manner. In embodiments, the server kit 200 may be configured without coding, such as using a web GUI that may edit a configuration file. In some of these embodiments, the server kit 200 may be configured, deployed, and updated by an administrator (e.g., network administrator, developer, IT professional) using a declarative language, such as the declarative language discussed above, as opposed to being programmed using compiled languages such as C++. In this way, one or more administrators may configure the server kit 200 via a simple GUI, a command line interface, a configuration file, and/or a simple text editor. As used herein, the term "administrator" may refer to any user that has permission to configure an instance of a server kit 200 via a user device (e.g., a PC, laptop, mobile device, tablet and the like). For purposes of discussion, a user device that is being used by an administrator for purposes of configuring an instance of a server kit 200 may be referred to as an "administrator device." Furthermore, in these embodiments, the server kit 200 may be updated without interrupting service to client applications because configuration statements provided in a declarative language do not need to be compiled in order to be deployed, synchronized, and/or adjusted. For purposes of discussion, the term "client application" may refer to an application that is provided by an application provider and that is executed by a client user device. Put another way, a client application may refer to the software product that interfaces with a server kit 200 to obtain access rights to the heterogeneous assets. Client applications may include web applications, native applications, and other suitable application architectures. Furthermore, as used herein a client application instance may refer to a singular instance of the client application being executed and/or accessed via a client device. The term client device may refer to a user device (e.g., PC, laptop, mobile device, tablet, gaming device, wearable devices, smart televisions, other smart appliances, and the like) that executes client applications.

In embodiments, an administrator may provision and/or install a server kit 200 from a marketplace/store associated with the selected cloud services architecture 142 and may connect to client applications. Once installed, a server kit 200 may, for example, provide a console (e.g., a web-accessible GUI) that allows an administrator to provide one or more configuration statements that relate to configurations of various connections and settings of the server kit 200.

For applications, individual users, and/or groups of users, a server kit 200 may allow an administrator to set the access rights to heterogeneous assets (e.g., database views, REST calls, micro services, files, folders, and the like) that may "reside" in an application provider's firewalled environment. In this way, the application provider and the users of an application may realize enhanced network security, as these heterogeneous assets are not exposed to every client application instance. In embodiments, assets may be requested using resource calls (e.g., a REST HTTP pull) and/or application instances may listen for changes to assets using real time push notifications via web sockets (e.g., WebSocket).

In embodiments, a server kit 200 may be configured to implement one or more caches, whereby database read views, REST responses, and/or files may be cached in one or more of the caches. In these embodiments, such caching strategies may reduce the load on internal and/or third party systems (e.g., through reduced API calls) and may improve download performance through the Internet's existing proxy architecture (e.g., edge caching strategies to improve download times of static or semi-static data). In embodiments, when an asset that is specific to a client application is added or updated, effected application instances of the client application that are in communication with the server kit 200 that supports the client application may be updated to reflect the new or updated asset by, for example, a live broadcast of the new or updated asset (e.g., via real time push using one or more sockets). Furthermore, in embodiments where the client application is implemented using a declarative language (e.g., the declarative language discussed above), the client application instances may be updated without interrupting service to the user.

In embodiments, a server kit 200 may provide a simple workflow system that may enable an administrator to define one or more task-based workflows or simply "workflows" in this context. An example of a task-based workflow may include chaining incoming requests and/or one or multiple server side processes to one or multiple heterogeneous systems. In embodiments, a workflow system may provide application instances supported by a server kit 210 updated with respect to changes in state using, for example, a live broadcast (e.g., via real time push using one or more sockets). In embodiments, the server kit 200 may establish one or more workflow nodes associated a workflow, whereby the workflow nodes may be implemented using basic configurable logic and/or customized plugins (e.g., JavaScript plugins).

In embodiments, some or all aspects of the configuration of the server kit 200 is data driven. For example, it may only be when an administrator (or application developer) determines a need for more capability that the administrator may provide a plugin (e.g., a JavaScript plugin) and/or may specify a REST hook to override the provided systems for a workflow rule or a data transformation. Such changes may be made by updating the server kit 200 using configuration update statements, which may be declarative statements. For example, a configuration may include multiple aggregate options to acquire user data.

In embodiments, a server kit 200 may include support for clonability. Importantly, the server kit 200 and its related data-structures may be configured to be able to be cloned. The server kit 200 and its related data-structures may be cloned without requiring data duplication on the enterprise side. However, items inside an appliance and nominated edge cache may end up the same when requested.

In embodiments, the server kit 200 may include a data transformation capability. For example, the data transformation capability may include REST data ingestion capability that uses XLST for XML, and JSONT for incoming JSON data, to transform the data for storage and future use or custom transformation specified as JS nodes.

In embodiments, a server kit 200 may include a data export capability. The data export capability may include, for example, structured templating, free-flow text templating (in HTML for example), and visual templating (e.g., for PDF, PNG and JPG), and may be provided to render out assets from data. Fully custom rules may be provided with JS nodes.

In embodiments, a server kit 200 may include support for various database operations, including cascaded operations. Cascaded operations may refer to dependent operations that are combined in a logical order. Cascaded operations may include cascaded views (e.g., cascaded reads), cascaded inserts and updates (e.g., cascaded writes), cascaded deletes, and the likes. In embodiments, executing cascaded operations include cascading dependent database operations. For example, cascaded views may include receiving a database request for data that is not present in a single database table or record, determining the database reads that are to be performed to fulfill the request and an order therefor, executing the database reads in the determined order (including requesting database reads from third party databases via API requests), receiving the responses to the database reads, and generating a singular response to the responses into a child record by compressing the multiple hierarchal database reads into a single packet (e.g., a single data record) of information. In the case of an insert the server kit 200 may first create a parent record to determine the primary key and then may automatically populate the primary key into the secondary key of multiple child records. In another example, a cascading delete may require deleting not just the parent, but the otherwise orphaned child records.

In embodiments, the server kit 200 supports task-based workflows (also referred to as "workflows"). A task-based workflows may define a set of sequenced items (e.g., operations) that are performed in support of the client application. Put another way, the task-based workflows may provide a manner to configure the backend of the client application. A task-based workflow corresponding to a task may include a list of items that the server kit 200 must execute as the server kit 200 proceeds through the execution of the task. Each item may correspond to a state of the task, one or more basic rules that determine whether the workflow may advance to another state, and the actions performed when a rule is triggered. In embodiments, these items may be configurable in a GUI presented by the server kit 200 to an administrator via an administrator device. In this way, workflows may be established without coding by way of declarative configuration statements. In embodiments, the server kit 200 may allow the administrator to provide support for custom rules to trigger different actions (e.g., external REST calls, real time Socket notifications or run supplied JavaScript functions). In embodiments, the server kit 200 may trigger workflows based on triggering events, such as temporal events and/or server events (e.g., a user has entered a search query, a user has requested to upload a picture to a photo album, a user has requested an invoice to be sent, etc.).

In embodiments, a server kit 200 may support plugins that allow for further customization of the server kit. The administrator of the server kit 200 may activate a plugin that may provide a default configuration along with a schema file provided by a developer. The default configuration may then configure the nominated schema on, for example, the SQL system chosen by an administrator, including data that was initially specified.

In embodiments, a server kit 200 may issue and revoke tokens for client application instances and maintain analytics relating to a client application via application usage logs and transaction logs. In these embodiments, the server kit 200 may maintain analytics pertaining to a client application by monitoring various aspects of a client application, such as authentication requests, resource requests, telemetry behavior, and the like. In some scenarios, a workflow associated with a client application may refuse service to a client application instance if the analytics associated with the client application instance trigger a rule that bars the client application instance from making particular resource calls (e.g., the client application instance has exceed a threshold number of permitted API calls to a particular resource in a defined period of time). The analytics that are maintained may be included in the default configuration of the server kit 200 and/or may be customized by an administrator.

In embodiments, a server kit 200 may maintain a list of users of an application instance and may assign rights and/or roles to those users. In an example, the rights that may be assigned to a user can include access to REST calls, DSTORE functions (e.g., database-related operations), and the like. In embodiments, the roles and rights that are assigned to a user may be application-specific. The manner by which roles and rights are assigned may be configured by an administrator. In embodiments, the server kit 200 may also assign tasks to a user given a particular state. For example, a user acting in an HR manager role may be able to approve some tasks that a general user cannot. In another example, a user acting in a "mod" role on an online forum may be able to delete threads or comments, while regular users may not have such abilities.

In embodiments, a server kit 200 may also support the ability to transform data when, for example, responding to a resource call (e.g., an API call, such as a REST API call). In embodiments, the server kit 200 may utilize data transformation to ensure that content may be processed and/or displayed by a client application instance. For example, data transformation in one scenario may include receiving a response from a third party resource that is in an XML format and transforming the response to a JSON format. In embodiments, the server kit 200 performs data transformation using techniques such as JSON Template (JSONT), cascading inserts, pivot table queries, and mail merge. In exemplary and non-limiting embodiments, the server kit 200 may support mail merge using a PHP library to generate HTML code. In embodiments, the server kit 200 may employ format readers to determine a format of the incoming data and then a mapping function that converts the incoming data to the desired output format. For example, one or more format readers may examine incoming data to determine the format of the incoming format. Once the format is determined, the server kit 200 may employ a specific mapping function that transforms the incoming data from the determined format to the desired output format. The mapping functions may be standard mapping functions that are included in the server kit 200 (e.g., JSONT) and standard mapping libraries (e.g., XLST) and/or customized mapping functions that are provided by an administrator via a custom plugin (e.g., a custom JavaScript plugin), such that the outgoing data may be encoded in a customized format or according to a custom schema. In the latter scenario, administrator may write and/or upload the customized mapping functions.

In embodiments, the server kit 200 supports file generation. File generation may refer to the process of generating output files that are intended for consumption by a user. Examples of file generation may include generating a PDF of an invoice for an invoicing application, generating a calendar event for an application that includes a scheduling feature, generating a printable ID tag for a human resources-related application, and the like. In embodiments, an administrator may upload a template for generating a particular file, where the template includes rules for using the template and/or mappings that define where particular types of data are inserted into the template. An administrator may additionally or alternatively select predefined software modules or upload customized software modules that convert files into specific types of files.

For example, an administrator may select or upload a software module that converts documents into PDF files. The administrator may further define the states (e.g., workflow nodes) at which specific file generation tasks are performed. For example, an administrator associated with a human resources client application may define a workflow corresponding to adding a new employee. In the workflow, there may be a workflow node corresponding to "ID Tag Generation", which is triggered after a new employee record is generated. In this workflow node, the administrator may define the template for generating the ID tag and the data that is to be used to generate the ID tag. When the ID Tag Generation workflow node is triggered, the server kit 200 may retrieve the specific data indicated in the workflow node (e.g., the employee name, the employee picture, the employee ID number, and the like) and may generate the ID tag based on the template and the retrieved data. In embodiments, a server kit 200 supports selective data caching. Selective data caching may refer to the practice of selectively caching data that was received in response to a resource call from a first client application instance to serve other client application instances (or the first client application instance) when the same or similar resource call is received. For example, in responding to a resource call for a weather forecast in a particular area (e.g., a zip code), the server kit 200 may determine that this is the weather forecast data is pertinent to any temporally-proximate (e.g., the same hour) resource calls coming from that particular area.

In embodiments, the server kit 200 supports pre-calculated data caching. Pre-calculated data caching may include transforming data to preferred formats, such as xml, json, and the like and selectively caching the transformed data. In embodiments, pre-calculated data caching may include support for user profile configuration, informing a dashboard about schemas and tools to create a schema and modify it on a dashboard. In embodiments, pre-calculated data caching may include a CRUD editor for tables in a data store. In embodiments, a database management subsystem may provide securely managed views into SQL databases, a reduction in the number of round trip calls normally required for bulk inserts, compressed queries, and powerful tools for cascading parameterized insertion, in addition to traditional deletion methods. In embodiments, certain database-related queries may be exposed to feeds. A CRUD editor may be a templated CRUD editor that may use available queries. Queries may be auto-suggested based on tables. Pre-calculated data caching may auto create JavaScript snippets to use in a project for retrieving data, for an application system front-end as well as other systems, such as PHP, website JS, and C# for .NET systems.

In embodiments, a server kit 200 may include a scaling and/or load balancing capability. In these embodiments, the server kit 200 may manage the deployment of individual server instances, as well as the function of each respective server instance. For example, the server kit 200 may determine the roles of each server instance, which may provide redundancy and/or may distribute functionality across multiple servers. The scaling and load balancing capability may allow one or more layers (e.g., function layer, data layer, interface layer, and the like) be managed independently of actual instances of the server kit 200. The scaling and load balancing capability may manage a database layer provided by a third party and maintain a synchronized overall list of files on a third-party system, such as an Amazon S3™ bucket, filename, or uploader.

In embodiments, the server kit 200 may manage various versions of configurations, as well as test and production configurations. In exemplary and non-limiting embodiments, server kit 200 test and production configurations may change views from test to production database systems.

In embodiments, a server kit 200 may provide a high performance, secure backend API for web and native applications. A server kit 200 may provide this by marshalling resource calls (e.g., API calls), implementing caching strategies where applicable, and broadcasting and responding to real time events from many different underlying enterprise systems and resources that may not need to be aware of each other. In embodiments, a server kit 200 may provide a securely managed middleware layer that sits on top of an enterprise ecosystem in a flexible and loosely coupled manner. In some of these embodiments, the server kit 200 may expose only the resources/assets that are needed by a client application and only to authorized client applications and/or authorized users of those applications.

Figure 15B:
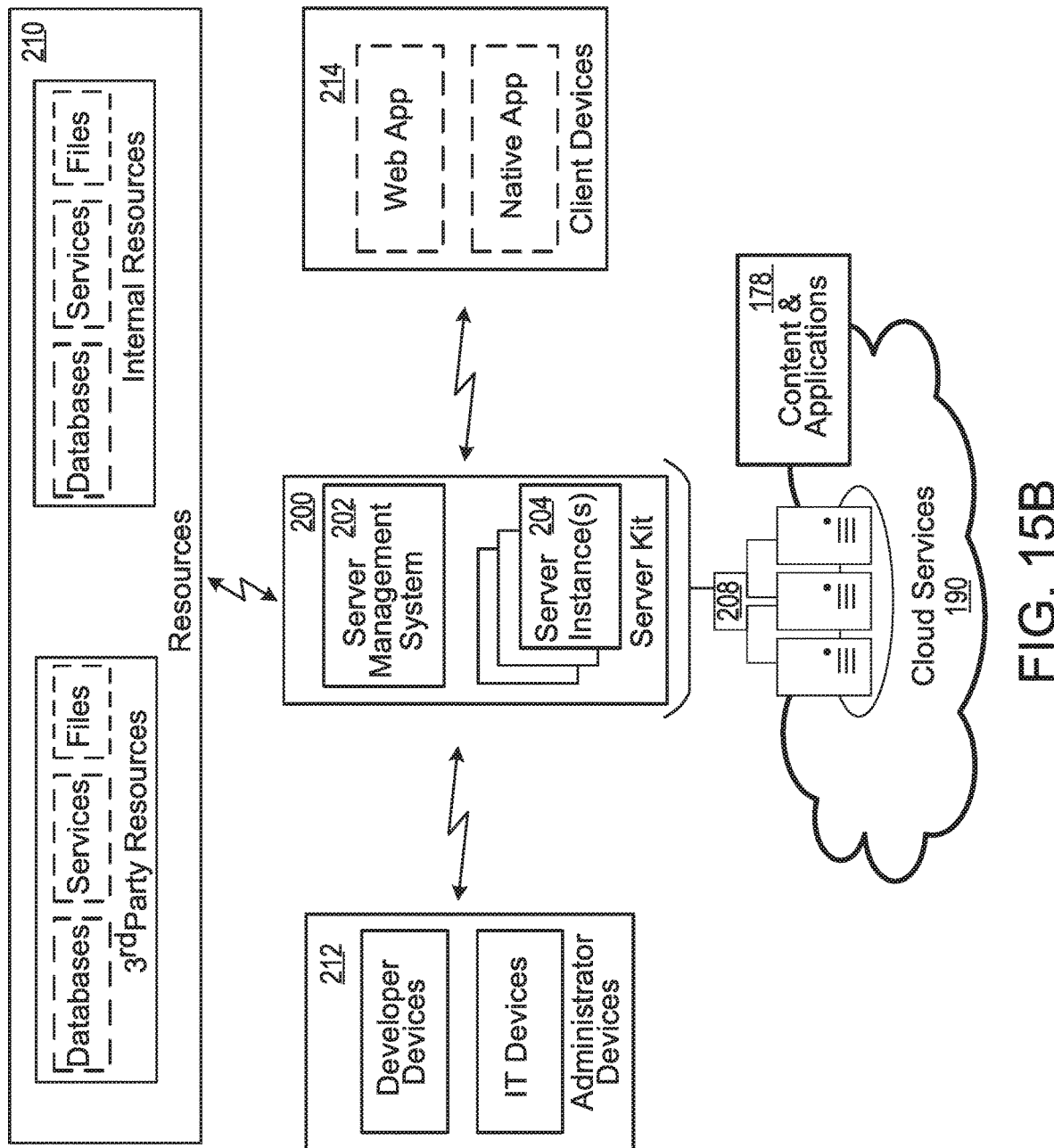
FIG. 15B depicts a schematic diagram of an environment of a server kit software appliance of an application system in accordance with the many embodiments of the present disclosure.

FIG. 15B illustrates an example environment of an instance of a server kit 200 and high level components thereof, according to some embodiments of the present disclosure. As discussed, a server kit 200 may integrate a combination of core capabilities, as well as some underlying features within its modules so as to make the overall capabilities of the server kit 200 possible. In embodiments, the server kit 200 may be hosted on one or more physical servers 208 of a cloud services system 142. As discussed, other hosting arrangements are within the scope of the disclosure as well. In embodiments, the server kit 200 may include a server management system 202 that provides an interface for communicating with an administrator via an administrator device 202. The server management system 202 allows an administrator to configure, deploy, and update one or more server instances 204.

In embodiments, the server instances 204 are virtual machines that execute on top of the cloud services system 142. In some of these embodiments, physical server devices 208 are made available via a cloud services provider 142, whereby the server instances 204 are executed by the physical server devices 208. In embodiments, the server instances 204 may be replicated server instances (e.g., having the same configurations and providing the same functionality). In embodiments, one or more of the server instances 204 may be distributed, such that different server instances 204 may perform different functionalities, including managing other server instances 204 (e.g., performing load balancing, data routing, implementing caching strategies, and the like). In embodiments, the server kit 200 communicates with one or more administrator devices 212, whereby an administrator may configure and deploy the server kit 200 via an administrator device 212. The server kit 200 also communicates with a plurality of client devices 214.

Once configured and deployed, the server instances 204 interface with one or more client devices 214 and one or more resources 210. Resources 210 may refer to assets (e.g., databases, services, files, and the like) that may be leveraged by a client application via one or more server instances 204 to perform one or more of the client application's functions. Resources 210 can include internal resources 216 and/or third party resources 218. Internal resources 216 may be resources that are proprietary and under control of the application provider to which the server kit 200 corresponds. Put another way, internal resources 216 may include the application provider's databases, files, and services (e.g., proprietary search services, video streaming, photo editing, and the like). The internal resources 216 may reside in the same cloud services system 142 as the server kit 200 and/or may be hosted on another cloud services system 142. Third party resources 218 may refer to assets (e.g., databases, services, files, and the like) that are controlled by an entity other than the provider of the client application. Put another way, third party resources can include services, databases, and files that are maintained and/or provided by organizations not closely associated with the application provider. For example, a retail-based client application may leverage a third party service for facilitating credit card transactions and may leverage a database of another third party to retrieve product descriptions of particular products. In embodiments, the resources 210 (e.g., internal resources 216 and/or external resources 218) may be leveraged by a client application via a resource call. A resource call may refer to a mechanism by which a software component requests one or more assets from another component. Examples of resource calls may include API calls (e.g., RESTful API calls, SOAP API calls), HTTP requests, Socket requests, FTP requests, and the like. Typically, a resource provider defines one or more APIs that a client application can leverage one or more assets of the resource provider. Each resource provider may have different protocols that expose their respective resources 210. Traditionally, a client application instance issues an API call directly to a resource, which exposes both the resource provider and the client application (and by proxy the client device 214). The server kit 200, however, deploys one or more server instances 204 that marshal resource calls made by a client application instance. Marshalling may refer to the process by which one or more server instances 204 handle a resource call. In embodiments, the process by which a particular type of resource call is handled is governed by the type of resource call and the type of request being made. In some scenarios, a client application instance transmits a resource call to a server instance 204 to request a particular resource. In embodiments, the resource call issued by the client application instance is defined according to an API of the server instance and includes a nested resource call to the particular resource 210, where the nested resource call is defined according to the API corresponding to the implicated resource 210. Depending on the configuration of the server kit 200 and the configuration of the client application, a resource may be a static unchanging entry (e.g., data that is capable of being cached in a public edge cache or private cache), sensitive data that is stored on a secure location (e.g., data stored in an S3 bucket), or generated on-demand using a service (e.g., data generated using machine-learning and user specific features). As the resources may differ, a server instance 204 is configured to marshal different resource calls in different manners. For example, when the resource call is received by a server instance 204, the server instance 204 may begin determine the manner by which the resource call will be handled. For example, the server instance 204 may determine the type of resource call based on the resource 210 specified in the resource call (e.g., is this an API call to a particular third party, an API call to a specific internal resource, a database operation to an internal or third party database, and the like) and/or the type of service being requested (e.g., requesting a search result, requesting a video stream, requesting a specific instance of data, requesting to store data, and the like). Depending on the classification of the resource call, the server instance 204 may elect different manners by which the resource call is handled. For example, in marshalling an API call to a third party service for a particular type of data, the server instance 204 may determine whether the client application instance that issued the API call (e.g., the user associated with that instance) has adequate permissions to access the requested resource and/or whether the nested API call appears to be legitimate (e.g., not having the characteristics of a security threat). If the user has adequate permissions and the API call appears to be legitimate, the server instance 204 generates a pass through resource call, whereby the server instance 204 utilizes the resource call provided by the client application instance but uses a security mechanism (e.g., a token) corresponding to the server kit 200 instead of a security mechanism of the client application instance. In this example, the pass through resource call may be an API call to the resource 210 indicated in the nested API call, but includes a security token (or other security mechanism) that authenticates the server instance 204 (or the server kit 200 in general) with the resource 210. In this way, a server instance 204 does not need to have a priori knowledge of all third party APIs to effectuate communication. Rather, the server instance 204 relies on the resource call issued by the client application instance to issue the pass through API call in accordance with the resource provider's defined protocols. Furthermore, by acting as an interface between the resource 210 and the client device 214, the resource provider can mitigate security concerns associated with exposed APIs. In embodiments, the marshalling of a resource call may include additional or alternative steps. For example, a server instance 204 may determine whether the data requested by the nested resource call is cached in a cache of the server instance 204 or another server instance 204 of the server kit 200, and if so, responding to the resource call with the cached data.

Figure 15C:
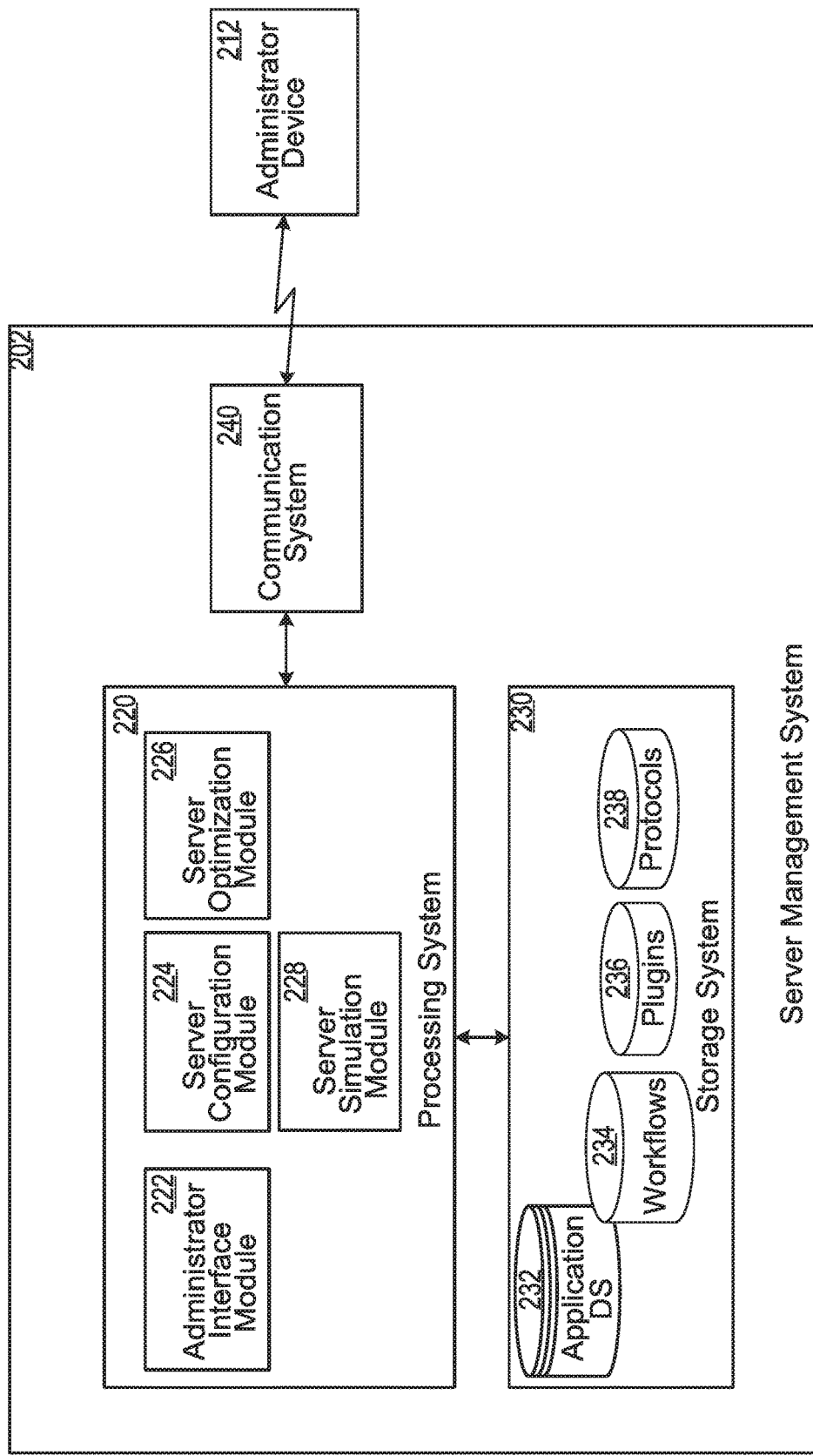
FIG. 15C depicts a schematic diagram of a server management system in accordance with the many embodiments of the present disclosure.

FIG. 15C illustrates an example embodiment of a server management system 202 of a server kit 200. The server management system 202 allows an administrator to configure various aspects of the server instances 204 associated with a server kit 200. As can be appreciated, the server management system 202 allows an administrator to configure and customize an instance of the server kit 200, such that the server kit 200 can serve one or more client applications with which the administrator is associated. In embodiments, the server management system 202 may be installed on and executed by set of one or more physical server devices, which may include a processing system 220, a storage system 230, and a communication system 240. As discussed, the physical server devices may be provided by the provider of the server kit, a user of the server kit, or by a $3^{rd}$ party cloud services provider.

In embodiments, the storage system 230 may include one or more storage devices (e.g., hard disk drives, flash disk drives, solid state disk drives, and the like) that collectively store one or more data stores that are used in connection with the configuration of a server kit 200. The data stores may include any combination of databases, indexes, tables, file structures, files, and/or the like. In embodiments, the storage system 230 includes an application data store 232, which stores workflow data 234, plugin data 236, and/or protocol data 238 associated with one or more client applications that the server kit 200 serves.

The workflow data 234 may define one or more task-based workflows (or "workflows") that are performed by the server kit 200 in support of the client application. Workflows may define a sequential flow relating to one or more tasks that are associated with a backend of a client application. For instance, a workflow may define a manner by which a server instance adds a new user, including obtaining and verifying user info (e.g., email address, password), assigning authentication data to the user, assigning a role to the user, and/or assigning a set of rights (or permissions) to the user. In another example, in relation to a client application that provides search capabilities via an API of a third party search provider, another workflow may define a manner by which a server instance 204 may handle an API call to receive search results, including marshalling an API call, receiving the search results from the third party search provider, potentially transforming the search results into a format that is compatible with the client application, and transmitting the reformatted search results to the client application. In embodiments, workflows may include one or more respective workflow nodes, which correspond to different states. Workflow nodes may define APIs, plugins, and/or databases that are to be leveraged to perform a task associated with the workflow node. Each state may be triggered by one or more rules, whereby the rules of a workflow define events for triggering a particular state. For example, upon determining that user information for a new user has been obtained and verified, a rule corresponding to such an event may trigger a next workflow state that defines a manner by which a server instance 204 may assign a role to the user. As discussed, workflows may be defined by an administrator during configuration or updating, and/or may be provided as default settings of the server kit 200.

In embodiments, the plugin data 236 may define one or more plugins that are used by the server kit 200 to support a client application. In embodiments, plugins may be JavaScript plugins or other suitable types of plugins. The plugins allow the application developer to customize the functionality of the server kit 200 such that the application developer may define processes that are not supported by an "off the shelf" server kit 200. For example, a plugin may define a manner by which a non-supported file type is handled by a server instance. Plugins may be used to customize various aspects of the server kit 200 including, but not limited to: custom workflow conditions, custom workflow actions, custom file generation, custom file ingestion, custom API ingestion, and the like.

In embodiments, protocol data 238 may define various protocols for communicating with instances of the client application, the client application's backend resources, and/or external resources. In some embodiments, protocol data 238 may include the various resource calls (e.g., APIs) that the server kit 200 uses to communicate with client application instances, the client application's backed resources, and/or external resources. This information may include the structure of each respective resource call, the data types received by each respective resource call, and the like.

In embodiments, the communication system 240 includes one or more communication devices that provide communication interfaces with which an administrator device 212 communicates with the server management system 202. In embodiments, the communication system 240 includes communication devices that provide wired or wireless communication with a communication network. For example, the communication devices may include network interface cards that support wired (e.g., Ethernet cards) and/or wireless (e.g., WIFI) communication with the network.

In embodiments, the processing system 220 may include one or more processors that execute software modules that configure, optimize, deploy, and/or update the server instances 204 of the server kit 200. In embodiments, the processing system 220 may include one or more processors that execute in an individual or distributed manner. The processors may reside in the same physical server device or may be in different physical server devices. In embodiments, the processing system 220 may execute an administrator interface module 222, a server configuration module 224, a server optimization module 226, and a server simulation module 228.

In embodiments, the administrator interface module 222 is configured to receive configuration statements from an administrator via an administrator device 202. Configuration statements are structured statements that are used by the server management system 202 to configure the server instances 202. In some embodiments, the configuration statements are declarative statements that conform to a declarative language, such as the declarative language described in this disclosure or other suitable declarative languages. In some of these embodiments, the administrator interface module 222 provides a GUI to an administrator device 202 that allows an administrator to provide configuration statements, to select various configuration options, provide values corresponding to the selected configuration options, and/or upload files (e.g., configuration files, protocols, plugins, workflows, and the like). In embodiments, the GUI may allow an administrator to select an option to generate a new workflow or update an existing workflow. In response to the selection, the GUI may then present an option to the administrator to add workflow nodes, to define relationships with other nodes (e.g., sequential relationships), to define states associated with each workflow node, to define rules that are triggered by workflow nodes, to define actions that a server instance 204 may perform when the workflow node is triggered, and the like. In these embodiments, the administrator may continue to add, define, and connect workflow nodes until a workflow is created/updated. In response to the user creating a workflow or adding nodes to a preexisting workflow, the administrator interface module 222 may generate a set of configuration statements that define the workflow based on the user input. The administrator interface module 222 may utilize a workflow template that receives various parameters that are provided by the administrator.

In embodiments, the GUI may allow an administrator to select an option relating to the various APIs that the server kit 200 is to support. The GUI may provide the administrator an ability to select and/or input one or more internal or external APIs that a client application uses. In embodiments, the external APIs may include the protocols by which the server kit 200 may communicate with an external resource. In embodiments, the internal APIs may include the protocols by which the server kit 200 may communicate with the client application and/or the backend resources of the client application (e.g., internal databases, services, file systems, and the like). For each API that an administrator adds, the GUI may allow the administrator to provide authentication data to have access to specific APIs (e.g., a key used by the API provider to authenticate the client application), caching data (e.g., whether a response may be cached, and if so, one or more properties of client application instances that may receive the cached data), expiration data relating to the data provided via a particular API (e.g., data may be cached for up to one hour or one day), data transformation data relating to specific APIs (e.g., mapping functions for formatting returned data), and the like. The GUI may allow the user to provide additional configuration data as well, including configurations relating to cascading operations, file generation, server deployment strategies, caching strategies, and the like. In embodiments, the GUI may allow the user to configure a user data store associated with the client application, including defining the types of rights users may be granted, the different roles that users may be assigned, and the type of user metadata, including analytical data that may be collected with respect to a user.

In response to receiving input from an administrator via the GUI, the administrator interface module 222 may generate one or more configuration statements based on the administrator input and may output the configuration statements to the server configuration module 224. The administrator interface module 222 may receive configuration statements from an administrator device 212 in other suitable manners as well. In embodiments, the administrator interface module 222 may receive configuration statements via a command prompt or similar interface displayed by an administrator device 212 in response to the administrator using a command line. In response to determining the configuration statements (provided via a GUI or a command prompt), the administrator interface module 222 may generate a configuration file that indicates a configuration of the server kit 200 or an update to the configuration of the server kit 200, whereby the configuration statements are arranged in the configuration file. Additionally or alternatively, the administrator interface module 222 may allow a user to upload an entire configuration file that includes a series of configuration statements.

The server configuration module 224 receives configuration statements and configures one or more server instances 204 based on the received configuration statements. In embodiments, the server configuration module 224 deploys the server instances 204 using the server simulation module 228. In some embodiments, an administrator may initially provision and/or install a server kit 200 from a marketplace/store associated with the selected cloud services architecture 142 and may associate a client application (or multiple client applications) to the server kit 200. The administrator may define a server cluster (e.g., one or more servers) on which the server instances 204 are to be deployed. The server configuration module 224 may allocate the physical server devices on which the one or more server instances 204 will reside. The server configuration module 224 may also load the source code/machine-readable code that defines the behavior of the server instances. The source code/machine-readable code may be precompiled and is not altered by the configuration statements. In embodiments, the source code/machine-readable code may act as an interface between a simulation of a server instance and an operating system and kernel of the physical server devices on which the server instance is hosted. In embodiments, a simulation is an instantiation of one or more modules (e.g., classes) defined in the source code/machine code, whereby an object of a module is configured in accordance with one or more configuration parameters defined in the configuration statements. Initially, the server instances 204 are configured according to a default configuration and have no customization.

Upon installing and provisioning the server kit 200, the administrator interface module 222 may present a GUI or command line to an administrator via an administrator device 212, and the administrator interface module 222 may receive the configuration statements from the administrator device 212. In embodiments, the server configuration module 224 includes a declaration processor that receives the configuration statements and determines the configurations of the server instances based thereon. In embodiments, the server configuration module 224 may generate a configuration file based on the configuration statements. In some scenarios, the administrator may provide the configuration file by way of upload from the administrator device 212. In embodiments, the declaration processor may parse a configuration statement and/or multiple configuration statements to determine a module (e.g., class) implicated by the one or more configuration statements and one or more configuration parameters that pertain to the implicated module. In embodiments, the configuration management system 224 may generate a server scene tree. In some embodiments, the server scene tree is a declared scene tree that is a hierarchical data structure that maps objects (e.g., instantiations of modules) and their respective relationships to one another, and that defines their properties and behaviors as defined by the parsed configuration parameters. In embodiments, the server scene tree is initially initialized to the default configurations of a server instance. In some of these embodiments, the configuration management system 224 may determine a difference (or "delta") between the parsed configuration parameters and the default configuration parameters, and may update the server scene tree to respect the delta. As will be discussed below, the server simulation module 228 simulates one or more server instances that are configured in accordance with the server scene tree, whereby the underlying modules may interface with the simulations in accordance with the configuration parameters defined in the server scene tree. In this way, the server configuration module 224 may effect changes to the workflows, caching strategies, database hooks, API (e.g., REST hooks), file generation modules, plugins, new versions of APIs, and the like, without needing to reboot the server instance. Upon determining a server scene tree, the server configuration module 224 may pass the server scene tree to the server simulation module 228.

During the operation of one or more server instances that are configured in accordance with a server scene tree, the administrator may provide configuration update statements that update one or more configuration parameters of the one or more server instances. In embodiments, the server configuration module 224 receives configuration update statements from an administrator via the administrator interface module 222. In some of these embodiments, the declaration processor may parse the configuration update statements to identify implicated modules and updated configuration parameters corresponding to the implicated modules. In embodiments, the server configuration module 224 may determine a delta between the configuration parameters of the implicated modules as indicated in the server scene tree and the updated configuration parameters as parsed from the updated configuration parameters. The configuration module 224 may apply the delta to the server scene tree. In embodiments, the updates to the configuration parameters, as indicated by the updated scene tree, may be propagated to the simulation of the one or more server instances in real time. In embodiments, the updated scene tree may be propagated to the simulation of the one or more server instances upon receiving a command from the administrator to commit the updated. Once updated and/or committed by an administrator, the server configuration module 224 may pass the updated server scene tree to the server simulation module 228. Furthermore, in embodiments, the server configuration module 224 may maintain previous configurations of the server scene tree, such that older versions of the client application may still be able to be served by server instance that are configured in accordance with a previous various of the server scene tree.

In embodiments, multiple server instances 204 in a cluster may synchronize in real time with the server which is being administered via the GUI interface as each change (or set of changes) is made and published. In embodiments, the declarative nature of the declarative language allows the server configuration module 224 to fully specify hierarchical properties that describe the behavior of the modules of the server kit 200 that are to be configured. Furthermore, the server configuration module 224 can configure workflow triggers, so as to define the behavior of the workflows as linear lists of actions. The server configuration module 224 can synchronize each change to the configuration of as server instance as an update to the server scene tree, such that the changes are implemented in a transactional manner.

In some embodiments, the server configuration module 224 can synchronize assets such as images, media contents, and/or custom JS files as whole files. The server configuration module 224 may receive asset containing files via the GUI interface from an administrator, including one or more configuration statements that define properties of the asset. In some embodiments, server configuration module 224 may write these files the application datastore or to other suitable datastore that serves an application. In embodiments, the server configuration module 224 may associate a received asset and/or file with an object in the server scene tree.

In embodiments, the server configuration module 224 may establish one or more task-based workflows of the server kit 200. As was discussed, an administrator may select predefined workflows and/or may provide custom workflows via the administrator interface module 222. For each workflow provided by the administrator, the server configuration module 224 may define one or more triggering events that trigger each workflow. Examples of triggering events that may trigger a workflow may include temporal events (e.g., a new day) and server events (e.g., a resource call has been received by a server instance 204). Furthermore, in embodiments, the server configuration module 224 may generate the workflow nodes of the workflow, including defining one or more rules that trigger the workflow node and the actions defined in the workflow node. In some embodiments, the server configuration module 224 may define the one or more rules that trigger a workflow using a variation. For example, the server configuration module 224 may define one or more properties of a state that correspond to a rule being triggered. The server configuration module 224 may include one or more actions in a workflow node, such as resource calls (e.g., API calls), JavaScript plugins, database operations, data transformation instructions, file generation instructions, and/or other suitable actions in a respective node. In embodiments, resource calls, JavaScript plugins, specific database operations, data transformation instructions, and file generation instructions may be selected/provided by an administrator via the administrator interface module 222. Once a workflow is generated, the server configuration module 224 may store the workflow in the workflow data 234 of the application data store 232.

Upon determining the configuration of the server kit 200, the server configuration module 224 may be deployed by an administrator by assigning additional servers to a cluster such that they generically share the same configuration. It is also possible for the administrator to allocate servers in a cluster for specific tasks. In an example embodiment, the server configuration module 224 may use GPU based servers to perform the task of training machine learning models and different servers to hold the computed model in memory for high speed prediction.

In embodiments, the server optimization module 226 determines optimizations to improve one or more aspects of the server kit 200 and/or its performance. Because the server kit 200 acts as a middleware appliance, the server optimization module 226 can determine both the internal cost of API calls and the external frequency of these calls. As a result a server optimization module 226 is able to self-tune aspects of the server kit 200, such as caching strategies in detail. For example, the server optimization module 226 may determine caching strategies such as the time to live (e.g., how long to cache data items), whether to cache data in memory or on disk caching, mangling and edge caching strategies for non-secure data, and the like. The ability to perform smart content and security dependent caching may reduce power consumption and/or reduce compute usage on the server instance.

In embodiments, the server simulation module 228 the behavior of the server kit 200 is either precompiled or supplied in JS plugins. For example, it is possible for a declaration of an API to be updated (e.g., written over) and the server instances 204 to run the new API version without stopping at any point. In this way, older versions of the API are at no time interrupted—right up until the administrator chooses to depreciate them and shut them down. This ability to support older and current API's—and receive new API's without downtime allows critical applications (e.g., enterprise software) to continue operation without interruption.

In embodiments, the server simulation module 228 instantiates server instances 204 and updates the server scene tree of a server instance in response to receiving a server scene tree from the server configuration module 222. In some embodiments, the server simulation module 228 may be called by the server configuration module 222 to instantiate a new server instance 204. In response, the server simulation module 228 may instantiate a new server instance 204 on one or more physical server devices that were provisioned by the server configuration module 222. Initially the new server instance 204 is configured with a server scene tree having default configuration parameters. The server configuration module 222 may provide updates to the server scene tree to the server simulation module 228 (e.g., updated server scene trees), which in turn applies the updates to the server scene tree to the server instance 204. The operation of a server instance 204 is described in greater detail with respect to FIGS. 2D and 2E.

Figure 15D:
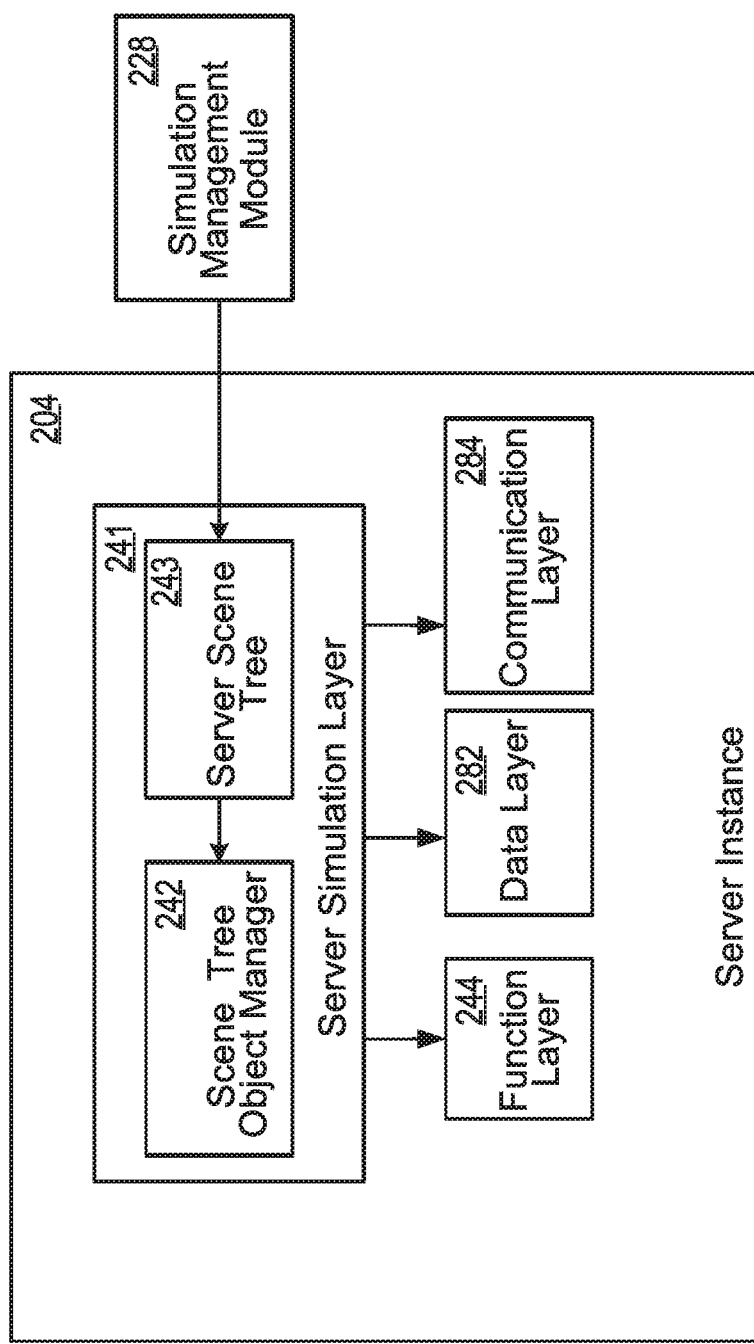
FIG. 15D depicts a schematic diagram of an example configuration of a server instance of a server kit according to many embodiments of the present disclosure.
Figure 15E:
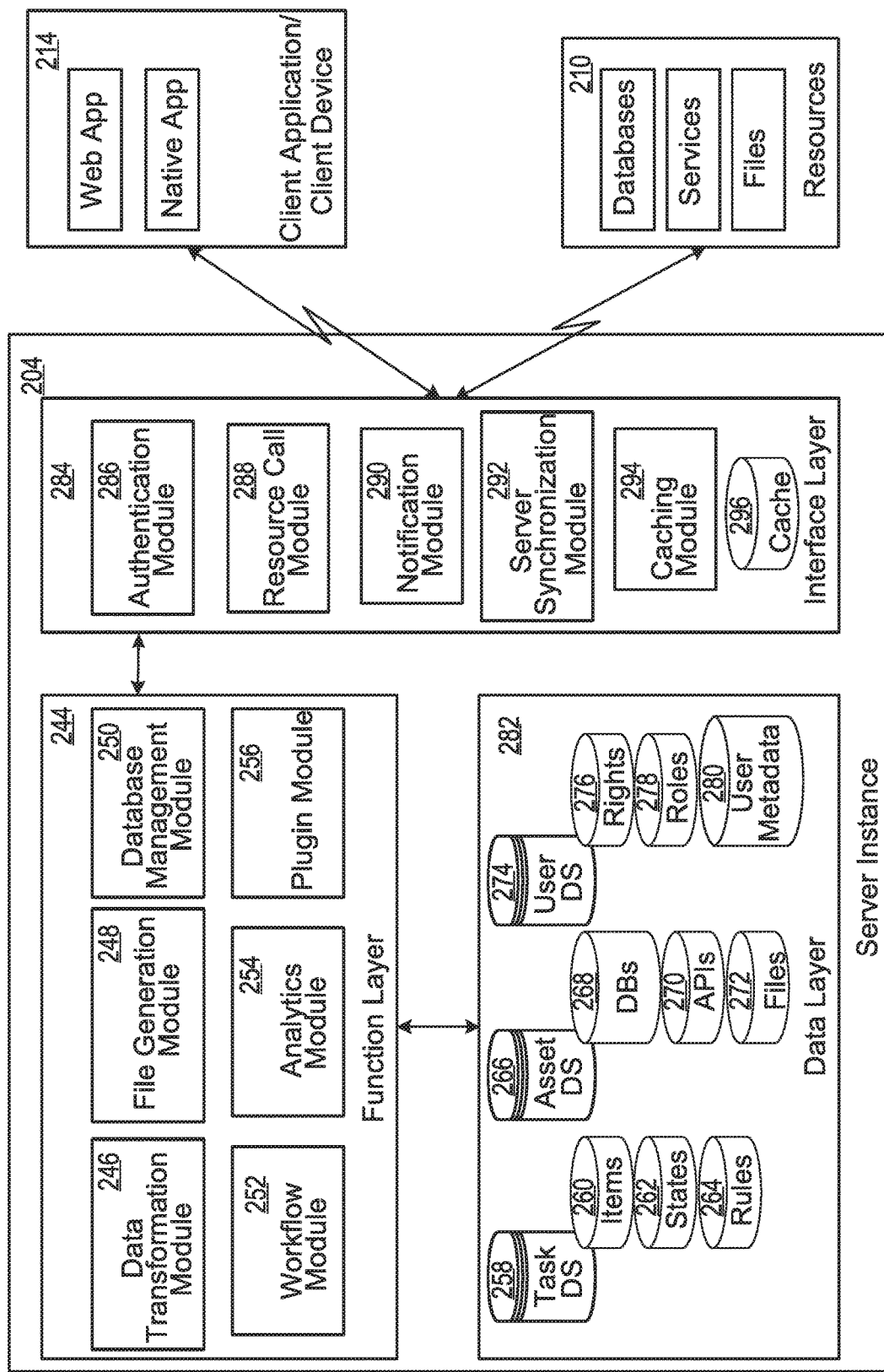
FIG. 15E depicts a schematic diagram of an example configuration of a data layer, interface layer, and function layer of a server instance of a server kit according to many embodiments of the present disclosure.

FIG. 15D illustrates an example configuration of a server instance 204 according to some implementations of the present disclosure. A server instance 204 may be executed by one or more physical server devices. In FIG. 15D, a server instance 204 may include a server simulation layer 241, a function layer 244, a data layer 282, and an interface layer 284. The server simulation layer 241 may include a scene tree object manager 242 and a scene tree 243. FIG. 15E illustrates an example configuration of a function layer 244, a data layer 282, and an interface layer 284 of a server instance 204 of a server kit 200, according to some embodiments of the present disclosure.

In embodiments, the server simulation layer 241 interfaces with the function layer 242, the data layer 282, and the interface layer 284 of the server instance 204 in accordance with the configuration parameters defined in the objects of the scene tree 243. In doing so, the server simulation layer 241 manages the runtime environment of the server instance 204 when the server instance is deployed. In embodiments, the data layer 282 maintains and manages access to data relating to the client applications, including data relating to tasks that are performed by the client application, assets that are leveraged by the client application, and/or users of the client application. In embodiments, the interface layer 284 manages communication with client application instances via client user devices 214 and resources 210 that are used by the client application. In embodiments, the function layer 244 manages the functional aspects of a server instance 204 in support of the client application. While FIGS. 2D and 2E depict a single server instance, it is appreciated that in some embodiments, the techniques disclosed herein may be applied to configure and operate two or more server instances 204. Furthermore, as the server kit 200 provides flexibility to the administrator and the client application developer, different instances of the server kit 200 may include additional functionality through customization.

Referring to FIG. 15D, the scene tree object manager 242 instantiates and manages instances of the various modules (e.g., objects) of the server instance 204 in accordance with the server scene tree 243 of the server instance 204. In embodiments, the various modules are embodied as classes in source code/machine-readable instructions that are precompiled and executed by the physical server devices. Each module may be configured to communicate with the operating system running on the physical server devices to which the server instance 204 is provisioned. At run time, the scene tree object manager 242 may instantiate objects of a class using the configuration parameters defined in the server scene tree. In doing so, the scene tree object manager 242 configures the objects to operate according to the properties and/or behaviors defined in the scene tree objects defined in the server scene tree. In this way, the instantiated objects may operate in accordance with configuration provided by an administrator without having to affect the manner by which the objects interface with the operating system. Furthermore, when the administrator updates the server configuration, the server simulation module 228 may propagate the updates to the server scene tree 243. In response to an update to the scene tree, the scene tree object manager 242 may instate new objects corresponding to the classes implicated by the updated parameters with the updated parameters. In some of these embodiments, the scene tree manager 242 may also deconstruct objects that are were implicated by the updated parameters. For example, if a particular object that handled API calls was implicated by an updated configuration parameter, the scene tree manager 242 may instantiate a new object that handles the API calls in accordance with the updated configuration parameters and may deconstruct the particular object that handled the API calls. In this example, the server instance 204 is reconfigured at runtime, and without the need to recompile the sever instance 204.

The components of FIG. 15E are now described in greater detail. As mentioned, the modules described in FIG. 15E may be implemented as classes defined in source code/machine-readable instructions that are precompiled and executed by the physical server devices. In embodiments, each module (e.g., class) may be configured to perform one or more functions using one or more defined datatypes so as to interface with the operating system running on the physical server devices to which the server instance 204 is provisioned. In embodiments, the scene tree object manager 242 may instantiate an instance (e.g., an object) of a module (e.g., class) based on the configuration parameters defined in the configuration statements provided by an administrator to customize the manner by which individual server instances operate. In some of these embodiments, the scene tree object manager 242 may instantiate objects of classes implicated by the respective objects defined in the server scene using the configuration parameters defined in the respective objects. Furthermore, in some scenarios the server scene tree may include multiple objects of the same class that define different configuration parameters. For example, in support of a client application that communicates with multiple APIs, the server scene tree may define multiple corresponding resource call objects, where each resource call object in the server scene tree corresponds to a respective API and defines one or more configuration parameters that enable communication with the respective API. In such scenarios, the scene tree object manager 243 instantiates multiple resource call objects, where each instantiated resource call object corresponds to a respective API and is instantiated from a resource call class based on the respective configuration parameters defined in the scene tree object corresponding to the respective API. In this way, each resource call object may be instantiated from the same class, but may provide a mechanism to communicate with a different API. While the underlying functionality of the class may remain unchanged (e.g., the manner by which a resource object responds to a resource call), the varied configuration parameters may provide varied behaviors and properties of the individual objects (e.g., each resource call object is configured to communicate with a respective API in accordance with the protocol of the respective API). The descriptions of FIG. 15E define example non-limiting implementations of the modules (e.g., classes) according to some embodiments of the present disclosure, while some of the examples provided in the description may give example configurations of various behaviors and properties of instances of the modules. Furthermore, in some example implementations, a client application may not implicate certain functions of the server kit 200 (e.g., data transformation). In these scenarios, an administrator may elect not to configure the non-implicated modules (e.g., the administrator elects not to configure a data transformation module administrator) and the default configuration (e.g., default server scene tree) of the server kit 200 does not include an instance of the non-implicated modules (e.g., the default scene tree does not include any data transformation objects). In the scenarios above, a server instance 204 configured according to the example implementations would not include any instances of the non-implicated modules.

In embodiments, the data layer 282 includes a task data store 258, an asset data store 266, and a user data store 274. In embodiments, the task data store 258 stores data relating to task-based workflows that are performed by the server kit 200, whereby the workflows may be expressed as items 260, states 262, and rules 264. In embodiments, a task-based workflow may define a business logic process. An item 260 may define an instance of a workflow. The states 262 of a task define the different stages within the process that an item can propagate through, including any operations that are performed when a state 262 is triggered. The rules 264 define the manner by which an item may be propagated to the respective stages. Put another way, the rules 264 define the manner by which a state 262 is triggered. As noted, the types of tasks of the client application depend on the client application itself, and as such, may be defined by an administrator at configuration time. In embodiments, an administrator may configure one or more properties relating to the items 260, states 262, and/or rules 264 associated with the tasks of a client application. For example, an administrator may configure schemas for items, the list of states, the rules against each of the states, and the like. During configuration, these properties may be parsed from configuration statements provided by an administrator, defined in the server scene tree as configuration parameters, and applied by instantiating an instance of the task data store 258 using the configuration parameters defined in the server scene tree.

In embodiments, the asset data store 266 stores data relating to available databases 268, available APIs 270, and available files 272. The data relating to available databases 268 may define the databases that may be queried, updated, and/or written to by the server instance 204 on behalf of a client, the schemas of those databases, and the manner by which those databases may be leveraged. In embodiments, an administrator may configure one or more properties of the available databases, including updating a schema of a database 268, operations that are available to clients with respect to the available databases, and the like. The data relating to available APIs 270 may define the APIs that are available to the server instance 204 in support of the client application, and the manner by which those APIs may be leveraged by the server instance 204. In embodiments, an administrator may configure one or more properties of the available APIs, including updating APIs used by the client application. The data relating to available files 272 may define file templates and/or resources that are available to the server instance 204 for generating files on behalf of a client application, and the manner by which those file templates may be leveraged by the server instance 204. In embodiments, the administrator may configure one or more properties of the available files, including updating or changing templates that are used in file generation, strategies relating to file generation, the resources (databases) that are used to populate the templates, and the like.

In embodiments, the user data store 274 stores data relating to users of the client application, including rights 276 of a user, roles 278 of a user, and user metadata 280 relating to the user (e.g., user ID, user profile, and the like). For each user of the client application, the rights 276 of the user may define the permissions the user has with respect to the client application, and the resources that the client application instance of the user may access. The roles 278 of a user may define the various roles of the user with respect to the client application. Examples of roles may include: administrator, user, and authorizer. The user metadata of a user may define any data that is pertinent to a particular user, such as a user ID, authentication data of the user, a location of the user, current tasks and the like. Furthermore, the user metadata may include analytics relating to the user's use of certain resources. For example, the user metadata of a user may indicate an amount of times the user has requested various resources (e.g., how many API calls have been issued by a client associated with the user), how often the user logs in, and the like. The types of rights 276, roles 278, and user metadata 280 of the various users of the client application may depend of the client application itself, and as such may be defined in the server scene tree. In embodiments, an administrator may configure one or more properties relating to the rights 276, roles 278, and/or metadata 280 of the users of a client application. For example, an administrator may configure the different types of roles on the client applications, various permissions assigned to the different types of roles, the types of metadata kept with respect to users (e.g., a schema of a user profile). During configuration, these properties may be defined in the server scene tree as configuration parameters, and may be applied by instantiating an instance of the user data store 274 using the configuration parameters defined in the server scene tree.

In embodiments, the interface layer 284 may include an authentication module 286, a resource call module 288, a notification module 290, a server synchronization module 292, a caching module 294, and a cache 296. In embodiments, the detailed configurations of various instances of the interface layer 284 may be defined by an administrator associated with the client application which the interface layer 284 interfaces, and as such may be defined as configuration parameters in respective scene tree objects in the server scene tree of the server instance 204.

In embodiments, the authentication module 286 authenticates client application instances. In embodiments, the authentication module 286 may utilize a third party security service (e.g., an identity management service such as LDAP) to authenticate a user of a client application. Alternatively, a user may simply provide a user ID (e.g., an email address) and a password via a client device 214, and the authentication module 286 may use the security service to authenticate the user based on the user ID, the password. In response to authenticating a user, either internally or externally (which may be an administrator-provided configuration decision), the security service or the authentication module may issue a session token to the combination of the user and the client application instance. A session token may be a token that is used to enable communication between the client application instance and the server instance 204 during a communication session. The session token may or may not have an expiry (e.g., an indication of how long the communication session lasts). In response to issuing the session token, the authentication module 286 may establish a communication session over which the client application instance may transmit to and receive data from the server instance 204. For example, the authentication module 286 may allow the client application instance to subscribe to a socket-based channel, whereby the client application instance may communicate with the server instance via the socket-based channel. Once the session token is issued to the client application instance, and the communication session is established, the client application instance may communicate resource calls to the server instance 204. In embodiments, one or more behaviors and/or properties of the authentication module 286 may be configured by an administrator using configuration statements that include configuration parameters relating to: an external authentication service to use to authenticate a user, configurations to define caching of users from external systems, rules for the expiry of session tokens, and the like. The configuration parameters may be defined in respective scene tree objects of a server scene tree. At run time, the scene tree object manager may instantiate an instance of the authentication module 286 using the configuration parameters defined in the server scene objects, thereby configuring the instance in accordance with the desired behaviors and/or properties.

In embodiments, the resource call module 288 handles resource calls on behalf of client application instances. Once a client application instance is authenticated, the resource call module 288 can handle all communications with any resource (internal or external) using whatever protocol that the resource requires. In embodiments, the server instance 204 manages the security level operations to be able to communicate with the resource (e.g., authentication, establishing sessions, etc.), but otherwise passes the request through to an intended resource 210 on behalf of the requesting client application instance. In embodiments, the resource call module 288 receives a resource call (e.g., a RESTful API call) from a client application instance. In embodiments, the received resource call may initially be nested within a resource call to the server kit instance, may include the session token of the authentication device, and may identify the implicated resource and related data. For example, the client application instance may issue an API call to the sever instance 204, such that the API call adheres to the server kit's API protocol and includes the session token that was issued to the client application instance. The API call may include a nested API call, where the nested API call identifies the implicated resource 210 and includes the parameter values that the implicated resource 210 needs in order to service the API call. In response to receiving the resource call, the resource call module 288 may marshal the nested resource call. Marshalling the nested resource call may include determining whether to allow the nested resource call, updating analytics relating to the user based on the nested resource call, and, if permitted, executing the nested resource call. In embodiments, determining whether to allow the nested resource call can include determining whether the user associated with the client application instance has been granted adequate permissions to make the resource call based on the rights 276 of the user. Determining whether to allow the client application instance to make the call may further include examining analytics relating to the client application instance/user to ensure that the nested resource call is not malicious. For example, the resource call module 288 may obtain analytics data that indicates how many times a client application instance associated with the user has requested a particular resource during a time period. If the number of requests exceeds a threshold, the resource call module 288 may deny the nested resource call. Furthermore, in some embodiments, if the resource call module 288 denies the nested resource call the client application instance and/or the user may be flagged or black listed. If the nested resource call is not denied by the resource call module 288, the resource call module may generate a pass through resource call. In embodiments, the resource call module 288 may generate the pass through resource call based on the nested resource call provided by the application instance and a security mechanism (e.g., a token) issued to the server instance 204 (or server kit 200) by the resource 210 indicated in the resource call. For example, the resource call module 288 may insert the security mechanism that is issued to the server instance 204 into the nested resource call. The security mechanism may be granted by the resource 210 to the server instance 204 (or the server kit 200 in general) upon the server instance 204 authenticating with the resource 210. The resource call module 288 may then issue the pass through resource call to the resource 210 by, for example, transmitting the pass through resource call to the implicated resource 210. In some scenarios, the pass through resource call requests data from the implicated resource 210. In these scenarios, the resource call module 288 may receive the requested data and may provide the received data to the client application instance. The foregoing techniques may reduce network security risks, as application developers and resource providers do not need to keep their respective APIs exposed to countless client application instances. Rather, the resource 210 authenticates the server instance 204 (or the server kit 200 in general) and the resource 210 may safely communicate with the server instance 204.

In some embodiments, the resource call module 288 may pass the received data to the data transformation module 246, which transforms the received data to another format prior to providing the data to the client application instance.

In embodiments, the resource call module 288 may pass the received data to the caching module 294, which determines whether to cache the received data. In some of these embodiments, the resource call module 288 may query the cache 296 (discussed below) prior to making a pass through resource call to determine whether the requested data is available on the cache, and if not, may execute the nested resource call.

In an example implementation, a client application instance may send an API request to server instance 204 that includes a nested API call for an internal resource or third party resource with the session token that is issued by the server instance 204 and to the client application instance. The resource call module 288 can then determine whether to allow the nested API, and if it allows the request, the resource call module 288 executes the nested API call. In embodiments, the resource call module 288 may determine whether to allow the nested API call by determining the rights 276 of the user associated with the client application instance and determining if the user has permission to access the resource 210 implicated by the nested API call. The resource call module 288 may further retrieve user metadata 280 associated with the user to determine whether the user has issued too many API calls to the implicated resource 210 (e.g., does the number of API calls to the resource by the client application instance or instances associated with the user exceed a threshold), and if so the resource call may deny the client application access to the requested resource (and may blacklist the user). Otherwise, the resource call module 288 may allow the nested API call to be executed. In some scenarios, the resource call module 288 may determine the type of the nested resource call (e.g., is the nested resource call requesting static or semi-static data) and the implicated resource 210. If the resource call is requesting static or semi-static data, the resource call module 288 may query the cache 296 to determine if the requested data resides in the cache. If so, the resource call module 288 may transmit the cached data to the client application instance. If the request is not requesting data or the requested data is not in the cache, the resource call module 288 may generate a pass through API call using the nested API call and the security mechanism of the server instance 204. The resource call module 288 may then issue the pass through API call to the implicated resource. The implicated resource may respond to the pass through API call, and if any data was returned, the resource call module 288 may provide the returned data to the client application instance. As discussed, in some scenarios, the resource call module 288 may pass the returned data to the data transformation module 246, which may transform the returned data into another format prior to transmission to the client application instance. In embodiments, one or more behaviors and/or properties of the resource call module 288 may be configured by an administrator using configuration statements that include configuration parameters relating to: the minimum user authenticated rights, roles to get access to a resource, and definitions of access to the resource through the caching system, the function layer and out of the data layer, and the like. The configuration parameters may be defined in respective scene tree objects of a server scene tree. At run time, the scene tree object manager may instantiate an instance of the resource call module 288 using the configuration parameters defined in the server scene objects, thereby configuring the instance in accordance with the desired behaviors and/or properties.

In embodiments, the interface layer 284 includes a notification module 290 that provides notifications to client application instances. In embodiments, the notification module 290 may be configured to provide real time notifications. In these embodiments, the notification module 290 may push notifications to a client application instance. Once a client application instance is authenticated with the server instance 204, the client application instance may listen for real time notifications. In some embodiments, the client application instance uses the session token issued to it to subscribe to a socket-based channel on the server instance 204. From time to time, the server instance 204 may receive data from resource 210 via an API corresponding to the subscribed to channel (e.g., updates to the client application, workflow messages, and/or responses to API calls issued by other related instances of the application). As the server instance 204 (e.g., the resource call module 288) receives relevant data, the notification module 290 may determine the appropriate channel or channels, if any, on which the relevant data should be broadcast, and may broadcast the relevant data to any client application listening to those channels. In these embodiments, the server kit 200 may increase the available network bandwidth to and from the server instances 204, as client applications instances are not consistently polling the server instances 204 for notifications. Furthermore, this may help conserve the battery life of some client devices, as the client application instances running on those devices are not required to poll for notifications consistently. The notification module 290 may support additional or alternative types of notifications as well, such as other types of UDP broadcast/listener, push notifications and different types of pull notifications. In embodiments, one or more behaviors and/or properties of the notification module 290 may be configured by an administrator using configuration statements that include configuration parameters relating to: the channels and broadcast messages available for client applications to listen for and for the notification module to be able to trigger, and the like. The configuration parameters may be defined in respective scene tree objects of a server scene tree. At run time, the scene tree object manager may instantiate an instance of the notification module 290 using the configuration parameters defined in the server scene objects, thereby configuring the instance in accordance with the desired behaviors and/or properties.

In embodiments, the interface layer 284 includes a server synchronization module 292. In some of these embodiments, the server synchronization module 292 is configured to synchronize data between the server instance 204 and other related server instances 204. The manner by which the server synchronization module 292 synchronizes data between various server instances may be dependent on the configuration of the server kit 200. For instance, if the server instances 204 are configured to all replicate one another, then the server synchronization module 292 may synchronize any data that is to be cached locally amongst all the server instances and to receive data that is to be cached from the other server instances 204. In some configurations, the server kit 200 may deploy one or more regional edge servers. In these configurations, the server synchronization module 292 may be configured to share data that is to be cached amongst other edge nodes covering the same geographic region or nearby regions. In embodiments, the manner by which the server synchronization module 292 synchronizes data between server instances 204 may be defined in workflows that are triggered when certain types of data are received. In embodiments, one or more behaviors and/or properties of the server synchronization module 292 may be configured by an administrator using configuration statements that include configuration parameters relating to: the types of data that are to be synchronized, how often the servers should be synchronized, synchronization triggers, specific server redundancy patterns (akin to RAID level), and the like. The configuration parameters may be defined in respective scene tree objects of a server scene tree. At run time, the scene tree object manager may instantiate an instance of the server synchronization module 292 using the configuration parameters defined in the server scene objects, thereby configuring the instance in accordance with the desired behaviors and/or properties.

In embodiments, the interface layer 284 includes a caching module 294 and a data cache 296. The data cache 296 may be a temporary data store that stores data that could be or will be sent to one or more client application instances. In embodiments, the data cache 296 is a high speed CSA cache. The caching module 294 may manage the data cache 296 according to one or more caching strategies. The caching strategies and other caching related tasks may be defined in one or more respective workflows, which may be provided by an administrator or default settings. Examples of caching strategies include first-in-first-out, least recently used, time aware least recently used, pseudo-least recently used, and the like. Furthermore, in some implementations, the data may be provided an expiry (e.g., a weather forecast or news item), such that once the data expires, the caching module 294 purges the data from the cache 296. In some embodiments, the caching module 294 may replace a data item when it receives a more current instance of the data item. For example, if the client application provides sports scores, the current score of a game can be stored in the cache, but once the score changes, the caching module 294 may purge the data pertaining to the previous score from the cache, and may store the fresher score-related data in the cache. In embodiments, the caching module 294 may provide the server synchronization module 292 with a notification that a particular data item is being removed from the cache 296, such that the server synchronization module 292 may synchronize the removal of the data item from the caches 296 of the other server instances 204 that are caching the data item. In embodiments, the server kit 200 may be configured to implement edge caching. In some of these embodiments, the server kit may implement an automating resource name mangling schema to ensure that when data is invalidated (e.g., updated) that the edge-cached data is correctly refreshed in all proxy caches between the client application interfaces and the server instance 204. In embodiments, one or more behaviors and/or properties of the caching module 294 may be configured by an administrator using configuration statements that include configuration parameters relating to: invalidating cache entries, uniquely defining cache entries, setting caching storage levels, defining how the cache entries will be distributed via synchronization, and the like. The configuration parameters may be defined in respective scene tree objects of a server scene tree. At run time, the scene tree object manager may instantiate an instance of the caching module 294 using the configuration parameters defined in the server scene objects, thereby configuring the instance in accordance with the desired behaviors and/or properties.

In embodiments, the function layer 244 may include one or more of a data transformation module 246, a file generation module 248, a databases management module 250, a workflow module 252, an analytics module 254, and a plugin module 256. In embodiments, the detailed configurations of various instances of the function layer 282 may be defined by an administrator associated with the client application which the function layer 282 supports, and as such may be defined as configuration parameters in respective scene tree objects in the server scene tree of the server instance 204.

In embodiments, the function layer includes a data transformation module 246. In embodiments, the data transformation module 246 is configured to transform data to ensure that the data may be processed and/or displayed by a client application instance. This may include formatting data into a format that is compatible with the client application instance, which may include formatting the data into a format that is compatible with the operating system and/or web browser of the client device 214 that is hosting the client application instance. In an example, the data transformation module 246 may receive a response from a third party resource that is provided in an XML format, but the client application is configured to receive JSONs. In this example, the data transformation module 246 may be configured to recognize the response as being an XML response and may transform the XML response into the JSON format by mapping the substantive data contained in the XML, response into a corresponding JSON format. In embodiments, the data transformation module 246 may utilize mapping functions that map schemas of a first format to a second format. In embodiments, the data transformation module 246 may employ format readers to determine a format of the incoming data and then a mapping function that converts the incoming data to the desired output format. For example, one or more format readers may examine incoming data to determine the format of the incoming format. Once the format is determined, the server kit 200 may select a mapping function that transforms the incoming data based on the format determined by the reader and the desired output format. The mapping functions may be provided in the libraries of the server kit 200 (e.g., JSONT, XLST, and the like) and/or may be customized mapping functions that are provided by an administrator as a custom plugin (e.g., a custom JavaScript plugin), such that the outgoing data may be encoded in a customized format or according to a custom schema. The data transformation module 246 may utilize techniques such as JSONT, cascading inserts, pivot table queries, and mail merge to transform the data. In exemplary and non-limiting embodiments, the data transformation module 246 may support mail merge using a PHP library to generate HTML code.

In embodiments, the triggering of the data transformation module 246 instance may be defined by a workflow. For example, an example workflow may include a workflow node relating to determining a format of an incoming response and one or more other workflow nodes that define the manner by which the incoming response is to be transformed given the format of the incoming response, where each of the other workflow nodes corresponds to a different type of format of the incoming response. In embodiments, one or more behaviors and/or properties of the data transformation module 246 may be configured by an administrator using configuration statements that include configuration parameters relating to: the format(s) of incoming messages, the fields in the schema of the message, respective transformations of those fields, the remapping of the schema to the new format, the re-encoding in the new format, and the like. The configuration parameters may be defined in respective scene tree objects of a server scene tree. At run time, the scene tree object manager may instantiate an instance of the data transformation module 246 using the configuration parameters defined in the server scene objects, thereby configuring the instance in accordance with the desired behaviors and/or properties.

In embodiments, the function layer 282 includes a file generation module 248. In embodiments, the file generation module 248 is configured to generate files on behalf of the client application. As discussed, file generation may refer to the process of generating output files that is intended for consumption by a user of the client application. For example, in support of a client application that provides invoicing capabilities, the file generation module 248 may be configured to generate PDF invoices. In this example, the file generation module 248 may be triggered by a workflow to generate the invoice in response to, for example, a user request to prepare and send invoices to customers. Upon being triggered, the file generation module 248 may obtain the relevant data to be included in the invoice (which may require the server instance 204 to issue resource calls to a database of the client application and/or perform cascading database reads to obtain the data). The file generation module 248 may then retrieve and populate a template with the relevant data for the invoice. The file generation module 248 may then generate the PDF using a PDF encoder. Depending on the workflow, the PDF may be transmitted to a client application instance, emailed to an intended recipient, cached, and/or stored in the client application's filesystem. The types of files that are generated by the file generation module 248, as well as the manner by which the files are generated may be defined by the administrator. Furthermore, the modules that are used to generate the files may be uploaded by the administrator and/or selected by the administrator from a set of existing file generation modules. In embodiments, the administrator may define workflows that leverage the file generation module 248, such that the administrator can define rules for triggering file generation and the details regarding file generation. For example, the administrator may further define the states (e.g., workflow nodes) at which specific file generation tasks are performed. For example, an administrator associated with the invoicing application may define a workflow corresponding to fulfil invoice request. In the workflow, there may be a workflow node corresponding to "fulfil invoice request," which is triggered after a user with the adequate rights requests that an invoice be generated. In this workflow node, the administrator may define the template for generating the invoice and the types of data that are to be used to generate the invoice (e.g., customer name, invoice number, products, date, amount due, etc.). When the "fulfil invoice request" workflow node is triggered, the file generation module 248 may retrieve the specific data indicated in the workflow node (e.g., customer name, invoice number, products, date, amount due, etc.) and may generate the invoice based on the template and the retrieved data. Once generated, a subsequent workflow node may define tasks that instructs the file generation module 248 (or another module) on what to do with the invoice (e.g., transmit to recipient, cache, store, return to requestor, etc.). In embodiments, one or more behaviors and/or properties of the file generation module 248 may be configured by an administrator using configuration statements that include configuration parameters relating to: the templates and resources used for generation, locations of data used in generation, mappings and transformations of the data to the template, and the like. The configuration parameters may be defined in respective scene tree objects of a server scene tree. At run time, the scene tree object manager may instantiate an instance of the file generation module 248 using the configuration parameters defined in the server scene objects, thereby configuring the instance in accordance with the desired behaviors and/or properties.

In embodiments, the function layer 244 may include a databases management module 250. The databases management module 250 may be configured to supported one or more types of cascaded operations. As previously mentioned, cascaded operations may refer to dependent operations that are combined in a logical order and may include cascaded views (e.g., cascaded reads), cascaded inserts, cascaded updates (e.g., cascaded writes), cascaded deletes, and combinations thereof. In some embodiments, the cascaded operations are cascaded database operations, such as cascaded SQL operations. In operation, a client application instance may transmit a request to the server instance 204 requesting the performance of a series of database request. In some embodiments, the client application instance may issue a resource call (e.g., a RESTful API call) to the server instance 204 that defines the set of database operations to be performed. The resource call module 288 may receive the resource call, which may invoke a workflow associated with handling resource calls. The workflow module 252 (discussed below) may determine that the resource call defines one or more database operations, which may trigger a rule to perform cascading operations and the one or more database operations are provided to the databases management module 250.

The databases management module 250 may receive and execute the one or more database operations. The database operations may be defined with respect to one or more databases. The databases may be internal/proprietary databases and/or may be third party databases. In embodiments, the database management module 250 may expose single operation database calls via a parameterized API. Furthermore, in embodiments, the databases management module 250 may expose multiple dependent database calls via a parameterized API. In some of these embodiments, the databases management module 250 may determine a set of cascaded operations to be performed in order to execute the multiple dependent database operations. In some of these embodiments, the administrator may define specific sequences of cascaded operations that are to be performed to fulfil respective requests, where each respective request may include a different set of database operations. Additionally or alternatively, the databases management module 250 may, during configuration, receive database schemas of any databases that are accessed by the client application and may determine the dependencies between the database operations defined in the request. In these embodiments, the databases management module 250 may determine a sequence of cascaded operations based on the set of dependencies by, for example, implementing a rules-based approach and/or a machine learning approach. The databases management module 250 may then execute the cascaded operations in the sequence provided. This may include accessing third party databases and/or internal databases. Furthermore, in some embodiments the databases management module 250 may access multiple databases (e.g., databases of different third parties) to execute the cascaded operations. In embodiments, the databases management module 250 may compress multiple hierarchal database reads into a single packet of information. In the case of an insert the system may first create a parent record to determine the primary key, and then automatically populate this primary key into the secondary key of multiple child records.

In embodiments, the databases management module 250 may further support cascaded updates, deletes, and combinations thereof. For example, the databases management module 250 may be tasked with executing a cascaded delete to a former employee that managed a team of employees from the company's database. Before removing a database record of the former employee, a workflow may mandate that the database records of the employees managed by the former employee must be updated to remove the linking database records of the former employee, and potentially are to be updated to include references to the a database record of the new manager of the team. In this example, the cascading delete may include identifying all records that are dependent on the former employee's record, deleting references to the former employee's record from the record of each dependent employee, adding new links to the new manager, and then deleting the former employee's record. Be enabling cascaded operations via a server kit 200, network bandwidth may be preserved and throughput may be increased. Furthermore, in having the server kit 200 handle all database operations (as opposed to the client application instance performing database operations directly), the security of internal and third party databases may be maintained, as potentially malicious and/or harmful database operation may be detected and prevented. In embodiments, one or more behaviors and/or properties of the database management module 250 may be configured by an administrator using configuration statements that include configuration parameters relating to: database connectors, the types of views into the database tables, the stored procedures, cascaded combinations of views and stored procedures, lists of parameterized commands which can be optimized, checked for security purposes and executed, and the like. The configuration parameters may be defined in respective scene tree objects of a server scene tree. At run time, the scene tree object manager may instantiate an instance of the database management module 250 using the configuration parameters defined in the server scene objects, thereby configuring the instance in accordance with the desired behaviors and/or properties.

In embodiments, the function layer 244 includes a workflow module 252. In embodiments, the workflow module 252 executes task-based workflows (or "workflows") on behalf of the client application. As previously discussed, the server kit 200 may include predefined workflows and an administrator may define additional customized workflows. Workflows may define processes relating to the back end of the client application, such as handling different types of resource calls in response to user input, performing cascaded operations in response to specific database requests, generating specific types of files in response to a user action, and the like. Each workflow may define different states, which may be represented in workflow nodes. Each workflow node (e.g., states) may be triggered by one or more rules and may define one or more actions to be performed when the one or more rules are triggered. For example, a workflow node may include external REST calls that are to be issued and/or custom JavaScript plugins that are to be performed when the workflow node is triggered.

In some embodiments, the rules are defined in variations, akin to the variations discussed with respect to FIGS. 8A, 8B, and 9. Each time a workflow node is triggered, the workflow module 252 may execute the workflow node, which may include delegating one or more of the actions to another module (e.g., the data transformation module 246, the resource call module 286, or the like), which executes the task. As the various modules of the server kit 200 execute tasks with respect to a workflow, the workflow module 252 may determine whether any other workflow nodes are triggered, and if so, may begin executing the workflow node. The rules governing the workflow module may be data defined by the specific tasks 258, items 260, states 262 and rules 264 in the data layer.

Initially, certain events trigger a new workflow instance. For example, reception of a new resource call may trigger a new workflow instance corresponding to the new resource call. In another example, a server alert may trigger a new workflow instance. Upon a new workflow instance being triggered, the workflow module 252 may declare a new workflow instance and may begin executing a first workflow node in the new workflow instance. The workflow module 252 may monitor the state of the workflow instance to determine whether any other workflow nodes in the workflow instance have been triggered, and if so, may begin executing the triggered workflow nodes. As can be appreciated, a server instance 204 may serve hundreds, thousands, or millions of client application instances. Thus, in embodiments, the workflow module 252 may implement a multithreaded approach in order to handle many workflow instances concurrently. In embodiments, one or more behaviors and/or properties of the workflow module 252 may be configured by an administrator using configuration statements that include configuration parameters relating to: the types of execution model for the data driven workflow (lazy, eager, immediate), how work is divided between the workflow nodes, and the like. The configuration parameters may be defined in respective scene tree objects of a server scene tree. At run time, the scene tree object manager may instantiate an instance of the workflow module 252 using the configuration parameters defined in the server scene objects, thereby configuring the instance in accordance with the desired behaviors and/or properties.

In embodiments, the function layer 244 includes a plugin module 256 that executes plugins (e.g., JavaScript plugins). As discussed, an administrator may provide plugins to customize the server kit 200 for a client application. A plugin may perform a function that is not included in the "out of the box" server kit 200 but that is needed to enable, support, and/or improve operation of a corresponding client application. In this way, the server kit 200 is extensible, in that new functionality can be easily added to the server kit. In embodiments, an administrator may provide/upload an action plugin to the server kit 200 and may associate the plugin with one or more workflow nodes, such that when the workflow node is triggered, the plugin module 256 may execute the plugin which can perform a custom action such as making a network call to a customer's proprietary enterprise system which does not use REST. JS Plugins may be used where custom logic is required and the standard actions including REST calls, emails, SMS messages, generating files, sending real time socket messages, changing task states, starting new tasks, and other suitable actions. In embodiments, one or more behaviors and/or properties of the plugin module 256 may be configured by an administrator using configuration statements that include configuration parameters relating to: the plugins available, the plugins assigned to data transformations, the plugins assigned to file generation, the plugins assigned to workflow rules, the plugins assigned to analytics calculation, and the like. The configuration parameters may be defined in respective scene tree objects of a server scene tree. At run time, the scene tree object manager may instantiate an instance of the plugin module 256 using the configuration parameters defined in the server scene objects, thereby configuring the instance in accordance with the desired behaviors and/or properties.

Figure 16:
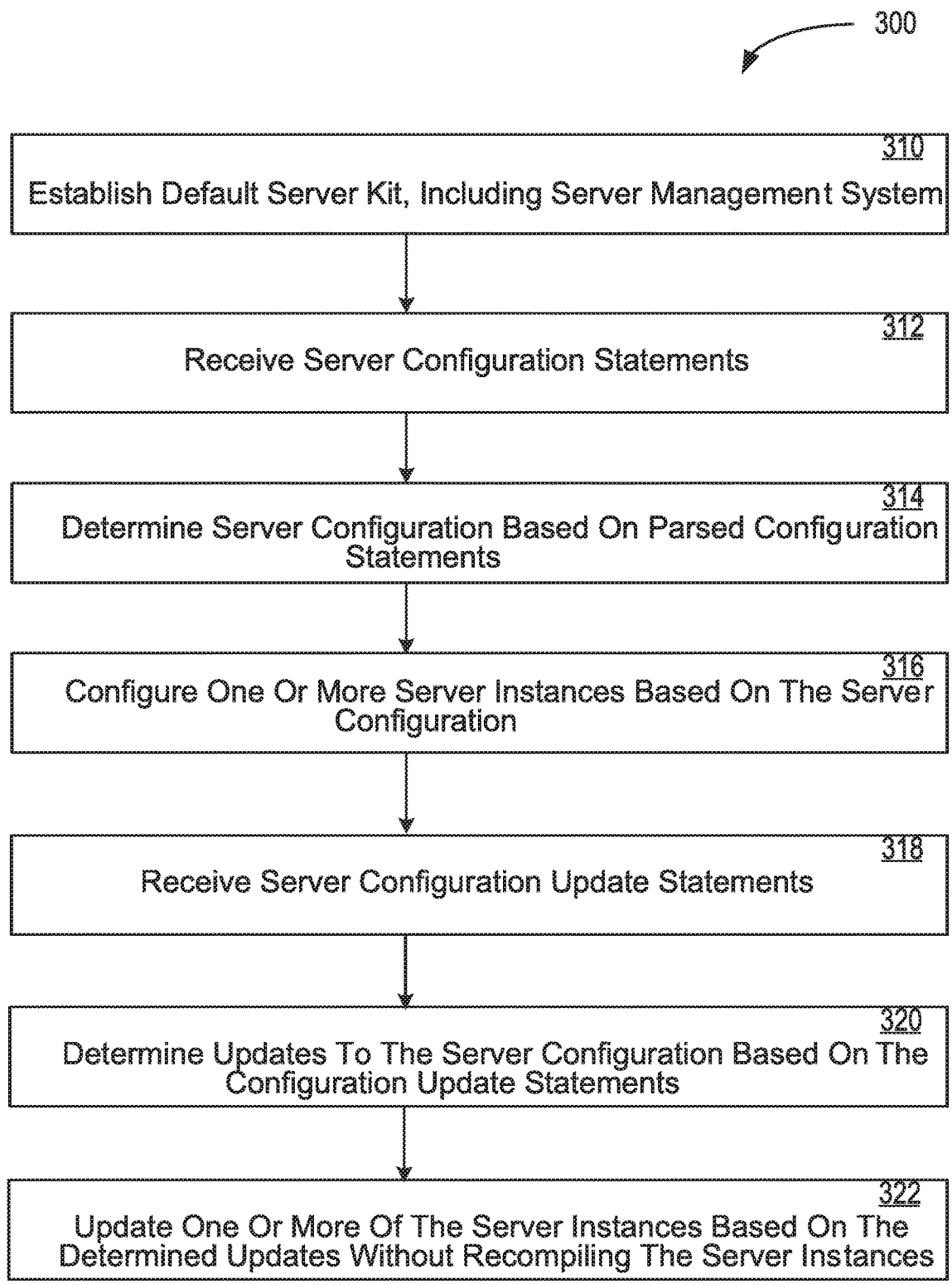
FIG. 16 depicts a set of operations of a method for configuring and updating a server kit according to some embodiments of the present disclosure.

FIG. 16 illustrates an example set of operations of a method 300 for configuring and updating a server kit according to some embodiments of the present disclosure. The method may be executed by the processors of one or more physical server devices, such as the physical serer devices of a cloud services system. In embodiments, the server kit is configured using a declarative language, whereby an administrator provides configuration statements in the declarative language. The server kit may use these statements to configure and update the server instances of the server kit without restarting or recompiling the server instances, thereby avoiding server downtime.

At 310, a default server kit is established, including a server management system. In embodiments, an administrator may provision and/or install the default server kit from a marketplace/store associated with the selected cloud services architecture. Initially, the server kit may be configured with default settings and may not be associated with a client application. In some of these embodiments, the server kit is configured based on a default server scene tree that defines default configuration parameters. In embodiments, a server management system of the server kit may be configured to receive configuration statements from an administrator. For example, the server management system may present a GUI and/or a command line prompt to the administrator via an administrator device that is in communication with the server kit. The server management system may receive configuration statements from the administrator device that associate a client application (or more than one client applications) with the server kit. In embodiments, the administrator may provision one or more physical server devices to host one or more server instances of the server kit. The administrator may define a number of server instances to deploy, as well as other suitable configurations of the server instances, such as whether to distribute operations or to replicate server instances, a caching strategy, and the like.

At 312, the server management system may receive a series of configuration statements from the administrator via the administrator device. For example, the administrator may utilize the GUI presented by the server management system to select configuration actions (e.g., create a new workflow, add workflow nodes to a workflow, upload JS plugin, add file generation templates, expose database, add API definitions, and the like) and may enter input relating to those configuration actions (e.g., a name for the new workflow, triggers and actions relating to the new workflow node, a file path and file name of the JS plugin, a file path and file name of the file generation template, an address of the database, and the like). In these embodiments, the configuration action and related configuration parameters are used to determine a corresponding configuration statement. In embodiments, the administrator may use a command line interface to enter the configuration statements, whereby the server management system receives the configuration statements as entered by the administrator via the command line interface. In embodiments, the administrator may provide the configuration statements in a configuration file, whereby the administrator prepares the configuration file containing the configuration statements and uploads the configuration statements to the server management system. As previously discussed, in embodiments the configuration statements are provided as declarative statements that are written in a declarative language.

At 314, the server management system may determine a server configuration based on the configuration statements. In embodiments, the server management system may parse the configuration statements to identify the action and any related configuration parameters. In embodiments, the server management system determines deltas (e.g., differences) between the default configuration of the server kit and the received configuration statements. In some embodiments, the server management system may apply the deltas to the server scene tree of a server instance. In some of these embodiments, the server management system may apply the delta by adding or removing scene tree objects from the server scene tree and/or by changing the parameters of one or more scene tree objects based on the determined deltas.

At 316, the server management system may configure one or more server instances based on the configuration statements. In embodiments, the server management system may apply the determined delta to the default configuration of the server instances. In embodiments where the configuration of a server instance is provided in a declarative language, the server management system may write the server scene tree to the server instance. The server instance may then instantiate a set of instances (e.g. objects) from the modules (e.g., classes) of the server instance in accordance with the server scene tree. Once configured, the server instances may begin serving instances of the client application.

At 318, the server management system may receive one or more configuration update statements from the administrator via an administrator device. The configuration update statements are configuration statements that are meant to the update the configuration of one or more aspects of the server kit. For example, an administrator may provide configuration update statements to add a new workflow, to edit a pre-existing workflow (e.g., adjust a workflow node or add a new workflow node), to add new plugins, add new templates, expose new databases, expose new APIs, and the like. The configuration update statements may be received via a GUI, a command line interface, and/or a configuration file.

At 320, the server management system may determine updates to the server configuration based on the received configuration update statements. In embodiments, the server management system may determine a delta to the current server configuration based on the configuration update statements. The delta represents differences to the current server configuration, whether additional configuration parameters, revisions to existing configuration parameters, and/or deletions of existing configuration parameters. In some embodiments, the server management system may apply the deltas to the server scene tree of a server instance to obtain an updated server scene tree. In some of these embodiments, the server management system may apply the delta by adding or removing scene tree objects from the server scene tree and/or by changing the parameters of one or more scene tree objects based on the determined deltas At 322, the server management system may update one or more server instances based on the one or more determined updates without recompiling the server instances. In embodiments, the server management system may apply the determined delta to the current configuration of the one or more server instances. In embodiments where the configuration of a server instance is defined in a server scene tree, the server management system may write the updated server scene tree to the server instance. The server instance may then instantiate a set of new instances (e.g. objects) from the modules (e.g., classes) of the server instance in accordance with the deltas between the updated scene tree and the previous version of server scene tree. In some embodiments, the server instance may deconstruct previously instantiated instances that are no longer implicated by the updated server scene tree. In this way, the server instances do not need to be recompiled and may continue to serve client application instances in accordance with the updated configuration parameters. In embodiments, the server management system may also maintain older configurations, such that the older configurations may configure one or more server instances as well. In these embodiments, the older configurations may be used to support older versions of the client application.

Figure 17:
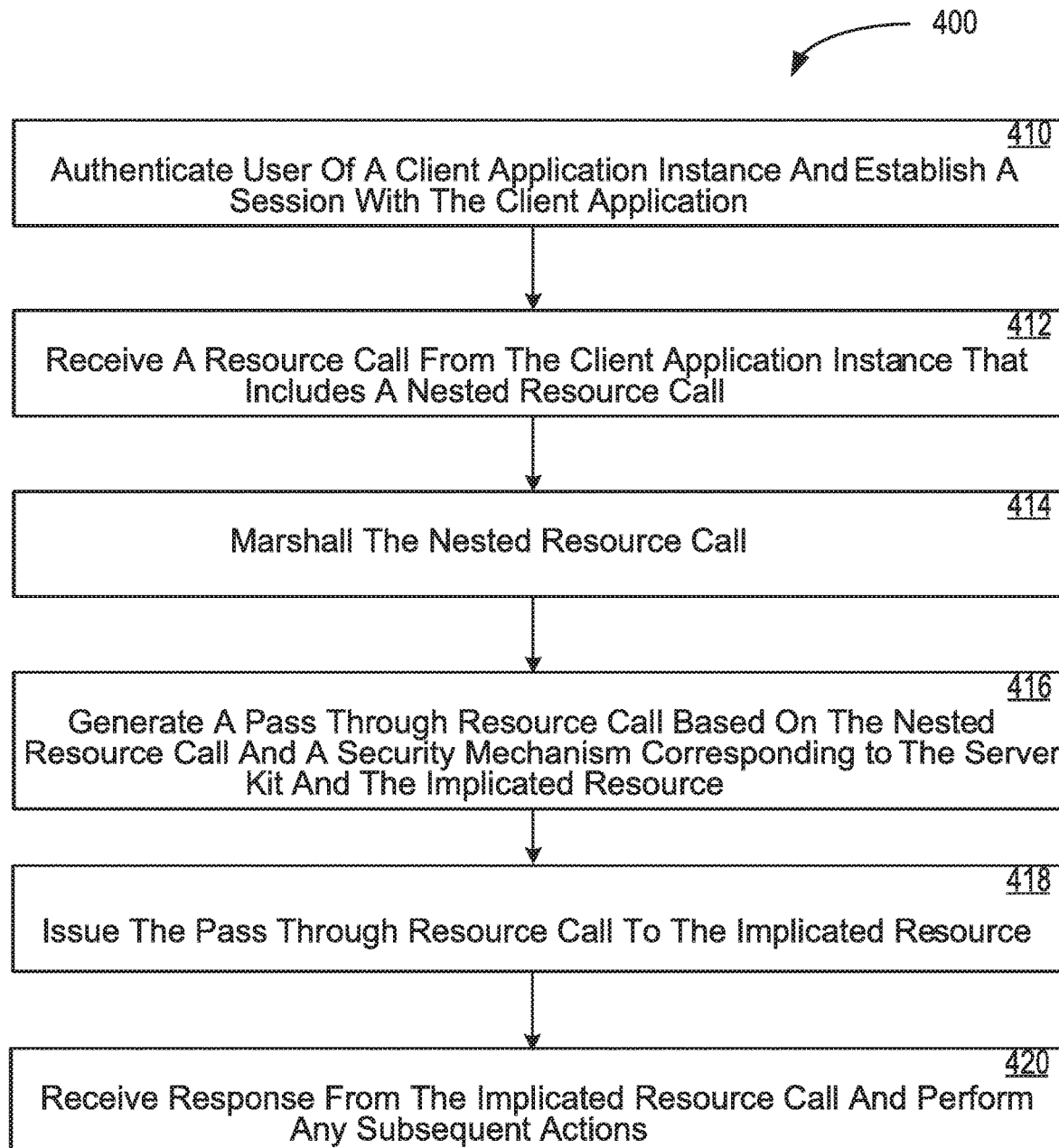
FIG. 17 depicts a set of operations of a method for handling a resource call provided by a client application instance according to some embodiments of the present disclosure.

FIG. 17 illustrates an example set of operations of a method 400 for handling a resource call issued by a client application instance. The method may be performed by one or more server instances of a server kit that supports the client application. The resource call may be to a third party resource or an internal resource.

At 410, a server instance authenticates a user of a client application instance (or the instance itself) and establishes a session with the client application instance. The client application instance may attempt to authenticate with the server instance upon the client application instance initiating communication with the server instance (e.g., a user opens a native application instance or accesses a web application instance of the client application). The client application instance may authenticate in any suitable manner, depending on the configuration of the client application. For example, the client application may be configured to prompt the user for a username and password or the client application may authenticate without a username and password but rather only information relating to the device (e.g., IP address, device identifier, and/or the like). In response to a request to authenticate the user and/or the client application instance, the server instance may perform a suitable authentication process. The authentication process may be performed internally (e.g., verifying username and password based on stored user metadata) or by an external service (e.g., IDAPP). Once authenticated, the server instance may establish a communication session with the client application instance. In embodiments, the server instance may further issue a security token (or other suitable security mechanism) to the client application instance. The client application instance may use the security token in future communications with the server instance.

At 412, the server instance receives a resource call from the client application instance that includes a nested resource call to an implicated resource. During operation of the client application instance, the client application instance will issue resource calls for internal and/or external resources. The client application instance may issue a resource call to the server instance that includes a nested resource call that implicates a resource. In embodiments, the client application may issue an API call to the server instance that includes a nested resource call to the implicated resource. The nested API call may include the information needed to make the API call to the implicated resource. For example, if the nested API call is for directions to a location, the nested API call may include a resource identifier of the implicated resource, a type of action being requested, and the longitudes and latitudes of the starting location and the destination. In another example, in a request to find hotel rooms, the nested API call may include a resource identifier of the implicated resource, a type of action being requested, an arrival date, a checkout date, and a search location (e.g., a city name or geo coordinates). As previously discussed, the nested API calls may be formatted in accordance with the protocol of the implicated resource's API.

At 414, the server instance marshals the nested resource call. As discussed, marshaling the nested resource call may include determining whether to allow the nested resource call, updating analytics relating to the user based on the nested resource call, and, if permitted, executing the nested resource call. In embodiments, determining whether to allow the nested resource call can include determining whether the user associated with the client application instance has been granted adequate permissions to make the resource call based on the rights of the user. Determining whether to allow the nested resource call may further include examining analytics relating to the client application instance/user to ensure that the nested resource call is not malicious. For example, the server instance may obtain analytics data that indicates how many times a client application instance associated with the user has requested the resource call during a time period. If the number of requests exceeds a threshold, the server instance may deny the nested resource call. Furthermore, in some embodiments, if the server instance denies the nested resource call the client application instance and/or the user may be flagged or black listed.

At 416, the server instance generates a pass through resource call based on the nested resource call and a security mechanism corresponding to the server instance and the implicated resource. If the nested resource call is not denied by the server instance, the server instance may generate a pass through resource call. In embodiments, the server instance may generate the pass through resource call based on the nested resource call provided by the client application instance and a security mechanism (e.g., a token) issued to the server instance (or the server kit) by the implicated resource. For example, the server instance may insert the security mechanism that is issued to the server instance into the nested resource call. In this way, the server instance does not need a priori knowledge of all the different APIs that a client application may access, but may still issue API calls on behalf of the client application instance.

At 418, the server instance issues the pass through resource call to the implicated resource. Upon generating the pass through resource call, the server instance may then issue the pass through resource call to the resource by, for example, transmitting the pass through resource call to the implicated resource. In some embodiments, the server instance may query a cache of the server kit (either at the server instance or another server instance) prior to making a pass through resource call to determine whether the requested data is available on the cache, and if not, may execute the pass through resource call. If the data is available at the cache, the server instance may forgo issuing the pass through resource call and may return the cached data corresponding to the nested resource call.

At 420, the server instance receives a response from the implicated resource and performs any subsequent actions pertaining to the response. In some scenarios, the pass through resource call requests data from the implicated resource. In these scenarios, the server instance may receive the requested data and may provide the received data to the client application instance. In some embodiments, the server instance may transform the received data to another format prior to providing the data to the client application instance. In embodiments, the server instance determines whether to cache the received data, and if the data is appropriate for caching, may cache the received data according to a caching strategy.

Figure 18:
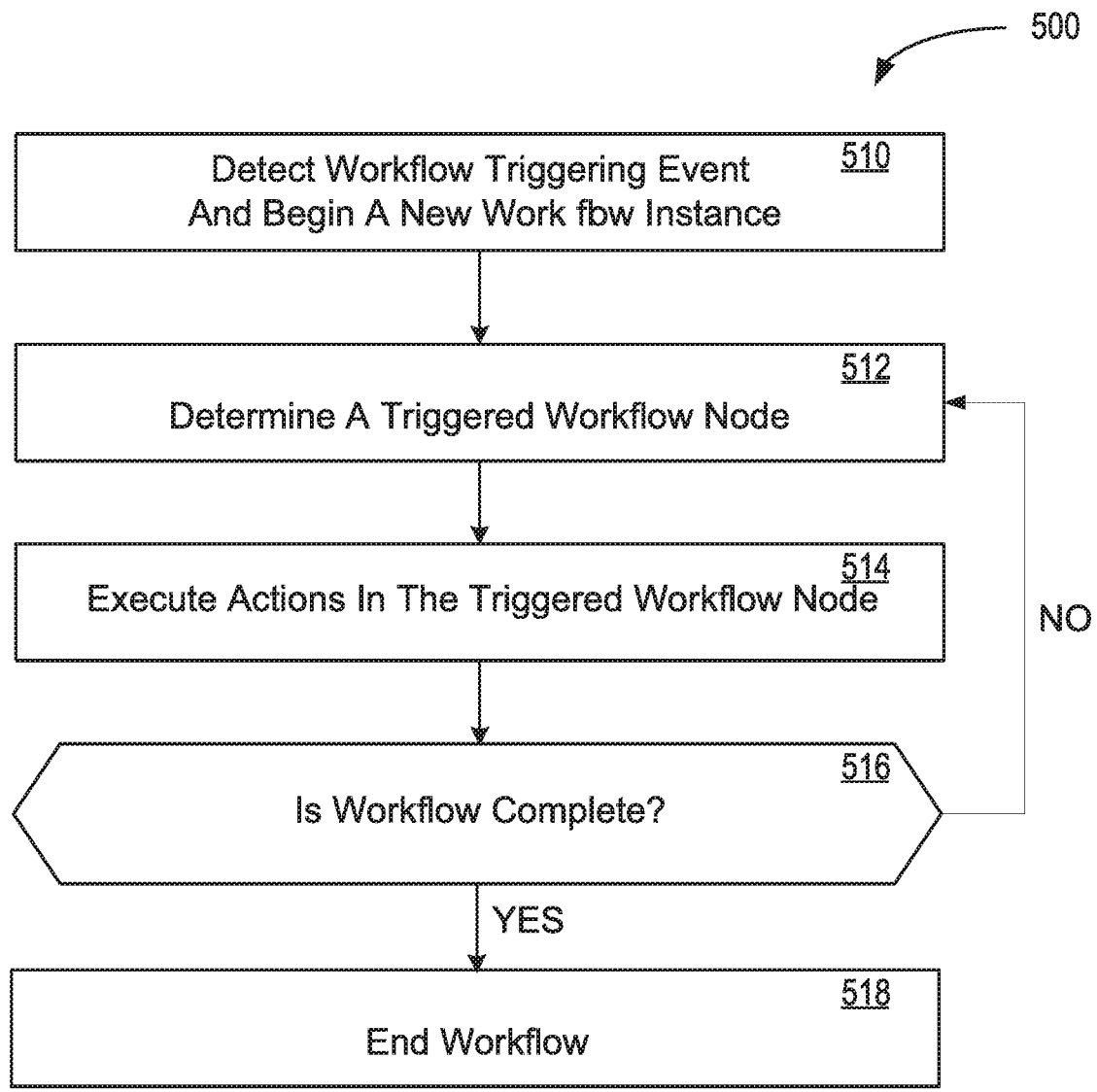
FIG. 18 depicts a set of operations of a method for processing a task-based workflow according to some embodiments of the present disclosure.

FIG. 18 illustrates an example set of operations of a method 500 for executing a workflow. As discussed, a workflow may be defined by an administrator or may be a default workflow. Each workflow may be triggered by a respective triggering event. Examples of triggering events may be temporal events or sever events (e.g., a user interacted with a GUI element of the client application instance, which initiates the server event indicating the same). The triggering events may be defined by an administrator or may be set by default. The workflow may define a series of states associated with a backend of a client application. In embodiments, each workflow may be defined as a series of workflow nodes, where each workflow node represents a different state. Each workflow node may be triggered by a respective set of one or more rules. In embodiments, the rules may be represented as variations. Each workflow node may define one or more actions that are to be performed when the workflow is in the respective state. Put another way, each workflow node may define one or more actions that are to be performed when the rules pertaining to the workflow node are triggered.

At operation 510, a server instance detects a workflow triggering event. In some scenarios, the workflow triggering event may be in response to an action being performed by a client application instance, where the client application instance may transmit a request (e.g., a resource call) to the server instance. In some scenarios, the workflow triggering event may be a scheduled event (e.g., an event that occurs every hour or day). In response to detecting a workflow triggering event, the server instance may determine the workflow that is triggered by the workflow triggering event and may create a new workflow instance based on the triggered workflow.

At operation 512, the server instance may determine a triggered workflow node. As mentioned, each workflow node may be triggered by one or more rules. The rules may be defined as variations, whereby a workflow node is triggered upon determining that the state of the workflow satisfies the conditions of the variation.

At 514, the server instance may execute actions defined in the triggered workflow node. As mentioned, each workflow node may define one or more actions that are to be performed when the workflow node is triggered. Examples of actions that are to be performed may include resource calls that are to be issued, plugins that are to be executed, data transformations that are to be performed, files that are to be generated, and the like. Upon triggering the workflow node, the server instance may execute the actions indicated in the workflow node.

At 516, the server instance determines whether the workflow is complete (e.g., there are no more states that are triggered and no more states that can be triggered). If so, the server instance may end the workflow, as shown at 518. Otherwise, the server instance may determine another workflow node that is triggered, as shown at 512.

Figure 19:
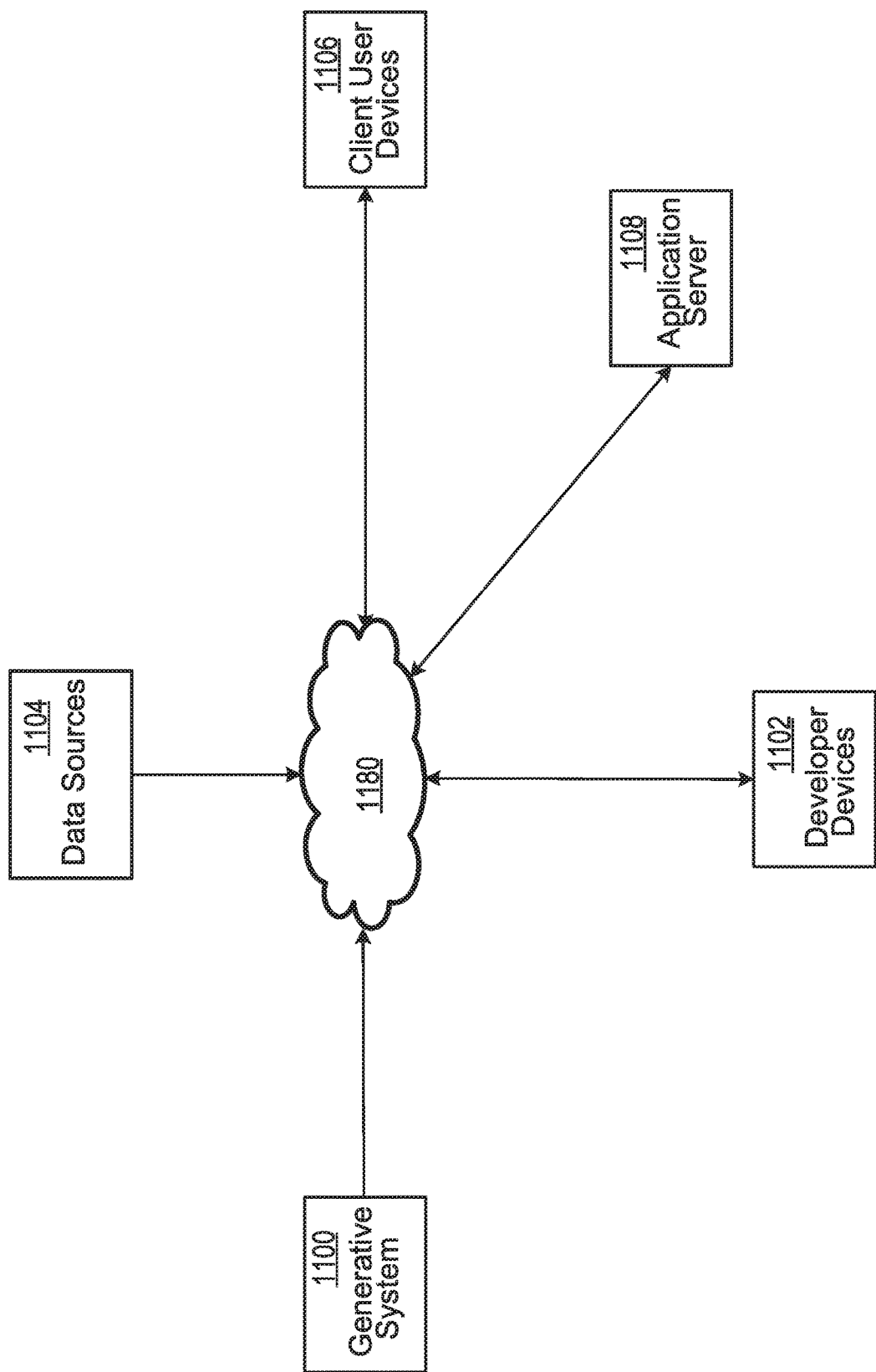
FIG. 19 depicts a schematic illustrating an example environment of a generative content system.

FIG. 19 illustrates an example environment 1000 of a generative content system 1100. In embodiments, the generative content system 1100 may include one or more computing devices, wherein each computing device includes one or more processors that executes computer readable instructions and memory that stores the instructions. The generative content system 1100 may be implemented as a standalone system that supports other applications or as a subsystem in a broader system, such as the application system 100 described above. In embodiments, the generative content system 1100 is configured to create, share, and manage generative content which may facilitate rendering and/or interaction with the generative content at a client device 1106. Additionally or alternatively, the generative content system 1100 may create, share, and manage generative content that is used to train machine-learned models (e.g., a neural network, a deep neural network, a convolution neural network, a recurrent neural network, forest of decision trees, a random forest decision tree, regression-based models, Hidden Markov Models, Bayesian model, and/or any other suitable trainable model) using data comprising the generative content. The generative content may be integrated into a broader application (e.g., a video game) or may be standalone content (e.g., a 3D map of a city).

In embodiments, the generative content system 1100 may be configured to generate multi-dimensional visual content, such as a 3D representation of a geographic area (e.g., a city or segment of a city), a 3D representation of a structure (e.g., a building or bridge), a 3D rendering of an organism (e.g., a human body), and the like. Additionally or alternatively, the generative content system 1100 may be configured to generate multi-dimensional data models, such as a model of a building that defines expected signal strengths throughout the building, a simulated sports game (e.g., football or hockey), the behavior of a fluid in a system, a model of an amino acid, a model of an audio signal (e.g., a function of amplitude, change of frequency, time, and instantaneous phase), and the like. In operations, the generative content system 1100 may receive instructions (e.g., code, declarations, parameter values, and the like) from one or more developer users via one or more developer user devices 1102. In embodiments, the instructions may, for example, define one or more data sources 1104 from which the generative content system 1100 is to obtain data from, one or more domain-specific classes that process the obtained data, one or more processes for connecting instances of the processed data, one or more processes to synthesize a representation based on the connected instances of processed data, and/or one or more processes to adjust the representation.

In some embodiments, the generative content system 1100 may be used to generate and/or enhance digital twins that can be integrated into another application. For example, the generative content system 1100 may be configured to generate visual digital twins that may be imported into video games, maps/GPS applications, enterprise applications, city planning applications, and the like. In another example, the generative content system 1100 may be configured to generate non-visual digital twins (data representations) of real world systems that may be leveraged in machine-learning services, location-based services, simulators, and the like.

In embodiments, the generative content system 1100 may ingest data from one or more data sources 1104 and may process the ingested data into an abstract representation. In some scenarios, the ingested data may be any data pertaining to an environments and/or one or more objects. Examples of real-world environments may include landscapes (e.g., cities, neighborhoods, mountains, caves, and the like), bodies of water (e.g., oceans, seas, lakes, rivers, and the like), organisms (e.g., the human body), communication networks (e.g., a model of network traffic over a private or public network), a signal map of an area (e.g., signal strengths of various type in an area), a mechanical system (e.g., an engine, a turbine, and the like), complex data sets (e.g., the contents of an organization's entire file system), and the like. Examples of real world objects may include to genes (e.g., human genes, plant genes, animal genes), buildings (e.g., houses, office buildings, apartment buildings, stores, warehouses, factories, and the like), body parts, and the like. The abstract representation may be a data representation of an environment or one or more objects. In embodiments, the generative content system 1100 may adapt the abstract representation to conform to a simulation environment, and may execute one or more simulations to produce outputs comparable to the ingested data. In embodiments, the generative content system 1100 may be configured to optimize simulated output representations through a simulated annealing process.

In embodiments, the generative content system 1100 synthesizes content from the outputs of the simulations. In these embodiments, the generative content system 1100 may generate content that complements the abstract representation that was generated based on the ingested data, such that the combination results in a richer representation. For example, in generating a representation of a building, the generative content system 1100 may generate a representation of a fire escape that fits to the parameters of the building. The generative content system 1100 may have acquired data that indicates the size of the building (from the building plans of the building), the type of fire escapes used (e.g., from a city's building department) and/or images of the building (e.g., from a video camera feed), but may have not acquired any images that show the fire escape. In this example, the generative content system 1100 may retrieve a template corresponding to the type of fire escape used in the building and may generate a representation that fits the parameters (e.g., size, window locations) of the building. In this example, the generative content system 1100 generates content that results in a more accurate representation of the building, despite not having data that shows the fire escape. In another example, the generative content system 1100 may be generating a data representation of a collection of various signal strength samplings of different types of radio signals collected throughout a structure (e.g., a hotel). In this example, the generative content system 1100 may generate simulated signal strength samples that conform to the actual signal strengths samples to provide a richer model. In embodiments, the generative content system 1100 may further "clean up" the synthesized content, such as with a simulated annealing process.

In embodiments, the generative content system 1100 may compress, transmit, and/or render the representation for display on different types of computing devices. In embodiments, the system 100 may optionally perform steps including decimation of the content, encoding of the decimated content, and storage of the encoded content in a multi-dimensional database. In these embodiments, the generative content system 1100 may support multi-dimensional querying of the multi-dimensional database by a client user device 1106 and/or an application server, so as to support the accessing of segments of the representation of a system. For example, a query corresponding to a 3D environment may indicate an x, y, and z coordinate within the environment and a viewing angle, and the generative content system 1100 may return a segment of a 3D representation of the 3D environment that corresponds to the query parameters. In embodiments, the client user devices 106 may implement one or more class-specific decoders to decode the data received in response to the query. Fidelity of the representation (e.g., a compression ratio) during decimation may be linked to the level of detail required, with the lower the level of detail needed, the simpler the representation.

In embodiments, the generative content system 1100 supports a generative kernel language. The general kernel language may be a language with a minimal subset of instructions designed to recreate the original input. Data formatted in accordance to the generative kernel language may result in a smaller representation of the source input. In these embodiments, the generative kernel language may comprise parameterized procedural instructions for transmitting the representations to rendering client devices 106 that may process a series of execution/decompression phases. In embodiments, a generative kernel language may comprise a minimal subset of instructions that facilitate generating outputs in a two-phase geometric digital content asset process. In embodiments, the generative kernel language may be used in a first phase of execution on the CPU. Secondary phases of the two-phase process may use methods other than generative kernel language on a CPU and or GPU. The secondary phases may be specific to a type of output being generated and, therefore, may not be restricted to generative kernel language instructions. The second phase may result in a reconstructed output similar to original content being rendered such as data, textures, geometry, and the like. In embodiments, the generative kernel language may accommodate the process of transforming geometric primitives through a two-phase execution process. The generative kernel language may act as a set of CPU-based parameterized procedural instructions which can be executed to create other CPU and/or GPU instructions or data, which can in turn be used to generate content similar to original content. The created instructions or data may be used in secondary phase to create data, textures, geometry, and the like with a CPU or a GPU to a preferred level of rendering fidelity. It is noted that generative content system 1100 may support additional or alternative languages, such as Java™, Javascript™ C, C++, C Sharp, Python, assembly language, and the like.

In embodiments, a generative content system 1100 may perform ingestion and combination of inputs. Inputs may be ingested from many different sources, may be of differing types, differing accuracy, differing precision, and the like. Inputs may be ingested independent of a rate of update of the different inputs (e.g., some data sources may update continuously, while other data sources may update periodically or sporadically). Ingesting and combining inputs may include statistically processing the inputs, temporally filtering the inputs, spatially filtering the inputs, and combining the processed inputs.

In embodiments, a generative content system 1100 may use these processed inputs to create abstract instances of classes. In embodiments, the abstract instances of classes are represented in nodes. The abstract instances of classes may include properties that can connect an abstract instance to one abstract instance, such as in a hierarchical graph. For example, in generating an abstract representation of a city, an abstract instance of a building (e.g., a "building node") may connect to an abstract instance of a sidewalk (e.g., a "sidewalk node"). Similarly, abstract instances of doors, walls, windows, floors, pipes, screws, and the like, may be connected to the abstract instance of the building. In embodiments, the abstract instances of classes may also be spatially and temporally arranged in a data structure. In embodiments, the data structure of the abstract instance of classes may include a data structure that partitions items with multi-dimensional axes, such as nested squares forming a quad tree, cubes forming an oct tree, tesseracts forming a 'hyper tree', and/or the like. In embodiments, the processing of inputs to create abstract instances of classes may be scalable, such as based on the number or volume of inputs, to facilitate, for example batch processing. Results of such batch processing may be combined into a shared representation. In embodiments, the abstract instances of classes may contribute to a graph with any number of nodes. Properties of these nodes may be connected to other nodes (e.g., with comparable properties, and the like) in a tree structure, such as a directed acyclic graph and the like. In embodiments, the nodes may also be partitioned in a plurality of dimensions, such as four dimensions based on the node properties (e.g., time and x, y, z location, or x, y, z, location and viewing angle). The data structure (e.g., the graph) of abstract instances (e.g., nodes) may be referred to as an abstract representation. The abstract representation represents the object/environment that is to be modeled, including ingested data obtained from a data source and/or data derived from the ingested data.

In embodiments, the generative content system 1100 may process a graph of classes with a set of class-dependent algorithms to update the abstract representation of the input (e.g., a graph representation of the object/environment/system being modeled). The generative content system 1100 may iterate over the graph with the class-dependent algorithms. The class dependent algorithms may attempt to converge on a set of fitness criteria that may have many arbitrary or predefined weighted elements associated with the graph node hierarchy, classes, node properties, and the like. Respective class dependent algorithms may be specific to a given class or to a class hierarchy, and can operate at different levels of detail on the graph. In embodiments, the class dependent algorithms may alter node properties, such as altering certain properties of a current node based on the class and properties of the current node, its parent, children, and/or sibling nodes. In embodiments, the class dependent algorithms may prune nodes from the graph, such as to correct errors in the representation. In embodiments, the class dependent algorithms may add nodes to the graph, such as to fill in information that should be in the graph (e.g., adding pipe nodes to a building node, despite not having any data to suggest the building being modeled has piping). The class dependent algorithms (also referred to as "convergence algorithms") may iterate on the graph, each time potentially altering node properties, adding nodes to the graph, and/or pruning nodes from the graph until the representation converges on a fitness criteria. A fitness criteria may define a metric to be optimized with respect to the model. The fitness criteria may be defined by one or more rules, and a rule can apply to one or more fitness criteria. The degree to which the graph is processed (e.g., the number of iterations run on the graph) may be adjusted based on a preference for convergence to the fitness criteria versus time/computation. In an example, an abstract representation of a city may include a road node that may define the road centerline and a number of lanes and, by way of the road node's connection properties, may indicate where a minor road centerline joins the major road centerline, where the intersection does not contain a controlled intersection (e.g. no traffic lights). In response to analyzing the road node and the properties defining the road, the generative content system 1100 may define properties of the road node such as an intersection surface and markings in contact with the road and in some scenarios, may add one or more stop sign nodes, which may be connected to the road node to indicate a respective stop sign at one or both sides of the intersection. Similarly, the generative content system 1100 may define the properties of the road node of the minor road to indicate a stop sign by, for example, instantiating a stop sign node and adding the stop sign node to the connection properties of the road node corresponding to the minor road.

In embodiments, a densely packed abstract representation may provide faster processing while utilizing fewer computing resources, increased centralized computation (thereby reducing computation load on end user devices), and, potentially, less network traffic. Additionally, fewer simulation and conformance iterations may need to be completed before content synthesis operations. In embodiments, content synthesis may be performed in a computationally distributed manner (e.g. actually making the vertexes for the 3D representation of the road and signs). In embodiments, a densely packed abstract representation may facilitate efficiently splitting this densely packed representation. In embodiments, the convergence algorithms act on the graph by updating nodes, deleting nodes, creating nodes, updating node properties, deleting node properties, creating node properties, and the like.

In embodiments, once the conformance simulation portion of the generative content system 1100 completes conformance simulation responsive to one or more fitness criteria, the hierarchical graph may be prepared for the generation of synthetic content based on the nodes of the graph. In embodiments, preparing the hierarchical graph for generation of synthetic content may facilitate distributed computation and storage. In embodiments, preparing the hierarchical graph for generation of synthetic content may include partitioning the graph according to a partitioning scheme, such that respective partitions of the hierarchical graph may be distributed to different computational resources and/or storage mechanisms based in part on the partitioning scheme. In embodiments, the partitioning scheme may allow multiple sparse data sets to be generated for processing which have edge nodes that are marked to be used for different computations based on the partition scheme. In some embodiments, marked edge nodes do not have results in localized graph operations that use techniques such as procedural rules, simulations, a libraries of templates/lookup tables, AI models, and/or genetic algorithms to create the content at the maximum quality.

Through the use of the partitioning scheme and the marking of some nodes, it is possible to distribute the synthesis process, as a local copy of the graph may only need to have some nodes marked for content synthesis/generation. In embodiments, these synthetic generative processes, which may be associated with a class, can act on the graph nodes and can generate, copy, and/or parametrize a plurality of types of content that may be associated with the nodes.

In embodiments, the generated content may go through a set of specialized conformance processes that may clean up and/or anneal aspects of the content. Specialized conformance processing may be required at a class level, content type, spatial or temporal level, and the like. In an example relating to 3D content, conformance processing may include splitting polygons, adding and aligning vertexes in spatially proximate meshes (e.g., where a lower resolution ground plane meets a road surface). In an example relating to models of audio signals, conformance processing may include normalizing an envelope when combining two generated audio signals. In embodiments, specialized conformance processing may be distributed for processing. In embodiments, a specialized conformance process may be associated with a class and can act on one or more content items of the class. The content items may be identified by the type of content, properties of the content itself, the node's properties, the association of other nodes and the properties of those nodes, and/or content which is connected via hierarchy or partitioning, and as defined by the specialized conformance process.

In embodiments, the generative content system 1100 may perform one or more specialized decimation processes on the processed content, where the one or more specialized decimation processes may be specific to a type of content being processed and a level of detail required to be preserved for rendering, and the like. Decimation may refer to a process where segments of a representation are identified and properties of the respective segments are defined at different levels of detail or specificity. For example, in the decimation of a 3D representation of a bridge that can be viewed at different vantage points, the generative content system 1100 may define multiple sets of properties, including a first set of properties when the level of detail is relatively high (e.g., a representation of the bridge includes rivets and screws when viewed from up close) and a second set of properties when the level of detail is relatively low (e.g., only the color and shape of the bridge when viewed from a relatively further vantage point). In embodiments, the generative content system 1100 may distribute the decimation process, as only the current piece of content being processed is required for decimation. These content type-specific decimation processes can act on the processed content for each level of detail required. In embodiments, the generative content system 1100 may simplify/quantize/transform the output of the decimation process or empty pieces of content for each level of detail based on, for example, a set simplification rules that may be encoded in the decimation process.

In embodiments, each respective level of detail of decimated content may go through a content-specific encoding processes. These processes may be specific to a type of content and a type of encoding or compression applied. In embodiments, it is possible to distribute the content-specific encoding processes because only the specific content item being processed is required for encoding. In embodiments, content-specific coherent batch execution may be preferred due to it is more efficient and may facilitate inter-content techniques such as a shared texture atlas, building a statistical model for a lookup table, and/or the like. In embodiments, these encoding processes output data in a generative kernel language format.

In embodiments, the generative content system 1100 may incorporate a multi-dimensional database that may be distributed over one or more servers. In embodiments, multiple representations of an encoded content item, or group of encoded content items, representing different levels of detail may be stored in a multi-dimensional database. As mentioned above, the multi-dimensional database may be configured to support multi-dimensional queries. In some embodiments, the multi-dimensional database may be configured to manage volume and/or spatial occlusion in responding to a query. For example, in response to query having an x, y, z, location and a viewing angle, the multi-dimensional database may return only content items that would be visible from the viewing angle at the x, y, z location and may not include any content items that would be occluded by other content items.

In embodiments, the multi-dimensional database may be queried remotely using multi-dimensional queries (e.g., x, y, z position and a viewing angle, or an x, y, z orientation and a time). In some of these embodiments, the multi-dimensional database may reply to a query by supplying packets of the encoded content ordered from the front of a frustum (e.g., the closest location to the x, y, z position) to the back of the frustum (e.g., the furthest portion of the representation from the x, y, z position in the direction of the viewing angle); thereby allowing rendering to proceed with the most important packets arriving first. These packets may also be supplied with the right level of detail for the proximity to the viewer, and may take considerations such as occlusion into account. In embodiments, a query of the multi-dimensional database may define other criteria. For example, a query of the multi-dimensional database that requests 3D content that will be rendered may define the type of rendering that will be performed on the content. In this way, the multi-dimensional database may determine a manner by which to respond to the query. In embodiments, the multi-dimensional database may return time series data, simulations of interactions (e.g., particle interactions), and the like. In embodiments, the data packets containing the requested content may be cached by the local client in an encoded format. These embodiments may reduce bandwidth demands and/or the need to re-compute items which are in view in subsequent frames, and/or may result in higher frame rates.

In embodiments, a generative content system 1100 may support class-specific decoding. A client user device 1106 may execute a plurality of decoders and processing steps to the unpacked encoded content. These may be determined by the specific class and can be executed on a CPU or GPU. Examples of class-specific decoders include: SE (Spline Extraction) designed to unpack smoothly varying time series data such as joint angles on the CPU; TS (Texture Synthesis) and GML (Generative modeling language) designed to be executed on the GPU; and the like. The client user device 1106 may decode the encoded content using the class-specific decoders and may display the decoded content via a user interface of the client user device 1106.

The generative content system 1100 may be used to create representations for many different applications. For example, the approach disclosed herein can be applied to any suitable domains which have missing data and different levels of detail, such as: 3D representation of landscapes, structures, mechanical systems, and/or any other real world environments or objects; protein interactions; weather simulations; crowd/agent interactions; and the like. Furthermore, while the disclosure discuss a content generation system 100 performing all of the functionality, one or more functions may be performed by other suitable systems. For example, the generative content system 1100 may generate content that is used to train machine-learned models and/or that can be leveraged for other artificial intelligence processes.

Figure 20:
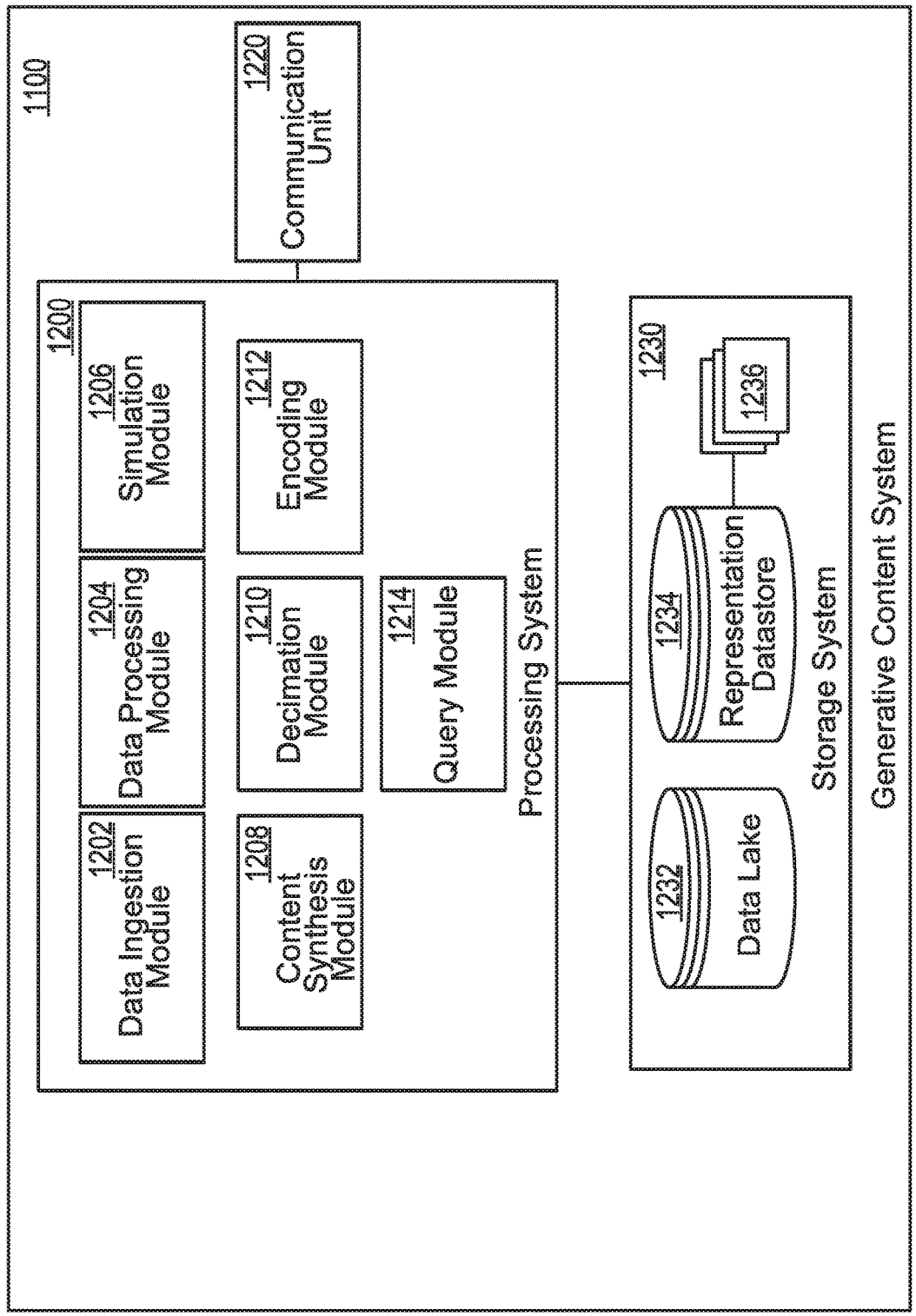
FIG. 20 depicts a schematic illustrating an example set of components of a generative content system.

FIG. 20 illustrates an example configuration of a generative content system 1100 and the components thereof. In the illustrated example, the generative content system 1100 includes a processing system 1200, a communication system 1220, and a storage system 1230. The generative content system 1100 can include other components without departing from the scope of the disclosure.

The processing system 1200 may include one or more processors and memory. The processors may operate in an individual or distributed manner. The processors may be located in the same physical device and/or location, or may be distributed across multiple devices and/or locations. The memory may store computer-executable instructions that are executed by the one or more processors. In embodiments, the processing system 1200 may execute a data ingestion module 1202, a data processing module 1204, a simulation module 1206, a content synthesis module 1208, a decimation module 1210, an encoding module 1212, and a query module 1214.

The communication system 1220 may include one or more transceivers that are configured to effectuate wireless or wired communication with one or more external devices. The communication system 1220 may implement any suitable communication protocol. The communication system 1220 may implement, for example, the IEEE 801.11 wireless communication protocol and/or any suitable cellular communication protocol to effectuate wireless communication with external devices via a wireless network. The communication system 1220 may implement wired communication protocols, such as suitable LAN protocols.

The storage system 1230 may include one or more computer-readable storage mediums. Computer-readable storage mediums may include flash devices, solid-state memory devices, hard disk drives, and the like. The storage mediums may be located in the same physical device and/or location, or may be distributed across multiple devices and/or locations. In embodiments, the storage system 1230 stores a data lake 232 and a representation datastore 1234. The data lake 232 stores raw data collected by the data ingestion module 1202. The raw data may include metadata, such as a type of data, the source of the data, and the time at which the data was collected.

In embodiments, the representation datastore 1234 stores virtual representations 1236 of respective environments generated by the generative content system 1100 and based in part on data relating to the respective environments collected from various data sources. The representation datastore 1234 may include one or more databases, indexes, tables, files, and the like. In embodiments, a representation 1236 may include a graph having a plurality of nodes, whereby a node may represent objects in the environment, including objects that may have been synthesized based on ingested data. A node may store properties of the object, including relationship data that indicates relationships with other nodes (e.g., parent or child). In some embodiments, the types of relationships are defined in accordance with a customized ontology relating to a type of environment. For example, an ontology defining the permissible objects and relationships of a city may require that stop sign nodes can only be a child node of different types of roadways, such that a specific stop sign node can only relate to one roadway node. In embodiments, the ontology may also define properties of different objects that may be included in a representation. In some of these embodiments, a property of an object may be defined in a related node, where the related node defines a type of property and a property value. In embodiments, the various nodes in a representation may store data relating to the object represented by the node, including a node identifier, a node type defining the type of object and/or property represented by the node, relationships of the node, and/or any other suitable metadata. In embodiments, relationships may be defined as edges in the graph, whereby an edge may store data including an edge identifier, the type of relationship represented by the edge, and the nodes that are connected by the edge. In embodiments, the edges may be directed, thereby providing the context of the relationship (e.g., A→B, B←A, or A→←B).

In embodiments, the representation datastore 1234 may be a multi-dimensioned partitioned database. In some of these embodiments, the representation datastore 1234 is configured to manage volumes and/or spatial occlusions. In embodiments, the stored representations 1236 may include various levels of detail for respective portions of a representation, whereby respective nodes representing an object at different levels of detail contain different sets of properties. For example, in a graphical representation of a system such as a city, a node of a building may include a first set of properties corresponding to a first level of detail (e.g., when the building is depicted from a "nearby" position) and a second node of the same building may include a second set of properties corresponding to a second level of detail when viewed from a "far away" position. The representation datastore 1234 may further store metadata corresponding to the representation and the respective portions thereof. For example, the metadata may include a viewing angle of a portion of the representation, level of detail indicators of a portion of the representation, encoding data indicating the types of encoding used to encode portions of the representation, and the like. In embodiments, metadata relating to a particular node may be stored in the node.

The data ingestion module 1202 is configured to acquire data from one or more data sources (e.g., data sources 1104 from FIG. 19). Data sources may include any suitable devices or systems that capture and/or store data. Data sources may include websites, news articles, publically available databases (e.g., municipality databases, product databases, building permit databases, and the like), maps, video camera feeds, audio feeds, user devices, data collection devices, IoT devices and sensors, LIDAR devices, radar devices, and the like. In operation, a developer may define one or more data sources from which the data ingestion module 1202 is to collect data. The data ingestion module 1202 receives the data from the respective data sources using any suitable techniques (e.g., crawlers, API, data streams, and the like) and tags the data with metadata. The data ingestion module 1202 can tag the received data with an identifier of the data source, a type of the data, a time at which the data was acquired, and the like. The data ingestion module 1202 can store the tagged raw data in the data lake 232.

It is noted that the data ingestion module 1202 can collect data at any suitable frequency (e.g., continuously, according to a schedule, randomly, when a data source is updated, and the like). The data can be partially complete and/or have errors in it. Thus, in embodiments, the data ingestion module 1202 (and other modules) execute one or more algorithms to clean up and manage the ingested data. In this way, data sets can be added over time and the quality, resolution and/or frequency of the updates can be improved over time. In some embodiments, the data input processes which are associated with a type of raw input can be specified in LLVM IR ("intermediate representation") or other executable models, which can be marshalled by the ingestion module 1202 to act on the incoming data (e.g., statistically process, temporally filter, spatially filter, and/or combine the incoming data).

In embodiments, the data processing module 1204 operates on the raw data collected by the data processing module 1204 and/or stored in the data lake 232 to generate abstract instances (e.g., nodes) of classes with properties that can connect to one another in a data structure (e.g., a hierarchical graph). In embodiments, the data processing module 1204 spatially and/or temporally arranges the abstract instances, such that the abstract instances can be arranged in a data structure (e.g., a data structure partitioning items with up N-dimensional axes, nested squares forming a quad tree, cubes forming an oct tree, tesseracts forming a hyper tree, and the like).

In embodiments, the data processing module 1204 implements one or more class-specific executable classes that analyze the ingested raw data to determine a source of the data and/or a type of the data. Each respective class-specific executable class may be configured to perform class-specific operations, such as identifying a particular type of data, and in response to determining the data type class-specific analysis of the data. For example, a class-specific executable class may receive a video feed and identify the video feed as being a video of a particular building in a city that is being modeled. In this class-specific executable class may be configured to identify a color of the building, a texture of the building, a size of the building, and the like. In this example, the class-specific executable class may include one or more machine-vision modules that analyze the video feed to identify the properties of the building. In embodiments, the class-specific executable classes may be included/provided by a user (e.g., developer or system architect) and may define, for example, the types of data being identified, properties to be extracted from the data, a structure of an abstract instance (e.g., node) that is generated by the class-specific executable class, and one or more functions, algorithms, and/or processes to process the raw data.

In embodiments, the data processing module 1204 connects related abstract instances (e.g., nodes) to generate the abstract representation (e.g., a graph) based on the properties defined in the abstract instances. In embodiments, the class-specific executable classes may be further configured to identify relationships between abstract classes and to define those relationships in the properties of the abstract instances. For example, a building may have a brick surface. In this example, the data processing module 1204 may generate a first node corresponding to the building and a second node corresponding to the brick surface. Furthermore, the data processing module 1204 may determine that the brick surface is the surface of the building. In this scenario, the data processing module 1204 may define a relationship property in one of or both the first node and the second node, thereby indicating an edge in the graph. The data processing module 1204 can connect any nodes that it determines are related, thereby creating an abstract representation 1236 of the object/environment/system being modeled.

In some embodiments, the class-specific executable classes can be specified in LLVR IR or other executable models, which can be marshalled by the data processing module 1204 to act on the processed input and create N nodes with properties that can be connected to other nodes with properties in a tree structure (e.g., a directed acyclic graph). In embodiments, the nodes may also be partitioned in N (e.g., N=4) dimensions based on the nodes properties (such as time and x,y,z location). In embodiments, the data processing module 1204 is configured to batch process the raw data, so as to scale the process and contribute transactions to a shared representation.

The simulation module 1206 may perform conformance simulation to generate an abstract representation that converges to one or more fitness criteria. The fitness criteria may be defined by a user (e.g., developer or system architect) and may have many arbitrary weighted elements associated with the node hierarchy and classes. During this process, the simulation module 1206 may connect nodes that should have been connected but were not connected previously, while correcting or removing errors in the abstract representation. In embodiments, the simulation module 1206 may implement one or more domain-specific algorithms that ensure criteria specific types of data conform to one or more criteria and/or one or more domain-specific rules for correcting detected errors. For example, in analyzing data relating to a building, a building that is taller than 5,000 feet may be deemed an obvious error and the building properties in a building node may be corrected to be less than 3000 feet. In another example, in generating an abstract representation of a human face, a scenario where one eye is five times larger than the other eye may be deeded an obvious error, and the simulation module 1206 may adjust the properties of an eye node so that the eyes are equally sized and in proportion with the rest of the elements related to a face node. In another example, a data set of road centerlines may be collected by the data ingestion module 1202, where the data set includes the number of lanes. In this example, a minor road centerline may join a major road centerline without a controlled intersection (e.g. no traffic lights). In this example, the simulation module 1206 may define the objects (and properties thereof) defining a road intersection surface and markings in contact with a ground plane according to a class-dependent algorithm. The simulation module 1206 may also add a stop sign node, if the class-dependent algorithm is configured to converge the intersection as such.

In embodiments, the simulation module 1206 may ensure that nodes that are connected are in dimensional proximity. The graph may be iterated over multiple times using the set of class dependent algorithms to ensure that the graph converges on the set of fitness criteria. The class-dependent algorithms can be specific to a given class or class hierarchy and act at different levels of detail on the graph. The class-dependent algorithms may alter a node's properties based on the class and properties of the current node, its parent nodes, children nodes, and/or sibling nodes. In embodiments, the class-dependent algorithms may prune or create new nodes (also referred to as "simulated nodes"), as required to have the abstract representation converge on the set of fitness criteria. As the simulation module 1206 generates simulated nodes, or alters or adds to the properties of a preexisting node, the simulation module 1206 may generate simulated data (also referred to as "simulated content") and may add the simulated data to the properties of the nodes. For example, if the simulation module 1206 is generating a simulated window node in response to determining that the abstract instance representing a residential building does not include a window, the simulation module 1206 may generate the following properties: a type of the simulated node (e.g., "window"), the size of the window, a shape of the window, a position with respect to the building to which the window is "connected," and other suitable properties of the node. In this example, the position with respect to the building may be defined as a relationship between the window and the residential building. In embodiments, the properties may be represented in nodes as well, which are related to the generated node. In an example the simulation module 1206 may identify the nodes connected to the building node (e.g., using a 2-edge breadth-first search of the graph in relation to the building node) and determine that the building has no screws (e.g., no screw nodes). The simulation module 1206 may then generate screw nodes, and the corresponding properties of the screw nodes. Furthermore, the simulation module 1206 may determine the appropriate spacing between screws in a building (e.g., from a retrieved building code of the city) and may define the properties in the respective screw nodes such that the screws are aligned in accordance with the appropriate spacing. Furthermore, the simulation module 1206 may connect the screw nodes to the appropriate parent nodes (e.g., wall nodes, window nodes, and the like).

As the simulation module 1206 generates simulated nodes and/or edges (e.g., simulated objects, properties, and/or relationships therebetween), the simulation module 1206 may connect the simulated nodes to the other nodes in the graph, including to other simulated nodes. In this way, the simulation module 1206 may update the abstract representation. As the simulation module 1206 updates the abstract representation, as defined by the class-dependent algorithms, the simulation module 1206 may determine whether the abstract representation is converging on the fitness criteria. The simulation module 1206 may continue to iterate in the manner until the abstract representation converges to the one or more fitness criteria.

The conformance process, by way of adding simulated nodes and simulated data to the abstract representation, results in abstract representations that are more densely populated. In embodiments, a densely populated abstract representation allows faster, more centralized computation, and simulation and conformance passes may be completed before the actual content is synthesized in a computationally distributed manner (e.g. actually making the vertexes for the 3D representation of the road and signs).

In some embodiments, the conformance processes, which may be associated with a class under simulation, can be specified in LLVM IR or other executable models which can be marshalled by the simulation module 1206 to act on the graph and update, delete or create nodes and update, delete or create node properties as a result of the execution.

In embodiments, the content synthesis module 1208 generates a literal representation of the ingested data based on the abstract representation (e.g., the graph). Once conformance is completed to the degree of fitness is required, the content synthesis module 1208 is configured to generate synthesized content (or "generated content") based on the nodes from the graph. In embodiments, the content synthesis module 1208 can generate a literal representation based on the synthesized content. The literal representation is a digital representation of the object/environment to which the ingested data pertains. For example, in a digital representation of a city, the literal representation includes the buildings, roads, trees, and landscapes that make up the city, and in particular, the shapes, meshes, polygons, and other visual elements that make up the buildings, roads, trees, and landscapes. Furthermore, within individual elements, such as a building, subcomponents of the building may be represented with pipes, frames, beams, and the like. In some embodiments, synthesized (or generated) content can refer to data that is created by the content synthesis module 1208 (or any other suitable module) for inclusion in the literal representation. For example, in generating a literal representation of a city, the abstract representation (e.g., graph) may include nodes of a building, which may be connected to sub-nodes corresponding to walls, doors, pipes, windows, fire escapes, and the like. The content synthesis module 1208 may be configured to generate synthesized content in any suitable manner. For instance, the content synthesis module 1208 may implement localized graph operations, procedural rules, simulations, a libraries of templates/lookup tables, AI models and genetic algorithms to identify gaps (e.g., incomplete data) in the abstract representation, to create the content at the maximum quality, and insert the synthesized content in the abstract representation (e.g., by connecting new nodes to previous nodes). In embodiments, the generated content can be outputs like data, geometry, and/or textures.

For each node in the literal representation, the content synthesis module 1208 may associate a content item corresponding to the object represented by a respective node and may connect the content items based on the connections between nodes. For instance, if a building node is connected to a sidewalk node, the content synthesis module 1208 may associate an appropriate representation of a building with the building node and an appropriate representation of a sidewalk with the sidewalk node. The content synthesis module 1208 may further connect the bottom of a content item representing a building to the surface of a content item representing the sidewalk. In doing so, the content synthesis module 1208 may further execute one or more convergence processes to ensure that the synthesized content, as well as the connections between the synthesized content, adhere to one or more domain-specific conditions. For example, in generating a literal representation of a sound wave traveling through an environment, an example condition could require that the speed of a sound wave (which is a content item) can never exceed the speed of sound, upon the content item being connected to the environment. In another example, in generating a literal representation of a cityscape, a domain-specific condition may require that an edge of a building must be in contact with a sidewalk, parking lot, or grassy expanse (e.g., a yard or park). To the extent this domain-specific condition is not met, the content synthesis module 1208 may adjust preexisting content, generate new content, and/or delete content, so as to converge with respect to the domain-specific condition and/or properties defined in the abstract representation. The content synthesis module 1208 may iterate in this manner until the literal representation converges with respect to the domain specific rules and/or the properties defined in the abstract representation (e.g., until the sound wave is traveling less than the speed of sound; until the bottom edge of the building is in contact with a sidewalk, parking lot, or grassy expanse).

In embodiments, the content synthesis module 1208 may generate the literal representation such that the literal representation is suitable to be distributed, which improves the representation's performance computationally and/or storage-wise. In embodiments, the literal representation may distributed via the partitioning scheme. This allows multiple sparse data sets to be generated for processing, whereby edge nodes in the partition scheme may be marked only for use for specific computations. For example, in visual applications, certain content items may not be used to render a larger content item when the larger item is being displayed far away from a point of view, but may be used to render the larger content item when the larger item is being viewed from a close up point of view. In embodiments, it is possible to distribute content synthesis, as the local copy of the graph needs only have some nodes marked for actual content generation. In embodiments, the synthesis processes which are associated with a class can be specified in LLVM IR or other executable models which can be marshalled by the content synthesis module 1208 to act on the graph nodes, and to generate, copy and parametrize N-types of content which is then associated with the node.

In embodiments, the content synthesis module 1208 may be configured to clean up and/or anneal the literal representation. In some of these embodiments, the content synthesis module 1208 can execute a set of specialized conformance processes (broadly termed "clean up" and "annealing") that may operate at the class, content type, spatial and/or temporal level. For example, depending on the type of literal representation, the content synthesis module may split polygons, add and align vertexes in spatially proximate meshes (e.g., where a lower resolution ground plane meets a sidewalk surface), normalize an envelope when combining two generated audio signals, or any other suitable task.

In embodiments, the content synthesis module 1208 may be configured to distribute the clean-up and annealing processes, as the local copy of the graph needs only have some nodes marked for actual content generation. The clean-up and annealing processes that are associated with a respective class can be specified in LLVM IR or other executable models that can be marshalled by the content synthesis module 1208 to act on one or more content items. The content items can identified by the type of content, properties of the content itself, the nodes properties or the association of other nodes, and their properties and content which are connected via hierarchy or partitioning as defined by the process.

In embodiments, the decimation module 1210 may execute a set of specialized decimation processes with respect to the literal representation. The specialized decimation processes are highly specific to the type of content being decimated and the levels of detail required for the content. Decimation may refer to a process in which the literal representation (or a portion thereof) is partitioned according to one or more properties of the literal representation (or the portion thereof) and the resultant partitions are defined at various levels of detail or specificity. For example, in performing a specialized decimation process specific to a city representation, the decimation module 1210 may partition the city into subsections of the city (e.g., individual blocks of the city, or individual structures, such as roads, buildings, and the like). The decimation module 1210 may then, for each individual structure (or group of structures), determine the manner in which each individual structure (or group of structures) will be displayed at various levels of details. For example, from far away a building may appear as a silhouette with very little detail and from closer views, subcomponents of the buildings may be displayed, such as windows, bricks, doorways, signage, and the like. In another, non-visual example, when an application is running a simulation on a data set that does not require a fine granularity, the data set may be represented by five significant digits, but when the application is running a different simulation that requires a fine granularity, the data set may be represented by 500 significant digits. The decimation module 1210 may utilize the properties of the nodes corresponding to the content items, and the relationships between the nodes to decimate the literal representation in accordance with the specialized decimation processes.

In embodiments, the decimation module 1210 may distribute the decimation process, as only the current piece of content being processed is required for decimation. In embodiments, similar types of content are processed together, to improve with the encoding process discussed below. The decimation processes, which are associated with a specific type of content, can be specified in LLVM IR or other executable models which can be marshalled by the decimation module 1210 to act on this content for each level of detail required. The output of a respective decimation process may be a simplified/quantized/transformed and/or empty piece of content for each level of detail, based on the simplification rules encoded in the respective decimation process.

In embodiments, the encoding module 1212 may encode the literal representation (and/or portions thereof) at various levels of detail. In embodiments, the encoding process may include one or more content-specific encoding processes and/or general encoding/compression processes. A content-specific encoding process may be an encoding process that is specific to the type of content being encoded and/or that applies a particular type of encoding or compression. For example, encodings of city structures may be encoded using a first content-specific encoding process, while roadways may be encoded using a second content-specific encoding process. In embodiments, the encoding module 1212 may distribute this process. In some embodiments, content specific coherent batch execution is recommended as this may be more efficient and may also allow for inter-content techniques, such as a shared texture atlas or building a statistical model for a lookup table.

In embodiments, the encoding processes which are associated with a specific type of content and level of detail may be specified in LLVM IR or other executable models, which can be marshalled by the encoding module 1212 to encode the content. In some of these embodiments, the encoding module 1212 outputs the encoded representation in the GKL format. The encoding module 1212 may, however, output the encoded representation in any other suitable format. Once encoded, the encoding module 1212 may output the encoded representation to the representation datastore 734. In embodiments, the representation 1234 includes a multi-dimensioned partitioned database. In some of these embodiments, the multi-dimensioned partitioned database is configured to manage volumes and/or spatial occlusions.

In embodiments, the query module 1214 receives queries from external systems (e.g., an application system 108) and/or client devices 106 and responds to queries with content corresponding to the request. In this way, the multi-dimensional partitioned database can be queried remotely. For example, the query module 1214 may receive a multi-dimensional query (e.g., an x, y, z location and a viewing angle, or an x, y, z, location and a time), and the query module may retrieve the relevant content from the multi-dimensional partitioned database based on the query. The query module 1214 may packetize and transmit the retrieved content to the requesting device or system. In embodiments, the query module 1214 supplies the packets in the order of importance. For instance, packets corresponding to the front of the frustum may be delivered before packets corresponding to the back of the frustum, where the frustum is the field of view given the current orientation. In embodiments, the query module 1214 may supply the content at various levels of detail and taking into account occlusions. In embodiments, the remote device or system can also query the multi-dimensional database with more abstract queries depending on the type of rendering required as the content may include, for example, time series data, or simulations of particle interactions.

In embodiments, the local client device 1106 can cache the received content most lazily, and the resulting data from unpacking the content can be cached more aggressively. This reduces bandwidth and re-computing content which is in view in subsequent frames. This may allow for higher frame rates. In embodiments, LOD cached content may be queried and downloaded to a device 1106 with only the compressed representation transmitted for the current point of view. This makes it possible to view a whole city in 3D from a smartphone in real time at 60 fps in stereo, and be able to zoom right into the detailed structure of an individual building to the level of individual bolts attaching two steel beams together inside the structure. Importantly geometry is not just a shell, but can be representative of the detailed structure, power, and plumbing within the building A client user device 1106 receives the requested content in response to a query and, in some embodiments, displays the literal representation based on the received encoded content. In embodiments, the client user device 1106 executes the received content in a virtual machine. In embodiments, the client user device may implement one or more specialized decoders to decode the encoded content. The decoder that is used may be determined based on the specific class of the content and whether the content can be executed on a CPU or a GPU. Examples of decoders include SE (Spline Extraction) designed to unpack smoothly varying time series data such as joint angles on the CPU, or TS (Texture Synthesis) and GML (Generative modelling language) both designed to be executed on the GPU.

In embodiments, the components of the generative content system 1100 and/or the client user device 1106 may implement a generative kernel language (GKL) to retrieve, display, and manipulate the literal representation. In embodiments, the GKL is encoded (not compiled) into a compact machine-readable form. One goal of the generative process is to be able to extract class-specific data and instructions.

This is more than a file format, as the GKL also allows for parametric expansion, conditions, loops and method calls. In embodiments, the GKL minimal command set may support if statements and loops, and may include the following commands:
[value]=CALL ([method name],[parameter1], [parameter2] . . . )
INCLUDE ([shared resource name])
[value]=EXTRACT ([resource name])
[value]=REPLACE ([source],[expression])
[value]=READ ([property name])
These commands may provide a flexible runtime processing backbone and data marshalling layer, which is able to manage multi step processes. In embodiments, method "call" command may be designed such that any engine registered extraction methods can be called (and are parameter checked before execution). These methods are where a majority of the workload will be performed. These methods can be executed on a CPU, GPU, or a combination as determined by the implementation. All of the marshalling of parameters to these methods will be managed by the GKL runtime. In embodiments, it is possible to include a shared resource such as lookup tables or texture atlases. A resource can be extracted from the "include" command, or from the set of items packed into the current GKL. The "replace" command is similar to a regex, but allows for quite sophisticated patterns to be matched and pieces to be replaced with properties or variables supplied. In embodiments, properties can be read from the node which was associated with this GKL. This is very common as these properties usually act to conditionally branch, repeat or parameterize the methods to be called. In embodiments, typed variables, standard expressions, and mathematical operators are also included in the GKL, but there are no concepts of subroutines or classes.

An example of how a GKL instruction set can work may be a synthesized texture. For example, a standard JPG header may be imported and extracted with the appropriate dimensions replaced with properties. A block of image data may then be extracted from this GKL. These can then be concatenated and passed as parameters to a call to the JPG_DECODER method, which will in turn generate an RGB texture of the required dimension. This texture can then be passed along with a blending property to the IMG_BLEND method, which will combine this with an imported stone texture. The blended texture can then be passed along with the GKL resource ID to the ATLAS_INSERT method to be added to the global texture atlas.

Figure 21:
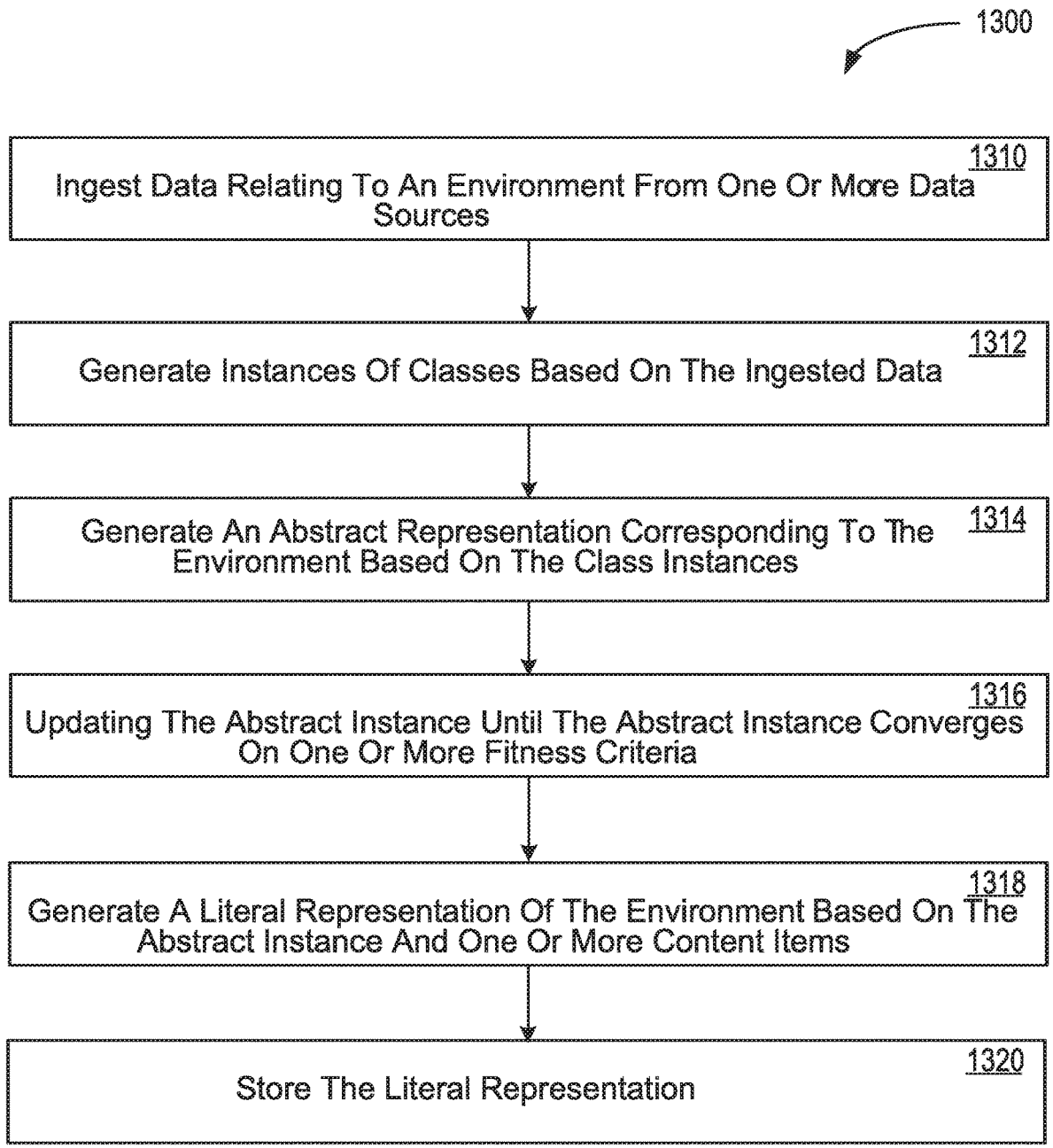
FIG. 21 depicts a flow chart illustrating an example set of operations of a method for generating a literal representation of an environment.

FIG. 21 illustrates an example set of operations of a method 1300 for generating a literal representation of an environment. The literal representation may be a visual representation and/or a data representation of the environment. In embodiments, the method 1300 may be executed by one or more processors of the generative content system 1100. The method 1300 may be executed by other suitable systems without departing from the scope of the disclosure. For purposes of disclosure, the method is described with respect to the generative content system 1100.

At 1302, the generative content system 1100 ingests data from one or more data sources. Data sources may include any suitable devices or systems that capture and/or store data, including but not limited to websites, news articles, publically available databases (e.g., municipality databases, product databases, building permit databases, and the like), maps, video camera feeds, audio feeds, user devices, data collection devices, IoT devices and sensors, LIDAR devices, radar devices, and the like. The generative content system 1100 receives the data from the respective data sources using any suitable techniques (e.g., crawlers, API, data streams, and the like) and tags the data with metadata. The data ingestion module 1202 can tag the received data with an identifier of the data source, a type of the data, a time at which the data was acquired, and the like. The generative content system 1100 may collect the data continuously, according to a schedule, randomly, when a data source is updated, and the like. The data can be partially complete and/or have errors in it. Thus, in embodiments, the generative content system 1100 execute one or more algorithms to clean up and manage the ingested data. In this way, data sets can be added over time and the quality, resolution and/or frequency of the updates can be improved over time.

At 1304, the generative content system 1100 generates instances of classes based on the ingested data. In some embodiments, the instances of classes are node data structures that may be connected to form a graph. In some of these embodiments, the generative content system implements one or more class-specific executable classes that analyze the ingested raw data to determine a source of the data and/or a type of the data. Each respective class-specific executable class may be configured to perform class-specific operations, such as identifying a particular type of data, and in response to determining the data type class-specific analysis of the data. For example, a class-specific executable class may receive a video feed and identify the video feed as being a video of a particular building in a city that is being modeled. In this class-specific executable class may be configured to identify a color of the building, a texture of the building, a size of the building, and the like. In this example, the class-specific executable class may include one or more machine-vision modules that analyze the video feed to identify the properties of the building. In embodiments, the class-specific executable classes may be included/provided by a user (e.g., developer or system architect) and may define, for example, the types of data being identified, properties to be extracted from the data, a structure of an abstract instance (e.g., node) that is generated by the class-specific executable class, and one or more functions, algorithms, and/or processes to process the raw data.

At 1306, the generative content system 1100 generates an abstract representation based on the abstract instances. In some embodiments, the abstract representations are connected graphs, where the nodes represent objects and the edges in the graph that connect two nodes represent relationships between the objects represented by the two connected nodes. In embodiments, the class-specific executable classes may be further configured to identify relationships between abstract instances and to define those relationships in the properties of the abstract instances. The generative content system 1100 can connect any nodes that it determines are related, thereby creating an abstract representation of the object/environment/system being modeled.

At 1308, the generative content system 1100 may update the abstract representation until the abstract representation converges on a set of fitness criteria. The simulation module 1206 may perform conformance simulation to generate an abstract representation that converges to one or more fitness criteria. The fitness criteria may be defined by a user (e.g., developer or system architect) and may have many arbitrary weighted elements associated with the node hierarchy and classes. During this process, the generative content system 1100 may connect nodes that should have been connected but were not connected previously, while correcting or removing errors in the abstract representation. In embodiments, the generative content system 1100 may implement one or more domain-specific algorithms that ensure criteria specific types of data conform to one or more criteria and/or one or more domain-specific rules for correcting detected errors. In an example, a data set of road centerlines may be collected by the generative content system 1100, where the data set includes the number of lanes. In this example, a minor road centerline may join a major road centerline without a controlled intersection (e.g. no traffic lights). In this example, the generative content system 1100 may define the objects (and properties thereof) defining a road intersection surface and markings in contact with a ground plane according to a class-dependent algorithm.

In embodiments, the generative content system 1100 may ensure that nodes that are connected are in dimensional proximity. The graph may be iterated over multiple times using the set of class dependent algorithms to ensure that the graph converges on the set of fitness criteria. The class-dependent algorithms can be specific to a given class or class hierarchy and act at different levels of detail on the graph. The class-dependent algorithms may alter a node's properties based on the class and properties of the current node, its parent nodes, children nodes, and/or sibling nodes. In embodiments, the class-dependent algorithms may prune or create new nodes (also referred to as "simulated nodes"), as required to have the abstract representation converge on the set of fitness criteria. As the generative content system 1100 generates simulated nodes, or alters or adds to the properties of a preexisting node, the generative content system 1100 may generate simulated data (also referred to as "simulated content") and may add the simulated data to the properties of the nodes.

As the generative content system 1100 generates simulated nodes and/or edges (e.g., simulated objects, properties, and/or relationships therebetween), the generative content system 1100 may connect the simulated nodes to the other nodes in the graph, including to other simulated nodes. In this way, the generative content system 1100 may update the abstract representation. As the generative content system 1100 updates the abstract representation, as defined by the class-dependent algorithms, the generative content system 1100 may determine whether the abstract representation is converging on the fitness criteria. The generative content system 1100 may continue to iterate in the manner until the abstract representation converges to the one or more fitness criteria.

At 1310, the generative content system 1100 generates a literal representation of the environment based on the abstract representation and one or more content items. In embodiments, the generative content system 1100 may generate synthesized content (or "generated content") based on the nodes from the graph, which is used to generate the literal representation. The generative content system 1100 may generate synthesized content in any suitable manner. For instance, the generative content system 1100 may implement localized graph operations, procedural rules, simulations, a libraries of templates/lookup tables, AI models, and/or genetic algorithms to identify gaps (e.g., incomplete data) in the abstract representation, to create the content at the maximum quality, and insert the synthesized content in the abstract representation (e.g., by connecting new nodes to previous nodes). In embodiments, the generated content can be outputs like data, geometry, and/or textures.

For each node in the literal representation, the generative content system 1100 may associate a content item corresponding to the object represented by a respective node and may connect the content items based on the connections between nodes. In connecting content items, the generative content system 1100 may further execute one or more convergence processes to ensure that the synthesized content, as well as the connections between the synthesized content, adhere to one or more domain-specific conditions. To the extent a domain-specific condition is not met, the generative content system 1100 may adjust preexisting content, generate new content, and/or delete content, so as to converge with respect to the domain-specific condition and/or properties defined in the abstract representation. The generative content system 1100 may iterate in this manner until the literal representation converges with respect to the domain specific rules and/or the properties defined in the abstract representation.

At 1312, the generative content system 1100 may store the literal representation. In embodiments, the literal representation may be stored in a multi-dimensioned data base. In some embodiments, storing a literal representation may include partitioning the literal representation. In embodiments, storing a literal representation may include cleaning and annealing the literal representation. In some of these embodiments, the generative content system 1100 can execute a set of specialized conformance processes (broadly termed "clean up" and "annealing") that may operate at the class, content type, spatial and/or temporal level. For example, depending on the type of literal representation, the content synthesis module may split polygons, add and align vertexes in spatially proximate meshes (e.g., where a lower resolution ground plane meets a sidewalk surface), normalize an envelope when combining two generated audio signals, or any other suitable task.

In some embodiments, storing the literal representation may include decimating the literal representation. Decimation may refer to a process in which the literal representation (or a portion thereof) is partitioned according to one or more properties of the literal representation (or the portion thereof) and the resultant partitions are defined at various levels of detail or specificity. The decimation process may be a specialized process that is tailored for the type of content that is to be decimated. For example, in performing a specialized decimation process specific to a city representation, a partitioned literal representation of the city may be partitioned into subsections of the city (e.g., individual blocks of the city, or individual structures, such as roads, buildings, and the like). The generative content system 1100 may, for each individual structure (or group of structures), determine the manner in which each individual structure (or group of structures) will be displayed at various levels of details. For example, from far away a building may appear as a silhouette with very little detail and from closer views, subcomponents of the buildings may be displayed, such as windows, bricks, doorways, signage, and the like. In another, non-visual example, when an application is running a simulation on a data set that does not require a fine granularity, the data set may be represented by five significant digits, but when the application is running a different simulation that requires a fine granularity, the data set may be represented by 500 significant digits. The generative content system 1100 may utilize the properties of the nodes corresponding to the content items, and the relationships between the nodes to decimate the literal representation in accordance with the specialized decimation processes.

In embodiments, storing the literal representation may include encoding the literal representation. In embodiments, the encoding process may include one or more content-specific encoding processes and/or general encoding/compression processes. A content-specific encoding process may be an encoding process that is specific to the type of content being encoded and/or that applies a particular type of encoding or compression. For example, encodings of city structures may be encoded using a first content-specific encoding process, while roadways may be encoded using a second content-specific encoding process. In embodiments, the encoding processes which are associated with a specific type of content and level of detail may be specified in LLVM IR or other executable models. In some of these embodiments, the encoding module 1212 outputs the encoded representation in the GKL format. The encoding module 1212 may, however, output the encoded representation in any other suitable format. Once encoded, the encoding module 1212 may output the encoded representation to the representation datastore 734. In embodiments, the representation 1234 includes a multi-dimensional partitioned database. In some of these embodiments, the multi-dimensional partitioned database is configured to manage volumes and/or spatial occlusions.

In embodiments, the query module 1214 receives queries from external systems (e.g., an application system 108) and/or client devices 106 and responds to queries with content corresponding to the request. In this way, the multi-dimensional partitioned database can be queried remotely. For example, the query module 1214 may receive a multi-dimensional query (e.g., an x, y, z location and a viewing angle, or an x, y, z, location and a time), and the query module may retrieve the relevant content from the multi-dimensional partitioned database based on the query. The query module 1214 may packetize and transmit the retrieved content to the requesting device or system. In embodiments, the query module 1214 supplies the packets in the order of importance. For instance, packets corresponding to the front of the frustum may be delivered before packets corresponding to the back of the frustum, where the frustum is the field of view given the current orientation. In embodiments, the query module 1214 may supply the content at various levels of detail and taking into account occlusions. In embodiments, the remote device or system can also query the multi-dimensional database with more abstract queries depending on the type of rendering required as the content may include, for example, time series data, or simulations of particle interactions.

The method 1300 of FIG. 21 may include additional or alternative operations without departing from the scope of the disclosure. Once a literal representation is stored, the literal representation may be used for any suitable applications. For example, a literal representation comprised of visual content may be displayed as a 3D environment via a 2D screen or virtual reality display device, whereby a user may "traverse" the 3D environment and view various objects within the 3D environment from different points of view and at different levels of detail. In another example, a literal representation may be comprised of data points, such that the literal representation may be used for analytics and machine-learning tasks (e.g., training a machine learned model). The method may be applied to generate additional or alternative types of literal representations that may be used for any suitable applications.

Referring back to FIG. 20, in embodiments, the generative content system 1100 is configured to structure and generate content that is used in machine learning and/or artificial intelligence tasks. In some embodiments, the generative content system 1100 may collect, structure, and generate training data that is used to train machine learned models used in various types of systems. In these embodiments, the generative content system 1100 generates training data that supplements collected training data collected from one or more data sources 1104. The generative content system 1100 may then train the one or more models based on the combination of the collected data and the generated data. Furthermore, in some of these embodiments, the generative content system 1100 may utilize similar techniques when the model is being deploying (e.g., during classification) to improve the input data to a machine-learned model, which may improve the accuracy of the prediction/classification. For example, in embodiments, the generative content system 1100 may generate additional data points to supplement sampled data when the sampled data alone is not sufficient to provide a clear cut prediction/classification (e.g., two or more classifications have confidence scores above a threshold or no classifications have a confidence score above the threshold). In these embodiments, the generative content system 1100 may synthesize additional data based on the sampled data that was initially used as input to the model. The synthesized data may be included with the sampled data to produce a new input to the machine learned model, which may improve the accuracy of the prediction.

In example embodiments, the generative content system 1100 may be configured to train machine-learned classification models (e.g., random forests, support vector machines SVMs, neural networks, deep neural networks, recurrent neural networks, etc.) that are used to estimate a location of a client user device 1106 based on signal-related attributes (and other relevant attributes) recorded by the client user device 1106. In this way, these machine-learned classification models may be deployed to perform location-based services in areas that are not traditionally well served by traditional location techniques, such as inside buildings (e.g., hotels), parking structures, prison facilities, military bases, underground facilities, and the like. At deployment time, the generative content system 1100 (or another system that leverages the models generated at least in part by the generative content system 1100) may receive signal profiles from a client device 1106 indicating different networks that are detected by the client device (e.g., WIFI, cellular, Bluetooth, magnetic flux, and GPS networks that are detected and the signal strengths thereof), and may input the contents of the signal profile into the machine learned model. In embodiments, the machine learned model outputs one or more candidate locations and a confidence score for each candidate location. In some embodiments, the generative content system 1100 may be configured to resolve ambiguous location classifications. For example, when only one candidate location has a confidence score that exceeds a minimum threshold (e.g., $\geq 0.80$), the candidate location is selected as the confidence score. If, however, none of the candidate locations or more than one candidate locations have confidence scores that exceed the threshold, the generative content system 1100 can synthesize additional data points (e.g., synthesized signal strengths corresponding to one or more known networks) and may include the additional data points in the signal profile. In these embodiments, the data points from the updated signal profile may be used as input to the machine-learned model, which may output a new set of candidate locations and corresponding confidence scores.

Figure 22A:
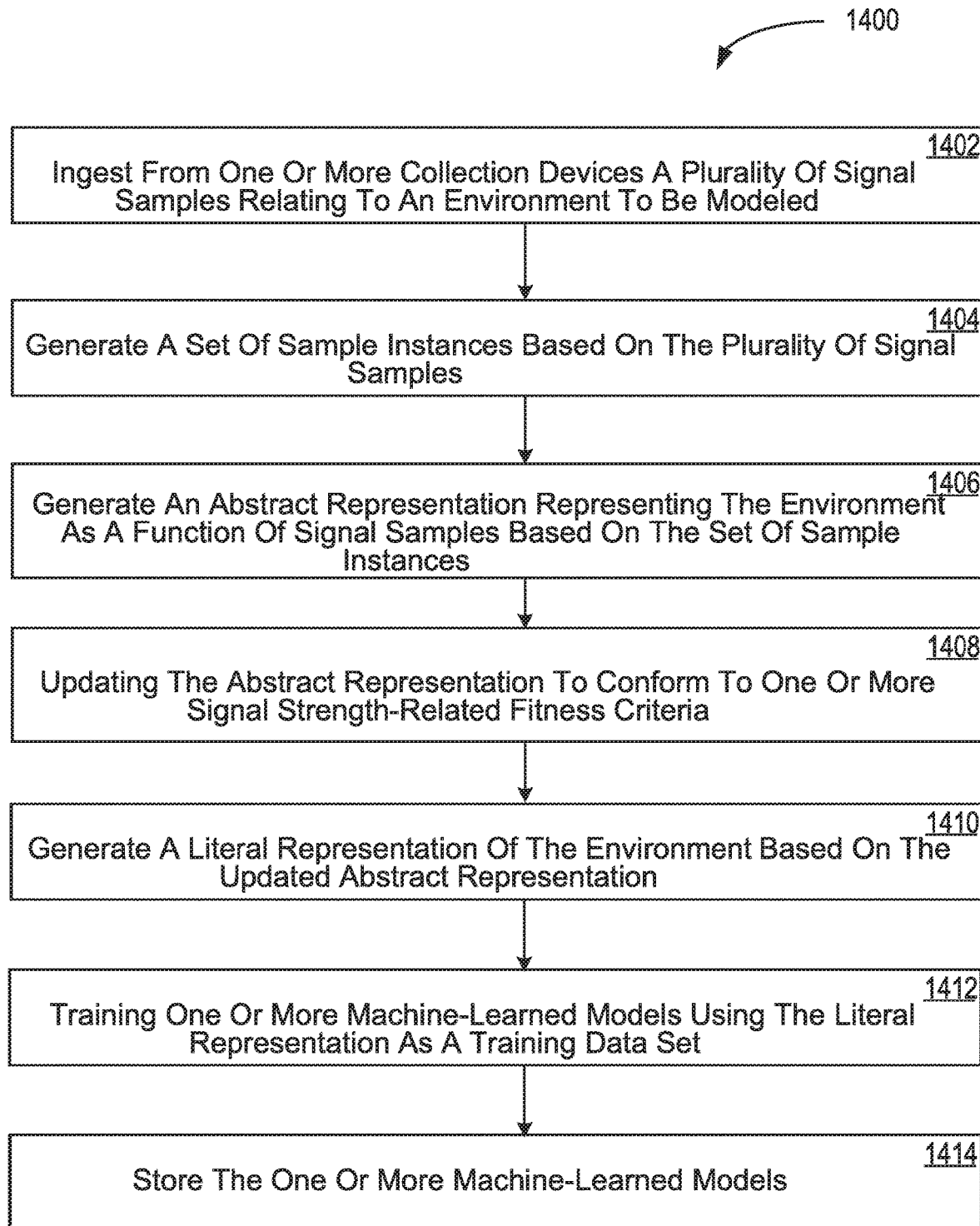
FIG. 22A depicts a flow chart illustrating an example set of operations of a method for training a location classification model based in part on synthesized content.

FIG. 22A illustrates an example set of operations of a method 1400 for training a machine learned model that is used to estimate a location of a client device based in part on synthesized content. The method 1400 is described with respect to the generative content system 1100. The method 1400, however, may be performed by other suitable systems. Furthermore, in some embodiments, the generative content system 1400 may perform some operations, while other operations may be performed by an affiliated system (e.g., a 3rd party application in communication with the generative content system 1100).

At 1402, the generative content system 1100 may receive samples captured by a set of data collection devices. A data collection device may be any portable device that has one or more types of communication capabilities (e.g., WIFI, LTE, Bluetooth, RF, and/or GPS). Each sample may be captured by a device at a particular snapshot in time and at a particular location. Each device may capture multiple samples at a single location, and in some cases, in temporal proximity to other samples while the device is at the same location (for example, a device may capture four samples at the same location over the course of one or two minutes). A sample may indicate one or more detected networks that are detected by the data collection device (e.g., SSIDs of detected WIFI networks, identifiers of detected 4G or 5G cellular networks, identifiers of detected Bluetooth networks or devices, identifiers of detected GPS satellites, and the like), respective signal strengths of the signals being received from the detected networks (e.g., signal strengths of available WIFI networks, available cellular networks, Bluetooth networks, and the like), the location or point of interest at which the sample was taken (e.g., geo coordinates of the location at which the sample was taken, a pin dropped on a map of the area, a predefined point of interest (e.g., ("outside the door of Room 2"), and/or an estimated location defined with respect to an original point of reference based on the outputs of one or more inertial sensors of the device), the device type and/or MAC address of the device that took the sample, a timestamp of the sample, and the like. In these examples, the data sources 1104 may be different user devices of different form factor, make, and/or model. For example, a data collector (human or robot) may move an iPhone®, a Google Pixel®, a Samsung® smartphone, a laptop computer, a WIFI enabled smart watch, and/or any other devices throughout a building (e.g., hotel, office building, airport, apartment building, prison complex, or dormitory), visiting every room or section of the building. In an example, the data collector may note the room number (or analogous identifier) and whether the collector was inside the room or outside the room, or even a particular part of the room. At each point of interest, each device may take one or more samples corresponding to any of the networks that are discoverable by the device. For example, each device may record the radio received signal strength (RSSI) of each detected WIFI network, each GPS satellite detected by a GPS module of the device, the strength of the 4G or 5G networks detected by the device, strength of Bluetooth signals from nearby devices, a current orientation of the device (e.g., output of a compass on the device, gyroscope, and/or accelerometer of the device), and the like. This may include noting the name and/or identifier (e.g., MAC address, Satellite identifier) of the network, the type of network, and the signal strength recorded.

The generative content system 1100 may collect multiple samples at various locations. For example, the generative content system 1100 may collect multiple samples inside a hotel room and outside the hotel room. Each sample may be collected at similar times, or at different times of the day. In embodiments, each device may attempt to collect as many samplings as many times as possible, to improve the statistical distributions of the samples. Also, the signal samples may be taken with different conditions (e.g., different temperatures, different humilities, with people walking through the hall, with an empty hall, with the room empty, with people in the room), as different conditions affect the measured signal strengths. In some embodiments, the generative content system 1100 may process the ingested samples. For example, the generative content system 1100 may generate a $4^{th}$ or $5^{th}$ order polynomial antennae response curve adjustments for each signal strength indicated in a sample. In another example, the generative content system 1100 may normalize each sample based on the device used to obtain a particular sample, so as to correct the response curve of the physical radio frequency hardware (e.g., device/antenna combination) to match the rest of the readings.

At 1404, the generative content system 1100 generates a set of abstract instances (e.g., nodes) corresponding to the plurality of samples. In embodiments, the generative content system 1100 may generate a respective node for each respective sample. In some of these embodiments, each node may have sub-nodes that define properties of the sample. In some embodiments, the generative content system 1100 executes domain-specific executable classes that identify the properties of each sample, including the properties of each detected network. For each sample, the generative content system 1100 may generate a sample node that is related to a set of sub-nodes, where the sub-nodes may correspond to the various detected networks and may, in turn, include properties defining a time stamp at which the network was sampled, a point of interest at which the network was sampled, and the strength of the signal that was detected at the point of interest. The sub-nodes may also include device nodes indicating the type of device that took the sample and/or other relevant properties of the device. In embodiments, the sampled data points are mapped into different data structures (e.g., types of nodes), including different partitions for different types of data (e.g., radio strength v. GPS location, and satellite count v. cellular signal strength v. Bluetooth signal strength). In embodiments, the generative content system 1100 may also generate similarity maps between clusters of MAC identifiers of detected network devices (e.g., Bluetooth devices or wireless routers) and link those similarity maps to latitude/longitude estimations (e.g., based on GPS or signal strength profiles) of the detected network devices and/or known points of interest on a map of the area being sampled (e.g., from a map of the hotel). In some embodiments, the generative content system 1100 may generate a sample node for each respective sample, and for each sample node, a set of sample sub-nodes corresponding to the individual data points received in the sample (e.g., a first sub-node for a first SSID and corresponding signal strength, a second sub-node for a second SSID and a corresponding signal strength, a third sub-node for a detected GPS satellite and an identifier thereof, a fourth sub-node for a detected cellular network and a corresponding signal strength, a fifth sub-node for a compass orientation, a sixth sub-node for a point of interest from which the sample was taken (e.g., "in front of Room 7"), a seventh sub-node for a time of day, etc.). It is noted that any suitable otology may be implemented to structure the hierarchy of nodes and sub-nodes, and the relationships there between.

At 1406, the generative content system 1100 generates an abstract representation (e.g., a hierarchical graph or other data structure) that represents the environment (e.g., the building being sampled) as a function of signal samples based on a collection of nodes including the sample nodes, sub-nodes corresponding to the sample nodes, and any other relevant nodes (e.g., a set of nodes that describe the environment being sampled). In embodiments, the generative content system 1100 may execute a set of class-dependent algorithms (also referred to as class-dependent processes) on the collection of nodes to determine the connections (e.g., edges) in the graph. The connections in the graph may define relationships between two nodes (e.g., a sample node may be connected to a network node, thereby indicating that the network represented by the network node was indicated in the signal sample indicated by the sample node). Each time a class-dependent process identifies a relationship between two nodes (e.g., a relationship between the two objects represented by the nodes), the generative content system may connect the two nodes with an edge, where the edge may define the type of relationship between the two nodes. As the generative content system 1100 connects the nodes, the connected nodes form a graph (i.e., an abstract representation) that represents the environment being modeled.

At 1408, the generative content system 1100 may update the abstract representation to conform to one or more fitness criteria, including one or more signal strength-related fitness criteria. In embodiments, updating the abstract representation may include deleting one or more nodes that do not conform to the fitness criteria and/or modifying the values or properties of one or more nodes to provide conformance to the fitness criteria. In some embodiments, updating may include synthesizing one or more sample instances (e.g., synthesized sample nodes) and adding the one or more synthesized sample instances to the abstract representation. In some embodiments, synthesizing sample instances may include synthesizing properties of synthesized sample instances. For example, a synthesized sample node may include a set of sub-nodes that define properties of the synthesized sample such as different known networks (i.e., previously detected networks that were detected by one or more data collection devices), synthesized signal strengths of the known networks, a location corresponding to the synthesized sample (e.g., a point of interest, geo-coordinates, an x, y, z location defined with respect to a frame of reference, or the like), and other suitable properties.

In embodiments, the generative content system 1100 may execute various simulations on the abstract representations until the graph converges with respect to a set of fitness criteria. As discussed, this process may be referred to as conformance simulation. In embodiments, the simulations may be defined in the class-dependent algorithms, such that different simulations test different fitness criteria and may operate on different types of nodes and/or relationships between nodes. In some embodiments, the generative content system 1100 may modify the properties of nodes containing properties considered to be outliers or physically impossible from the graph and/or remove those nodes altogether from the graph, thereby cleaning the data for better classification. For example, if a measured signal strength corresponding to a particular network taken by a particular device is ten times higher than five other samples of the same signal strength, taken by the same device, and in temporal proximity to the five other samples, the generative content system 1100 may modify a signal strength property of the node corresponding to the outlier signal strength to reflect simulated data that indicates a more appropriate signal strength (e.g., an average of the five other sampled signal strengths), or may remove the outlier node altogether from the graph. The generative content system 1100 may further connect sample nodes to point of interest nodes, which may be in relation to the area being sampled. In some embodiments, the generative content system 1100 may synthesize sample nodes that represent synthesized samples, including properties of the synthesized samples. For example, in embodiments, a fitness criteria may require that each point of interest have a minimum number of samples attributed thereto. In this scenario, a particular point of interest may not have the requisite number of samples. In this example, the generative content system 1100 may synthesize enough sample nodes to satisfy the fitness criteria. In embodiments, the generative content system 1100 may use samples collected at the point of interest, as well as samples collected at other points of interest that are near the particular point of interest. For example, in the scenario where the particular point of interest is outside a door of a hotel room, the generative content system 1100 may use a collection of samples that were collected at the particular point of interest, inside the hotel room, outside the doors of the rooms to the left and right of the hotel room, from the door of the room directly above and/or below the hotel room, and the like. The generative content system 1100 may use different combinations of these samples to synthesize different sample nodes. For example, the generative content system 1100 may temporally group different samples based on when the samples were captured, and, for each temporal group, may extrapolate synthesized signal strengths of the detected networks based on the respective locations from which each sample was taken. Upon synthesizing the one or more samples, the generative content system 1100 may generate corresponding sample nodes, and in some embodiments, sub-nodes defining the properties of the synthesized sample. The generative content system 1100 may then connect the synthesized nodes to the graph (e.g., to a location node corresponding to the particular point of interest). The generative content system 1100 may iterate over the abstract representation (e.g., graph) any number of times to ensure the abstract instances (e.g., nodes) thereof and the relationships between those nodes converge to one or more fitness criteria.

At 1410, the generative content system 1100 generates a literal representation of the area being sampled based on the abstract representation. In the context of location-based services, the literal representation is not a visual representation, but rather a data model that may be used as a training data set. Thus, in some embodiments, the generative content system 1100 may synthesize content items (e.g., structured data sets) that represent the area being sampled as a function of the network-related properties and the devices that captured the network-related properties. For example, for each network-related node, the content generation system 100 may generate content items in the form of an ordered tuples that respectively indicate various properties of a detected network represented by the network-related node, whereby each ordered tuple may represent the properties of the detected network from a respective sample (whether synthesized or collected). For example, an ordered tuple corresponding to a detected node may include a network identifier of the detected network (e.g., a WIFI network or Bluetooth network), a point of interest, the signal strength of the detected network at the point of interest, a time stamp, a device type, a device MAC address, and/or other suitable data (e.g., temperature, humidity, etc.). In another example, an ordered tuple corresponding to a GPS-related sample may indicate a point of interest, a time stamp, a device type, a device MAC address, a list of detected GPS satellites, and the orientation of the GPS satellites with respect to the device. In embodiments, the generative content system 1100 may be configured to generate content items corresponding to different networks and/or different points of interest.

In embodiments, the generative content system 1100 may analyze the literal representation, including individual content items to determine any gaps in the literal representation (e.g., points of interest that may have been under sampled or not sampled). In these scenarios, the generative content system 1100 may generate one or more content items to enrich the literal representation. In doing so, the generative content system 1100 may utilize suitable techniques to synthesize the one or more content items. In embodiments, the generative content system 1100 can implement one or more algorithms to synthesize content items. For example, the generative content system 1100 may execute one or more rules-based algorithms that analyze particular partitions of the data model to determine whether any points of interest are missing data (e.g., devices at a point of interest on a particular floor typically detects a particular Bluetooth network, but there are content items where this reading is absent). Upon identifying the missing data points, such as a missing Bluetooth signal at a particular location, the generative content system 1100 may generate a data point that indicates a signal strength of a Bluetooth device measured at the particular location where the Bluetooth signal was deemed absent. The generative content system 1100 may utilize any suitable technique for generating missing data points, such as using a default value or using an average value determined using other collected samples. The generative content system 1100 may utilize rules-based and/or machine-learning techniques to generate the missing data points.

In embodiments, the generative content system 1100 may clean up and/or anneal the literal representation. In some embodiments, the generative content system 1100 may merge the generated data with the collected data and may process the data to improve the quality of the representation of the area. In embodiments, the generative content system 1100 may use the relationships established between clusters of MAC identifiers and various locations to clean and/or anneal the representation. In embodiments, the generative content system 1100 may utilize corrected and/or synthesized data to clean and/or anneal the representation of the area.

Upon generating a literal representation of an area being modeled (e.g., a multi-room structure such as a hotel), the generative content system 1100 may support location-based services (e.g., location estimation) on a client user device 1106 in the sampled area. In some embodiments, the literal representation of a sampled area may be a data set that is similar to the data collected in the data collection phase—that is, a collection of samples, including collected, modified, and/or synthesized data.

At 1412, the generative content system 1100 trains one or more machine-learned models based on the literal representation of the environment being modeled. For example, the generative content system 1100 may train a neural network (e.g., a deep neural network, convolution neural network, or recurrent neural network), a forest of decision trees (e.g., a random forest), or a regression-based classification model using data comprising the representation. In this way, the collected data and any modified or synthesized content are used to train the model. The machine-learned model may receive a signal profile indicative of a set of networks detected by a user device at a given time and the respective properties of the detected networks, as determined by the user. The machine-learned model may identify one or more candidate location estimates (also referred to as "candidate locations") based on the signal profile. The machine-learned model may further output a respective confidence score corresponding to each candidate location.

At 1414, the generative content system 1100 stores the model in a datastore. In embodiments, storing the model may include partitioning the model into two or more partitions. In some of these embodiments, the generative content system 1100 may partition the machine-learned model based on different subareas of the environment to which the machine-learned model corresponds. In embodiments, the generative content system 1100 may store the machine-learned model is a location services datastore. The machine-learned model may then be leveraged to estimate locations of client devices in the environment.

Figure 22B:
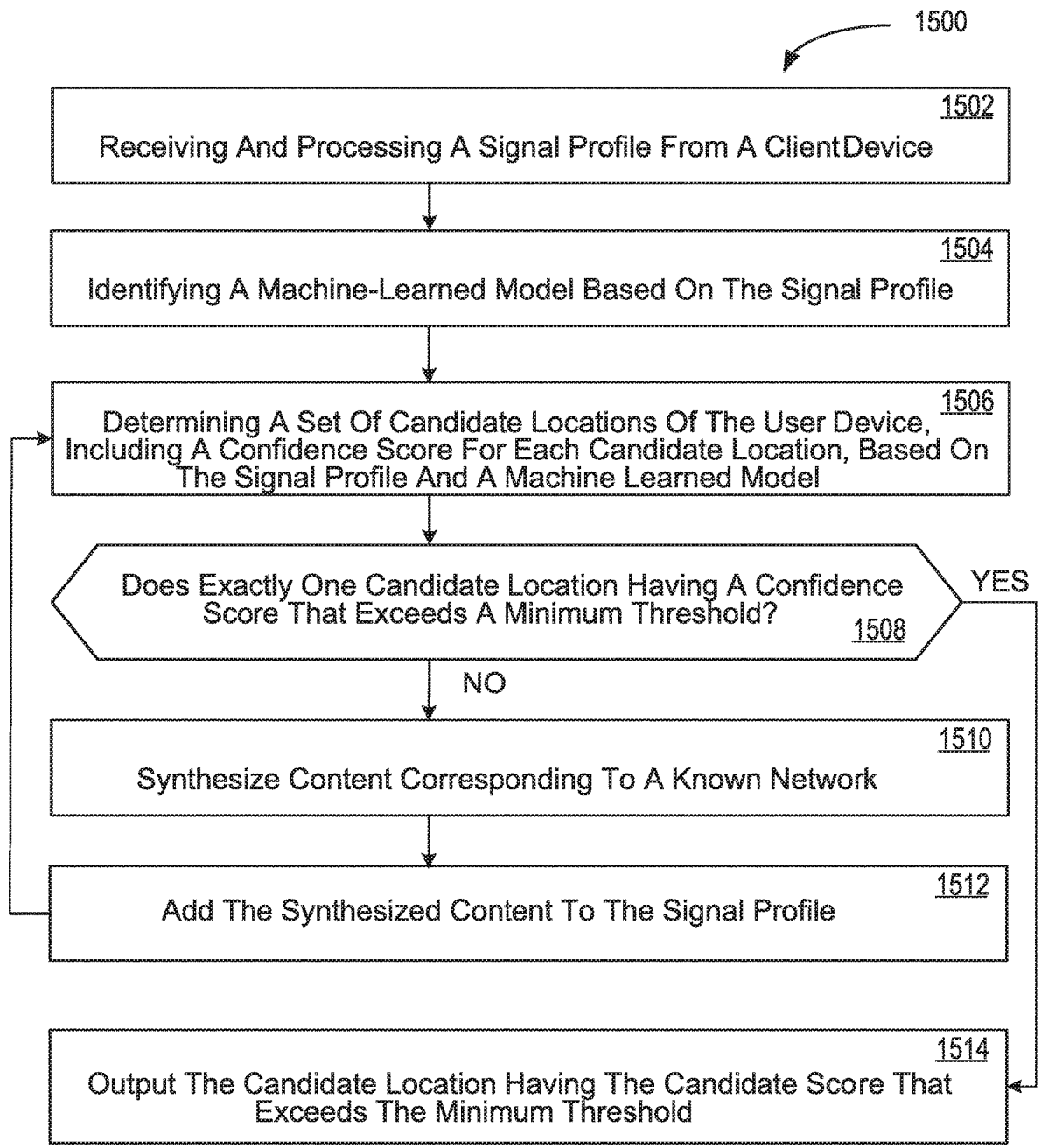
FIG. 22B depicts a flow chart illustrating an example set of operations of a method for estimating a location of a client device based on a signal profile of the client device and a machine learned model.

FIG. 22B illustrates an example set of operations of a method 1500 for estimating a location of a client device based on a signal profile of the client device and a machine learned model. In these embodiments, the generative content system 1100 may receive a signal profile from a client user device 1106 and may determine an estimated location (or "location estimate") of the client user device 1106 based on the signal profile. Such location estimated techniques, when applied to estimate locations inside large buildings or structures such as hotels, office buildings, apartment buildings, dormitories, prisons, and the like, are more accurate than traditional GPS-based location estimation techniques.

The method 1500 is described with respect to the generative content system 1100. The method 1500, however, may be performed by other suitable systems. Furthermore, in some embodiments, the generative content system 1500 may perform some operations, while other operations may be performed by an affiliated system (e.g., a $3^{rd}$ party application in communication with the generative content system 1100).

At 1502, the generative content system 1100 receives a signal profile from a client user device 1106 and processes the signal profile. A client user device 1106 may determine a signal profile corresponding to its location. Determining a signal profile may include determining any networks that are available to the client user device 1106, including WIFI networks, cellular networks, Bluetooth networks, and the like. For each detected network, the client user device 1106 may determine a signal strength detected from each respective network. In embodiments, the client user device 1106 may generate a $4^{th}$ or $5^{th}$ order polynomial antennae response curve adjustment for each signal strength. In other embodiments, the client user device 1106 may leave the signal strengths as raw data, and the generative content system 1100 may determine the $4^{th}$ or $5^{th}$ order polynomial antennae response curve adjustment for each signal strength. In embodiments, the client user device 1106 may identify any GPS satellites from which the client device 1106 is receiving signals, as well as the locations of said satellites (which may be communicated to the client device 1106 from the GPS satellites). The client user device 1106 may include additional data in the signal profile, such as the device type of the client user device 1106, a MAC address of the client user device 1106, and/or other suitable features. The client user device 1106 may communicate a signal profile to the generative content system 1100.

The generative content system 1100 receives a signal profile from a client device 1106 (or an intermediate system that is requesting service from the generative content system 1100). In some of these embodiments, the generative content system 1100 may process the signal profile to determine one or more attributes to input to a machine-learned model corresponding to an area of the client user device 1106. For example, in some embodiments, the generative content system 1100 may receive raw signal strength data from a client device 1106 and may generate the $4^{th}$ or $5^{th}$ order polynomial antennae response curve adjustment for each received signal strength.

At 1504, the generative content system 1100 identifies a machine-learned model to use based on the signal profile. In embodiments, the generative content system 1100 may determine a general area to which the signal profile corresponds (e.g., which building that the client user device 1106 is in) and may determine which machine-learned model to use when determining the candidate locations. For example, the generative content system 1100 may determine a building that the user device 1106 is in based on the network identifiers appearing in the signal profile. In some embodiments, the generative content system 1100 may perform a clustering process (e.g., k-means clustering) to identify a particular machine-learned model to user and/or the partition of the machine-learned model to use for location estimation. In some of these embodiments, the generative content system 1100 may cluster the signal profile (or a data structure generated based thereon) with the content items of the literal representations stored in the representation datastore. The generative content system 1100 can then select a machine-learned model and/or a partition thereof that corresponds to the cluster to which the received signal profile corresponds.

At 1506, the generative content system 1100 determines one or more candidate locations based on the machine-learned model, including a confidence score for each respective candidate location. In embodiments, the generative content system 1100 may input one or more attributes corresponding to the user device and/or the signal strength to the model (or partition thereof). The model may output a set of candidate locations and, for each candidate location a confidence score in the candidate location. A confidence score indicates a degree of likelihood that the respective candidate location is the location of the client user device 1106.

Figure 23A:
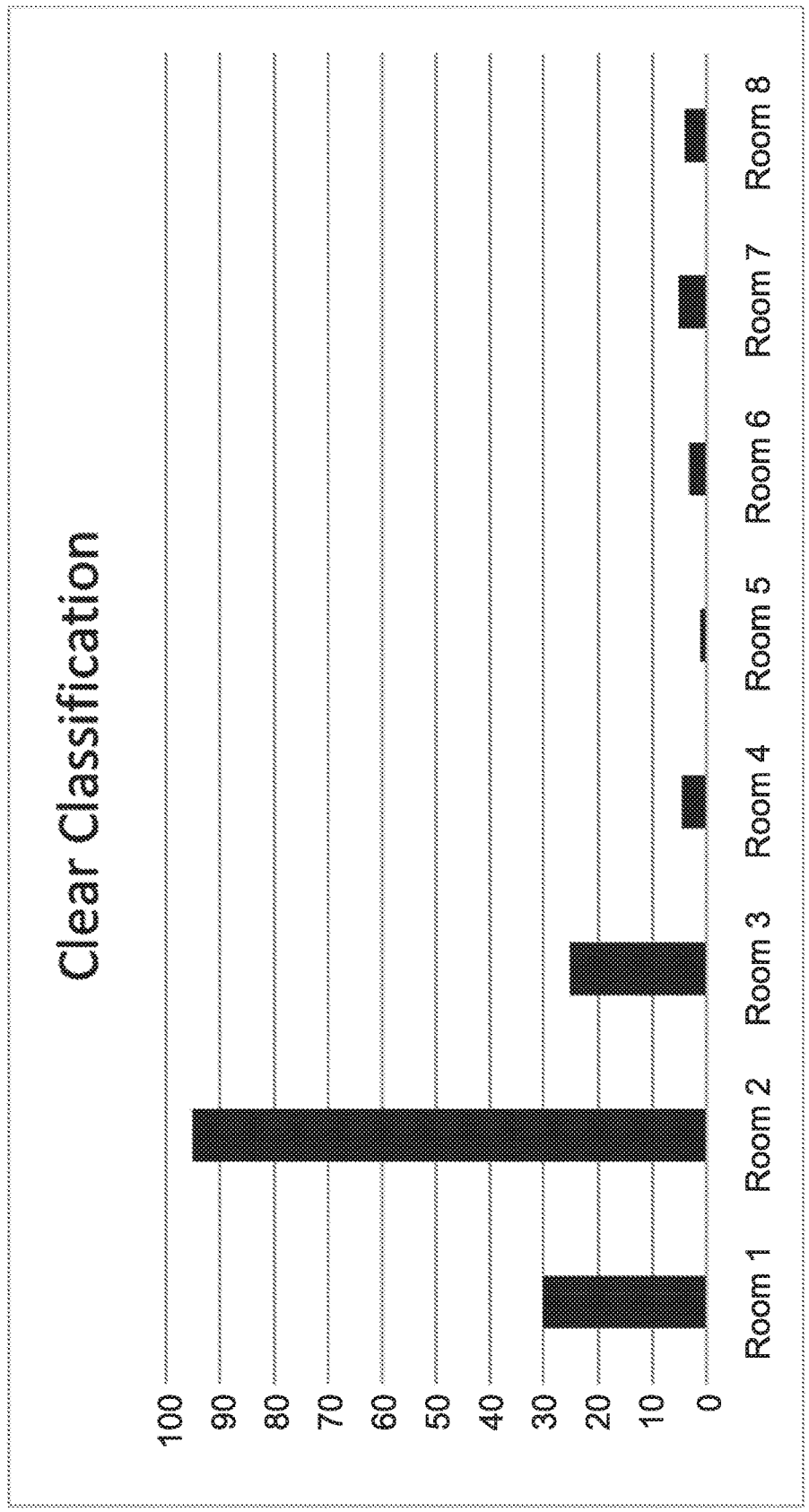
FIGS. 23A-23C depict illustrate examples of candidate locations that may be output by a model in response to a signal profile.
Figure 23B:
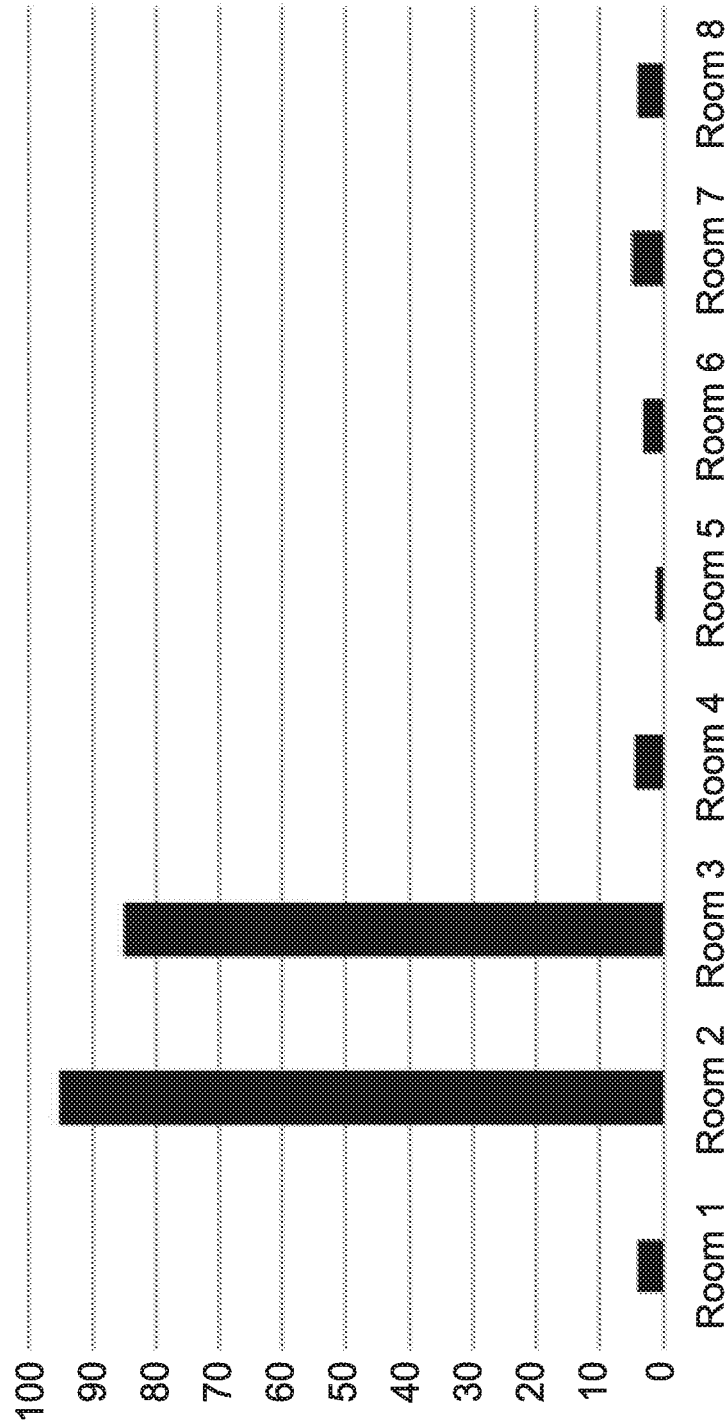
Figure 23C:
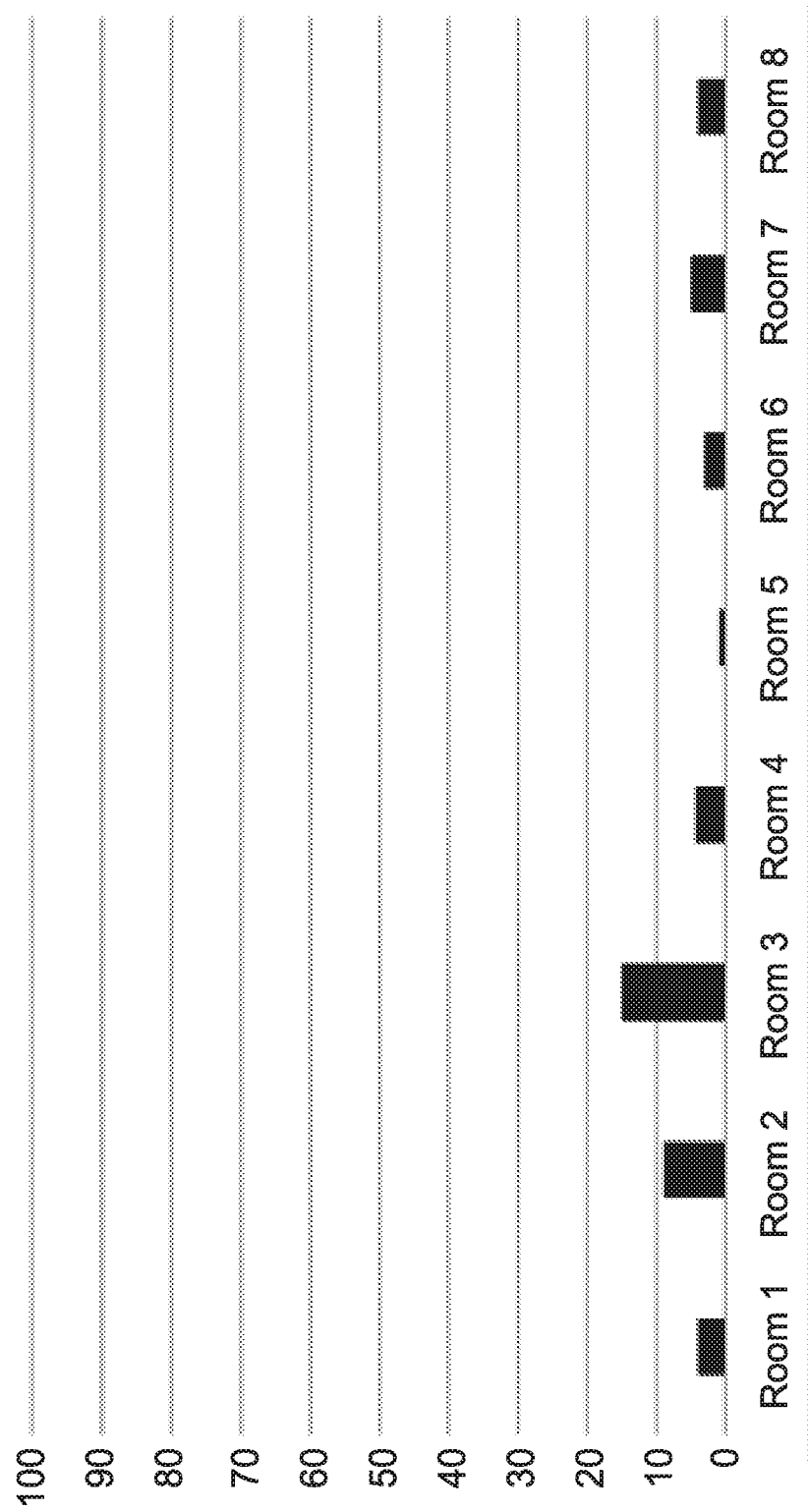

At 1508, the generative content system 1100 determines whether there is exactly one candidate location having a confidence score that is greater than a threshold. FIGS. 23A-23C illustrate three examples of outputs by a model trained to classify estimated locations of a device with respect to eight rooms in a hotel. In FIG. 23A, the model has output an ideal outcome, where the classification is clear and unambiguous. In this scenario, it is likely that there are very strong short range signals detected (e.g., Bluetooth signals) and/or other streams of information, such as a highly accurate GPS reading. In response to this scenario (e.g., where only one candidate location has a confidence score greater than a threshold), the generative content system 1100 selects the candidate location having the highest confidence score, as shown at 1514.

In FIG. 23B, the model has output two candidate locations that are likely locations. In this example, the confidence scores of Room 2 and Room 3 are much greater than any other room. In this scenario, Room 2 and Room 3 have similar profiles. This situation may be referred to as a multi-classification scenario. In FIG. 23C, all of the candidate locations have relatively low confidence scores (all confidence scores <0.20) and none of the candidate scores is significantly greater than the other candidate scores. This situation may be referred to as a no-classification scenario, which are the most difficult to handle. These situations may occur because the transmitting user device 1106 may be in an area that was not properly sampled, the environment has changed drastically, and/or only a small number of scans were taken in the area.

In some embodiments, the generative content system 1100 may select the candidate location having the highest confidence score, despite the relative similarity in scores. In other embodiments, the generative content system 1100 is configured to reprocess the received signal profile when it cannot initially classify a location estimate from the candidate locations (e.g., in a multi-classification or no-classification scenario), as shown at 1510 and 1512.

At 1510, the generative content system 1100 may synthesize content corresponding to one or more known networks. In embodiments, the generative content system 1100 may perform one or more of the techniques described to synthesize content corresponding to one or more known network. In embodiments, the generative content system 1100 may generate an abstract representation of the signal profile using the class-specific executable classes. The generative content system 1100 may then perform conformance simulation on the abstract representation. During this process, the generative content system 1100 may remove outliners and/or obvious errors from the abstract representation until the abstract representation converges on one or more fitness criteria. During this process, the generative content system 1100 may further include simulated nodes and/or may modify an already connected node with simulated data. The generative content system 1100 may then generate one or more content items based on the abstract representation of the signal profile, and may analyze the abstract representation to determine any gaps in the data (e.g., missing networks given the other detected networks) and may synthesize content based on the determined gaps using one or more rules and/or machine-learning techniques. For example, the generative content system 1100 may generate a content item indicating a synthesized signal strength value corresponding to a missing network identifier, where the content item may indicate the device type of the client user device 1106 and other relevant data. The generative content system 1100 may generate a random signal strength value. Alternatively, the generative content system 1100 may generate a signal strength value based on signal strength values previously measured for the missing network identifier. In some embodiments, the generative content system 1100 may further clean up and/or anneal the content items.

At 1514, the generative content system 1100 adds the synthesized content item(s) to the signal profile. The generative content system 1100 may then determine a new set of attributes based on the content items. As can be appreciated, the new set of attributes will include attributes that were determined from the properties of the received signal profile and properties generated by the generative content system. The generative content system 1100 may input the new set of attributes into the machine-learned model (or the relevant partition thereof) to obtain a set of candidate locations and confidence scores corresponding thereto, as shown at 1506. If the generative content system 1100 is unable to classify a location estimate, the generative content system 1100 can continue to iterate in this manner until it can classify a location estimate. Upon classifying a location estimate, the generative content system 1100 can output the location estimate to the appropriate module or system.

It is noted that the location-based services described herein are provided for example. While the collection of operations described herein are described with respect to a generative content system, the operations may be performed by other suitable systems and devices without departing from the scope of the disclosure.

Figure 24:
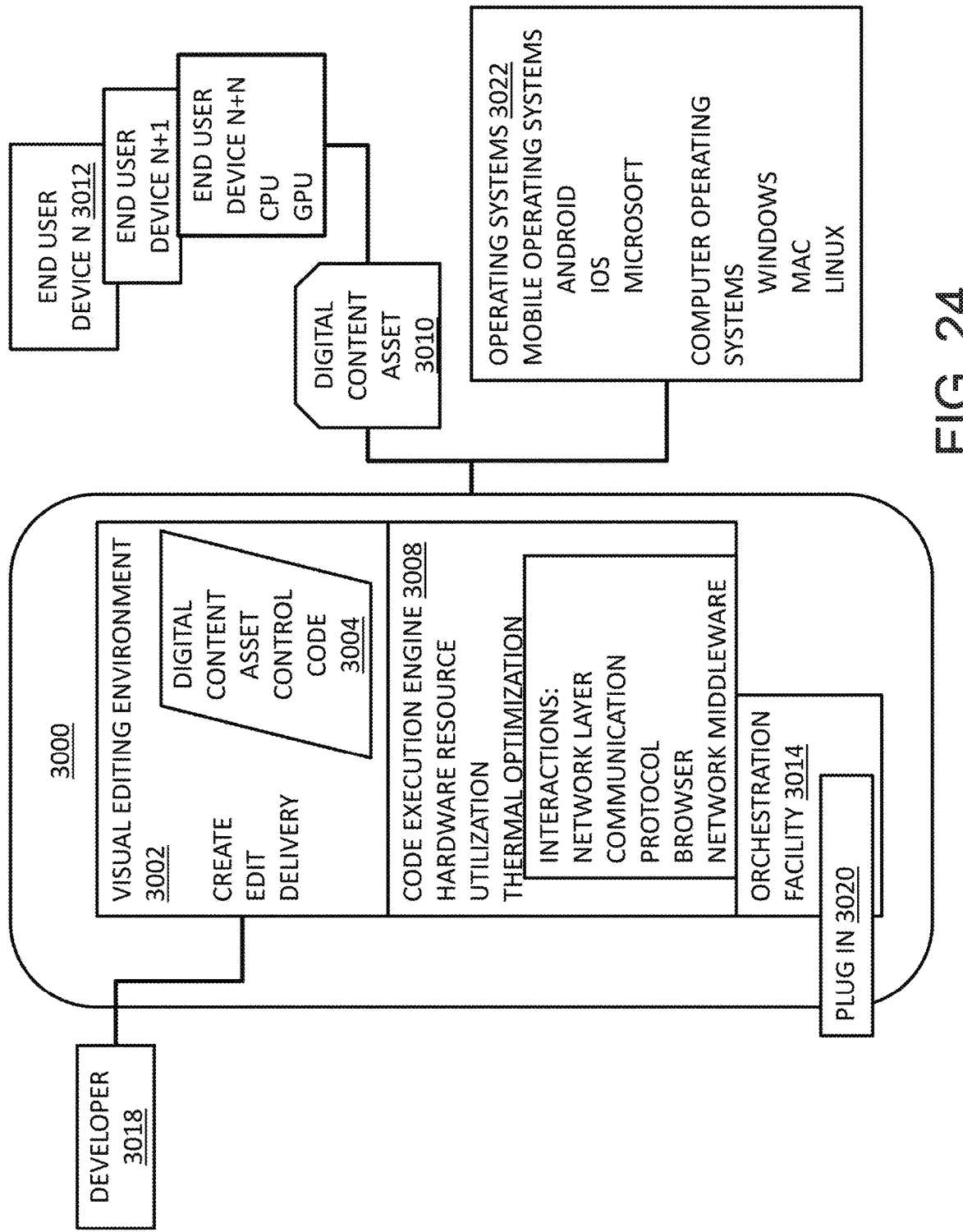
FIG. 24 depicts a system diagram of an embodiment of a system for creating, sharing and managing digital content in accordance with the many embodiments of the present disclosure.

In embodiments, a system for creating, sharing and managing digital content is depicted in FIG. 24. The system 3000 may comprise a visual editing environment 3002 that may enable a developer 3018 and the like creating, editing, and delivery of digital content asset control code 3004. The system 3000 may further comprise a code execution engine 3008 may facilitate hardware resource utilization and thermal optimization for CPUs, GPU, and the like of different devices, such as end user devices 3012 on which a digital content asset 3010 operates. The code execution engine 3008 may also control interactions, such as network layer interactions, communication protocol interactions, browser interactions, network middleware and the like. The system 3000 may further comprise an orchestration facility 3014 for orchestrating components, events, and the like associated with the digital content asset 3010. The orchestration facility 3014 may further comprise a plug-in system 3020. The system 3000 may further facilitate consistent user experience across a plurality of different operating systems 3022, including mobile, computer and other operating systems.

In embodiments, a system for creating, sharing and managing digital content may include a visual editing environment, a code execution engine, a declarative language, and use of a Low-Level Virtual Machine (LLVM) compiler. The visual editing environment may enable a developer to create and edit code controlling a digital content asset in the declarative language. In embodiments, the visual editing environment may enable a developer to create and edit declarative language code controlling a digital content asset. In embodiments, the code execution engine may operate in the visual editing environment, such as on the created declarative language code to control execution of hardware elements, such as a hardware infrastructure element that enables utilization of the digital content asset.

In embodiments, a system that combines the visual editing environment and the code execution engine to enable at least creating and editing declarative language code for controlling a digital content assess may include the visual editing environment interacting with the code execution engine during, for example creation of digital content asset management code. In embodiments, a user, such as a developer interacting with the visual editing environment may, such as through graphical manipulation of a digital content asset and the like, may effectively be producing declarative language code that the code execution engine responds to by executing it to cause visual effects in the visual editing environment, and the like. The code execution engine may be configured to respond to the produced declarative language code with data and graphic manipulation functions as may be expressed in the declarative language. In embodiments, the declarative language and the code execution engine used during editing of the digital content asset in the visual editing environment are also used at runtime. In embodiments, the visual editing environment and the code execution engine are constructed from this declarative language. In embodiments, the visual editing environment, runtime code derived from the declarative language, and optionally the code execution engine are compiled for distribution using a LLVM-based compiler architecture. In embodiments, the visual editing environment makes the declarative language available to a developer to generate the digital content asset management code.

In embodiments, the code execution engine may operate with the visual editing environment during creation, editing, and the like as well as during runtime of digital content asset code generated by use of the visual editing environment. With the same declarative language and code execution engine operating during visual editing and during runtime, visual editing may result in generating code, such as digital content asset control code that can control execution of hardware infrastructure elements, such as by generating code execution control statements. Code execution control statements may include hardware execution statements that may directly control hardware resources, such as a CPU, GPU, and the like that may participate in utilization of the digital content asset. In embodiments, a language used in the visual editing environment, such as a declarative language that may be described herein, may include hardware execution statements that, when compiled with an LLVM compiler, for example may be executed by the code execution engine. In embodiments, the visual editing environment output digital content asset control code may be compiled with the code execution engine, such as with an LLVM compiler-based architecture to produce runtime code. In embodiments, the compiled runtime code may be distributed as it is compiled to facilitate efficient distribution and timely execution on computing devices. In embodiments, the visual editing environment, and runtime code produced from editing, creation and other actions of a user of the visual editing environment may be bound to the code execution engine, such as through compilation, such as with an LLVM-based compiler architecture and the like. In embodiments, the code execution engine may comprise a C++ engine. The code execution engine may perform execution of C++ code; the code execution engine may be coded in C++; the code execution engine may facilitate execution of C++ code as well as other code types, such as the declarative language type described herein, and the like.

In embodiments, the system for creating, sharing and managing digital content may be adapted so that a digital content asset may be edited and the like via a visual editing environment of the system, compiled, linked to the code execution engine and executed, such as by the code execution engine without depending on comparable tools (e.g., editors, compilers, execution engines, and other code generation and execution tools), and the like. The digital content asset may be compiled, linked to the code execution engine and executed by the code execution engine independent of support by tools outside of the visual editing environment and the code execution engine. In embodiments, the system may cover the domain of tools required to build and deploy digital content, such as a digital content asset and the like, while maintaining integration of elements and simplicity of configuration, use, portability, update, extension, and the like. In embodiments, the code execution engine may auto compile, effectively compiling itself. In embodiments, the engine and declarative language may be automatically compiled at runtime. The declarative language for controlling a digital content asset may be instantiated upon loading it into an execution environment. The code execution engine may be a fully compiled binary that is compiled at runtime.

In embodiments, a system that uses declarative code to control a digital content asset and a code execution engine to enable creation-time and editing-time consistent behavior across different devices may include the visual editing environment interacting with the code execution engine during, for example creation of digital content asset management code, as described herein with declarative language and the like. In embodiments, a user interacting with the visual editing environment, such as through graphical manipulation of a digital content asset, may effectively be producing code that the code execution engine responds to by executing it to cause visual effects in the visual editing environment, the runtime environment, and the like. The code execution engine may be configured to respond to the declarative language code with graphic manipulation functions for each different device based, for example on device identification information, such as the type of operating system that the different devices are executing, and the like.

In embodiments, a code execution engine of the system for creating, sharing and managing digital content through use of a declarative language and the same language and code execution engine being used during editing and runtime may further ensure consistent user experience with the digital content asset, such as a consistent user experience of the same behavior, over a plurality of devices. In embodiments, the code execution engine may govern how the declarative language is executed to provide the consistent user experience. A consistent user experience may include a look and feel of a user interface, a speed of control of a digital content asset, interaction elements in the user interface, and the like. In embodiments, a code execution engine may take a declarative language statement for a digital content asset and convert it into a set of instructions that ensure a consistent user experience across different operating systems. This may take the form of graphic primitives, and the like to generate a consistent visual element for each operating system.

In embodiments, a code execution engine of the system for creating, sharing and managing digital content may ensure simultaneous user experience of the same behavior of the digital content asset by, for example, decoupling the declarative language from target system-specific resources, such as a device and/or operating system specific rendering engine and the like. In embodiments, rendering actions, as may be represented by a rendering layer of functionality, may be encoded into the declarative language used in the visual editing environment to generate digital content asset control code and the like. In this way, a digital content asset may perform the same behavior on different devices, different operating systems, and combinations thereof. In embodiments, the code execution engine may function similarly to a gaming engine in that the combination of the declarative language, and optionally runtime code output therefrom with the code execution engine define behaviors at a rendering level of the digital content asset, such as 3D movements, and the like. In embodiments, this combination facilitates coding the users experience (e.g., how the digital content asset will behave) with respect to the digital content asset behavior with the declarative language at the time that the digital content asset is created, edited and the like, such as in the visual editing environment. In this way, the code execution engine, which may function similarly to a gaming engine for this specific aspect, may do the underlying work of making the behavior consistent, without a developer having to consider how any target device and/or operating system may need to be controlled to generate the desired behavior.

In embodiments, a code execution engine of a system for creating, sharing and managing digital content through use of a declarative language may control utilization of hardware resources of a plurality of different devices, such as CPUs, GPUs and the like. Utilization of, for example, CPUs of some of the different devices, such as hardware endpoint devices and the like may be controlled to facilitate users of different devices experiencing the same behavior. In embodiments, the code execution engine may operate with the visual editing environment during creation, editing, and the like as well as during runtime of digital content asset code generated by use of the visual editing environment. With the same code execution engine operating during visual editing and during runtime, and the same declarative language being utilized by the visual editing environment and the code execution engine, visual editing may result in generating code, such as digital content asset control code that can control utilization of a CPU and/or GPU, such as by generating code execution control statements. Code execution control statements may include hardware resource utilization statements that may directly control utilization of different device hardware resources, such as a CPU, GPU, and the like. In embodiments, a language used in the visual editing environment, such as a declarative language, may include hardware resource utilization statements that the code execution engine may execute or that may affect how the code execution engine executes code, such as executing a graphic function with a CPU even when a GPU is available on the device, and the like.

In embodiments, a code execution engine of the system for creating, sharing and managing digital content, in conjunction with a declarative language for generating digital content assets and the like may further ensure consistent user experience with the digital content asset, such as a consistent user experience of the common behavior, over a plurality of operating systems. In embodiments, the code execution engine may govern execution of the digital content asset to provide the consistent user experience. A code execution engine may perform a runtime check of the operating system of a device on which the code execution engine is executing the digital content asset control code and adjust a sequence of instructions, a selection of instructions, and the like based on a result of the runtime operating system check. In embodiments, a code execution engine of the system for creating, sharing and managing digital content may ensure consistent user experience of the digital content asset by, for example, decoupling the declarative language from a target system-specific resources, such as a device and/or operating system specific rendering engine and the like. In embodiments, rendering actions, as may be represented by a rendering layer of functionality, may be encoded into the declarative language used in the visual editing environment to generate a digital content asset and the like. In this way, a digital content asset may perform the same behavior on different devices, different operating systems, and combinations thereof. In embodiments, the code execution engine may function similarly to a gaming engine in that the combination of the declarative language with the code execution engine may define behaviors at a rendering level of the digital content asset, such graphic drawing primitives, and the like. In embodiments, this combination may facilitate coding the users experience (e.g., how the digital content asset will behave) with respect to the digital content asset behavior at the time that the digital content asset control code is generated through use of the declarative language in the visual editing environment. In this way, the code execution engine, which may function similarly to a gaming engine for this specific aspect, may do the underlying work of making the behavior consistent, without a developer having to adjust the use of the declarative language for a digital content asset for each target device and/or operating system that may need to be controlled to generate the desired behavior.

In embodiments, a code execution engine that works cooperatively with a declarative language for digital content asset creating and editing may govern execution of the code for a consistent user experience, such as is described herein, across a plurality of mobile operating systems, including, without limitation operating systems such as IOS™, ANDROID™ WINDOWS™, and the like. Mobile operating systems may include their own look and feel, including how fundamental user interactions are performed. Governing execution of code across mobile operating systems may include use of some device-specific declarative language so that, while the user experience may not be the same across mobile operating systems, a user of an IOS™ based device may experience the digital content asset with a look and feel that a user experiences when using other mobile applications on the device. In this way, a consistent user experience may be tailored to each individual mobile operating system so that the digital content asset may effectively appear to have the same behavior, while the underlying user interface and mobile operating system native controls may be preserved for each mobile operating system. This may involve, for example, executing portions of the declarative language consistently on each mobile operating system and executing other portions of the declarative language according to the mobile operating system. In embodiments, declarative language statements for rotational behavior of a digital content asset may be consistent across mobile operating systems, whereas declarative language statements for user interface elements for controlling the rotation may be operating system specific.

In embodiments, a code execution engine of a system that uses a declarative language for digital content asset creation and editing may govern execution of the code for a consistent user experience across a plurality of computer operating systems, including, without limitation operating systems such as MAC™, LINUX™, WINDOWS™, and the like. Likewise, the code execution engine may govern execution of the code for a consistent user experience in deployments that include combinations of mobile operating systems (e.g., an IPHONE™) and a computer (e.g., a WINDOWS™ LAPTOP). In embodiments, a combination of the code execution engine and the visual editing environment may facilitate this consistent user experience across mobile, computer, and other operating systems, such as by enabling creation, delivery and editing of the digital content asset during runtime (e.g., when the code execution engine is executing digital content asset control code, and the like). In embodiments, LLVM compilation may facilitate generation of operating system-specific sets of compiled code that may include a portion of the declarative language representation of the digital content asset and a portion of the code execution engine to perform one or more digital content asset control actions consistently across a plurality of operating systems, including mobile operating systems, computer operating systems, and the like.

In embodiments, the code execution engine may enable control of network layer interactions for the digital content asset. In embodiments, the code execution engine may be structured with a layer that may facilitate controlling network layer interactions, such as a network layer of the code execution engine, and the like. In embodiments, the code execution engine may gain control of network layer interactions for the digital content asset via network layer interaction control statements that may be available to a developer in the declarative language during editing. The visual editing environment may make available to a developer and/or other user of the environment network layer interaction declarative language statements that may be coded into digital content asset behavior and the like so that when executed by the code execution engine, network layer interactions and the like may be controlled.

In embodiments, a system for creating, sharing and managing digital content that may further enable digital content asset generation and control via a declarative language may further comprise a LLVM debugging tool. The LLVM debugging tool may facilitate debugging compiled code for the digital content asset, and the like.

In embodiments, the system for creating, sharing and managing digital content that cooperatively uses a declarative language for generating a digital content asset via a visual editing environment and executed the digital content asset with a code execution engine may further include functions that facilitate orchestrating components, events, response to triggers and the like for a digital content asset. In embodiments, orchestrating may include without limitation automated arrangement, coordination, and management of components, events and the like. Such orchestrating may facilitate control of aspects of the system to accomplish goals of the system, such as just-in-time compilation through use of an LLVM-based compiler architecture and the like. In embodiments, orchestrating functionality may be enabled by a plug-in capability of the system, where an orchestrating capability may be plugged-in to the system. In embodiments, the plug-in capability of the system may be a JAVASCRIPT™ compatible plug-in system.

It is noted that the location-based services described herein are provided for example. While the collection of operations described herein are described with respect to a generative content system, the operations may be performed by other suitable systems and devices without departing from the scope of the disclosure.

The methods 1400 and 1500 of FIGS. 22A and 22B may be used in a number of different applications. In embodiments, the methods 1400, 1500 may be used in connection with a locator application that may be used to locate individuals within a large environment, such as a hotel, a prison, a parking structure, a hospital, a dormitory, an apartment building, a school, an office building, or the like. In other embodiments, the methods 1400, 1500 may be used in connection with an asset tracking application, such as applications for tracking high value items (e.g., medical devices, high value electronics, precious metals and gems, or the like) within an environment, such as a hospital, office building, warehouse, shipping facility, or the like.

Figure 31:
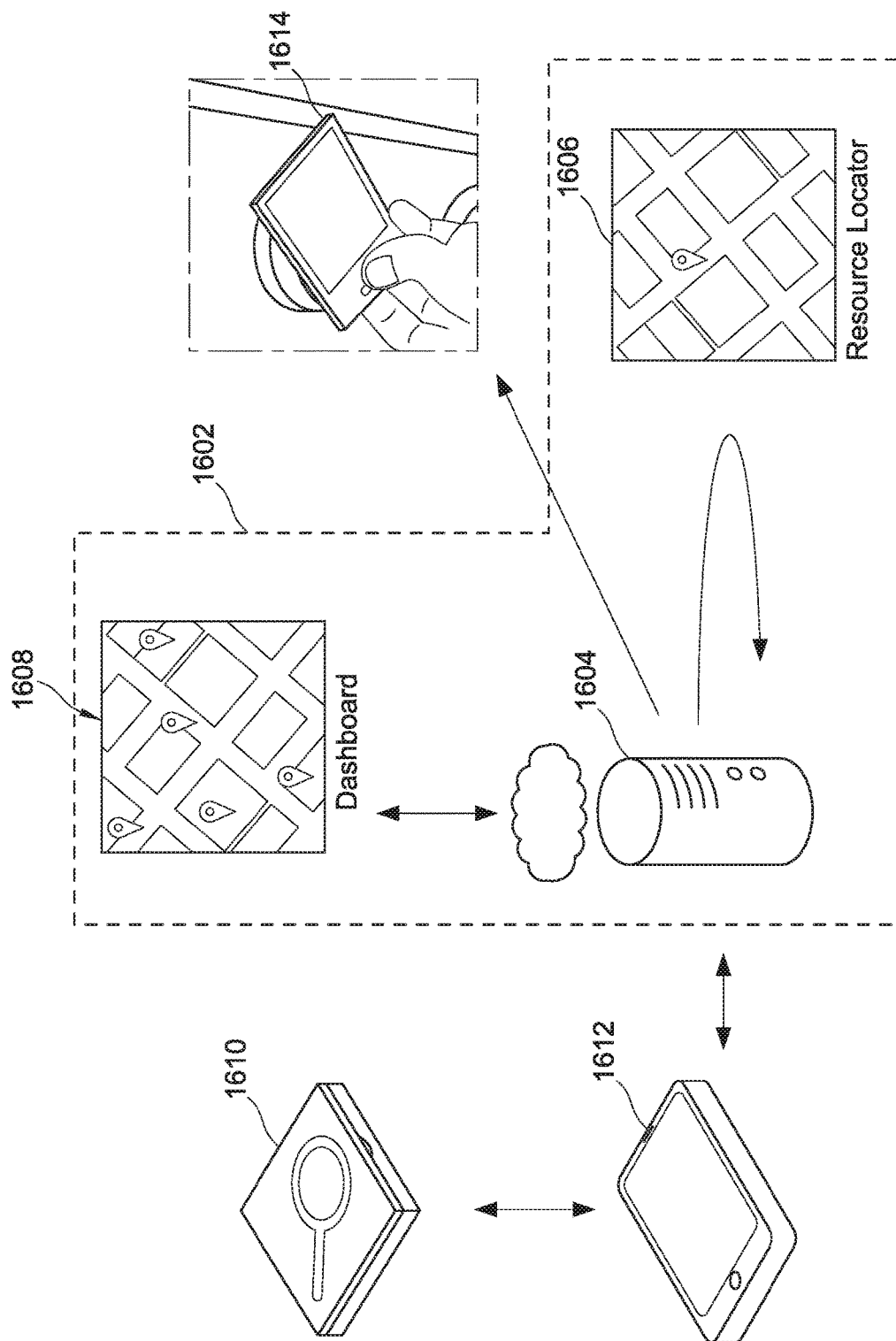
FIG. 31 depicts an example system for locating individuals within a large environment according to some embodiments of the present disclosure.

FIG. 31 illustrates an example system 1600 for locating individuals within an environment (e.g., a hotel, a prison, a parking structure, a hospital, a dormitory, an apartment building, a school, an office building, a department store, a mall, a warehouse, a factory, a ship, or the like). In this example, the system 1600 may include a configured server kit 1602 that provides a database layer 1604, a locator module 1606, and a custom dashboard 1608. The system 1600 may further include a set of devices that execute/simulate applications created using the application system 100 of FIG. 1 (or other suitable application systems). In embodiments, the set of devices may include a set of scanning rigs 1610, a set of one or more collection devices 1612 (e.g., smartphones, tablet devices, laptops, or the like), and a set of client devices 1614 (e.g., smartphones, smart key cards, tablet devices, or the like). In embodiments, the set of scanning rigs 1610 is controlled by one or more collection devices 1612 to scan a large environment at a set of different locations throughout the environment, whereby scanning rigs capture one or more signal strength samples at each of the different locations. The collection devices 1612 provide the signal strength samples to the server kit 1602, which trains one or more machine-learned models to classify locations of client devices 1614 within the large environment.

In embodiments, a scanning rig 1610 may include a set of antennas (e.g., WIFI antenna, a Bluetooth® antenna, an RFID antenna, a GPS antenna, a magnetic flux sensor, and/or the like) and a microprocessor that executes/simulates an embedded scanning application. In embodiments, the embedded scanning application is configured to identify the detectable networks (e.g., WIFI, Bluetooth, RFID, GPS, magnetic flux, and/or the like) in the vicinity of the scanning rig 1610 at a location and, for each available network, determine a signal strength corresponding to each network.

As discussed, the network identifiers of networks that are detected at a particular location and the respective signal strengths of the detected networks may be referred to as a signal strength sample. In embodiments, a collection device 1612 may be a user device that includes a set of one or more antennas that communicate with one or more scanning rigs and a processor that is executing/simulating an environment scanning application. In embodiments, the environment scanning application commands one or more scanning rigs 1610 to obtain a set of signal strength samples and, for each signal strength sample, determines a corresponding location of the signal strength sample. In embodiments, a signal strength sample may indicate a network identifier of a detected signal and the strength of the detected signal. In this way, the unique set of signal strength samples obtained at a device at any particular location may be akin to a fingerprint that is a function of that location. The environment scanning application may associate each signal strength sample set with the respective location from which the sample set was captured and may report the signal strength samples (including the associated location) to the server kit 1602.

In embodiments, the environment scanning application presents, via a display of the collection device 1612, a GUI to a user (e.g., a scanner of the environment) that allows a user to define or specify a location of a scanning rig 1612 relative to an environment. For example, the environment scanning collection device 1612 may present a site map of the environment or a digital twin of the environment. In these examples, the user may select a location on the site map/digital twin that indicates a current location of the scanning rig. Alternatively, the user may enter a description of the location (e.g., "hotel room 419, outside of door"; "Cell block J, cell 24, inside cell"; "floor 3, outside of elevator bank"; or the like). Upon receiving a location via the GUI, the environment scanning application issues a command to the scanning rig to capture a signal strength sample. In response to the command, a scanning rig 1610 captures a signal strength sample at its current location and communicates the signal strength sample to the collection device 1612. The collection device 1612 may receive the signal strength sample from the scanning rig and may associate the signal strength sample with the location at which the signal strength sample was taken (e.g., as provided by the user). As the collection device 1612 obtains samples from different locations within an environment, the collection device 1612 may report the signal strength samples and the corresponding locations to the server kit 1602. It is noted that in some embodiments, the scanning rig 1610 and the collection device 1612 may be integrated with a single device. For example, the collection device 1612 may be configured to capture signal strength samples from various locations and to report the signal strength samples to the server kit 1602.

A set of one or more collection devices 1612 may scan an environment in this manner and collectively report signal strength samples taken at various locations throughout the environment to the server kit 1602, thereby providing a signal strength map across the location for various signal types collected during the sampling process, with each location on the map reflecting the distinct combination of signal strengths at that location.

In embodiments, the server kit 1602 may leverage a generative content system (e.g., generative content system 1100) to synthesize additional signal strength information based on the collected samples. This may include modeling likely signal strengths at other locations based on physical models (such as models of electromagnetic radiation that indicate patterns of diminishing radiation over distances based on power laws or the like) and/or estimating intermediate signal strengths between two known locations based on the signal strengths at those locations, such as by averaging, weighted averaging, or the like, among other techniques. Generated signal strength information may be added to the signal strength map to augment the granularity of the signal strength map. Generated, versus sampled, information may be tagged within the system, such as to weight the relative importance or reliability of each in location determination, such as where there is ambiguity in determining a location from the signal strength map.

In embodiments, the server kit 1604 may then train one or more machine-learned models (e.g., location classification models) corresponding to the scanned environment using the signal strength samples as training data, as well as optionally using the generated/synthesized data. It is noted that in some embodiments, training the location classification models may include parameterizing a statistical model based on the signal strength samples. In embodiments, the server kit 1602/generative content system 1100 may synthesize additional signal strength samples and train and/or partition the machine-learned models using the collected and synthesized signal strength samples in the manner discussed above with respect to FIGS. 20-22A. The trained model(s) may be used to locate client devices 1614 within the environment.

In embodiments the signal strength samples may be used to populate a matching model, such as one that operates on a signal strength sample to determine the closest match of the signal strength sample to another signal strength sample in a signal strength map. This may occur, for example, using various statistical techniques, such as ones based on the cumulative differences between signal strength samples, ones based on square-roots of the differences, or others. In embodiments a set of rules may be used to disambiguate the matching, such as where signal strength samples are similar for two locations within an environment. Disambiguation may include, for example, weighting particular signal types more heavily in ambiguous situations (such as signals that decline more rapidly over distances, thereby providing greater granularity), weighting particular locations more heavily (such as weighting areas of heavy traffic like a hotel lobby more heavily than rarely visited areas, such as basements), or other techniques. Disambiguation may also apply historical information, such as information about previous locations visited by an individual, for example by facilitating selection of more proximate new locations from a signal strength map in cases of ambiguity.

In embodiments, a client device 1614 may be a user device or an embedded device (e.g., a smart key card) that includes a set of antennas (e.g., WIFI antenna, a Bluetooth® antenna, an RFID antenna, a GPS antenna, and/or the like) and a processor/microprocessor that executes/simulates a location-based application that requests a location-based service from the server kit 1602. In embodiments, a client device 1614 may receive, via a user interface (e.g., a graphical user interface or a mechanical interface, such as a button), an instruction from a user to locate the user. For example, the user may be in an emergency situation or may otherwise need assistance. In response to receiving the instruction from the user, the location-based application causes the client device 1614 to capture a signal strength sample and transmit the signal strength sample to the server kit 1602. The server kit 1602 receives the signal strength sample and determines a location of the client device 1614 based on the signal sample and one or more of the machine-learned models trained with respect to the environment in which the client device 1614 is located. In embodiments, the server kit 1602 may determine the location of the client device 1614 in the manner described with respect to FIG. 22B. Once the location of the client device 1614 has been determined, the server kit 1602 can perform a location-based service using the location. For example, in some embodiments, the server kit 1602 may provide a notification to a security system and/or security guard that indicates a location of the user device 1612, such that a security guard may be dispatched to the location of the determined user device 1612. Location-based services may include alternative suitable services as well.

Figure 32:
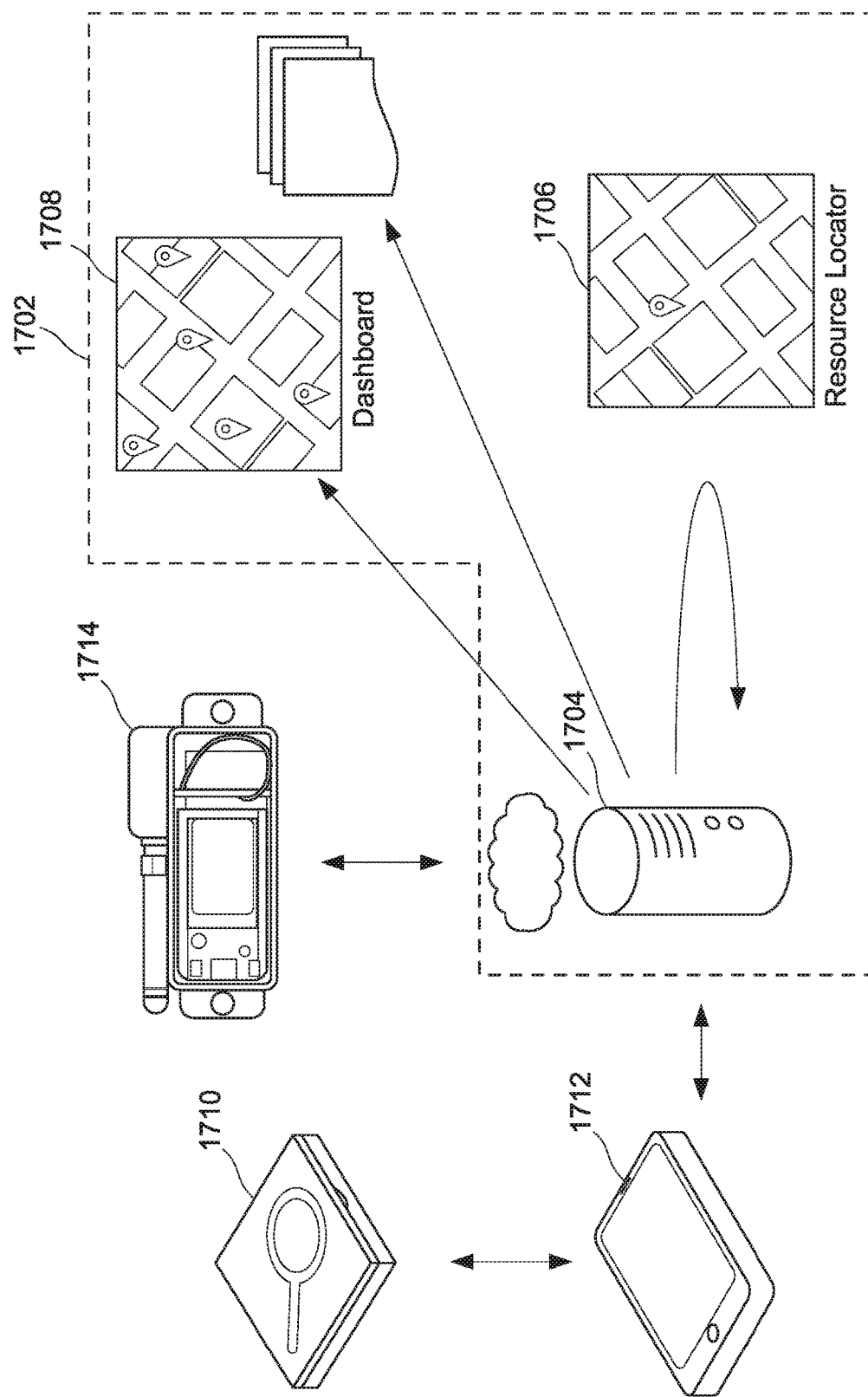
FIG. 32 depicts an example system for tracking assets within a large environment according to some embodiments of the present disclosure.

FIG. 32 illustrates an example system 1700 for tracking high-value assets within an environment (e.g., a hotel, a prison, a parking structure, a hospital, a dormitory, an apartment building, a school, an office building, a department store, a mall, a warehouse, a factory, a ship, or the like). In this example, the system 1700 may include a configured server kit 1702 that provides a database layer 1704, an asset tracking module 1706, and a custom dashboard 1708. The system 1700 may further include a set of devices that execute/simulate applications created using the application system 100 of FIG. 1 (or other suitable application systems). In embodiments, the set of devices may include a set of scanning rigs 1710, a set of collection devices 1712 (e.g., smartphones, tablet devices, laptops, or the like), a set of tracking devices 1714 (e.g., embedded devices having a power source), and a set of one or more configuration devices 1716. In embodiments, the one or more scanning rigs 1710 are controlled by one or more collection devices 1712 to scan a large environment at a set of different locations throughout the large environment, whereby the scanning rigs 1712 capture one or more signal strength samples at each of the different locations. The collection devices 1712 provide the signal strength samples to the server kit 1702, which trains one or more machine-learned models to classify locations of the asset tracking devices 1714 within the large environment. In embodiments, the scanning rigs 1710, the collection devices 1712, and the server kit 1702 may be configured to operate in the manner discussed with respect to FIGS. 16 and 20-22A to collect the signal strength samples, define the locations of the samples, and to train the machine learned models.

In embodiments, a configuration device 1716 may be a user device (e.g., a tablet, a laptop, a user device, or the like) that executes/simulates a tracking device configuration application. In embodiments, the tracking device configuration application presents a GUI that allows a user to associate tracking devices 1714 with respective items being tracked. In embodiments, the user may enter a tracking device identifier of a tracking device 1714 (e.g., a serial number, a QR-code, a barcode, or the like) and an item identifier (e.g., a serial number, a QR-code, a barcode, an item name, or the like) of the item being tracked. In response, the tracking device configuration application provides the tracking device identifier and item identifier pairing to the server kit 1702, which may record and/or index the tracking device identifier and item identifier pairing. In embodiments, the server kit 1702 may further record a current location of the tracking device and/or item. In some embodiments, the tracking configuration application may allow a user to provide additional data relating to an item being tracked. For example, in embodiments, a user may provide a whitelist of areas where the item may be moved to and/or a blacklist of areas where the item is prohibited from entering. In another example, the user may provide an action that is to be performed should the item move out of a whitelisted area and/or move into a blacklisted area, such as triggering an alarm and/or issuing a notification to one or more persons.

In embodiments, a tracking device 1714 may be an embedded device (e.g., a small device) that includes a set of antennas (e.g., WIFI antenna, a Bluetooth® antenna, an RFID antenna, a GPS antenna, and/or the like) and a processor/microprocessor that executes/simulates a tracking application. In embodiments, the tracking application is configured to cause the tracking device 1714 to capture a signal strength sample and transmit the signal strength sample to the server kit 1602 via a network connection. In embodiments, the tracking device 1714 may transmit the signal strength sample via a low-power, wide area network (LWPAN) connection (e.g., LoRa or SigFox), a WIFI connection, a cellular connection, or the like. In embodiments, the tracking device 1714 identifies the network identifiers of the detected networks in the vicinity of the tracking device and a signal strength for each of the detected networks to obtain a signal strength sample. In embodiments, the tracking device 1714 captures signal strength samples at predetermined intervals (e.g., every minute, every five minutes, every hour, or the like). Additionally or alternatively, the tracking device 1714 may include a motion-activated circuit (e.g., a circuit with a piezo-electric transducer, a circuit with a mechanical spring switch, or an accelerometer that activates the circuit when motion is detected/no longer detected) that causes the tracking device 1714 to "wake up" when the tracking device 1714 is moved and/or when the tracking device 1714 stops moving. In this way, the tracking device 1714 captures signal strength samples when a tracked item is moved and/or when it returns to rest. Upon capturing a signal strength sample, the tracking device 1714 may communicate the signal strength sample to the server kit 1702. In embodiments, the tracking device 1714 may further provide its tracking device identifier to the server kit 1702.

In embodiments, the server kit 1702 receives a signal strength sample and a tracking device identifier and determines a location of the tracking device 1714 based on the signal sample and one or more of the machine-learned models trained with respect to the environment in which the tracking device 1714 is located. In embodiments, the server kit 1702 may determine the location of the tracking device 1714 in the manner described with respect to FIG. 22B. Once the location of the tracking device 1714 has been determined, the server kit 1702 can update a location of the item being tracked by the tracking device 1714. In embodiments, the server kit 1702 may identify the item being tracked based on the tracking device identifier of the tracking device 1714 that provided the signal sample. For example, the server kit 1702 may query an index that relates items being tracked to the tracking devices 1714 that are tracking the items. In response to identifying the item being tracked, the server kit 1702 may update the current location and/or a previous location of the item. In some embodiments, the server kit 1702 may execute additional workflows, such as raising an alarm/triggering a notification when an item is determined to be somewhere that is not a white listed location (e.g., in a storage closet, in an examination room, in a certain classroom, or the like).

It is noted that the systems 1600 and 1700 of FIGS. 16 and 17 may be implemented using the declarative language described above. In these embodiments, a developer may provide the declarative statements and/or may use a visual editor. In the case of applications executed/simulated by embedded applications (e.g., the scanning application, the tracking application, and the like), a developer (or multiple developers) may still use the visual editor to create such applications. In these embodiments, the developer may provide quasi-UI elements that have actions associated therewith, whereby the quasi-UI element may define a trigger that causes the actions to be performed. For example, a quasi-UI element in the case of a tracking application may have a "capture signal sample" action tied to the quasi-UI element and may be triggered at predetermined intervals and/or upon detection of a motion event (e.g., begins moving and/or stops moving).

Figure 33:
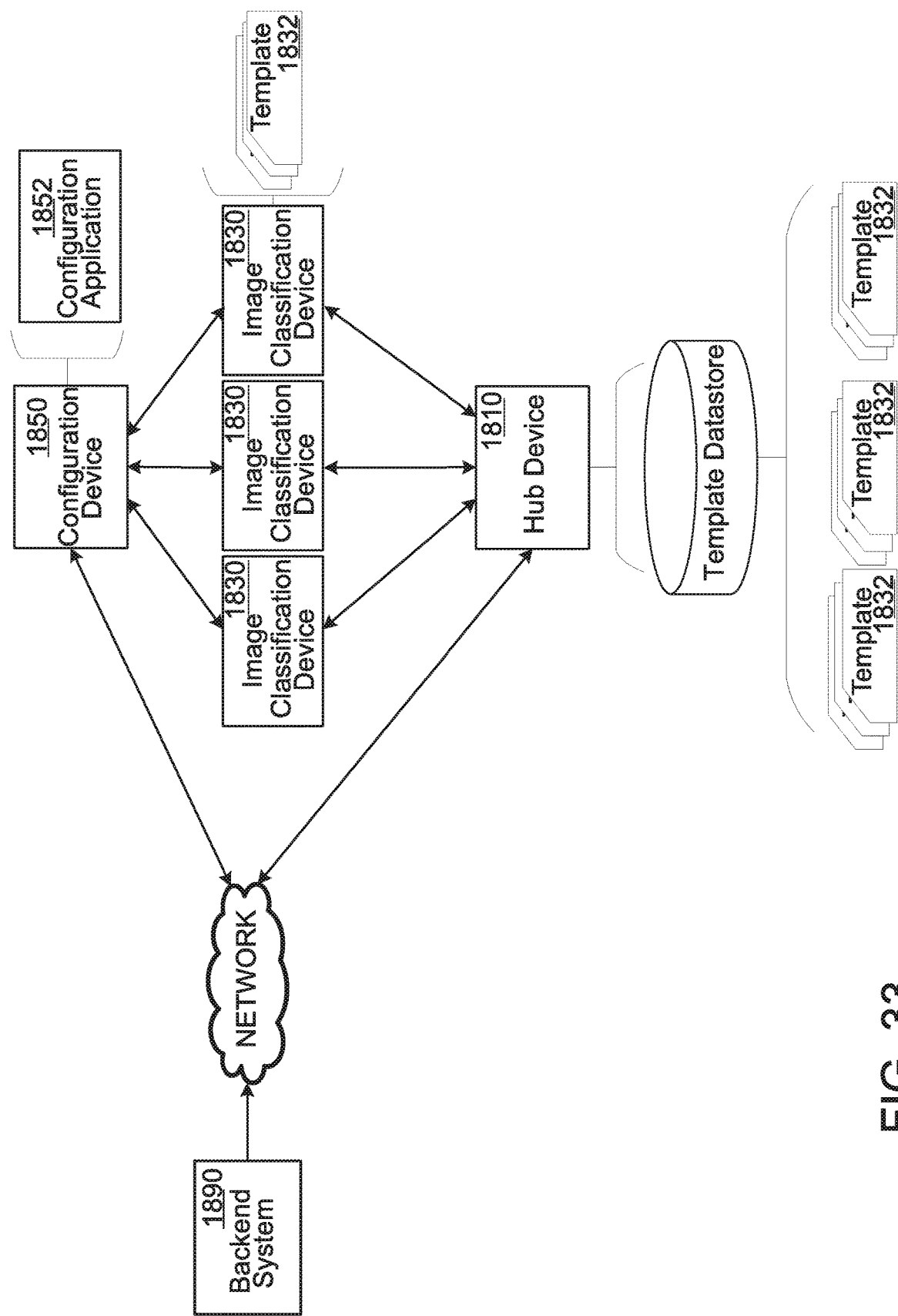
FIG. 33 depicts an example hub-and-spoke image classification system according to some embodiments of the present disclosure.

FIG. 33 illustrates an example hub-and-spoke image classification system 1800 (or "image classification system 1800" or "the system 1800") according to some embodiments of the present disclosure. In embodiments, the image classification system 1800 may be implemented to perform constrained machine-learning classification tasks. In some embodiments, constrained machine-learning tasks include constrained machine vision tasks, such as reading digital or analog meters. For example, many meters were purchased and/or installed prior to the advent of the internet of things (IoT) and smart meters. For example, many water meters, electricity meters, odometers, bio-monitoring meters in a hospital, and the like are a critical infrastructure component of varying types of businesses but are not connected or connectable to a network. As such, the data that can be read from these meters is not easily ported into downstream applications that leverage such types of data, such as analytics applications, billing applications, healthcare applications, and the like. These meters number in the hundreds of millions or even billions. As such, wholesale replacement of these meters is cost prohibitive. The hub-and-spoke image classification system 1800 of FIG. 33 provides a scalable solution to retrofit existing meters with IoT-like capabilities.

In the example embodiments, the hub-and-spoke image classification system 1800 may include one or more hub devices 1810 (or "hubs"), one or more image classification devices 1830, and one or more configuration devices 1850. In some embodiments, the hub device 1810 may act as one of the spokes in the hub-and-spoke classification system 1800. The system 1800 may communicate with a back-end server 1890 (e.g., a server kit) via a communication network. For example, the system 1800 may report the classifications made by the system 1800 to the back-end server 1890. It is noted that in some embodiments, the functionality of a configuration device 1850 may be performed by a hub device 1810 that has a user interface. For purposes of explanation, however, the configuration device 1850 and the hub device 1810 are described as separate devices.

In embodiments, the hub-and-spoke image classification system 1800 is configured to reduce overall power consumption, and to further reduce network traffic required to facilitate the constrained image classification tasks. For example, the system 1800 may be configured to read water meters in a large hotel. In such environments, there may be ten or more water meters in a single hotel. Furthermore, the hotel may be a single property in a chain of dozens or hundreds of hotels. As such, the hotel chain may wish to monitor 1000s of different water meters (or other meters). Furthermore, as the meters may have been made in different eras and/or by different companies, the meters may have different types of displays (e.g., an analog wheel counter meter or a digital panel meter with an LED interface) and/or may use different measurement systems (e.g., metric system or Imperial system). As such, the locations of the relevant portion of the meter, the text type (e.g., analog or digital), the font of characters in the meter, the units that are used, and/or other factors may vary from meter to meter. Thus, a hub-and-spoke system 1800 tasked with reading legacy meters should be able to account for the different variations between different meters. Furthermore, as these legacy meters may be located in remote areas of the building or outdoors, power outlets may be limited, and transmitting potentially hundreds of photographs every hour of every day may require additional bandwidth in areas where network connectivity may not be optimal. As will be described below, embodiments of the hub-and-spoke image classification system 1800 mitigates these concerns.

In embodiments, the hub 1810 is a network-connected device that includes a continuous power supply (e.g., a rechargeable battery and/or an AC power supply), a short range communication unit capable of communicating with one or more image classification devices 1830, expanded memory that stores a template datastore 1812, a higher-power processor that can perform: image classification on images from various image classification devices 1830; unsupervised machine learning; rules-based logic to guide classification and/or learning; reporting data from the image classification devices to a backend server; and the like. In some embodiments, the hub 1810 may further include a direct network connection, a power over Ethernet connection, or a long-range communication unit (e.g., a LPWAN or cellular chipset) that allows the hub 1810 to directly communicate with a communication network. In some embodiments, the hub 1810 communicates with a wireless router using the short-range communication unit, such that the router routes the communications to a modem that communicates with the communication network. In some embodiments, the hub 1810 is configured with a Linux operating system or an Android® operating system (e.g., Key Lime Pie). If a more sophisticated matching algorithm is required, the hub 1810 can also perform classification tasks on behalf of the various image classification devices 1830, such that the image classification devices 1830 may capture and send images in a slave mode. Thus, in some embodiments, the hub-and-spoke image classification system 1800 may operate in a master/slave manner, whereby the image classification devices 1830 capture images and provide the images to the hub 1810, which then classifies the images.

In embodiments, the template datastore 1812 stores image classification templates 1832 (or "templates" 1832). An image classification template may include a reference image and a classification of the element depicted in the reference image. In some embodiments, the templates 1832 correspond to characters (e.g., letters, digits, symbols, punctuation marks, and the like). In these embodiments, each template 1832 may include a reference image displaying the character and a classification of the character, whereby the classification indicates the character depicted in the image. In some scenarios, a character may be depicted in different fonts, colors, and/or styles. Thus, in some embodiments, each classifiable character may have a template 1832 for every respective combination of display type, font, color, and/or style in which the character is depicted. Furthermore, for certain types of display types (e.g., wheel counters), a character may be depicted in different orientations in different templates (e.g., six different states of a rolling digit, as shown in FIG. 19 below). Thus, in some embodiments, each character may have two or more respective templates 1832 for each type of display type, where each respective template 1832 depicts the character in a respective orientation corresponding to the display type. As such, the template datastore 1812 may store thousands or millions of templates 1832. As will be discussed below, each image classification device 1830 stores a much smaller respective subset of templates

1832. For example, an image classification device 1830 that is fully trained to classify digits that are read from a meter may store less than 100 total templates 1832 and may correctly classify digits with greater than 95% accuracy.

In embodiments, the hub device 1810 trains each respective image classification device 1830 that is in communication with the hub device 1810 by providing classifications of subsections of images captured and provided by the respective image classification device 1830. In some of these embodiments, an image classification device 1830 captures a subsection of an image and provides the captured subsection of an image when the image classification device 1830 is unable to make a classification of the subsection using the templates 1832 stored on its local memory device. In response, the hub device 1810 determines a classification of the captured subsection based on the templates 1832 stored in the template datastore 1812 using one or more matching techniques. In response to classifying the captured subsection, the hub device 1810 may provide the classification and/or the template used to make the classification to the image classification device 1830. In embodiments where the hub device 1810 only provides the classification of the previously unclassifiable subsection of the image, the image classification device 1830 may generate a new template 1832 based on the classification and the previously unclassifiable subsection of the image. In embodiments, where the hub device 1810 provides the template used to classify the previously unclassifiable subsection of the image, the image classification device 1830 receives the new template from the hub device 1810. As will be discussed, an image classification device 1830 may store a new template 1832 corresponding to the classification of the previously unclassifiable subsection. It is noted that in most cases, the image classification device 1830 may use the new template 1832 (or any other template 1832) to potentially classify image subsections extracted from other bounding box sections, as the font, font size, style, and/or color are typically the same for each respective unit of the area being monitored.

In embodiments, the image classification devices 1830 may be low power cameras, such that the image classification devices 1830 may be powered with a replaceable battery (e.g., A, AA, AAA, D, DD, or E batteries) or a rechargeable battery. In embodiments, the image classification device 1830 may include a lower resolution camera (e.g., a 2 megapixel), a short-range communication unit capable of communicating with a nearby hub and/or configuration device, a (limited) memory device that stores a set of classification templates 1832, and a low-power processor that executes instructions to configure the image classification device 1830, execute a classification process on a constrained input image, and control communication with the hub 1810. In embodiments, the image classification device 1830 may include additional components, such as a flash device to illuminate an area being captured by the image classification device 1830. In some embodiments, the image classification device 1830 may further include one or more environment sensors, such as a temperature sensor (e.g., a thermistor), a humidity sensor, and/or the like.

In embodiments, each image classification device 1830 may include a housing that encapsulates the components of the image classification device 1830. In embodiments, the housing is manufactured to be resistant to wet, humid, arid, cold, and/or hot conditions. In this way, the image classification device 1830 may be placed in many different environments. In embodiments, the image classification device 1830 may include coupling means that allow an installer to affix the image classification device 1830 to a surface of the object being monitored or a surface adjacent to the object being monitored (e.g., a wall or pipe). For example, the image classification device 1830 may include a plate to be screwed in or clamped to a surface, a surface with a strong adhesive, or any other suitable mechanism capable of fixedly coupling the image classification device 1830 to the surface. In embodiments, the image classification device 1830 may be positioned at an angle (e.g., greater than 30 degrees and less than 60 degrees) with respect to the area being monitored.

In operation, an image classification device 1830 captures images and reads a predefined area of a captured image by extracting subsections of the predefined area that is being monitored and determining a classification of each extracted subsection. In embodiments, the predefined area is defined by a bounding box and the subsections are defined by bounding box segments. In some of these embodiments, the bounding box and the bounding box segments are configured by a configuration device 1850, as described below. The bounding box may define an area that is being monitored, and each bounding box segment may define an area where an individual unit is depicted. For instance, when the image classification device 1830 monitors a meter, the bounding box may define where the meter reading is depicted in a field of view of the image classification device, and each bounding box segment may define where a respective digit is depicted within the bounding box. In this example, a first bounding box segment may define a ones digit, a second bounding box segment may define a tens digit, a third bounding box segment may define a hundreds digit, a fourth bounding box may define a thousands digit, and so on and so forth. For each subsection of an image extracted from a respective bounding box segment, the image classification device 1830 may first try to match the subsection to a template 1832 stored on the image classification device 1830. If a match is found (e.g., the subsection matches a template 1832 with a degree of confidence that exceeds a threshold), the image classification device 1830 assigns the classification of the matching template to the subsection of the image. If the image classification device 1830 is unable to match the subsection to a template with a high degree of confidence, the image classification device 1830 provides the subsection of the image to the hub 1810 and obtains a classification of the subsection from the hub device 1810.

In embodiments, the configuration device 1850 is a user device (e.g., mobile device or tablet device) executing a configuration application 1852. In embodiments, the configuration application 1852 may be created using a visual editor of an application system, such as the application system 100 discussed throughout this disclosure. The configuration application 1852 may communicate with an image classification device 1830 to configure the image classification device 1830. In embodiments, the configuration application may connect directly with an image classification device 1830 via a Bluetooth (e.g., Bluetooth Low Energy) connection or a WIFI connection. In some embodiments, the configuration application 1852 may assign or request a device identifier of the image classification device 1830 being configured. The configuration application 1852 may command an image classification device 1830 to capture and send a photo of an area being monitored. In response, the image classification device 1830 captures a photo and sends it to the configuration device 1850. In response to receiving the photo, the configuration application 1852 displays the photo via a user interface of the configuration device 1850 and asks the user to define a bounding box around the area being read. For example, if the image classification device 1830 is reading a round meter but the meter reading is displayed in a small rectangle near the middle of the meter, the user may define a small box over the small rectangle. In response to the user defining the bounding box, the configuration application 1852 may transmit the pixel values of the bounding box to the image classification device 1830 and may command the image classification device 1830 to capture an image of the area within the bounding box. In response, the image classification device 1830 captures an image of the area within the bounding box and transmits the image to the configuration device 1850. In response to capturing the image of the area within the bounding box, the configuration application 1852 may perform a pattern recognition process on the area within the bounding box to identify one or more bounding box segments. In some embodiments, each bounding box segment may correspond to a different region in the area where a character is displayed. For example, if reading a meter that reads two decimal points (e.g. tenths and hundredths) and five digits (e.g., 00000.00-99999.99), the configuration application 1852 may identify seven bounding box segments. Upon determining the bounding box segments, the configuration application 1852 provides pixel values corresponding to the boundaries of each bounding box segment.

In some embodiments, the configuration application 1852 may receive additional configuration information from the user. In embodiments, the configuration application 1852 may allow the user to define a type of unit being read (e.g., cubic meters, kilowatt hours, meters, seconds, or the like). In embodiments, the configuration application 1852 may allow the user to define a particular condition that triggers a reporting by the image classification device 1830 (e.g., when a multi-mode meter displays a reading in a particular unit). In these embodiments, the user may define an area in the captured image which the image classification device 1830 may analyze for the particular condition. In these embodiments, the configuration application 1852 may provide the boundaries of the area to analyze for the particular condition. The user may provide additional or alternative configuration parameters, such as a language being used, the type of text being read (numbers, letters, symbols, or combinations thereof), and the like.

The image classification device 1830 may receive the bounding box definition, the bounding box segments definitions, and any definitions of any additional areas to monitor (e.g., an area to monitor for a particular condition) and may begin to capture images. In embodiments, the image classification device 1830 may be configured to capture images at predetermined intervals (e.g., every ten minutes, every hour, every day, or the like). Additionally or alternatively, the image classification device 1830 may capture images in response to being instructed to by the hub device 1810. In either scenario, the image classification device 1830 may provide power to the camera (e.g., "wake up" the camera) and may capture an image of the entire field of view of the camera. The image classification device 1830 may then extract the relevant portions of the image. In embodiments, the image classification device 1830 may extract the portion of the image contained within the bounding box. The image classification device 1830 may then extract each subsection of the image contained within each respective bounding box segment. For each subsection of the image (i.e., the area within each respective bounding box segment), the image classification device 1830 attempts to match the image depicted in the subsection to a template 1832 that is stored in the memory of the image classification device 1830. Initially, the image classification device 1830 does not have any templates 1832 stored thereon. As such, the image classification device 1830 will initially be unable to match the subsection of the image to a template 1832. In the instance the image classification device 1830 cannot match the subsection to a template 1832, the image classification device 1830 provides the subsection of the image to the hub 1810, which in turn classifies the subsection of the image based on the subsection of the image and a larger set of templates 1832 that are stored on a template datastore 1812. In response, the hub 1810 classifies the subsection of the image and provides the classification to the image classification device 1830. In some embodiments, the hub 1810 also provides the template used to classify the subsection. Alternatively, in embodiments, the hub 1810 may only provide the classification and may instruct the image classification device to use the subsection of the image as a template 1832. The image classification device 1830 may then store the new template 1832, such that the template is used to classify the character indicated by the template in the future. Furthermore, the image classification device 1830 may associate the classification provided by the hub 1810 with the bounding box segment from which the subsection of the image was extracted. If the image classification device 1830 is able to match the subsection of the image with a template 1832 with a high degree of matching (e.g., >98%), the image classification device 1830 may classify the subsection of the image based on the classification of the matching template 1832 and may associate the classification with the bounding box segment from which the subsection of the image was extracted. Once the image classification device 1830 has classified and/or obtained classifications (e.g., from the hub device 1810) for the subsection extracted from each respective bounding box segment, the image classification device 1830 may combine the classifications of each subsection in accordance with the spatial relationships between the respective bounding box segments to obtain a string. For example, if the image classification device 1830 classifies a "1" from the leftmost bounding box segment, a "2" from the middle bounding box segment, and a "3" from the rightmost bounding box segment, the image classification device 1830 may combine the classifications into the string "123". The image classification 1830 may then transmit the string to the hub 1810. The hub 1810 may store the string and/or may transmit the string to another device (e.g., the backend server).

As the image classification device 1830 and the hub 1810 may iterate in the foregoing manner over a prolonged period of time, the hub 1810 will train the image classification device 1830 with a set of templates 1832 that can be used to classify any character that can appear in the area being monitored (e.g., any character that may appear in the bounding box). As the object being monitored is unlikely to change (e.g., the digits in a meter will always be in the same location, in the same size, and the same font), the set of templates 1832 on the image classification device 1830 is orders of magnitude smaller than the larger set of templates 1832 stored in the template database 1812 of the hub device 1810. This results in less memory being used and accessed by the image classification device 1830, as well as in less computations for the image classification device 1830 to perform, as the image classification device 1830 compares the captured images with a limited number of templates 1832. For example, in the case of a digital LED meter, the image classification device 1830 only needs to store ten templates (i.e., a template for a digital "0", a template for a digital "1", a template for a digital "2", . . . , and a template for a digital "9"). Thus, each time a subsection of an image is extracted, the image classification device 1830 only needs to compare the subsection with ten different templates. In another example, in the case of a wheel counter meter, each digit may have anywhere from three to seven templates 1832 corresponding thereto. In this example, each time a subsection of an image is extracted, the image classification device 1830 only needs to compare the subsection with up to seventy different templates 1832 (assuming there are seven templates per digit).

In some embodiments, the image classification device 1A30 may extract an area to monitor for a particular condition and may determine whether the condition is met, prior to analyzing the area within the bounding box. In these embodiments, the image classification device 1A30 may classify a portion of the image for the particular condition (e.g., a water meter is depicting gallons) before performing other operations.

Figure 34:
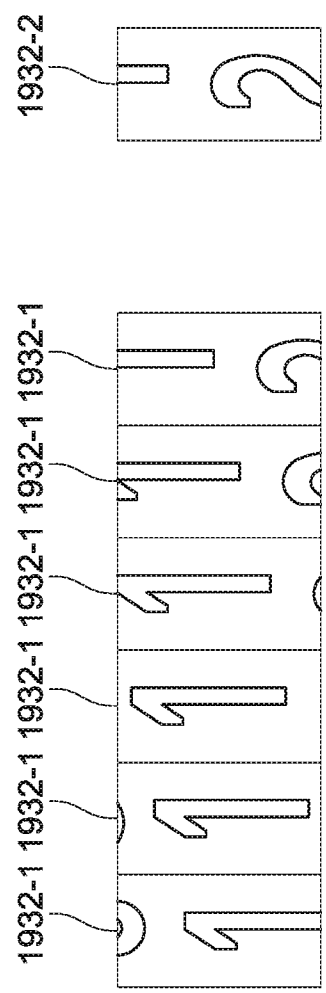
FIG. 34 illustrates an example of templates that may be stored on an image classification device, according to some embodiments of the present disclosure.

FIG. 34 illustrates an example of templates 1932-1 that may be stored on an image classification device 1830 to classify a "1" and a template 1932-2 that may be stored on the image classification device 1830 to classify a "2" when the object being monitored is a wheel counter meter. It is noted that the templates 1932-1, 1932-2 correspond to the font and font size of the characters being captured by the image classification device 1830 in the bounding box segments. In this example, the "1" templates illustrate the different ways a "1" may appear in the meter. While there may be instances where an image of a "1" on the meter falls between two of the templates 1932-1, the image classification device 1830 will determine that the image "matches" one of the two templates 1932-1 on account of being more similar to one of the templates 1932-1. The foregoing example is meant to illustrate templates 1832 of a particular font and color on a wheel counter meter. A respective image classification device 1830 may store any other suitable templates, the appearance of which depends on the font, color, and meter type of the meter being monitored by a respective image classification device 1830.

Figure 35:
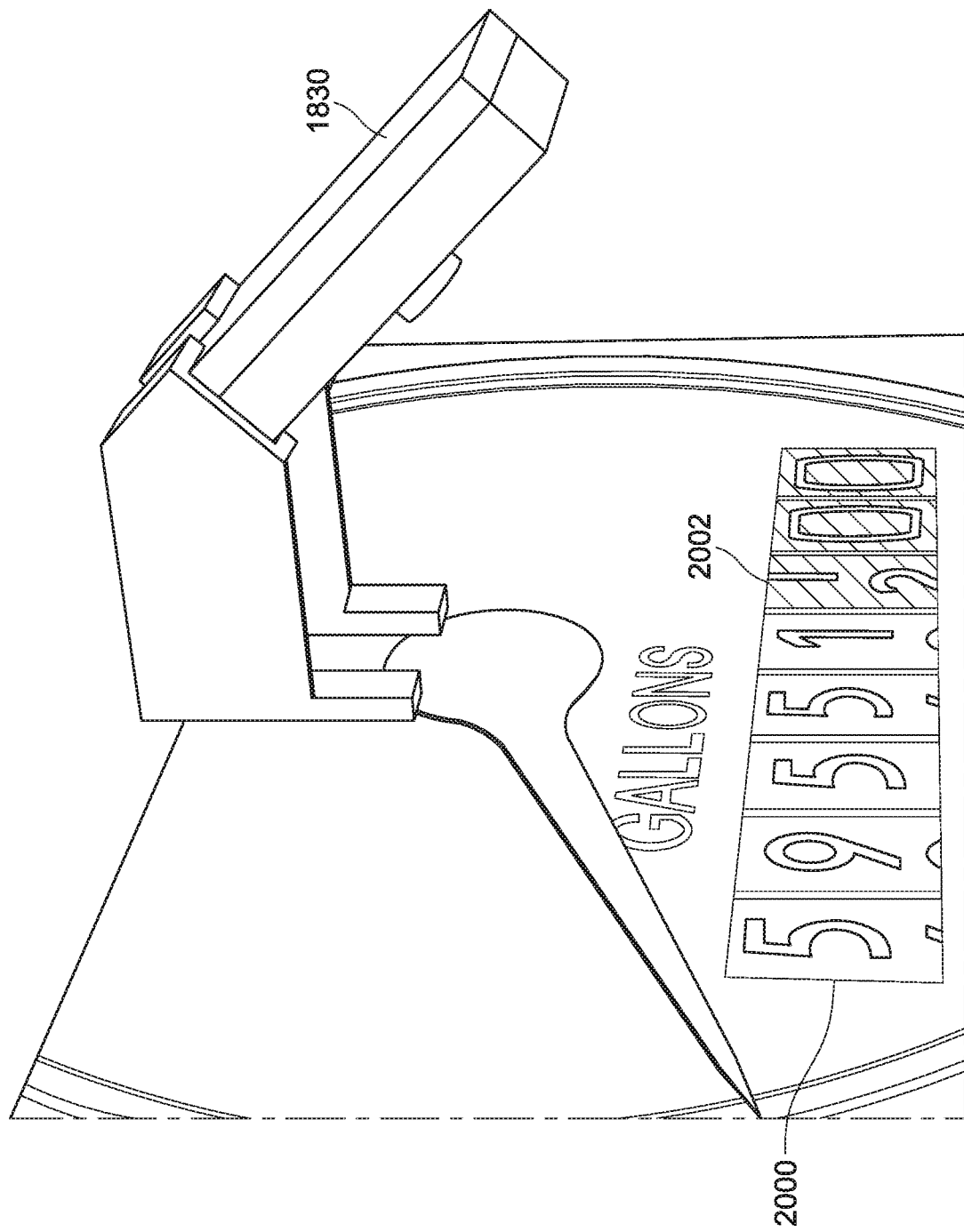
FIG. 35 depicts an example of a wheel counter meter (e.g., a water meter) that may be read by an image classification device, according to some embodiments of the present disclosure.

FIG. 35 illustrates an example of a wheel counter meter 2000 (e.g., a water meter) that may be read by an image classification device 1830. As shown in FIG. 20, the unit of measurement is gallons and the meter has eight digits. In this example, the meter 2000 can display values between 00000.000 gallons to 99999.999 gallons. In the example, the meter is reading 59551.100 gallons or 59551.200 gallons, as the tenths digit is between a "1" and a "2". When the image classification device 1830 reads the third bounding box segment from the right 2002, the image classification device 1830 may classify the value as a "2", assuming the template 1932-2 from FIG. 34 is stored on the image classification device 1830. In the event the template 1932-2 is not stored on the image classification device 1830, the image classification device 1830 transmits the image contained within the third bounding box segment 2002 to the hub device 1810, which classifies the image as depicting a "2", and the image classification device 1830 may update its templates 1832 accordingly. Once the image classification has classified and/or obtained classifications for each character/character orientation depicted in the bounding box segments, the image classification device 1830 may combine the classifications to obtain the string "59551.200", which the image classification device 1830 may output to the hub device 1810.

Referring back to FIG. 33, the hub-and-spoke system 1800 provides a low power, computationally efficient manner to train and deploy an image classification device 1830 to perform a narrowly defined image classification task. In embodiments, the image classification devices 1830 attempts to match subsections of images to the limited set of templates respectively stored thereon, while the hub device 1810 may perform the more computationally intensive classification tasks on behalf of the image classification devices 1830 when the image classification devices 1830 are unable to classify subsections of images. In determining a classification on behalf of an image classification device 1830, the hub device 1810 may update the templates 1832 of the image classification device 1830 based on the results of the classification (i.e., either providing the template 1832 used to make the classification or instructing the image classification device to store the now classified subsection as a template 1832). Initially, the hub device 1810 will perform most of the image classification tasks. As an image classification device 1830 learns more templates 1832, however, the image classification device 1830 will be able to perform most or all of the classifications without assistance from the hub device 1810. In this way, the image classification devices 1830 will use less power and reduces the amount of data transmitted between the image classification devices 1830 and the hub 1810 over time.

In embodiments, the hub device 1810 may store a template datastore 1812 that stores a wide range of templates 1832. For example, the templates 1832 may include templates 1832 depicting characters in the most common fonts (e.g., the twenty most common fonts), variations of characters in different languages, punctuation marks, depictions of characters in a digital LED display, depictions of digits in a wheel counter display, and the like. In embodiments, the hub device 1810 is configured to receive an image (e.g., a subsection of an image extracted from a bounding box segment) and to attempt to match the image to one of the templates 1832. Furthermore in some embodiments, the hub device 1810 may include a set of logic rules that help guide classification of borderline cases and/or to determine when classification of the image is unreliable (e.g., in the case of an obstruction of the field of view of the camera). For example, if reading a wheel counter, a "1" and a "7" may appear to be similar to one another when the top of the digit is no longer visible in the field of view of the image classification device 1830. In such an example scenario, the hub device 1810 may be configured with a logic rule that indicates that a "1" is always followed by a "2" and a "7" is always followed by an "8". In this example, due to the positioning of the digit, the top of the next digit will be in the field of the view of the camera, and the hub device 1810 may attempt to classify the depicted digit based on whether the top of the next digit more closely resembles a "2" or an "8". Once the hub device 1810 is able to make a classification (e.g., a classification of a "1" rather than a "7")), the hub device 1810 may instruct the image classification device 1830 that captured the image to use the classified image as a template 1832.

In another example, the hub device 1810 may be configured with logic rules that determine when a portion or the entire area within the bounding box is occluded. For example, the hub device 1810 may receive one or more images contained in one or more respective bounding box segments that the hub device 1810 is unable to match to a template 1832 stored in the template datastore 1812. In such a scenario, the logic rules may instruct the hub device 1810 to request another set of images from the image classification device 1830 that provided the images. If the hub device 1810 had previously classified images contained in the respective bounding box segments, and the hub device 1810 is unable to classify the set of images received in response to the request, then the hub device 1810 may determine that there is an occlusion that is preventing the image classification device 1830 from capturing a classifiable image. In such a scenario, the hub device 1810 may be configured to make a record of the occlusion, such that the downstream application that receives the results of the classification may receive the record of the detected occlusion. Furthermore, in this example, if the occlusion remains for a prolonged period of time (e.g., more than thirty minutes), the rules may cause the hub device 1810 to issue a notification to a human (e.g., to a user device/account associated with the human) so that the occlusion may be removed from the object being read or the lens of the image classification device 1830. The foregoing are only examples of logic rules that may be executed by the hub device 1810. Additional or alternative logic rules may be implemented without departing from the scope of the disclosure.

In the case the image classification device 1830 is unable to match a subsection of an image to a template 1832 (either because the image classification device 1830 does not have any templates 1832 or none of the templates match the subsection with a minimum degree of confidence), the image classification device 1830 may transmit the subsection of the image to the hub 1810. As discussed, the hub device 1810 may include a template datastore 1812 that may store hundreds, thousands, or tens of thousands of templates 1832, where each template 1832 includes an image of a character (e.g., a letter, a number, a symbol, or the like) and an identifier of the character depicted in the image. The hub 1810 attempts to identify the template 1832 that most closely matches the subsection of the image. In response to identifying the closest matching template, the hub 1810 transmits the template 1832 and/or a classification of the subsection image to the image classification device 1830. The image classification device 1830 may associate the classification of the subsection with the bounding box segment from which the subsection was extracted.

It is noted that while the foregoing examples pertain to classifying digits, the foregoing system 1800 may be applied to other constrained machine vision tasks. For example, the system 1800 may be configured to read text from predefined areas, to identify certain objects in a predefined area and the like. In these alternate use cases, the hub device 1810 needs to have templates that can be used to classify the types of things being monitored for. For example, in some embodiments, the hub-and-spoke image classification system 1800 may be configured to count certain types of objects in the field of view of one or more image classification devices 1830. For example, the image classification device 1830 may count the number of people walking in through a particular area, the number of trays in a TSA security checkpoint, a number of packages passing through a conveyer belt, and the like. In these embodiments, the templates 1832 stored on a hub device 1810 include templates of the different objects that the image classification device 1830 monitors for. For example, in monitoring the number of packages passing through a particular area, the hub 1810 may be configured with templates of all different types of packages, while the image classification devices 1830 may only store templates 1832 corresponding to images of packages that have been captured by the respective image classification devices. In some embodiments, a hub-and-spoke image classification system 1800 may be configured to detect the presence of objects. For example, an image classification system 1800 may be configured to detect the presence of an airplane on a tarmac. In this example, the hub 1810 may store images of various types of airplanes taken from various angles. Each image classification device, 1830 may be oriented at a different angle from the tarmac. As such, an image classification device 1810 only needs templates of images of a clear tarmac and images of different types of planes that enter its field of view (e.g., particular models, particular airlines, etc.) taken at angles that correspond to the field of view of the image classification device 1830 (e.g., taken from the side, taken from the front, etc.). In this way, the image classification devices 1830 may be dispersed along a tarmac, so that it can classify whether a plane is in the point of view of the image classification device 1830, the type of plane that is in the field of view, and/or an airline of the plane that is in the field of view.

Figure 36:
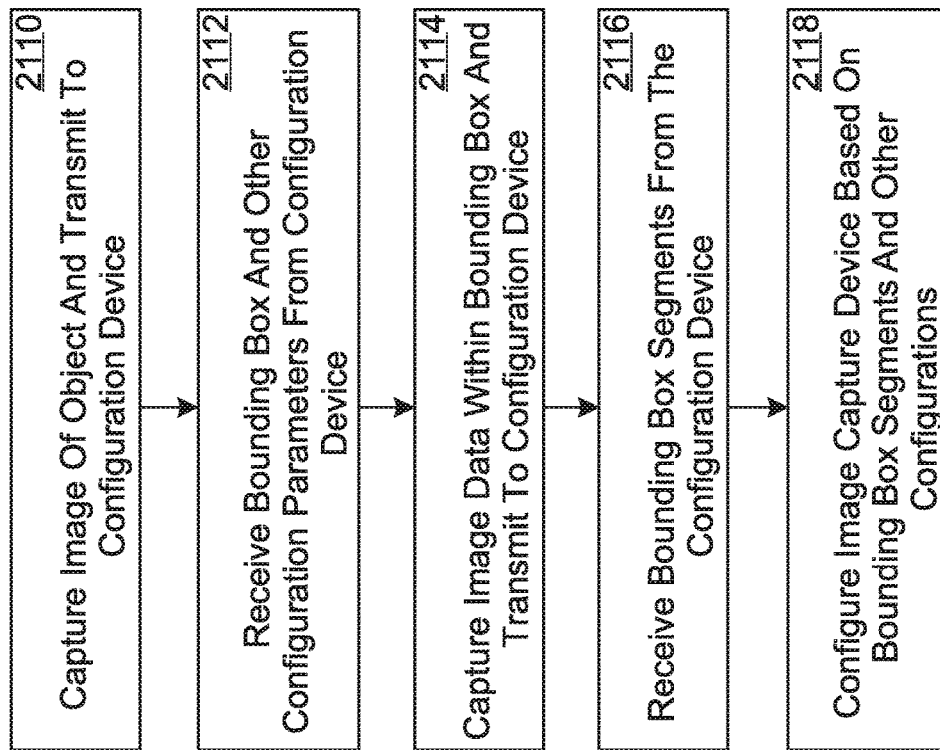
FIG. 36 depicts an example set of operations of a method for configuring an image classification device, according to some embodiments of the present disclosure.

FIG. 36 illustrates an example set of operations of a method 2100 for configuring an image classification device 1830. In embodiments, the method is executed by an image classification device 1830. The image classification device 1830 may be configured by a configuration device 1850 that is operated by a user. The configuration device 1850 may communicate with the image classification device 1830 via a Bluetooth connection or a WIFI connection. Once a connection is established, the configuration device 1850 may obtain a device identifier of the image classification device 1830 or may assign a device identifier to the image classification device 1830. The configuration device 1850 may request an image from the image classification device 1830.

At 2110, the image classification device 1830 captures an image of an object being monitored and transmits the image to the configuration device 1850. For example, the image classification device 1830 may capture an image of a meter (e.g., a digital LED meter or a wheel counter meter).

In embodiments, the configuration device 1850 may present the captured image in a GUI to a user of the configuration device 1850, whereby the user may define the bounding box via the GUI presented by the configuration device. For example, the configuration device 1850 may display the image of the object being monitored and the user may draw the boundary of the bounding box. In response the configuration device 1850 may determine the pixels corresponding to the boundaries of the bounding box (e.g., the corners of the bounding box or the lines making up the bounding box), which may be referred to as a bounding box definition. The configuration device 1850 transmits the bounding box definition (e.g., pixels corresponding to the boundaries of the bounding box) to the image capture device 1830.

At 2112, the image classification device 1830 receives the bounding box definition from the configuration device. The image classification device 1830 may store the bounding box definition, such that the image classification device 1830 uses the bounding box definition to crop images that are captured in the future. In embodiments, the image classification device 1830 may receive other configuration parameters. For example, the user may request additional types of sensor data that are to be collected by the image classification device 1830. In these embodiments, the user may select sensor data types from a set of sensor data types that the image classification device 1830 is configured to measure (e.g., temperature, humidity, etc.).

At 2114, the image classification device 1830 captures image data within the bounding box and transmits the image data to the configuration device 1850. In embodiments, the image classification device 1830 captures an image of the object being monitored and extracts the portion of the image contained in the bounding box. The image classification device 1830 may transmit the image data to the configuration device 1850. The configuration device 1850 receives the image data and performs image analysis on the image data to determine one or more bounding box segments. In embodiments, the configuration device 1850 identifies segments that define respective areas where a character may be found. For example, with respect to a meter, each bounding box segment corresponds to a different digit of the meter. In embodiments, the configuration device 1850 may define the boundaries of each identified bounding box segment (e.g., pixel values of each corner). In some embodiments, the configuration device 1850 may also determine whether certain symbols are present, such as a decimal point, and if so, a location of the symbol. If so, the configuration device 1850 may provide the symbol and a location of the symbol relative to the bounding box segments.

At 2116, the image classification device 1830 receives the bounding box segment definitions and configures itself in accordance with the bounding box segment definitions and any other configuration parameters. The image classification device 1830 may store the pixel locations of each respective bounding box segment, such that when images are captured, the image classification device 1830 may extract subsections of the image from each respective bounding box segment. In embodiments, the image classification device 1830 may further configure itself to capture and report data from specific sensors. In these embodiments, the image classification device 1830 may obtain the sensor data each time (or every N times) an image is captured and may communicate the sensor data to the hub device 1810. Once configured, the image classification device 1830 may begin capturing and classifying images, and in the process training itself to perform image classification.

Figure 37:
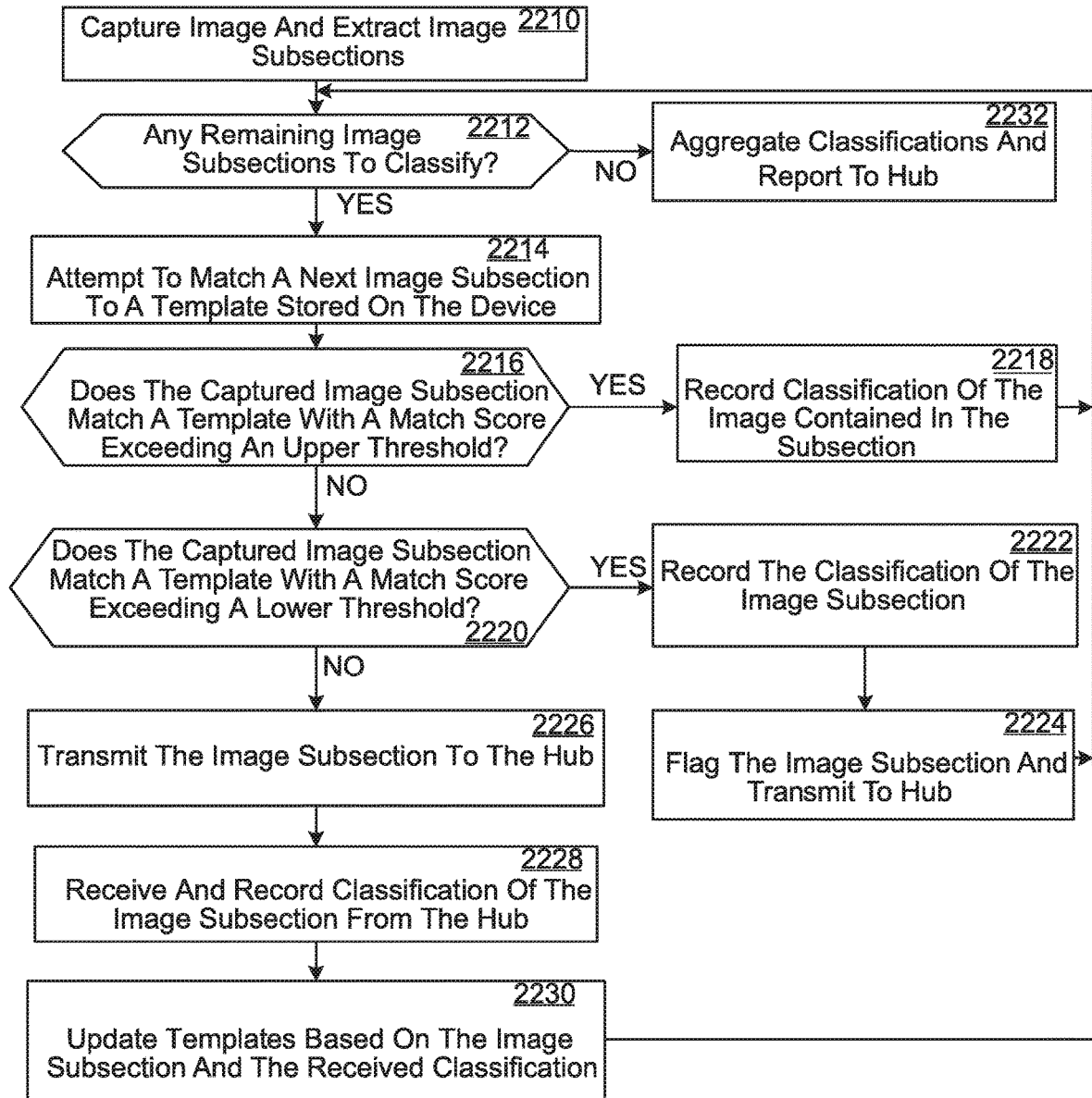
FIG. 37 depicts an example set of operations of a method for classifying images by an image classification device and, in the process, training the image classification device, according to some embodiments of the present disclosure.

FIG. 37 illustrates an example set of operations of a method 2200 for classifying images by an image classification device 1830 and, in the process, training the image classification device 1830. The method 2200 is executed by the image classification device 1830 and may be performed in conjunction with a hub device 1810 in communication with the image classification device 1830. As discussed the hub device 1810 may be configured with a template datastore 1812 that stores a broad set of templates 1832. The hub device 1810 may use these templates 1832 to perform image classification on behalf of the image classification device 1830 when the image classification device 1830 is unable to classify a subsection of an image.

At 2210, the image classification device 1830 captures an image and extracts subsections of the image. In embodiments, the image classification device 1830 captures the image at predefined intervals. Alternatively, the image classification device 1830 may capture the image at the request of the hub device 1810. Upon capturing the image, the image classification device 1830 extracts one or more subsections of the image. In some embodiments, the image classification device 1830 extracts the area being monitored based on the boundaries of the bounding box defined via the configuration device 1850. Alternatively, the image classification device 1830 only captures an image of the area being monitored, such that the captured image is bounded by the bounding box. In embodiments, the image classification device 1830 extracts each subsection from the image of the area being monitored by extracting the portion of the image bounded by a respective bounding box segment. In embodiments, the image classification device 1830 may associate each subsection to the bounding box segment from which it was extracted. It is noted that in some embodiments, the image classification device 1830 may perform additional image processing operations on the captured image prior to or after extraction of the subsections. In embodiments, the image classification device 1830 may rectify an image (or subsection thereof), denoise an image, perform light compensation and auto logical thresholding, and/or perform 2, 4, 8, and/or 16 level morphological closing on the image.

At 2212, the image classification device 1830 determines whether there are more image subsections to analyze. In some embodiments, the analysis of each image subsection can be performed in parallel. For purposes of explanation, however, the method 2200 is depicted as being performed serially. When there are no more image subsections to analyze, the image classification device 1830 may proceed to operation 2232, which is discussed below.

At 2214, the image classification device 1830 attempts to match a subsection of the image to a template 1832 stored on the image classification device 1830. In embodiments, the image classification device 1830 may compare the extracted image subsection to each of the templates 1832 stored on the image classification device 1830. In some embodiments, the image classification device 1830 executes a pattern matcher that analyzes the image subsection with a respective template. In some embodiments, the pattern matcher performs fuzzy radial matching. In some of these embodiments, the image classification device 1830 performs a 1/32 pixel Gaussian blur for the fuzzy radial matching. In embodiments, the image classification device 1830 uses 2, 4, 8, or 16 level grey scale templates 1832 to perform the pattern matching. In some embodiments, the pattern matcher outputs a match score indicating a degree to which the image subsection matches a template 1832. In some of these embodiments, the pattern matcher determines a match score with respect to a template 1832 based on a match penalty and/or a match quality. In embodiments, the match penalty may be calculated according to $\Sigma(abs([a]-[b]))$. In embodiments, the match quality may be calculated according to $\Sigma(16-abs([a]-[b])).])$. In embodiments, the pattern matcher compares an image subsection to a template using a sliding window. For example, an image subsection may be compared with a template using a sliding window offset of 0 (e.g., an offset of (x, y)=(0, 0)), which is just a direct comparison. In this example, the image subsection may be compared with a template using a sliding window offset of 1 (e.g., offsets are (x, y)=(0,0), (0,1), (0,−1), (1, 1), (1, −1), (1,0), (−11, 1), (−1, −1), and (−1,0)), which is a total of 9 comparisons. In some examples the image subsection may be compared with a template with a sliding window offset of two, which would include 25 comparisons. It is noted that the comparisons may be made in grayscale and/or in color.

At 2216, the image classification device 1830 determines whether the match score corresponding to a template 1832 exceeds an upper threshold (e.g., 0.98). In embodiments, match scores that exceed the upper threshold are considered high confidence matches. Thus, when a match score with respect to a subsection and template 1832 exceeds the upper threshold, the subsection is determined to have matched the template 1832, and the image classification device 1830 proceeds to operation 2218. If none of the templates 1832 have a match score that exceeds the upper threshold, the image classification device 1830 proceeds to 2220.

At 2218, the image classification device 1830 records a classification of the image subsection. In embodiments, the image classification device 1830 may associate the classification indicated by the matching template 1832 with the image subsection and/or the bounding box segment from which the image subsection was extracted.

At 2220, the image classification device 1830, the image classification device 1830 determines whether the match score corresponding to a template 1832 exceeds a lower threshold (e.g., 0.90). In embodiments, match scores that exceed the lower threshold but are less than the upper threshold are considered lower confidence matches. Thus, when a match score with respect to a subsection and template 1832 exceeds the lower threshold but is less than the upper threshold, the subsection may be considered a match, but may be flagged for later consideration by the hub device 1810. In this scenario, the image classification device 1830 proceeds to operation 2222. Otherwise, the image classification device 1830 determines that the subsection does not match any of the templates 1832 and proceeds to operation 2226.

At 2222, the image classification device 1830, the image classification device 1830 records a classification of the image subsection. In embodiments, the image classification device 1830 may associate the classification indicated by the matching template 1832 with the image subsection and/or the bounding box segment from which the image subsection was extracted.

At 2224, the image classification device 1830 flags the image subsection and transmits the image subsection to the hub device 1810. In embodiments, the image classification device 1830 may flag the image subsection by storing the image subsection in a temporary buffer, such that the hub device 1810 may verify the classification. If the hub device 1810 verifies the classification, the classification may be stored and used as a template 1832 for future classifications. If the hub device 1810 does not verify the classification, the hub device 1810 may provide a new classification of the image subsection. In some of these embodiments, the hub device 1810 may provide the template 1832 used to determine the new classification to the image classification device 1830 or may instruct the image classification device 1830 to use the subsection and the new classification as a template 1832.

At 2226, the image classification device 1830 transmits the image subsection to the hub device 1810. In this scenario, the image classification device 1830 was unable to match the image subsection to a template 1832. In response, the hub device 1810 classifies the image subsection based on the templates 1832 stored on the template datastore 1812 of the hub device 1810. The hub device 1810 may use similar pattern matching techniques as the image classification device 1830. Furthermore, in some embodiments, the hub device 1810 may execute one or more rules to assist in the classification or determine that the area being monitored is occluded. Assuming the hub device 1810 is able to make a classification of the image subsection, the hub device 1810 provides the classification of the image subsection to the image classification device 1830. In some of these embodiments, the hub device 1810 may provide the template 1832 used to determine the new classification to the image classification device 1830. In some embodiments, the hub device 1810 may instruct the image classification device 1830 to use the subsection and the new classification as a template 1832.

At 2228, the image classification device 1830 receives and records the classification of the image subsection from the hub device 1810. In response to receiving the classification of the image subsection, the image classification device 1830 associates the classification with the image subsection and/or the bounding box segment from which the image subsection classification was extracted.

At 2230, the image classification device 1830 updates the templates based on the image subsection and the received classification. In some embodiments, the image classification device 1830 may create a new template 1832 based on the classification provided by the hub device 1810 and the image subsection. In response to generating the new template, the image classification device 1830 may store the new template 1832 in its memory. In other embodiments, the hub device 1810 provides a template 1832 that was used to classify the image subsection. In response to receiving the template 1832 from the hub device 1810, the image classification device 1830 may store the received template 1832 in its memory. In some embodiments, the hub device 1810 may manage the templates stored on an image classification device 1830. In these embodiments, the hub device 1810 may limit the number of templates 1832 that are stored on a particular image classification device 1830 for each particular symbol that the image classification device 1830 may receive. For example, the hub device 1810 may determine that only three different templates 1832 are needed to classify a "5" but six different templates are needed to classify a "1" or a "7". In such a scenario, the hub device 1810 may determine the best three templates 1832 to classify a "5" for a given image classification device 1830, and the best six templates to classify each of a "1" and a "7" for the given image classification device 1830 based on the variations of the respective templates.

At 2232, the image classification device 1830 aggregates the classifications of all of the image subsections. In embodiments, the image classification device 1830 maintains a reporting string. Each time the image classification device 1830 makes or receives a classification, the image classification device 1830 appends the classification to the string, assuming the image subsections are classified from left to right. Once each image subsection is classified, the image classification device 1830 may transmit the reporting string to the hub device 1810.

The methods 2100 and 2200 may be executed with respect to multiple image classification devices 1830 that communicate with a hub device 1810 to monitor a number of different objects being monitored. For example, a hub device 1810 may be paired with multiple image classification devices 1830 that are positioned relative to respective meters, whereby each image classification device 1830 is tasked with "reading" the meter using the techniques described above.

Figure 38:
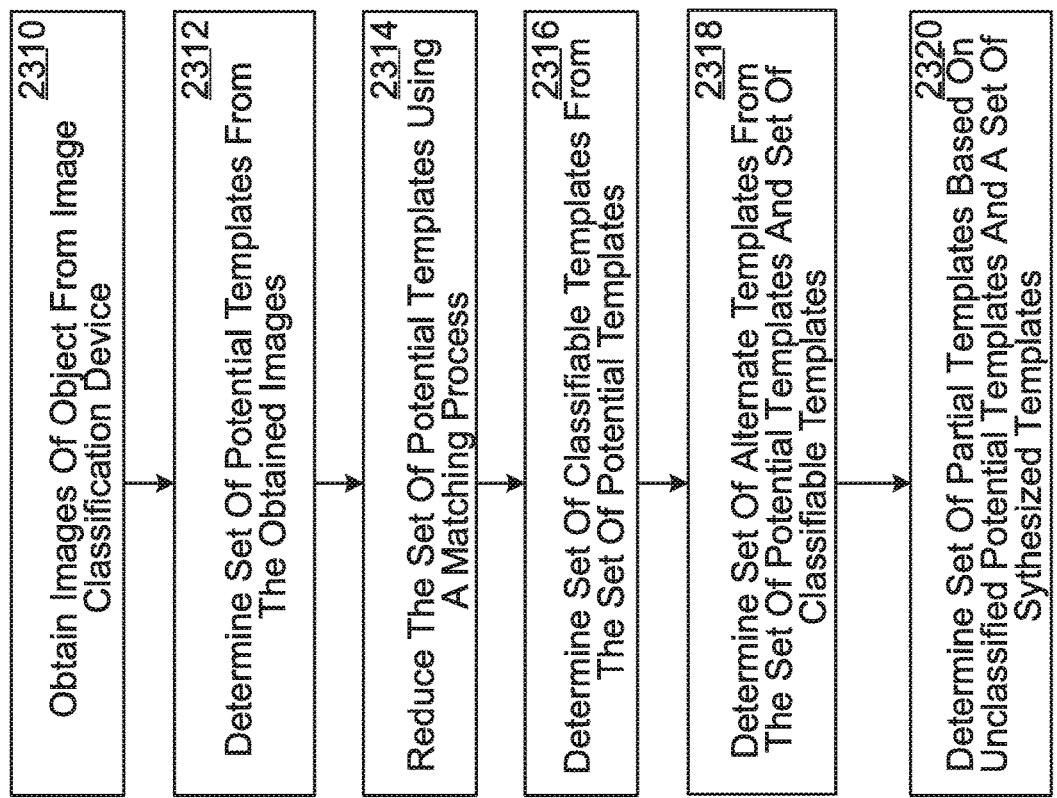
FIG. 38 depicts a method for training minimal efficient template sets for an image classification system, according to some embodiments of the present disclosure.

FIG. 38 illustrates a method for training minimal efficient template sets for an image classification system. In embodiments, the hub-and-spoke classification system 1800 may be configured to generate minimal efficient template sets. A minimal efficient template set is a template set that is trained to reduce processor usage, consumption, and battery usage for image classification devices 1830, while still maintaining a targeted confidence in the accuracy of a classification (e.g., >99%). For example, an efficient template set that characterizes digits on a wheel counter may include three templates for the number "2" and four templates for the number "8", as the character "8" may be more likely to be confused with a "9" or a "0".

At 2310, the hub device 1810 obtains a set of images from an image classification device 1830. In embodiments, the hub device 1810 controls an image classification device 1830 to capture images. The hub device 1810 may obtain a large set of images from the image classification device 1830 for which the hub device 1810 is generating the minimal efficient template set.

At 2312, the hub device 1810 determines a set of potential templates from the captured images. For each captured image, the hub device 1810 may preprocess the captured image. In embodiments, preprocessing a captured image may include transforming the perspective of the image, rotating and/or scaling the image, cropping the image in relation to the bounding box defined with respect to the image classification device 1830, and extracting the image subsections relating to individual characters from the bounding box. In embodiments, the image subsections may correspond to potential characters, which may be joined into a set of potential templates. Initially each respective extracted image subsection may be considered a potential template.

At 2314, the hub device 1810 reduces the set of potential templates via a matching process. For each potential template, the hub device 1810 attempts to match the potential template against each of the other potential templates that are collected by the hub device 1810 from a respective image classification device 1830. In embodiments, the hub device 1810 implements a template matching algorithm (e.g., invariant grey scale matching or the like) to attempt to perform the matching process. In embodiments, the matching process results in a list of similarity scores for each respective potential template indicating a degree of similarity to every other potential template. In embodiments, the similarity score between two potential templates (e.g., a potential template being analyzed and another captured potential template) may be represented by a value (e.g., a value between zero and one, where zero indicates no similarity between two potential templates and one indicates a 100% match between two images). If the list of similarity scores for a potential template does not include a similarity score that exceeds a similarity threshold (e.g., 0.97), the potential template is added to a set of new templates, such that the set of new templates are templates that will be further analyzed and/or classified. In some embodiments, if a potential template has at least one similarity score associated therewith that exceeds the similarity threshold, the hub device 1810 may discard the potential template or may associate the potential template with a template that is already in the set of new templates. In the latter scenario, the potential template is kept for analysis templates but is considered duplicative of the previously identified template or templates. In embodiments, the hub device 1810 may continue to iterate in this manner (e.g., identifying potential templates and determining a list of similarity scores for the potential templates) until a requisite amount of new potential templates captured from N (where N≥2) consecutive images all have a similarity score that are equal to or greater than a similarity threshold (e.g., 0.97), such that all the potential templates are determined to substantially match one or more other previously collected potential templates. In these embodiments, having such matching templates may imply that the hub device 1810 has encountered all of the characters and character positions possible for an object being monitored (e.g., meter). Once all of the captured images converge with the set of new templates, the hub device 1810 may consider the set of new templates to be complete. Depending on the speed at which the characters change (e.g., the speed at which a meter turns) and/or the frequency at which the images are captured, the hub device 1810 may capture and process many images. To avoid creating a very large corpus of potential templates, in embodiments the hub device 1810 may discard new potential templates that substantially match one or more other templates (e.g., similarity score ≥0.98) in the set of new templates. In some embodiments, the hub device 1810 may maintain a count of occurrences of matching potential templates (e.g., a number of potential templates that substantially matched another potential template) to help ensure an accurate statistical measure.

At 2316, the hub device 1810 determines a set of classifiable templates based on the reduced set of potential templates. In embodiments, the hub device 1810 may attempt to classify each potential template in the set of new templates. In some of these embodiments, the hub device 1810 may employ unsupervised OCR and/or image matching techniques to attempt to recognize a character in a potential template. For each potential template, the hub device 1810 may identify zero or more prospective matches (i.e., matches to a known character). For each prospective match, the hub device 1810 may assign a weighted match value to the prospective match between a potential template and a respective known character, whereby the weighted match value indicates a likelihood that the potential template matches the respective known character. In these embodiments, the hub device 1810 may determine an estimated character label classification for a potential template based on the weighted match scores corresponding to the potential template. For example, the hub device 1810 may assign an estimated character label classification to a potential template when a weighted match value pertaining to a particular character exceeds a match threshold (e.g., >96%). Because of the deficiencies related to unsupervised character recognition with respect to partial characters (e.g., partially rotated characters) and generalized character recognition (which may be from varying styles of characters), the unsupervised character recognition may be less reliable for many templates (e.g., no weighted match scores exceed the match threshold), but very reliable when classifying potential templates depicting whole or nearly whole characters. For example, the unsupervised character recognition process may accurately classify a fully depicted "2" character but may be unable to reliably classify a half depicted "2" character. The potential templates that are reliably classified (e.g., having respective weighted match values that equal or exceed the match threshold) are labeled with the character determined by the character recognition and included in the set of classifiable templates, which is provided to the image classification device 1830 that captured the images from which the templates were derived.

At 2318, the hub device 1810 determines a set of alternate templates based on the potential templates that were unable to be classified and the set of classified images. With respect to templates that were not reliably classified, the hub device 1810 may have been unable to classify for a number of different reasons. For example, a character in the potential template may have been partially obfuscated, may be depicted in a slightly different manner (e.g., the ink on a number "7" is slightly thicker on one of the meters), or the image may depict the character in transition (e.g., between a "0" and a "1"). The former two scenarios may be referred to as "ambiguous labelling." In these scenarios, the ambiguous labelling may be detected when a potential template matches a known character but does not sufficiently match the majority of other templates having the same classification. For instance, the potential template may be confidently classified as a "7" but does not match the other "7" templates previously classified by the hub device. In this scenario, the hub device 1810 may determine a similarity score between the prospective template and other templates that were classified as a "7", where the similarity score may be based on a number of matching pixels v. a total number of pixels in the respective images of the "7" s. If the similarity does not exceed the match threshold, the potential template is not included in the set of alternate templates and, in some embodiments, may be flagged for later resolution. If the similarity score is greater than a match threshold (e.g., >0.97) the prospective template is included in the set of alternate templates. In this way, potential templates falsely matched with a classification (e.g., a partially occluded "8" that is falsely matched to a "3" or a "6") are not later used as templates by the image classification device 1830 being trained, while potential templates corresponding to characters that may be depicted in a slightly different manner (e.g., a character that was depicted in a slightly thicker or thinner font in a particular instance) are used to later classify characters depicted in that manner, while maintaining a power efficient number of templates. After analyzing the potential templates that were not reliable classified in this manner, the hub device 1810 may provide the set of alternate templates to the image classification device 1830 being trained.

At 2320, the hub device 1810 determines a set of character fragment templates based on the potential templates that were unable to be classified using character recognition and a set of synthesized templates. In some scenarios, an image of a character may be captured when the character is in transition (e.g., a spinning digit on a wheel counter meter transitioning from "1" to "2"). As traditional character techniques recognition (e.g., OCR) cannot classify such template fragments reliably, the hub device 1810 may generate a set of synthetic templates that represent transitioning characters (e.g., transitions between "0" and "1", "1" and "2", "2" and "3", "3" and "4-", "4" and "5", "5" and "6", "6" and "7", "7" and "8", "8" and "9", and "9" and "0") from the set of characterized template. For example, to generate a synthesized template for the transition between "0" and "1", the hub device 1810 may generate a template using the bottom half of a "0" character and a top half of a "1" character, as depicted in classified templates of the "0" character and the "1" character. Similarly, to generate a synthesized template for the transition between "1" and "2", the hub device 1810 may generate a template using the bottom half of a "1" character and a top half of a "2" character, as depicted in classified templates of the "1" character and the "2" character, and so on and so forth. It is noted that the hub device 1810 may generate other suitable synthesized templates for other logical depictions of a character (e.g., bottom third of a "1" character with a top two thirds of a "2" character). For each synthesized template, the hub device 1810 attempts to match the synthesized template to the unclassified potential templates. If more than a threshold number of potential templates match the synthesized template (e.g., >5 potential templates match the synthesized template), the hub device 1810 may include one of the matching potential templates in the set of character fragment templates. The hub device 1810 may continue in this manner until each of the synthesized templates is analyzed. The hub device 1810 may provide the set of character fragment templates to the image classification device 1830 being trained. In embodiments, the hub device 1810 may determine the most efficient set of character fragment templates, whereby the greatest amount of captured images match to the least number of character fragment templates. For example, there may be more character fragment templates that are used to classify the transition from "1" to "2" and from "7" to "8" than from "0" to "1" or from "6" to "7". The number of character fragment templates may be selected to be the most efficient number of such templates that still result in highly accurate (e.g., >0.99) accuracy.

The forgoing method may be applied to generate a minimal template set of templates. These templates (the classified templates, the alternate templates, and the character fragment templates) improve the performance of the image classification device 1830, as there are less templates to test against, which preserves the battery of the image classification device. Furthermore, in embodiments, the foregoing method ensures that the templates are unique and will contribute to a known number of matches statistically. In this way, it is possible to allocate more templates for certain characters due to physical variation and errors are more easily detected based on the statistical probabilities associated with future matches (i.e., matches or lack of matches when the image classification device 1830 is in operation). For example, the probability distribution of matches from the template sets should be the same when comparing the original corpus data against all future captured images. To the extent that the distribution of future matches decreases, an error condition is likely (e.g., an obfuscation of the character being read).

Referring to FIGS. 1, 15A-15E, and 19, in embodiments the application system 100 in combination with a server kit 200 and/or a generative content system 1100 may be collectively configured to generate, provide, and/or enhance digital twins. In embodiments, a digital twin may refer to a data representation of a real-world environment and/or data representations of one or more entities, and/or combinations thereof. In embodiments, one or more digital twins may be embedded in a larger digital twin. For example, digital twins of buildings, roads, or the like, may be embedded in a digital twin of a city environment. Taking this example one step further, digital twins of pipes, electrical wiring, and the like, may be embedded in the digital twin of a building. Furthermore, in some embodiments, a digital twin may be infused with additional data that relates to a state of a real-world environment and/or entity. For example, a digital twin of a city may be enhanced with traffic data, population data, population density data, demographic data, water flow data, entity data (e.g., names of retail establishments, business, and the like), weather data, and any other suitable data. In another example, a digital twin of a building may include occupancy data, blueprint data (e.g., locations of load bearing walls, elevator shafts, electrical work, plumbing, and the like), water usage data (e.g., read from water meters that measure water usage of the building), electricity usage data (e.g., read by electricity meters that measure electricity usage of the building), and the like.

Figure 39:
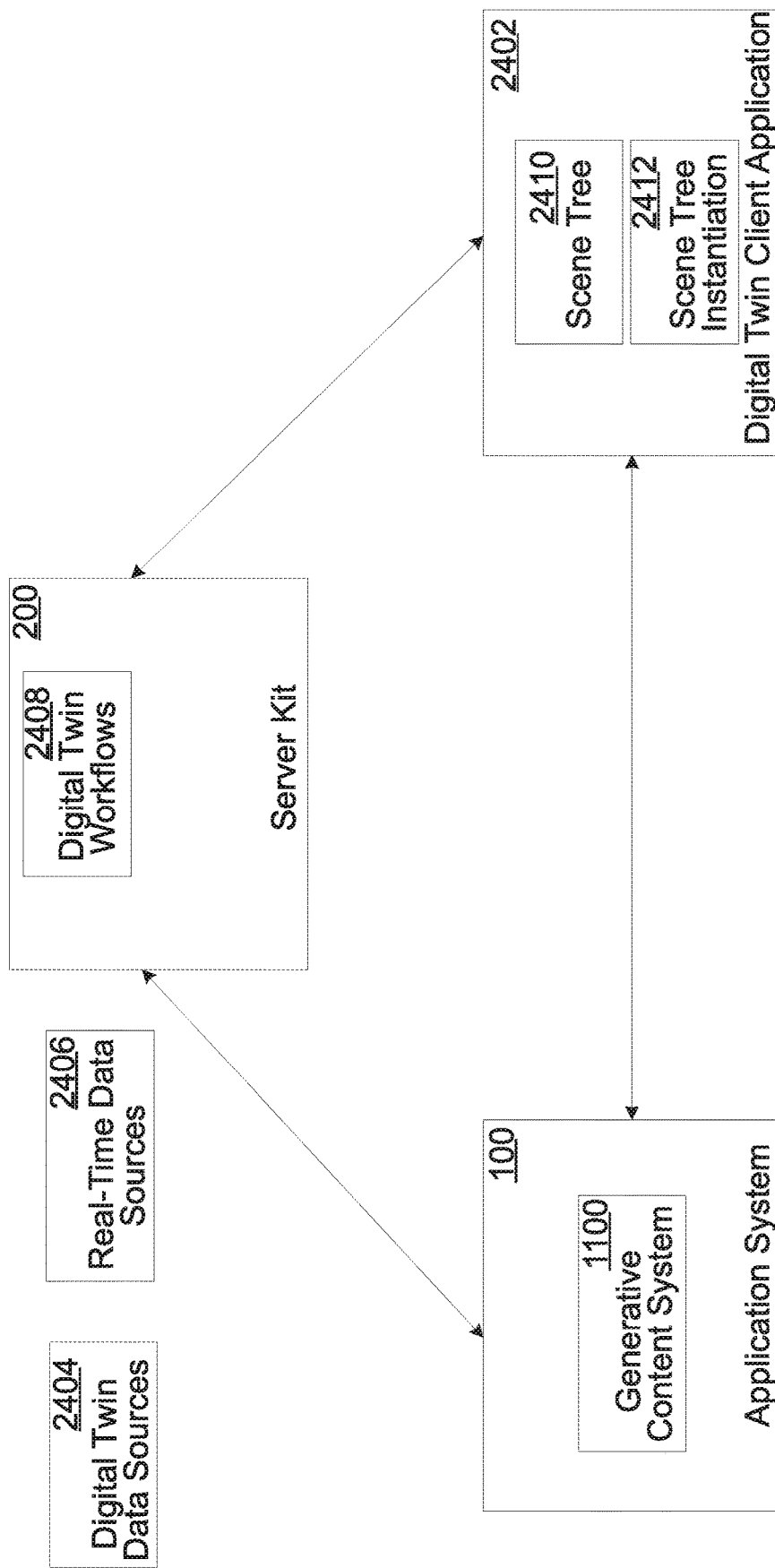
FIG. 39 depicts an example system for creating, enhancing, and utilizing digital twins, according to some embodiments of the present disclosure.

FIG. 39 illustrates an example system 2400 for creating, enhancing, and utilizing digital twins. In the illustrated example, a user may create a digital twin using the application system 100. In embodiments, a digital twin may be created based on data obtained from a set of digital twin data sources 2404. In some of these embodiments, a user may define the digital data sources that are to be used to create a digital twin and may define the types of objects that will be defined in a digital twin (or set of embedded digital twins). For example, in creating digital twins of a city and the buildings therein, a user can define an object defining a city and a building and may define the data sources where city-related and building-related data may be uploaded/imported from. In this example, the application system 100 may upload/import maps of a city from a map application, a city planning database, or the like from the defined digital twin data sources 2404. In some scenarios, the map of the city may include street names, the addresses of buildings, elevations, locations of traffic lights and signs, speed limits, and the like. In embodiments, the application system 100 may create an object that defines the city and the properties thereof (e.g., temperatures, elevations, traffic, populations, population densities, etc.), where the object includes children objects that define various entities appearing in the city (e.g., neighborhoods, buildings, roads, intersections, parks, street signs, traffic lights, etc.) and the properties thereof (e.g., temperatures in each neighborhood, populations in each neighborhood, population densities in each neighborhood, building heights, building areas, speed limits, traffic on a street, etc.). Continuing this example, a user may upload/import individual building-related data, such as blueprints, floor plans, CAD drawings, images, LIDAR scans, or other suitable building-related data. In some scenarios, the building-related data may be of individual buildings. In embodiments, the application system 100 may create objects for each building. In some of these embodiments, the building objects may define the properties of the building (e.g., height, area, occupancy, water usage, electricity usage, gas usage, number of floors, number of units/rooms, and the like) and may include children objects that define various entities (e.g., units/rooms in the building, pipes, walls, etc.) appearing in the building and properties thereof. In some embodiments, the application system 100 may execute one or more scripts (e.g., a user-define script) that link the input data (e.g., data obtained from multiple data sources) to the appropriate objects of the digital twin. For example, the application system 100 may execute a script that links the building-related data of each respective building to the map of the city based on the addresses of the buildings. In this way, each building object (or child objects of the building object) may be linked to the appropriate "location" within the digital twin of the city and may be parameterized with the corresponding building-related data corresponding to the building. In embodiments, the application system 100 ingests the data from the digital twin data sources 2404 and parameterizes the objects comprising the digital twin(s) based on the ingested data and one or more scripts.

In embodiments, a user (e.g., developer or team of developers) may create applications that utilize the digital twin. For example, a developer or team of developers may develop video games, enterprise applications, monitoring applications, location-based services applications or the like that utilize a digital twin. In embodiments, the developer(s) may create the application using the application system 100, such that the application is created using a declarative language. In doing so, the developer(s) may define a scene tree of the application. In embodiments, a digital twin may be represented in a scene tree of an application as an object in a scene tree, or a collection of objects. For example, a digital twin of a city may include a city object whose children include a set of building objects, a set of road objects, a set of intersection objects, and the like. In some instances of this example, the children of a building object may include floor objects, whose children include room objects, pipe objects, wiring objects, elevator objects, or the like. Upon the developer defining the digital twin in an application, the visual editor of the application system 100 may depict the digital twin in the graphical user interface of the application. In embodiments, a developer can define one or more actions corresponding to a digital twin, such as when to display the digital twin or a segment thereof, how to toggle between views of a digital twin, animations or sequences that may occur in or with respect to the digital twin, or the like. In embodiments, a developer may define the look and feel of the application with respect to a digital twin. For example, the developer may define various colors of the digital twin or the user interface, stylization elements, or the like.

In embodiments, the user may define different states that correspond to different display options of the digital twin via the application system 100. In some of these embodiments, the user may define variances that define different display options, given a state of a digital twin. For example, if the application is to display a portion of a digital twin in red when a temperature of the real-world entity represented by the digital twin exceeds a threshold, the variance may define the temperature values that exceed the threshold and may define the color of the digital twin to be displayed in red. In embodiments, the user may define different states that correspond to different alarm conditions of the digital twin. In some of these embodiments, the user may define variances that define alarm conditions, given a state of a digital twin. For example, if a location-based services application is to notify security personal when an emergency button is activated, the variance may define the action that triggers the notification to the security personal and may also display the real-time location of the device from which the emergency button was activated in the digital twin. As discussed, a client application 2402 may be developed to configure and customize other suitable aspects of the application as well.

As discussed, a user may utilize variances to control different aspects of a client application. In embodiments, the application system 100 creates a client application 2402 that leverages one or more digital twins via a scene tree. In some of these embodiments, the application system 100 creates a scene tree that corresponds to the entire application (e.g., all potential states of the application). When the client application 2402 is running, the client application 2402 may instantiate an instance of the scene tree, whereby the instantiated scene tree includes only the objects that are currently implicated given the current state of the application. For example, if a user of the client application 2402 elects to view a digital twin of a first city (e.g., New York City) over other available cities, the scene tree instantiation may include the object(s) that define the digital twin of the first city, but not the other available cities. Taking this example further, if the user is viewing a particular region of the city, the scene tree instantiation may include the object(s) that correspond to the particular region of the city (e.g., objects of buildings, roads, intersections, parks, and the like that are in the particular region).

In embodiments, the application system 100 may leverage a generative content system 1100 to enhance a digital twin. In these embodiments, the generative content system 1100 may ingest data from a set of digital twin data sources 2404 and may generate instances of classes based on the ingested data. The generative content system may then generate an abstract representation of the environment or item that is to be represented by a digital twin. The generative content system may then update the abstract representation until the abstract representation converges on a set of fitness criteria (which may be defined by a developer or in a library). The generative content system may then generate the digital twin based on the converged abstract representation.

In embodiments, a developer may configure a server kit 200 that provides real-time data to an application that includes a digital twin. In embodiments, the server kit 200 may be configured to receive real-time data from one or more real-time data sources 2406 and to update a digital twin based on the real-time data. In embodiments, real-time data may be streamed or periodically updated (e.g., every few seconds, minutes or hours).

In embodiments, a developer may configure an API via the server kit to receive real-time data when a real-time data source 2406 periodically updates the real-time data, whereby the application may make periodic API requests to the server kit. In some embodiments, the requesting application may issue a nested API call to the server kit 200, whereby the requesting application includes the intended API call in an API call to the server kit 200. In response, the server kit 200 may marshal the API call, which may include retrieving requested data (e.g., real-time data) and returning the requested data to the requesting application. For example, in the context of location-based services (e.g., asset tracking or emergency notification), a first client application may periodically determine its location (e.g., based on GPS or based on a signal profile) and may provide the location to the server kit 200 or another server. In this example, a second application (e.g., a monitoring application) may periodically (e.g., every few second or every few minutes) issue a nested API request to the server kit 200. In response, an instance of the server kit 200 may marshal the API request (e.g., determine the contents of the request) and may obtain the requested location (e.g., from a cache or an external server). The instance of the server kit 200 may then return the requested location to the second application. In embodiments, the second application may then update an instantiation of a scene tree with the new location of the person or item being tracked. In some embodiments, the second application may then update the displayed digital twin to indicate the location of the person or item being tracked.

In embodiments, a developer may configure a socket that forwards real-time data from the real-time data source 2406 when the real-time data source 2406 streams data. In these embodiments, a client application 2402 may be configured to subscribe to one or more socket-based channels via a server kit 200. In these embodiments, a real-time data source 2402 may stream data (e.g., sensor data, audio streams, video streams, and the like). When the client application 2402 is running and subscribed to a particular socket-based channel, the server kit 200 may push real-time data to the client application 2402. For example, an application that allows a user to view a digital twin of mechanical equipment (e.g., a wind turbine) may continuously receive sensor readings (e.g., vibration sensor data, temperature data, humidity data, and the like) from the server kit 200. In this example, the 8server kit 200 may receive a stream of sensor data from one or more IoT sensors that monitor the equipment. In response to receiving the real-time data, a server kit instance may push the receive real-time data to a subscribed client application 2402 via a designated socket. In response, the client application 2402 may update the digital twin (e.g., the scene tree objects that correspond to the received real-time data) with the received data. In some examples, the client application 2402 may depict the sensor readings as they are updated to the scene tree. For example, the client application may display text indicating the sensor readings or may display the digital twin, or a portion thereof, in a different color depending on the sensor reading. As the client application 2402 is updated with new sensor data from the one or more real-time data sources 2402, the scene tree of the client application 2402 is updated and the client application 2402 may update the display of the sensor readings.

In embodiments, a developer may configure a server kit 200 that serves client applications 2402 that leverage digital twins with one or more custom workflows 2408. In some of these embodiments, the developer may utilize the declarative language to define the custom workflows 2408, as discussed above. In embodiments, an instance of the server kit 200 may execute a custom workflow 2408 when triggered by a client application 2402 or another triggering condition (e.g., receiving particular types of data from one or more real-time data sources 2406). For example, a server kit 200 may be configured with a workflow 2408 that performs data fusion (e.g., sensor fusion) in response to receiving sensor readings from a set of different sensors. In this example, the workflow 2408 may be configured to extrapolate a water usage for each tenant or group of tenants in the building based on water meter readings from a smart meter or a hub-and-spoke classification system that is trained to read a meter In another example, the workflow 2408 may be configured to extrapolate a condition of a piece of machinery by fusing sensor data from a group of sensors (e.g., a vibration sensor, a temperature sensor, a weight sensor, or the like). Depending on the workflow 2408, the server kit 200 may output the results of the workflow to the client application 2402 that triggered the workflow 2408.

It is appreciated that the system 2400 of FIG. 39 may be used in any number of scenarios. As discussed, the system 2400 may be used to provide applications that display digital twins. In some embodiments, the states of environments may be updated using real-time data obtained from real-time data sources 2406. Examples of real-time data and real-time data sources 2406 may include, but are not limited to, locations that are tracked by a location-based services application or a GPS, classifications determined by a hub-and-spoke classification system, readings from smart meters, sensor data from IoT sensors, third party data from third party data sources, and the like.

Referring back to FIGS. 1 and 2A-2E, in embodiments, the application system 100 may be used to create virtual reality and/or augmented reality applications. For instance, the application system 100 may be used to create virtual reality training applications. Examples of virtual reality training applications may include police and emergency responder simulations, hazardous material training, and the like. In embodiments, developers may import VR objects from an external data source. Examples of VR objects that may be used in a police or first responder simulation may include humans, vehicles, buildings, weapons, and the like. Examples of VR objects that may be imported in a hazardous material training may include furniture (e.g., lab tables), nuclear reactors, nuclear rods, and the like. Once imported to the application system 100, the developer may leverage the visual editor 108 and/or the VR engine 154 of the application system 100 to create a virtual reality environment. A developer may add objects to the virtual reality environment. For example, in creating a traffic stop simulation as part of a police training simulator, the developer can add a vehicle with a human in it, the human may or may not be brandishing a weapon. The developer can define a set of actions that the human can perform given one or more stimuli (e.g., shoots the user if not approached from the correct angle, drops their weapon if told to by the trainee, provides license and registration if asked by the trainee, dialogue spoken by the human in response to prompts, or the like). In embodiments, the visual editor 108 may allow a developer to view the environment (e.g., a city street side) and the items (e.g., humans, vehicles, weapons, etc.) within the environment. Furthermore, a developer may test and edit the actions of the items in real-time.

In embodiments, the visual editor may incorporate a "ghost hands" feature, which may provide a machine-vision fingertip tracking capability and a gesture library which can detect hand motions (e.g., wiggles, taps, swipes, dwells, opening hand, closing hand, and the like). In embodiments, the ghost hands feature may include a UI library for visualizing the hands and fingertips of a user, and for showing the current state of a user's hands. The ghost hands libraries may be used as a development tool in designing and developing VR applications and as a feature for the published VR applications. In this way, a user of a VR application, such as a training application, may experience more accurate response to hand gestures, such as squeezing a trigger of a VR weapon or picking up hazardous waste. U.S. Patent 10,534,6062 discusses the ghost hands feature in greater detail and other aspects of VR enabled applications, the contents of which are hereby incorporated in their entirety.

Figure 40:
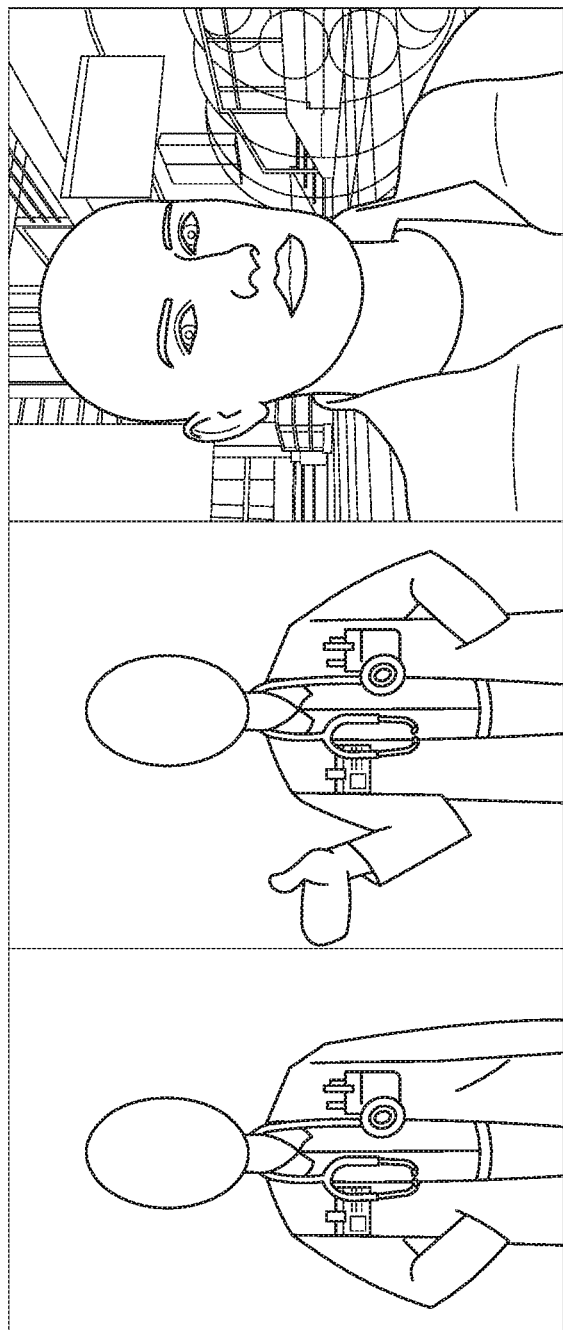
FIG. 40 depicts digital agent avatar examples of an application system in accordance with the many embodiments of the present disclosure.

In embodiments, the application system 100 may support a continuum of user interactions including voice, gesture and touch. To support this continuum of user interactions, the application system 100 may include a user experience guided by an artificial intelligence (AI) digital agent, also referred to as a digital agent. In embodiments, digital agents may be used in VR and AR applications. In embodiments, a digital agent may provide users with a highly visual user experience. This highly visual user experience may support the continuum of voice, gesture and touch interactions interchangeably for the user of the application system 100. In embodiments, a digital agent may include a 2D or 3D digital agent avatar to guide the user through the highly visual user experience. In an exemplary and non-limiting embodiment, the digital agent avatar may be generated and managed by the avatar interaction engine 148. The digital agent may also be uniquely optimized for real time processing of voice input received from the user. FIG. 40 depicts digital agent avatars according to exemplary and non-limiting embodiments.

Current state of the art voice interfaces such as Siri® from Apple® or Alexa® from Amazon®, for example, are very lacking in several important areas of usability, cognitive load for the user and unnecessarily slow interactions. The digital agent may provide a user of the application system 100 an improved user experience that addresses these and other shortcomings of current state of the art voice interfaces.

Current state of the art voice-only interfaces, or visual interfaces that provide only a command prompt, may make it extremely challenging for users to discover the range of capabilities and commands that the user can user to interact with these interfaces. For example, new Alexa skills that may be available to a user of an Alexa device may have very low usage rates because unless the correct 'key phrase' is spoken to activate the skill, the skill cannot be initiated. Continuing with this example, it may be possible to install hundreds of skills into an Alexa device, causing three issues; a) too many skills to enumerate (read out), b) confusion between similarly phrased 'key phrases', c) no iconography or illustrations, requiring the short text description alone to be enough to instruct the user what this skill is used for.

In embodiments, digital agents may make more skills readily available to a user of the application system 100 by combining a voice and visual interface. The combined voice and visual interface of a digital agent may make it easier to find a skill, for example by presenting a set of skills in a list made available to the user, reduce or eliminate confusion between similar 'key phrases', for example by requesting clarification and presenting a list of similar 'key phrases' for a user to choose their intended 'key phrase' from and provide iconography and illustrations along with short text descriptions to allow a user to better understand what a skill may be used for.

Remembering key phrases may be difficult for users, particularly when a user is listening to and remembering lists of key phrases, as well as understanding processes. A key phrase selection process typically requires a user to listen to a list of key phrase options and then remember from the list the key phrase the user want to use. In embodiments, a key phrase may be used to activate a process. However, without a visual indicator of where a user might be in a process, for example the four steps to order a pizza, it may be very difficult for the user to navigate a voice-only interface. This difficulty may be exacerbated by any interruptions experienced by the user while executing the process. Returning to complete a process halfway through its execution may be extremely undesirable from a user experience point of view. In embodiments, a digital agent may allow a user to more easily remember key phrases, for example by simultaneously speaking and displaying a list of key phrases, allowing a user to refer back to the list. In embodiments, a digital agent may also allow a user to more easily follow a process, for example by speaking and displaying a list of processes, the steps of each process, as well as the position within a process a user may be at a particular time.

Voice-only interfaces may be effective for certain uses, such as for selecting from information a user might already know (e.g., a favorite song) or for asking for information that may be easily understood from spoken words, such as "what is the weather." Voice-only interfaces may be ineffective, however, for visual tasks. For example, if a user is trying to select a pair of shoes, then a text description of the style and color may not be very useful to the user, while a series of images, or a 3D model presented with a text description by a digital agent may allow the user to better understand the available choices and options available to customize or alter the particular item. Because a voice-only interface may only 'pretend' to be a human, it may fail to understand most complex conversations. For example, a voice-only interface may function passably as a basic search engine, however once a user starts a process, application, or skill that may be executed as a command tree, hidden from the user, that includes variable ordering and a flexible natural language front end, using these voice-only interfaces may be frustrating to the user, as the boundaries of the command trees may not be visible to the user, however may still prevent a user from executing a desired process, application or skill.

In addition, by not restricting the paths a user may follow, it may be possible to execute one of many commands at any point in time. The availability of many commands at the same time may result in speech mistranslation that may cause commands to fail, the wrong path of the command tree to be taken and the like. Setting expectations and providing at least 98% reliability is critical for successful adoption of new user input methodologies, as has been seen with both mouse and touch.

In embodiments, a combined voice and visual interface, such as a combined voice and visual interface provided by the digital agent, may display a command tree as voice commands are being issued, allowing the user to better and more predictably navigate the command tree, simultaneously increasing the confidence of the user in the interface and increasing the reliability of the interface.

Providing users direct and obvious feedback on the selection they have made by voice, touch and gesture may be a critical component of a desirable user experience, equally providing clear navigation around the activities the user can perform, as well as indicate to the user where they are in a process or browsing a list. Importantly, with visual aids, such as those that may be provided by a digital agent, this feedback may be provided instantly, while not requiring a user to sit and listen to a computer read many statements and requests intended to clarify the input provided by the user, for example 'you are currently ordering a pizza and you have asked to change to find a song which will cancel your incomplete order, is this correct?'

Figure 41:
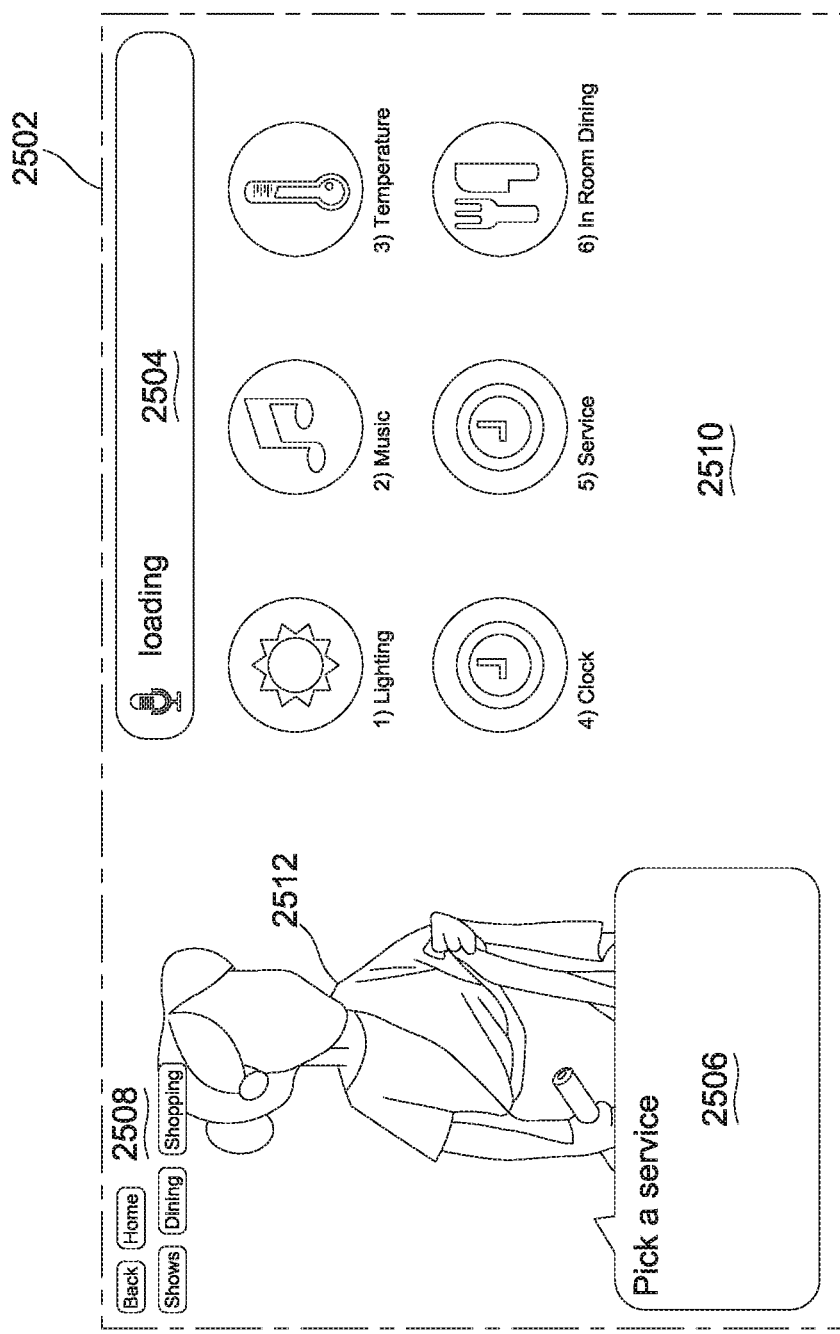
FIG. 41 depicts a digital agent user interface example of an application system in accordance with the many embodiments of the present disclosure.

In embodiments, a digital agent may provide a new style of user experience that addresses the issues described above. FIG. 41 depicts a digital agent user interface 2502, according to exemplary and non-linear embodiments. While the geometric configuration of the elements in the digital agent UI 2502 may not be of primary importance, the purpose of each element may result in a highly evolved and improved user experience. Importantly, this user experience may support voice, gesture and touch interactions and the digital agent UI 2502 may be specifically built to make voice interactions easier, faster, more reliable and work in visual task scenarios.

In embodiments, a digital agent UI 2502 may include a voice input box 2504. In some embodiments, the voice input box 2504 may include an ability to disable or enable a microphone, as well as a speech to text interpretation service. In embodiments, the voice input box 2504 may depict in an exemplary and non-limiting embodiment what a speech to text interpretation service interprets the voice input a user has provided in a configured language of choice. This ability may be important, as some phrases may not translate accurately or their pronunciation may translate into an unexpected word, for example, and seeing the translation may allow a user to self-correct and understand why the digital agent did not correctly interpret the voice input.

In embodiments, the speech-to-text interpretation service may be a local device speech-to-text interpretation service or may be a cloud-based speech-to-text service that is accessed via an API. In embodiments, the digital agent UI 2502 may also include a parts of speech tagging process that may use basic natural language processing and be based on tensor flow trained on a Syntaxnet corpus, providing an efficient speech to text interpretation service. In embodiments, he speech-to-text translation service may interpret and provide the text spoken by the user as best as can be interpreted, as well as the key elements of the sentence spoken by the user, such as the subjects of the sentence, verbs of the sentence, nouns of the sentence, negation and the like.

In embodiments, the digital agent UI 2502 may include a text box 2506. The text box 2506 may display the words an avatar speaks out loud. A user of a digital agent-enabled application may find the text box 2506 beneficial, for example when the user misses a phrase or is in a loud environment where it is not possible to hear easily. In this example, the text box 2506 displays the phrase that may have been missed by the user, increasing the persistence of the phrase, clearly showing the user what state the user is in and what is required of the user.

In embodiments, the digital agent UI 2502 may include a discoverable list of verbs 2508. Rather than overwhelming a user with any and all activity possibly available to the user, the avatar may demonstrate how a user may take a step back in a current process and also how to navigate to any other activities at the same level as that of the current step of the current process. Users may then initiate an action triggered by a verb in the list by speaking the verb, or using a touch or gesture associated with triggering the verb. In the case where a verb may duplicate a selection the verb may take priority and users may speak the ordinal number associated with the verb in the list, rather than speaking the label associated with the verb or use a touch or gesture associated with the verb.

In embodiments, the digital agent UI 2502 may allow the number of verbs available to a user at any one time to be restricted in the list of verbs and in the content area 2510, described later in this disclosure. Restricting the number of verbs available may allow a synonym/miss-translation capability to come into play. In this way, restricting the number of verbs available may make it easier for a user to see what they can do, while also restricting the list of possible inputs the digital agent may have to consider by many orders of magnitude, allowing for a much more robust rejection of incorrect speech and very robust acceptance of speech which is mistranslated, colloquial or off brand, for example "Coke" vs "Pepsi."

In embodiments, the digital agent UI may include a digital agent avatar 2512. The digital agent avatar 2512 displayed by the digital agent UI 2502 may include animated speech and an unlimited set of animations that may be performed as a result of actions and responses related to the tasks at hand. The digital agent avatar 2512 may be rendered as a 2D cartoon or as a more realistic 3D model (e.g., in a virtual reality application). In an exemplary and non-limiting embodiment, the digital agent avatar 2512 may be generated and managed by the avatar interaction engine 148.

Providing a 'real' character to interact with, in the form of the digital agent avatar 2512, may assist users in absorbing non-verbal cues that may be added to the digital agent avatar animation. For example, the digital agent avatar 2512 may look at the user when expecting a response or look at the content when talking about options. The digital agent avatar 2512 may gesture with a shoulder shrug when an item is not in stock, reinforcing the spoken and written text. Digital agent avatars 2512 may use cloud-based voice synthesizers or local generated speech, however a phoneme mapping system may be provided to make mouth animation automatic based on the text to be spoken.

As previously mentioned, the digital agent UI 2502 may include a content area 2510. The content area may display pages of a defined number of items to be displayed, for example nine items. Previous and next page or "page n" commands may be used when there is more than a single page of items. For touch and gesture actions, a drag or swipe may have the same page navigation effect.

In embodiments, a digital agent may include capability trees. Capability trees may be created and used to encode very rich voice, gesture and touch processes. The capability tree may specify a much richer set of capabilities than a traditional voice skill. FIG. 42 depicts a representation of a capability tree 2602 that may be encoded as JSON or another hierarchical markup formats like XML, or even as a set of linked relational database tables as examples. As depicted in FIG. 42, a capability tree may include root parameters such as "format", "version", "title" and "start". The initial set of root parameters may all be optional properties that may be added to and removed as required for the specific setup of an avatar layout and specific avatar capabilities. However largely, the root parameters may define the graphics, voice style, animations and labels for the setup.

In embodiments, a capability tree may include a capabilities list. The capabilities list may be where conceptual work is performed. The capability tree may be a list that may contain links to other items, as the capability tree may not formally be a tree or a directed acyclic graph. The capability tree may include support for circular relationships and it may also be possible to present specific additional verbs as siblings. Commonly these may be nodes at the same depth of a conceptual tree, however the author of the capability tree may make this decision. In this way the capability tree may provide flexibility to an author for defining unique workflows.

In embodiments, each capability in a capability list may include a key verb. The key verb may be accessed by voice, gesture, or touch if it is present in the list of verbs, or in the content area, for example as a menu. In embodiments, a parent may be provided along with a global verb, for example the global verb "back". Users may speak "back" or "go back" or they may use the actual verb that preceded the capability. In embodiments, each capability in a capability list may also include a type. Users may define their own custom element type or use one of several default types that may be provided. Examples of default types may include:

'menu' that may provide links to other verbs.

'Selection' that may allow the user to pick a single item from the action area and run an action.

'multi-selection' that may allow a user to pick multiple items from a list, where speaking them toggles their selection and runs actions.

'quantities' that may allow a user to pick quantities of items from a list and run actions.

'dashboard' that may present information and may allow one or more parameters to be altered and a function to be run, such as showing the current HVAC temperature, presenting a box with the current target temperature and fan status, letting the user adjust the target temperature or fan status and the like.

'function' may be similar to a dashboard, however parameters may be required and are all submitted upon request. For example, in a dashboard, changing the fan status may be immediate. Using a function, the same setup may allow a user to change temperature and fan, without the changes being implemented until a user confirms the changes should be implemented.

In embodiments, a capability tree may also include a parameterized statement an avatar may speak. The parameterized statement may include words to be replaced with a value, such as first name, random choices, embedded functions and conditional choices based on other values.

In embodiments, a capability tree may also include a sibling. A sibling may hold a list of verbs to display in the verb list. The list of verbs to display may commonly be the other nodes of a capability tree at the same level, however may also be specified by the author of the capability tree.

In embodiments, a capability tree may include a list of items to show in a content area. Each item may be accessed by its ordinal value or via a list of text triggers that may include synonyms and common mistranslations. Accessing an item by its ordinal value or via a list of text triggers may provide exponentially improved recognition.

Figure 25:
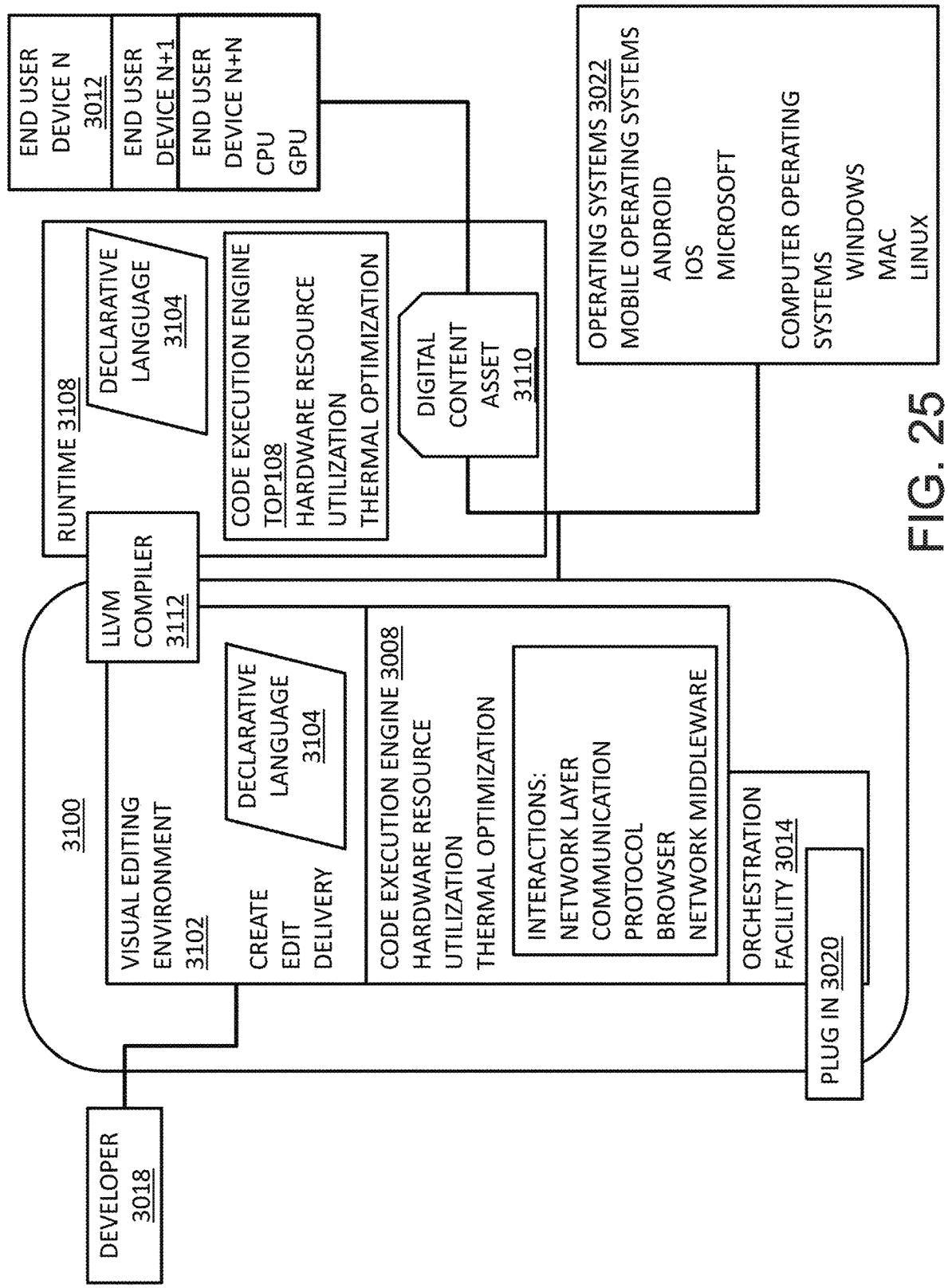
FIG. 25 depicts a system diagram of an embodiment of a system for creating, sharing and managing digital content with a runtime that shares a declarative language with a visual editing environment in accordance with the many embodiments of the present disclosure.

In embodiments, a system for creating, sharing and managing digital content is depicted in FIG. 25. The system 3100 may comprise a visual editing environment 3102 that may enable a developer 3018 and the like creating, editing, and delivery of a digital content asset 3110 with declarative language 3104. The system 3100 may further comprise a code execution engine 3008 that may facilitate hardware resource utilization and thermal optimization for CPUs, GPU, and the like of different devices, such as end user devices 3012 on which a digital content asset 3110 operates. The system 3100 may be adapted so that the same declarative code 3104 and code execution engine 3008 may be used during visual editing, such as with the visual editing environment 3102 and at runtime 3108. The visual editing environment 3102 and runtime 3108 may both be compiled with an LLVM compiler 3112. The code execution engine 3008 may also control interactions, such as network layer interactions, communication protocol interactions, browser interactions, network middleware and the like. The system 3100 may further comprise an orchestration facility 3014 for orchestrating components, events, and the like associated with the digital content asset 3110. The orchestration facility 3014 may further comprise a plug-in system 3020. The system 3100 may further facilitate consistent user experience across a plurality of different operating systems 3022, including mobile, computer and other operating systems.

In embodiments, a system for creating, sharing and managing digital content may include a visual editing environment, a code execution engine, a declarative language, and a gaming engine capability. The visual editing environment may enable a developer to create and edit code controlling a digital content asset in the declarative language. In embodiments, the visual editing environment may enable a developer to create and edit declarative language code controlling a digital content asset. In embodiments, the code execution engine may operate in the visual editing environment, such as on the created declarative language code to control execution of hardware elements, such as a hardware infrastructure element that enables utilization of the digital content asset. In embodiments, the code execution engine may include and utilize a gaming engine capability to facilitate execution of the declarative language. In embodiments, the code execution engine may utilize the gaming engine's capability to execute the declarative language to further control aspects of the digital content asset including, without limitation a behavior and a state of the digital content asset, and the like.

In embodiments, a system that combines the visual editing environment and a code execution engine with a gaming engine capability to enable at least creating and editing declarative language code for controlling a digital content assess may include the visual editing environment interacting with the code execution engine during, for example creation of digital content assets. The visual editing environment interacting with the code execution engine may further engage the gaming engine capability of the code execution engine for creation of digital content assets. In embodiments, a user, such as a developer interacting with the visual editing environment may, such as through graphical manipulation of a digital content asset, developing code using statements of the declarative language and the like, may effectively be producing declarative language code that the code execution engine, and optionally the gaming engine capability of the code execution engine responds to by executing it to cause visual effects in the visual editing environment, and the like. The code execution engine, such as through its gaming engine capability may be configured to respond to the produced declarative language code with data and graphic manipulation functions as may be expressed in the declarative language. In embodiments, the declarative language, the code execution engine and the gaming engine capability of the code execution engine that are used during editing of the digital content asset in the visual editing environment may also be used at runtime. In embodiments, the visual editing environment and the code execution engine are constructed from this declarative language. In embodiments, the visual editing environment may make the declarative language available to a developer to generate digital content assets and the like.

In embodiments, a gaming engine capability of a code execution engine of a system for creating, sharing and managing digital content may enable handling of a state, such as a state of a digital content asset that may be expressed in a declarative language. The gaming engine capability may recognize an explicit state of an object, such as a digital content asset and respond based on the context of the object in which the explicit state is expressed. In embodiments, an explicit state expression may be recognized by the gaming engine capability as declaring different properties or values thereof for an object such as a digital content asset, and the like. The gaming engine capability may, for example, recognize that a state in a painting application includes that a pen is selected with a particular color. The code execution engine, such as through the gaming engine capability may render the result of the user's use of the pen and any changes to the pen as a result, such as changing orientation, rotation, and the like.

In embodiments, a gaming engine capability of a code execution engine of a system for creating, sharing and managing digital content may enable handling of an inheritance parameter, such as an inheritance parameter of a digital content asset that may be expressed in a declarative language. The gaming engine capability may recognize expression of an inheritance parameter in the declarative language and respond thereto based on, for example, how the value of the inherited parameter impacts an object, such as an instance of digital content asset being executed by the code execution engine. In embodiments, a declarative language may support creating a sub class that may represent an inheritance parameter operation. The gaming engine capability may determine that when an object is of a sub-class, then it may process parameters of a parent class for the object, effecting enabling an inheritance parameter for the object, such as an instance of a digital content asset and the like. The gaming engine capability of the code execution engine may cause an object, such as an object in a sub-class to operate the same as the parent object. In embodiments, the gaming engine capability may cause an instance of a digital content asset that is contained in another object to perform actions, such as scaling, rotation, and the like by processing the action properties of the parent object through enabling inheritance of such parameters, and the like.

In embodiments, a gaming engine capability of a code execution engine of a system for creating, sharing and managing digital content may enable handling of an animation feature, such as an animation feature of a digital content asset that may be expressed in a declarative language. The gaming engine capability may recognize expression of an animation feature in the declarative language and respond thereto based on, for example, how the expressed animation feature impacts an object, such as an instance of digital content asset being executed by the code execution engine. A gaming engine capability of the code execution engine may handle an animation feature that is expressed in the declarative language through hardware acceleration of at least a portion of the animation expressed. The gaming engine capability may perform the animations and rendering of transitions of the digital content asset, such as property changes and the like that may be expressed in an animation feature statement and/or due to an impact of the animation on the digital content asset, such as on an instance of a digital content asset being rendered in a user interface, and the like. The gaming engine capability may enable animation features expressed in the declarative language, such as speech animation, procedural animation, skeletal animation, facial animation, 3D animation, and the like.

In embodiments, a gaming engine capability of a code execution engine of a system for creating, sharing and managing digital content may enable handling of a simulation feature, such as a simulation feature of a digital content asset that may be expressed in a declarative language. The gaming engine capability may recognize expression of a simulation feature in the declarative language and respond thereto based on, for example, how the expressed simulation feature impacts an object, such as an instance of digital content asset being executed by the code execution engine.

A gaming engine capability of the code execution engine may handle a simulation feature that is expressed in the declarative language through hardware acceleration of at least a portion of the simulation expressed. The gaming engine capability may perform the simulations and rendering of transitions of the digital content asset, such as property changes and the like that may be expressed in a simulation feature statement and/or due to an impact of the simulation of the digital content asset, such as on an instance of a digital content asset being rendered in a user interface, and the like. The gaming engine capability may enable simulation features of a digital content asset, such as an instance of a digital object expressed in the declarative language, such as speech simulation, skeletal simulation, facial simulation, and the like.

In embodiments, a gaming engine capability of a code execution engine of a system for creating, sharing and managing digital content may enable handling of a 3D geometric behavior, such as a 3D geometric behavior of a digital content asset that may be expressed in a declarative language. The gaming engine capability may recognize expression of a 3D geometric behavior in the declarative language and respond thereto based on, for example, how the expressed 3D geometric behavior impacts an object, such as an instance of digital content asset being executed by the code execution engine. A gaming engine capability of the code execution engine may handle a 3D geometric behavior that is expressed in the declarative language through hardware acceleration of at least a portion of the simulation expressed. In embodiments, the gaming engine capability of the code execution engine may be utilized by the visual editing environment to facilitate rendering three-dimensional visual effects, handling three-dimensional objects, and geometric parameters, such as 3D geometric parameters of objects, such as 3D digital content assets and the like. In embodiments, the gaming engine capability may be embodied in an animation engine portion of the code execution engine. In embodiments, 3D geometric behavior expressed through geometric behavioral statements of the declarative language may facilitate a gaming engine capability of the code execution engine applying rules of physics and geometry on the digital objects for which the geometric behavioral statements of the declarative language are expressed. In embodiments, the gaming engine capability may facilitate 3D geometric behavior for geometrically nested elements (e.g., by use of a scene tree/scene graph of the declarative language and the like as described herein), 3D geometric behavior based on a point of view that may be expressed in the declarative language, and the like.

In embodiments, a gaming engine capability of a code execution engine of a system for creating, sharing and managing digital content may enable handling of a shader functionality, such as shader loading parameters for utilizing a digital content asset in different hardware devices. In embodiments, the shader loading parameters may be expressed in a declarative language. The gaming engine capability may recognize expression of shader loading parameters in the declarative language and respond thereto based on, for example, how the expressed shader loading parameters may impact utilization of an object, such as an instance of digital content asset on different hardware devices. A gaming engine capability of the code execution engine may handle shader loading parameters that are expressed in the declarative language through hardware acceleration, such as through use of GPUs on different hardware devices, and the like. Handling shader loading parameters may be responsive to pixel-handling capacity of a display screen of different hardware devices. In embodiments, recognition of the pixel-handling capacity of a display screen for a hardware device on which the digital content asset is targeted to be utilized may impact how shader loading parameters are handled. The gaming engine capability may adjust how shader loading parameters, including any such parameters that are expressed and/or derived from a shader loading-related expression in the declarative language, are handled, including how they are applied to different devices based on, for example, the pixel-handling capacity of a display screen of the different devices.

In embodiments, a system that uses declarative language to create, and at least edit a digital content asset and uses a code execution engine with a gaming engine capability to enable creation-time and editing-time consistent behavior across different devices may include the visual editing environment interacting with the code execution engine during, for example creation of digital content asset management code, as described herein with declarative language being processed by the gaming engine capability and the like. In embodiments, a user interacting with the visual editing environment may effectively be producing code that portions of the code execution engine, such a gaming engine capability of the code execution engine respond to by causing visual effects in the visual editing environment, the runtime environment, and the like. A gaming engine capability of the code execution engine may be configured to respond to the declarative language code with graphic manipulation functions for each different device based on, for example, device identification information, such as the type of operating system that the different devices are executing, availability and type of GPU, pixel-handling capacity of the device display, and the like.

In embodiments, a code execution engine of the system for creating, sharing and managing digital content may use a declarative language during editing and the same language during runtime. The use of the same language may facilitate use of a gaming engine capability during editing, runtime, and the like for processing objects, such as digital content asset. This may further ensure consistent user experience with the digital content asset, such as a consistent user experience of the same behavior, over a plurality of devices. In embodiments, the gaming engine capability may govern how the declarative language is executed to provide the consistent user experience. A consistent user experience may include a look and feel of a user interface, a speed of control of a digital content asset, interaction elements in the user interface, and the like. In embodiments, a gaming engine capability may take a declarative language statement for a digital content asset and convert it into a set of pixel manipulation actions that ensure a consistent user experience across different operating systems. This may take the form of graphic primitives, and the like to generate a consistent visual element for each device and operating system.

In embodiments, a gaming engine capability enabled code execution engine of the system for creating, sharing and managing digital content may ensure simultaneous user experience of the same behavior of the digital content asset by, for example, decoupling the declarative language from target system-specific resources, such as a device and/or operating system specific rendering engine and the like. In embodiments, rendering actions, as may be represented by a gaming engine capability, may be encoded into the declarative language used in the visual editing environment to generate digital content asset control instances and the like.

In this way, a digital content asset may perform the same behavior on different devices, different operating systems, and combinations thereof. In embodiments, the code execution engine may function similarly to a gaming engine through the use of the gaming engine capability in that the combination of the declarative language, and optionally runtime code output therefrom with the gaming engine capability may define behaviors at a pixel-rendering level of the digital content asset, such as 3D movements, and the like. In embodiments, through use of a gaming engine capability in this combination a user in a visual editing environment may code the users experience (e.g., how the digital content asset will behave) with respect to the digital content asset behavior with the declarative language at the time that the digital content asset is created, edited and the like. In this way, the gaming engine capability of the code execution engine, which may function similarly to a gaming engine for this specific aspect, may do the underlying work of making the behavior consistent, without a developer having to consider how any target device and/or operating system may need to be controlled to generate the desired behavior.

In embodiments, a code execution engine of a system for creating, sharing and managing digital content may process a declarative language with a gaming engine capability to control utilization of hardware resources of a plurality of different devices, such as CPUs, GPUs and the like. Utilization of, for example, CPUs of some of the different devices, such as hardware endpoint devices and the like may be controlled to facilitate users of different devices experiencing the same behavior. In embodiments, the gaming engine capability of the code execution engine may operate within the visual editing environment during creation, editing, and the like by processing declarative language statements. With the same code execution engine operating during visual editing and during runtime, and the same declarative language being utilized by the visual editing environment and the code execution engine, visual editing may result in generating code, such as digital content asset control code that can control utilization of a CPU and/or GPU, such as by generating code execution control statements. Code execution control statements in a declarative language may include hardware resource utilization statements that a gaming engine capability and the like may process to directly control utilization of different device hardware resources, such as a CPU, GPU, and the like. In embodiments, a language used in the visual editing environment, such as a declarative language, may include hardware resource utilization statements that the code execution engine via the gaming engine capability and the like may execute or that may affect how the code execution engine executes code, such as executing a graphic function with a CPU even when the gaming engine capability determines that a GPU is available on the device, and the like.

In embodiments, the code execution engine of the system for creating, sharing and managing digital content may further control utilization of hardware resources for different aspects of hardware performance, including thermal performance, battery management, and the like. The code execution engine may rely on its gaming engine capability to help control utilization based on aspects such as thermal performance, and the like. A declarative language used to program digital content assets and the like may include statements that facilitate managing execution on target devices to optimize hardware aspects, such as thermal performance and the like. In embodiments, the declarative language may provide access to instruction-level execution power and thermal performance information for different devices. Device-specific instances of a compiled digital content asset, for example, may be represented at the instruction-level so that the impact on at least one of thermal and power performance may be determined for each instruction that may be executed by the code execution engine on the devices. The digital content asset control code created and/or edited, such as by a developer using the declarative language in the visual editing environment can be analyzed based on the power and/or thermal impact of each corresponding device-specific instruction. The result of this analysis may be a measure of the thermal and/or power (e.g., battery demand) impact on the device so that the impact may be controlled. In embodiments, the analysis of the digital content asset control code that the code execution engine may execute may suggest specific code and/or execution control of that code, such as a specific sequence of instructions, a rate of execution of instructions, use of a GPU, use of a CPU, use of a gaming engine capability, and the like that may reduce or optimize thermal performance of the device. In embodiments, optimizing thermal performance for a hardware resource of one or more different devices for which utilization may be controlled, such as a CPU, a GPU and the like may be based on computation of a thermal impact of executing a digital content asset control code set by a code execution engine. This thermal impact computation may include CPU utilization (e.g., execution rate and the like), GPU utilization, memory utilization, and the like and may be determined by the thermal impact of instructions, such as CPU instructions generated from execution sequences of the gaming engine capability by a compiler, and the like. In embodiments, the thermal impact computation may include compiled instructions generated from a code execution engine performing the digital content asset control code on the device.

In embodiments, a code execution engine of the system for creating, sharing and managing digital content, in conjunction with a gaming engine capability for processing declarative language used for generating digital content assets and the like may further ensure consistent user experience with the digital content asset, such as a consistent user experience of the common behavior, over a plurality of operating systems. In embodiments, the code execution engine may govern execution of the digital content asset to provide the consistent user experience. In embodiments, a code execution engine with a gaming engine capability may ensure consistent user experience of the digital content asset by, for example, decoupling the declarative language from a target system-specific resources, such as a device and/or operating system specific rendering engine and the like. In embodiments, rendering actions may be encoded into the declarative language used in the visual editing environment to generate a digital content asset and processed by the gaming engine capability for each type of operating system. In this way, a digital content asset may perform the same behavior on different devices, different operating systems, and combinations thereof. In embodiments, the code execution engine's gaming engine capability may function similarly to a gaming engine in that the combination of the declarative language with the gaming engine capability may define behaviors at a pixel-rendering level of the digital content asset, such graphic drawing primitives, and the like. In embodiments, this combination may facilitate coding the users experience (e.g., how the digital content asset will behave) with respect to the digital content asset behavior at the time that the digital content asset control code is generated through use of the declarative language in the visual editing environment. In this way, the code execution engine, through the gaming engine capability may do the underlying work of making the behavior consistent across different operating systems, without a developer having to adjust the use of the declarative language for a digital content asset for each target operating system that may need to be controlled to generate the desired behavior.

In embodiments, a code execution engine that works cooperatively with a declarative language for digital content asset creating and editing may govern gaming engine capability operation for a consistent user experience across a plurality of mobile operating systems, including, without limitation operating systems such as IOS™, ANDROID™, WINDOWS™, and the like.

In embodiments, a code execution engine of a system that uses a declarative language for digital content asset creation and editing may govern execution of the code for a consistent user experience across a plurality of computer operating systems, including, without limitation operating systems such as MAC™, LINUX™, WINDOWS™, and the like. Likewise, the code execution engine may govern execution of the code for a consistent user experience in deployments that include combinations of mobile operating systems (e.g., an IPHONE™) and a computer (e.g., a WINDOWS™ LAPTOP). In embodiments, a combination of the code execution engine and the visual editing environment may facilitate this consistent user experience across mobile, computer, and other operating systems, such as by enabling creation, delivery and editing of the digital content asset during runtime (e.g., when the code execution engine is executing digital content asset control code, and the like).

In embodiments, a code execution engine equipped with a gaming engine capability may enable control of network layer interactions for the digital content asset. In embodiments, the code execution engine may be structured with a layer that may facilitate controlling network layer interactions, such as a network layer of the code execution engine, and the like. This network layer of the code execution engine may be combined with gaming engine capabilities to facilitate processing declarative language network interaction statements and the like. In embodiments, the code execution engine may gain control of network layer interactions for the digital content asset via network layer interaction control statements that may be available to a developer in the declarative language during editing. The visual editing environment may make available to a developer and/or other user of the environment network layer interaction declarative language statements that may be coded into digital content asset behavior and the like so that when executed by the code execution engine, and optionally when executed by a gaming engine capability of the code execution engine, network layer interactions and the like may be controlled.

In embodiments, a code execution engine, such as a code execution engine with gaming engine capability as described herein, may gain control of browser interactions for the digital content asset via browser interaction control statements that may be part of digital content asset editing in the visual editing environment. The visual editing environment may make available to a developer and/or other user of the environment browser interaction statements that may be coded into digital content asset behavior and the like so that when executed by the code execution engine, and optionally by the gaming engine capability of the code execution engine, browser interactions and the like may be controlled. In embodiments, browser interactions that may be controlled may include Comet interactions, HTTP streaming interactions, Ajax push interactions, reverse Ajax interactions, Secure Socket interactions, and HTTP server push interactions, and the like. Browser interactions that may be controlled may facilitate browser interactions of one or more different devices that may be connected via a network and may, optionally be rendering the digital content asset in a way that ensures a consistent user interface across the different devices.

In embodiments, the system for creating, sharing and managing digital content that may include a gaming engine capability-enabled code execution engine may further include functions that facilitate orchestrating components, events, response to triggers and the like for a digital content asset. In embodiments, orchestrating functionality may be enabled by a plug-in capability of the system, where an orchestrating capability may be plugged-in to the system. In embodiments, the plug-in capability of the system may be a JAVASCRIPT™ compatible plug-in system.

In embodiments, the visual editing environment, and runtime code produced from editing, creation and other actions of a user of the visual editing environment may be written in the declarative language and may be bound to the code execution engine, such as through compilation, such as with an LLVM-based compiler architecture and the like. In embodiments, the code execution engine may comprise a C++ engine. The code execution engine may perform execution of C++ code; the code execution engine may be coded in C++; the gaming engine capability of the code execution engine may be C++-based; the code execution engine may facilitate execution of C++ code as well as other code types, such as the declarative language type described herein, and the like.

Figure 26:
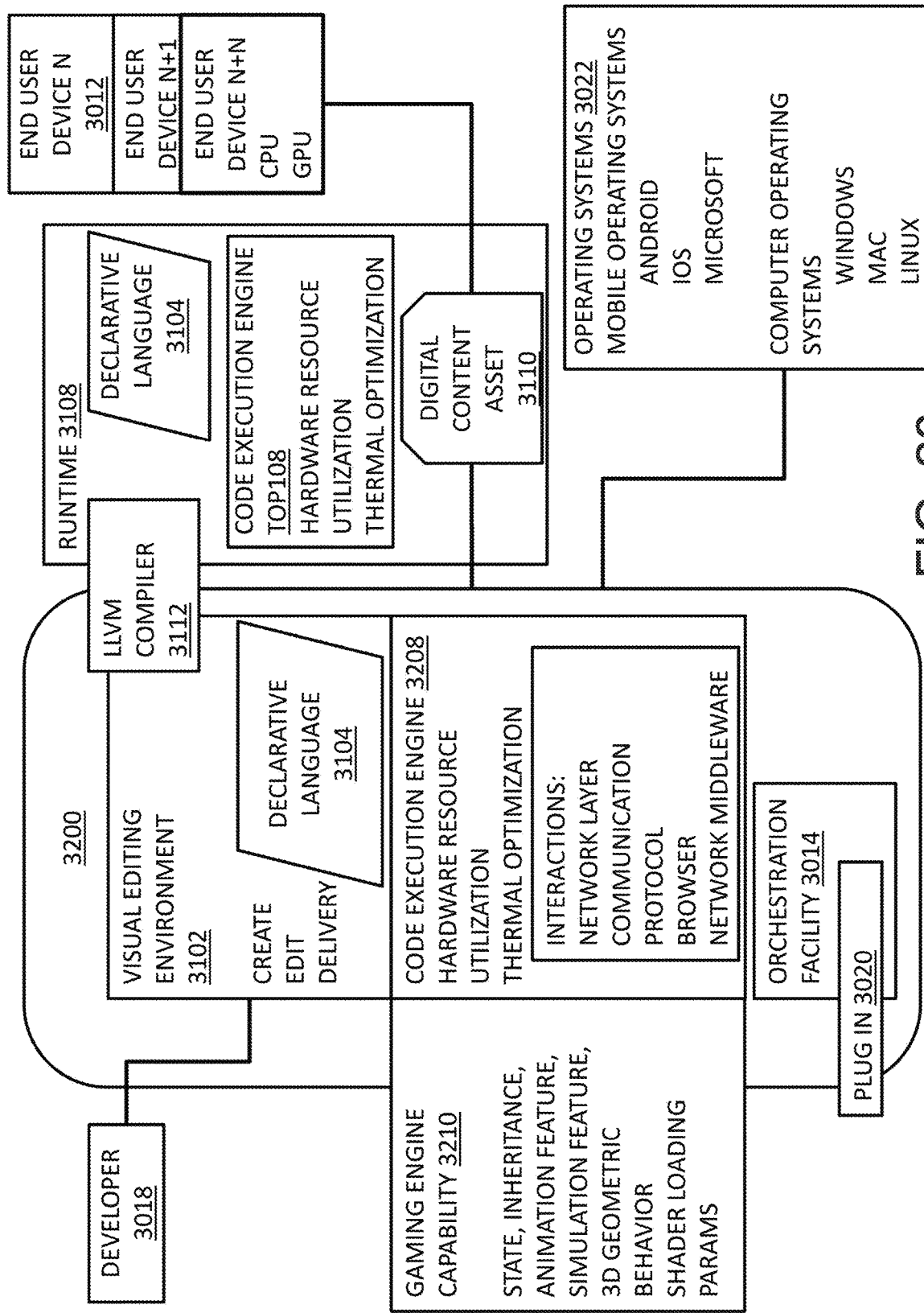
FIG. 26 depicts a system diagram of an embodiment of a system for creating, sharing and managing digital content with a gaming engine capability in accordance with the many embodiments of the present disclosure.

In embodiments, a system for creating, sharing and managing digital content is depicted in FIG. 26. The system 3200 may comprise a visual editing environment 3102 that may enable a developer 3018 and the like creating, editing, and delivery of a digital content asset 3110 with declarative language 3104. The system 3200 may further comprise a code execution engine 3208 that may facilitate hardware resource utilization and thermal optimization for CPUs, GPU, and the like of different devices, such as end user devices 3012 on which a digital content asset 3110 operates. The code execution engine 3208 may be adapted to provide gaming engine capability 3210 that may handle digital object state, inheritance, animation features, simulation features, 3D geometric behaviors, shader loading parameters, and the like. The system 3200 may be adapted so that the same declarative code 3104 and code execution engine 3208 may be used during visual editing, such as with the visual editing environment 3102 and at runtime 3108. The visual editing environment 3102 and runtime 3108 may both be compiled with an LLVM compiler 3112. The code execution engine 3208 may also control interactions, such as network layer interactions, communication protocol interactions, browser interactions, network middleware and the like. The system 3200 may further comprise an orchestration facility 3014 for orchestrating components, events, and the like associated with the digital content asset 3110. The orchestration facility 3014 may further comprise a plug-in system 3020. The system 3200 may further facilitate consistent user experience across a plurality of different operating systems 3022, including mobile, computer and other operating systems.

Figure 27:
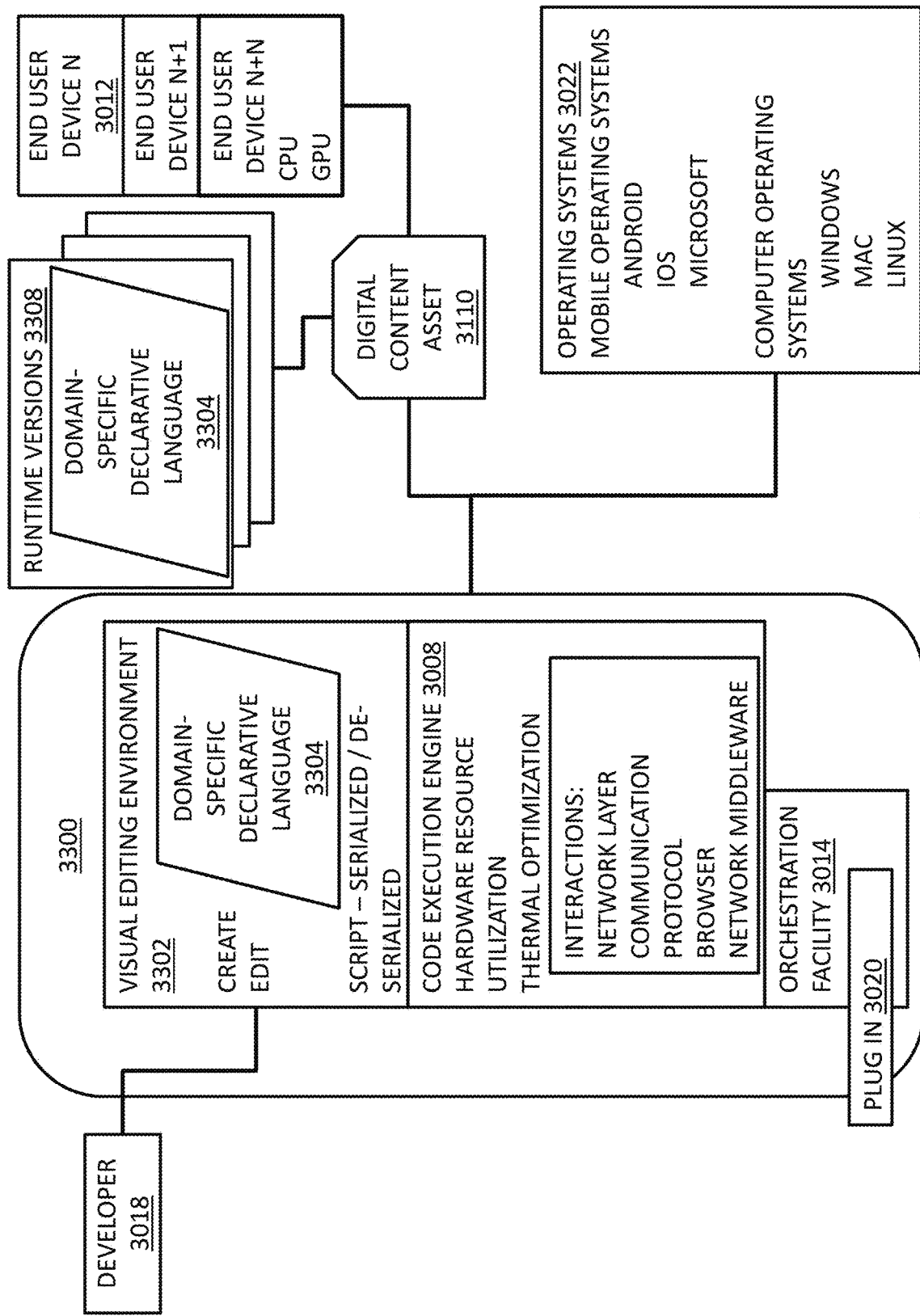
FIG. 27 depicts a system diagram of an embodiment of a system for creating, sharing and managing digital content with a plurality of runtimes that share a domain-specific declarative language with a visual editing environment in accordance with the many embodiments of the present disclosure.

In embodiments, a system for creating, sharing and managing digital content is depicted in FIG. 27. The system 3300 may comprise a visual editing environment 3302 that may enable a developer 3018 and the like creating, editing, and delivery of a digital content asset 3110 with domain-specific declarative language 3304. The system 3300 may further enable generation of a plurality of runtime versions 3308. The system 3300 may further comprise a code execution engine 3008 that may facilitate hardware resource utilization and thermal optimization for CPUs, GPU, and the like of different devices, such as end user devices 3012 on which a digital content asset 3110 operates. The system 3300 may be adapted so that the same domain-specific declarative language 3304 and code execution engine 3008 may be used to program the visual editing environment, and the plurality of runtime version 3308. The visual editing environment 3302 and runtime version 3308 may both be compiled with an LLVM compiler. The code execution engine 3008 may also control interactions, such as network layer interactions, communication protocol interactions, browser interactions, network middleware and the like. The system 3300 may further comprise an orchestration facility 3014 for orchestrating components, events, and the like associated with the digital content asset 3110. The orchestration facility 3014 may further comprise a plug-in system 3020. The system 3300 may further facilitate consistent user experience across a plurality of different operating systems 3022, including mobile, computer and other operating systems.

In embodiments, a system for creating, sharing and managing digital content may facilitate efficiency of artist workflow, such as by moving 3D generation into a GPU at runtime. The system may include a visual editing environment, a texture map processing engine, and a 2D-to-3D code generator. In embodiments, the visual editing environment may enable a developer to create and edit code controlling a digital content asset in a declarative language. The developer may specify aspects of the digital content asset such as color, texture and the like for a plurality of layers of an object of a digital content asset. In embodiments, the developer may specify the aspects as described herein in a 2D editing environment that facilitates specifying the aspects for each layer of the digital content asset. In embodiments, the layers of the digital content asset may be 2D layers that may be combined to generate a 3D version of the digital content asset. In embodiments, the texture map processing engine may facilitate processing color or texture information, compressing the color or texture information for the plurality of layers into a texture map data structure. The texture map data structure may represent at least color, texture and the like of the layers of the digital content asset. In embodiments, the 2D-to-3D code generator may apply texture data structure processing operations, such as vertex operations, pixel shading operations, and the like at runtime. By applying the texture map data structure operations at runtime, the code generator may project the object of the digital content asset in 3D at runtime.

In embodiments, the 2D-to-3D code generator may use a generative kernel language when applying texture map data structure processing operations. When a GPU of a hardware environment in which the 2D-to-3D code generator is operating is available, the code generator may use the GPU at runtime to facilitate projecting the object in 3D.

In embodiments, the system that facilitates 3D projection at runtime with a 2D-to-3D code generation engine may include a gaming engine that may govern behavior of a 3D object, such as 3D object of a digital content asset created with the declarative language. The gaming engine may recognize a 3D object behavior at runtime and respond based on the context of the object in which the 3D behavior is recognized.

In embodiments, the system that facilitates 3D projection at runtime with a 2D-to-3D code generation engine may include a gaming engine that may enable handling of a state, such as a state of a digital content asset expressed in the declarative language. The gaming engine may recognize an explicit state of an object, such as a digital content asset and respond based on the context of the object in which the explicit state is expressed. In embodiments, an explicit state expression may be recognized by the gaming engine as declaring different properties or values thereof for an object such as a digital content asset, and the like.

In embodiments, a gaming engine of the system for creating may enable handling of an inheritance parameter, such as an inheritance parameter of a digital content asset that may be expressed in a declarative language. The gaming engine may recognize expression of an inheritance parameter in the declarative language and respond based thereto based on, for example, how the value of the inherited parameter impacts an object, such as an instance of digital content asset being executed in a runtime environment. In embodiments, the declarative language may support creating a sub-class that may represent an inheritance parameter operation. The gaming engine may determine that when an object is of a sub-class, it may process parameters of a parent class for the object, enabling an inheritance parameter for the object, such as an instance of a digital content asset and the like. The gaming engine may cause an object, such as an object in a sub-class to operate the same as the parent object due to the gaming engine's ability to handle inheritance parameters expressed in the declarative language and the like.

In embodiments, a gaming engine may enable handling of an animation feature, such as an animation feature of a digital content asset that may be expressed in a declarative language. The gaming engine may recognize expression of an animation feature in the declarative language and respond thereto based on, for example, how the expressed animation feature impacts an object, such as an instance of the digital content asset being executed by the gaming engine. A gaming engine may handle an animation feature that is expressed in the declarative language through hardware acceleration of at least a portion of the animation expressed. The gaming engine may perform the animations and rendering of the digital content asset that may be expressed in an animation feature statement and/or due to an impact of the animation on the digital content asset, such as on an instance of a digital content asset being rendered in a user interface, and the like.

In embodiments, a gaming engine may enable handling of a simulation feature, such as a simulation feature of a digital content asset that may be expressed in a declarative language. The gaming engine may recognize expression of a simulation feature in the declarative language and respond thereto based on, for example, how the expressed simulation feature impacts an object, such as an instance of digital content asset being executed by the code execution engine. A gaming engine may handle a simulation feature that is expressed in the declarative language through hardware acceleration of at least a portion of the simulation expressed.

In embodiments, a gaming engine may enable handling of a 3D geometric behavior, such as a 3D geometric behavior of a digital content asset that may be expressed in a declarative language. The gaming engine may recognize expression of a 3D geometric behavior in the declarative language and respond game engine features that perform 3D geometric actions. A gaming engine may handle a 3D geometric behavior that is expressed in the declarative language through hardware acceleration of at least a portion of the simulation expressed. In embodiments, 3D geometric behavior expressed through geometric behavioral statements of the declarative language may facilitate a gaming engine applying rules of physics and geometry on the digital objects for which the geometric behavioral statements of the declarative language are expressed.

In embodiments, a gaming engine may enable handling of a shader functionality, such as shader loading parameters for utilizing a digital content asset in different hardware devices. In embodiments, the shader loading parameters may be expressed in a declarative language. The gaming engine may recognize expression of shader loading parameters in the declarative language and respond thereto based on, for example, how the expressed shader loading parameters may impact utilization of an object, such as an instance of digital content asset on different hardware devices. A gaming engine my handle shader loading parameters that are expressed in the declarative language through hardware acceleration, such as through use of GPUs on different hardware devices, and the like. Handling shader loading parameters may be responsive to pixel-handling capacity of a display screen of different hardware devices. In embodiments, recognition of the pixel-handling capacity of a display screen for a hardware device on which the digital content asset is targeted to be utilized may impact how shader loading parameters are handled. The gaming engine may adjust how shader loading parameters, including any such parameters that are expressed and/or derived from a shader loading-related expression in the declarative language, are handled, including how they are applied to different devices based on, for example, the pixel-handling capacity of a display screen of the different devices.

In embodiments, the 2D visual editing environment may enable placement of objects on non-linear planes. The 2D visual editing environment may also enable specifying an effect for a surface of the object, such as a directional light source effect, a shadow effect, a glow effect and the like.

In embodiments, the system may further include a code execution engine that may control utilization of hardware resources, such as CPUs, GPUs and the like of different computing devices. Utilization of, for example, GPUs of some of the different devices, such as hardware endpoint devices and the like may be controlled to facilitate the simultaneous experience of the same behavior.

In embodiments, the code execution engine included in the system may further control utilization of hardware resources for different aspects of hardware performance, including thermal performance, battery management, and the like. The control utilization may include specification and execution of instructions for optimization of thermal performance of a GPU based on execution of the declarative language. A domain-specific declarative language used for digital content asset control code and the like may include statements that facilitate managing execution on target devices to optimize hardware aspects, such as thermal performance and the like.

In embodiments, the code execution engine included with the system may further ensure consistent user experience with the digital content asset, such as a consistent user experience of the common behavior, over a plurality of operating systems. In embodiments, the included code execution engine may govern execution of the digital content asset to provide the consistent user experience. In embodiments, a code execution engine may operate differently on different operating systems for a consistent user experience across a plurality of operating systems, including, without limitation operating systems such as IOS™, ANDROID™ WINDOWS™ MAC™, LINUX™, and the like.

Figure 28:
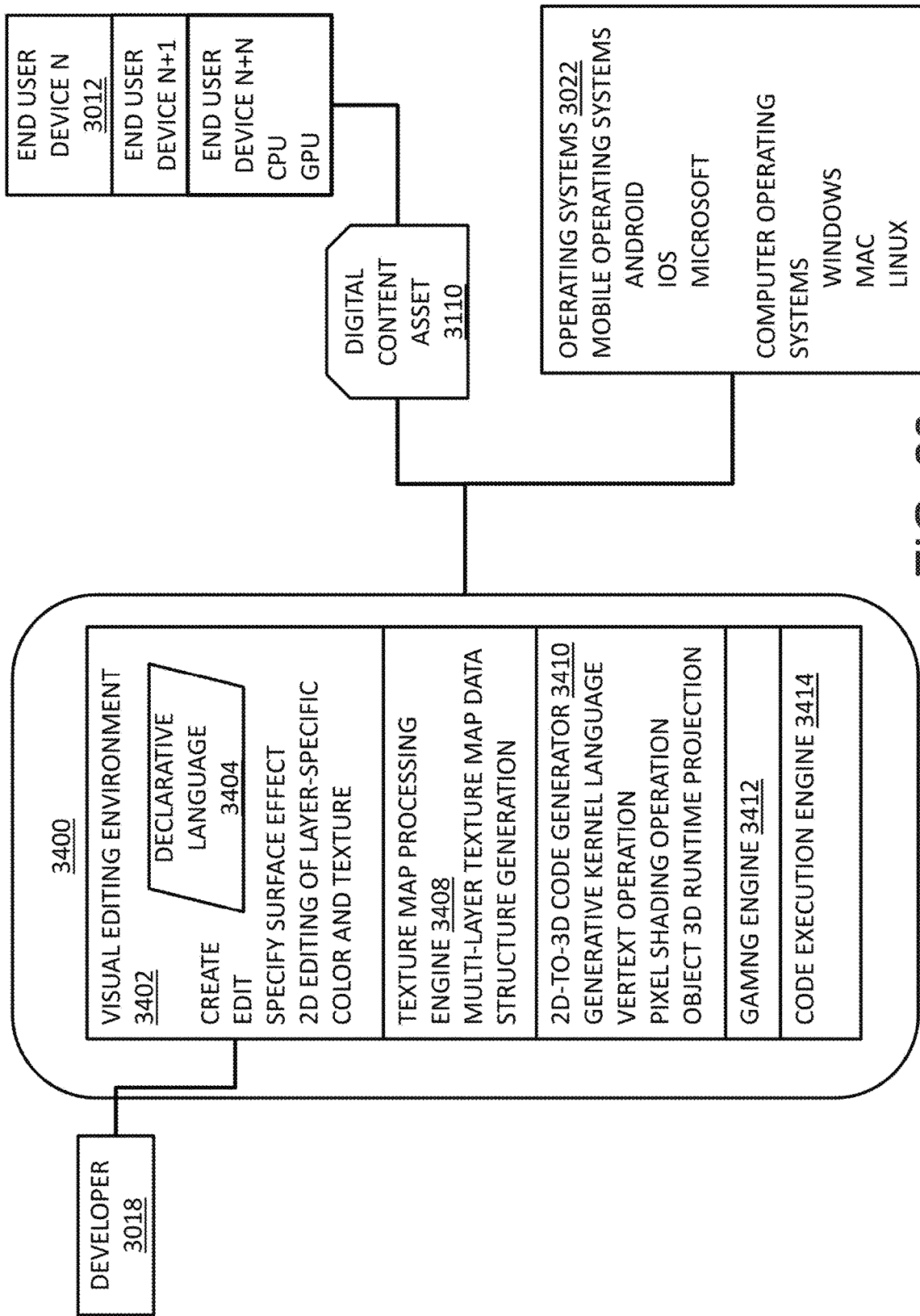
FIG. 28 depicts a system diagram of an embodiment of a system for creating, sharing and managing digital content that includes texture mapping and 2D-to-3D code generation in accordance with the many embodiments of the present disclosure.

In embodiments, a system for creating, sharing and managing digital content is depicted in FIG. 28. The system 3400 may comprise a visual editing environment 3402 that may enable a developer 3018 and the like to create, edit, and the like a digital content asset. The visual editing environment 3402 may further enable specifying a surface effect of an object placed on a non-linear plane. The visual editing environment 3402 may further facilitate specifying 2D editing of layer-specific color and textures. The visual editing environment 3402 may allow a developer to create a digital content asset 3110 using a declarative language 3404. The system 3400 may further include a texture mapping system 3408 that may facilitate producing a multi-layer texture map data structure from the 2D layer-specific colors and textures specified in the visual editing environment 3402. The system 3400 may further comprise a 2D-to-3D code generator 3420 that may function with a generative kernel language to perform vertex operations, pixel shading operations and object 3D runtime projection. The system 3400 may further comprise a code execution engine 3414 that may facilitate hardware resource utilization and thermal optimization for CPUs, GPU, and the like of different devices, such as end user devices 3012 on which a digital content asset 3110 operates. The system 3400 may further comprise a gaming engine 3412. The code execution engine 3414 may also control interactions, such as network layer interactions, communication protocol interactions, browser interactions, network middleware and the like. The system 3400 may further facilitate consistent user experience across a plurality of different operating systems 3022, including mobile, computer and other operating systems.

Figure 29:
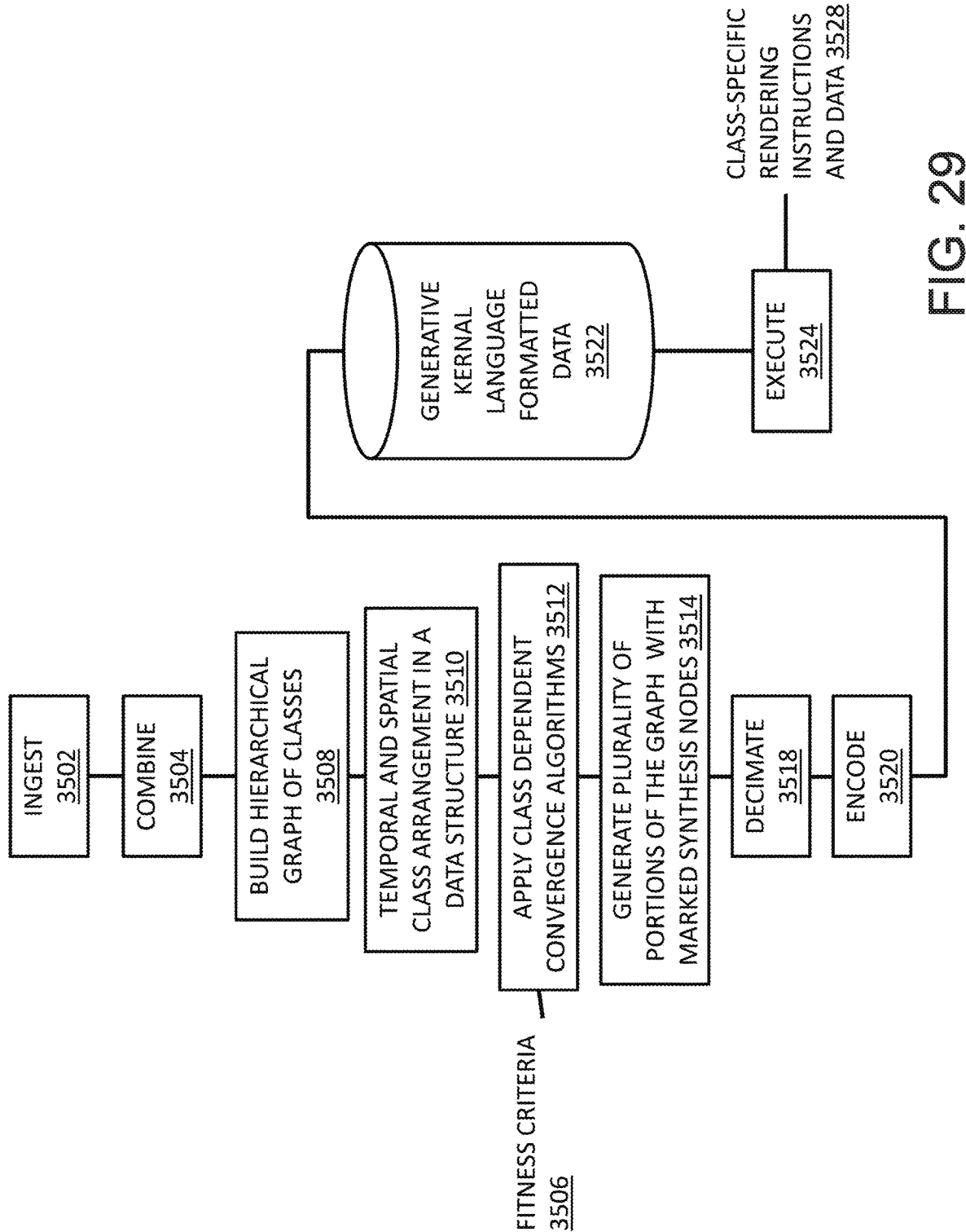
FIG. 29 depicts a flow chart of an embodiment of producing generative content with use of a generative kernel language in accordance with the many embodiments of the present disclosure.

FIG. 29 may depict a flow chart of a generative content approach that may include a method 3500 that may include an ingesting step 3502 that may ingest inputs from a range of sources, having a range of formats, and indicating a range of times. A step of combining 3504 the inputs may follow the ingesting step. A step of building a hierarchical graph of classes 3508 of the inputs may be followed by a step of arranging the classes of the data temporally and spatially in a data structure 3510. The result of step 3510 may be used in a step of applying class-dependent convergence algorithms 3512 to achieve a fitness criteria 3506. The converged data from 3512 may be processed to generate a plurality of portions of the graph with marked synthesis nodes at step 3514. These graph portions may be decimated at step 3518, and encoded at step 3520 to produce generative kernel language formatted data 3522. The generative kernel language formatted data may be executed by a processor at step 3524. Executing the generative kernel language formatted data at step 3524 may produce class-specific rendering instructions and data 3528.

Figure 30:
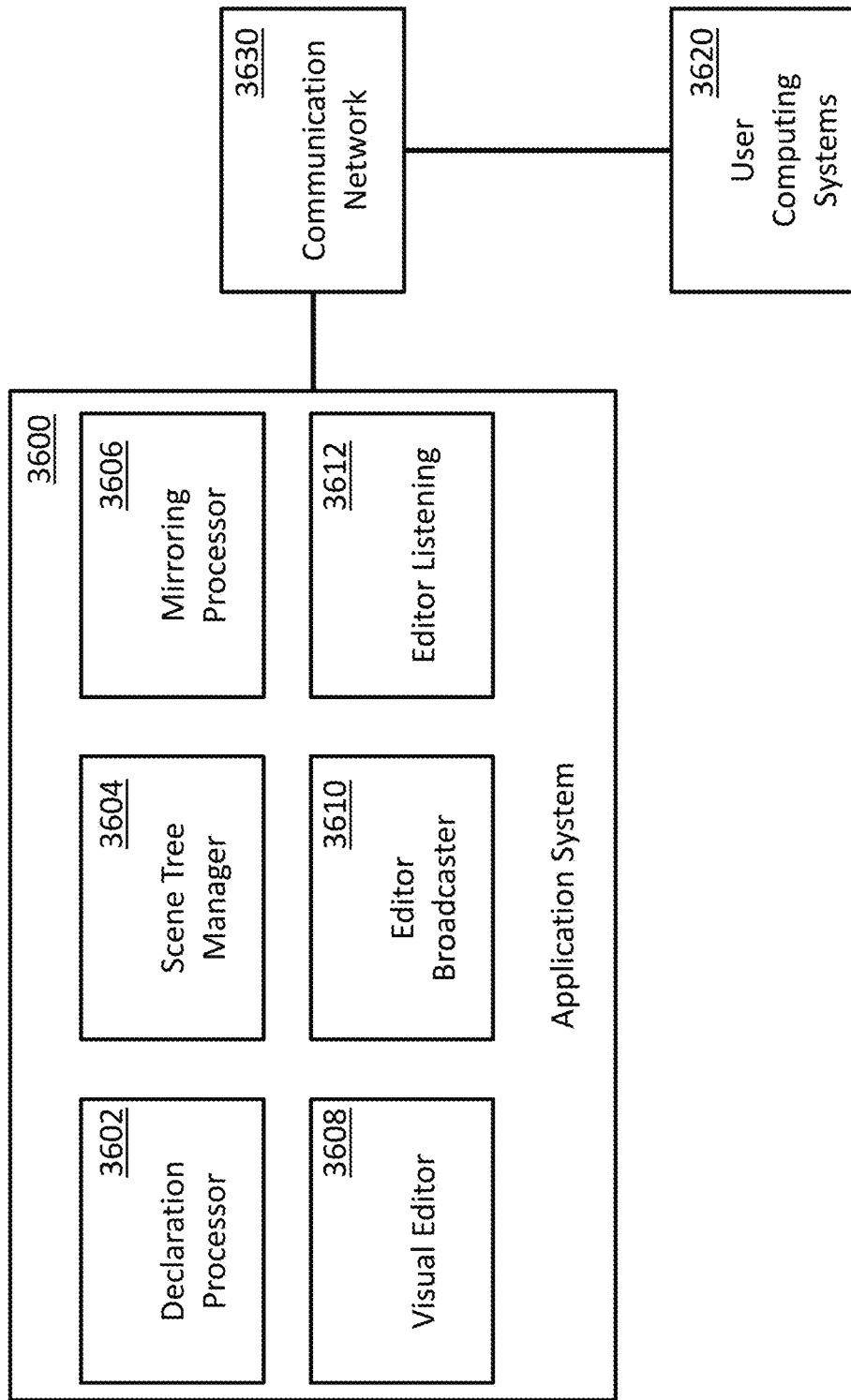
FIG. 30 depicts a system diagram of an embodiment of an application system environment engine in accordance with the many embodiments of the present disclosure.

FIG. 30 depicts an example configuration of an application system 3600. In some embodiments, the application system 3600 may be the system 100 shown with respect to FIG. 1. In the illustrated example, the application system 3600 may be configured to support a multi-user infrastructure and multi-user synchronization. The application system 3600 may include a declaration processor 3602, a scene tree manager 3604, a mirroring processor 3606, a visual editor 3608, an editor broadcaster 3610, and an editor listener 3612. The application system 3600 may include additional components, such as other components discussed with respect to FIG. 1.

In embodiments, the declaration processor 3602 is configured to linearly process a first declaration. The declaration may recite any set of items selected, including objects, relationships, properties, behaviors, and combinations thereof.

In embodiments, the scene tree manager 3604 may be configured to manage an instantiation of objects, object relationships, properties, and behaviors when embodied in an instantiation of a scene tree. In embodiments, the scene tree manager 3604 updates the instantiation of the scene tree when a user of many user provides user input to change the instantiation from a user computing system 3620 via a communication network 3630. For example, the user may provide input to change an object, an object relationship, a property, and/or a behavior. In response to the user input, the scene tree manager 3604 may update the instantiation to reflect the change to the object, the object relationship, the property, and/or the behavior.

In embodiments, the mirroring processor 3606 enables mirroring the first declaration to a second declaration. In embodiments, the mirroring processor 3606 is configured to cause generation of an instantiation of objects in the instantiation of the scene tree that mirror the set of items in the first declaration from the declaration processor. In embodiments, the mirroring processor 3606 is further configured to cause mirroring, in whole or in part, of the scene tree in a second declaration.

In embodiments, the visual editor 3608 is configured to receive user input indicating changes to instantiation of the scene tree and to change the instantiation of the scene tree based on the user input via the scene tree manager.

In embodiments, the editor broadcaster 3610 is configured to obtain changes from the visual editor and to cause the mirroring processor to transform a correspondingly changed part of the instantiation of the scene tree into a change declaration. In embodiments, the editor broadcaster 3610 is configured broadcast the change declaration embedded in a change message over the network 3630 to the user computer systems 3620.

In embodiments, the editor listener 3612 may be in communication with the communication network 3630. The editor listener 3612 may be configured to receive and process any change messages from any other user computer system 3620 of the user computer systems 3620 by causing the mirroring processor 3612 to transform a declaration embedded in received change message into a corresponding change in the instantiation of the scene tree.

In embodiments, the system 3600 may further implement one or more clocks to synchronize operation across the user computer systems. For example, the system may implement a frame clock that defines consecutive frames of the engine, whereby the systems may synchronize the operations to the frame clock.

In embodiments, executing generative kernel language attempts to recreate the original input. Generative kernel language formatted data is a much smaller representation of the source input and may comprise parameterized procedural instructions for transmission to rendering devices that may process a series of execution/decompression phases. Fidelity of the representation (e.g., a compression ratio) during decimation may be linked to the level of detail required, with the lower the detail, the simpler the representation.

In embodiments, a generative kernel language may comprise a minimal subset of instructions that facilitate generating outputs in a two-phase geometric digital content asset process. The generative kernel language may be used in a first phase of execution on the CPU. Secondary phases of the two-phase process may use methods other than generative kernel language on a CPU and or GPU. The secondary phases may be specific to a type of output being generated and therefor may not be restricted to generative kernel language instructions. This second phase may result in a reconstructed output similar to original content being rendered such as data, textures, geometry and the like. In embodiments, generative kernel language may accommodate the process of transforming geometric primitives through a two-phase execution process. The generative kernel language may act as a set of CPU-based parameterized procedural instructions which can be executed to create other CPU and/or GPU instructions or data, which can in turn be used to generate content similar to original content. The created instructions or data may be used in secondary phase to create data, textures, geometry and the like with a CPU or a GPU to a preferred level of rendering fidelity.

In embodiments, a generative content system may perform ingestion and combination of inputs. Inputs may be ingested from many different sources, may be of differing types, differing accuracy, differing precision and the like. Inputs may be ingested independent of a rate of update of the different inputs. Ingesting and combining input may include statistically processing the inputs, temporally filtering the inputs, spatially filtering the inputs, and combining these processed inputs.

In embodiments, a generative content system may use these processed inputs to create abstract instances of classes. These abstract instances of classes may include properties that can connect to one another, such as in a hierarchical graph. In embodiments, the abstract instance of classes may also be spatially and temporally arranged in a data structure. In embodiments, the data structure of the abstract instance of classes may include a data structure partitioning items with up to 4-dimensional axes, such as nested squares forming a quad tree, cubes forming an oct tree, tesseracts forming a 'hyper tree', and the like. In embodiments, processing inputs to create abstract instances of classes may be scalable, such as based on the number or volume of inputs, to facilitate, for example batch processing. Results of such batch processing may be combined into a shared representation. In embodiments, the abstract instances of classes may contribute to a graph with any number of nodes. Properties of these nodes may be connected to other nodes (e.g., with comparable properties, and the like) in a tree structure, such as a directed acyclic graph and the like. In embodiments, the nodes may also be partitioned in a plurality of dimensions, such as four dimensions based on the node properties (e.g., time and x, y, z location).

In embodiments, a generative content system may process a graph of classes with a set of class dependent algorithms. The generative content system may iterate over the graph with the class dependent algorithms. The class dependent algorithms may attempt to converge on a set of fitness criteria that may have many arbitrary weighted elements associated with the graph node hierarchy, classes, node properties, and the like. These algorithms can be specific to a given class or class hierarchy and act at different levels of detail on the graph. In embodiments, these algorithms may alter node properties, such as based on the class and properties of the current node, its parent, children or sibling nodes. These class dependent algorithms may also prune or create new nodes, such as for correcting errors, filling in information, and the like. The degree to which the graph is processed (e.g., the number of iterations and the like) may be adjusted based on a preference for convergence to the fitness criteria versus time/computation. In an example where data sets of road centerlines are provided with a number of lanes, where a minor road centerline joins a major road centerline without a controlled intersection (e.g. no traffic lights), nodes and properties defining a road intersection surface and markings in contact with the ground plane, even stop sign nodes can be added. In embodiments, a densely packed abstract representation may allow faster processing with fewer computing resources, increased centralized computation thereby reducing computation load on end user devices and potentially less network traffic. Additionally, fewer simulation and conformance passes may be needed to be completed before content synthesis operations. Also, synthesis may be performed in a computationally distributed manner (e.g. actually making the vertexes for the 3D representation of the road and signs). In embodiments, a densely packed abstract representation may facilitate efficiently splitting this densely packed representation. In embodiments, the convergence algorithms act on the graph by updating nodes, deleting nodes, creating nodes, updating node properties, deleting node properties, and creating node properties and the like.

In embodiments, once the conformance simulation portion of the generative content system is completed responsive to the fitness criteria, the hierarchical graph may be prepared for the generation of synthetic content from the nodes of the graph. An objective of preparing for generation of synthetic content is to facilitate distributed computation and storage. In embodiments, a partitioning scheme may be applied during this preparation process so that the hierarchical graph may be distributed based on the partitioning scheme. In embodiments, the partitioning scheme may allow multiple sparse data sets to be generated for processing which have edge nodes based on the partition scheme that are marked to be used for other computations. In embodiments, the marked edge nodes do not have results in localized graph operations that use techniques such as procedural rules, simulations, a libraries of templates/lookup tables, AI models and genetic algorithms to create the content at the maximum quality.

Through the use of the partitioning scheme and marking some nodes, it is possible to distribute this process of synthesis because a local copy of the graph may only need to have some nodes marked for content synthesis/generation. In embodiments, these synthetic generative processes, which may be associated with a class, can act on the graph nodes and generate, copy and parametrize a plurality of types of content that may be associated with the nodes.

In embodiments, the generated content may go through a set of specialized conformance processes that may perform clean up and annealing of aspects of the content. Specialized conformance processing may be required at a class level, content type, spatial or temporal level, and the like. In an example, conformance processing may include splitting polygons, adding and aligning vertexes in spatially proximate meshes, such as where a lower resolution ground plane meets a road surface, normalizing an envelope when combining two generated audio signals, and the like. Specialized conformance processing may be distributed for processing. In embodiments, the specialized conformance processing may be associated with a class can act on one or more content items. These content items can be identified by the type of content, properties of the content itself, the node's properties or the association of other nodes and their properties and content which are connected via hierarchy or partitioning as defined by the process, and the like.

In embodiments, the processed content can go through a set of specialized decimation processes that may be specific to a type of content being processed and a level of detail required to be preserved for rendering, and the like. It is possible to distribute this process as only the current piece of content being processed is required for decimation. These content type-specific decimation processes can act on the processed content for each level of detail required. In embodiments, output of this process may be simplified/quantized/transformed or empty pieces of content for each level of detail based, for example on a set simplification rules that may be encoded in the decimation process, and the like.

In embodiments, the level of detail decimated content may go through content specific encoding processes. These processes may be specific to a type of content and a type of encoding or compression applied. In embodiments, it is possible to distribute these processes because only the specific content item being processed is required for encoding. In embodiments, content-specific coherent batch execution may be preferred due to it is more efficient and may facilitate inter-content techniques like a shared texture atlas or building a statistical model for a lookup table, and the like. In embodiments, these encoding processes output data in a generative kernel language format.

In embodiments, the rendering level of detail generated generative kernel language formatted data may be stored in a multi-dimensional database that may manage volume and spatial occlusion. In embodiments, a generative content system may incorporate the multi-dimensional database. In embodiments, the multi-dimensional database may be distributed over multiple servers.

In embodiments, the multi-dimensional partitioned database may be queried remotely, such as based on an x/y/z position, x, y, z orientation and a time, and the like. The multi-dimensional partitioned database may reply by supplying packets of generative kernel language data ordered from the front of the frustum to the back; thereby allowing rendering to proceed with the most important packets arriving first. These packets may also be supplied with the right level of detail for the proximity to the viewer, taking into account occlusion, and the like. In embodiments, a query of the multi-dimensional database may be more abstract, such as based on the type of rendering required. In embodiments, the content may include generative kernel language holding time series data or simulations of particle interactions, and the like. In embodiments, generative kernel language data packets may be cached by the local client most lazily. This reduces bandwidth and re-computing items which are in view in subsequent frames. This may facilitate achieving high frame rates.

In embodiments, generative kernel language may facilitate local execution in a virtual machine and the like. In embodiments, generative kernel language may comprise a packing and parameterization language that expands into class-specific instructions and data.

In embodiments, a generative content system may support class-specific decoding. A plurality of decoders and processing steps may be applied to the unpacked results from generative kernel language execution. These may be determined by the specific class and can be executed on a CPU or GPU. Examples of class-specific decoders include SE (Spline Extraction) designed to unpack smoothly varying time series data such as joint angles on the CPU, TS (Texture Synthesis) and GML (Generative modelling language) both designed to be executed on the GPU, and the like.

In embodiments, a system for creating, sharing and managing digital content may facilitate creating and rendering generative content. The system may perform ingestion of inputs, combine the inputs into an abstract representation of a system that processes the inputs, the combined inputs may be adapted to confirm to a simulation environment and simulated to produce output comparable to outputs from the system for processing the inputs. The simulated outputs may be optimized, such as through a simulated annealing process. The system may further synthesize content from the outputs. In embodiments, the system may further clean up the synthesized content, such as with a simulated annealing process. In embodiments, the content maybe compressed, transmitted and rendered on different types of computing devices. In embodiments, the system may optionally perform steps including decimation of the content, encoding of the decimated content, storage of the encoded content, querying e.g., of the encoded content, generative kernel language execution by a CPU of the content, apply class-specific decoders to the content, and the like.

In embodiments, an application system is provided having an engine that unifies the creation, editing and deployment of an application across endpoint devices that run heterogeneous operating systems. In embodiments, an application system is provided having an engine that unifies the creation, editing and deployment of an application across endpoint devices that run heterogeneous operating systems and having a multi-user infrastructure that allows the editor to edit a scene tree for an application simultaneously with other users of the editor or users of the runtime of the application such that rendered simulations appear the same to all users. In embodiments, an application system 100 is provided having an engine that unifies the creation, editing and deployment of an application across endpoint devices that run heterogeneous operating systems and having a user interface for simulation of an application that shares the infrastructure and engine for the code that implements the application. In embodiments, an application system 100 is provided having an engine that unifies the creation, editing and deployment of an application across endpoint devices that run heterogeneous operating systems and having a visual code editing environment that uses the same engine for editing and running an application. In embodiments, an application system 100 is provided having an engine that unifies the creation, editing and deployment of an application across endpoint devices that run heterogeneous operating systems and having a visual code editing environment wherein a developer can code high-level application functions and can code how an application will use the CPU/GPU of an endpoint device that runs the application to enable optimization of application performance. In embodiments, an application system is provided having an engine that unifies the creation, editing and deployment of an application across endpoint devices that run heterogeneous operating systems and having a visual code editing environment that uses a gaming engine to handle machine code across different operating system platforms within the same editor interface. In embodiments, an application system is provided having an engine that unifies the creation, editing and deployment of an application across endpoint devices that run heterogeneous operating systems and having a JavaScript Plug-In system, an editor, a script layer and an engine for simulation and running of code developed using the system. In embodiments, an application system is provided having an engine that unifies the creation, editing and deployment of an application across endpoint devices that run heterogeneous operating systems and having a shared editing environment enabling real time, multi-user, simultaneous development, including shared simulation of the runtime behavior of an application that is being edited. In embodiments, an application system is provided having an engine that unifies the creation, editing and deployment of an application across endpoint devices that run heterogeneous operating systems and having a declarative language that is used to describe a scene tree that specifies the page layout of an application and the structure of interactions among application elements in response to user input. In embodiments, an application system is provided having an engine that unifies the creation, editing and deployment of an application across endpoint devices that run heterogeneous operating systems and having a coding environment with a declarative language in which the runtime and the editor for an application are compiled by LLVM. In embodiments, an application system is provided having an engine that unifies the creation, editing and deployment of an application across endpoint devices that run heterogeneous operating systems and having the ability to express logic for application behavior and presentation layer layouts of visual elements for the application in the same declarative language. In embodiments, an application system is provided having an engine that unifies the creation, editing and deployment of an application across endpoint devices that run heterogeneous operating systems and having the same domain-specific language for an editor, a runtime and file management for applications developed using the system. In embodiments, an application system is provided having an engine that unifies the creation, editing and deployment of an application across endpoint devices that run heterogeneous operating systems and having a development language with unlimited named states that can be added to an object or object class which can encapsulate properties or methods. In embodiments, an application system is provided having an engine that unifies the creation, editing and deployment of an application across endpoint devices that run heterogeneous operating systems and having an application development language designed to be extended with new object classes with methods, properties and events which can expose device features across devices using different operating system platforms. In embodiments, an application system is provided having an engine that unifies the creation, editing and deployment of an application across endpoint devices that run heterogeneous operating systems and having a domain-specific language for visual experience creation. In embodiments, an application system is provided having an engine that unifies the creation, editing and deployment of an application across endpoint devices that run heterogeneous operating systems and having a private portal within a development environment to publish applications from the development environment without requiring deployment through an app store. In embodiments, an application system is provided having an engine that unifies the creation, editing and deployment of an application across endpoint devices that run heterogeneous operating systems and having an editing engine within a development environment that includes an avatar class operating with JavaScript, wherein the avatar class specifies parameter for speech synthesis and 3D animation for an avatar. In embodiments, an application system is provided having an engine that unifies the creation, editing and deployment of an application across endpoint devices that run heterogeneous operating systems and having a declarative language with object classes and methods that allow a developer to specify conversational interfaces and natural language endpoints to create an emotionally responsive avatar for integration into a system that uses the avatar. In embodiments, an application system is provided having an engine that unifies the creation, editing and deployment of an application across endpoint devices that run heterogeneous operating systems and having a user interface that enables non-technical users to specify variations of visually presented objects in an application. In embodiments, an application system is provided having an engine that unifies the creation, editing and deployment of an application across endpoint devices that run heterogeneous operating systems and having a variations user interface layer that allows users to manage the state of one or more objects that are used to create a visual presentation for an application. In embodiments, an application system is provided having an engine that unifies the creation, editing and deployment of an application across endpoint devices that run heterogeneous operating systems and having one or more interfaces for handling input parameters for 3D content, the input parameters selected from the group consisting of content density, hand proximity display, head proximity change density, content as a virtual window, hysteresis for content density, and content density. In embodiments, an application system is provided having an engine that unifies the creation, editing and deployment of an application across endpoint devices that run heterogeneous operating systems and having a user interface for 3D content generation including the ability to hot key to identify the object and properties of a 3D object for an application. In embodiments, an application system is provided having an engine that unifies the creation, editing and deployment of an application across endpoint devices that run heterogeneous operating systems and having an engine and editor for handling 3D machine vision input that manages color information and information relating to distance from a defined point in space. In embodiments, an application system is provided having an engine that unifies the creation, editing and deployment of an application across endpoint devices that run heterogeneous operating systems and having an editor and engine for creating, editing and running an application that has 2D and 3D elements, wherein the editor uses a hybrid scene tree system that includes 2D and 3D elements that can be rendered, composited and interacted within the same visual scene.

In embodiments, an application system is provided having a multi-user infrastructure that allows the editor to edit a scene tree for an application simultaneously with other users of the editor or users of the runtime of the application such that rendered simulations appear the same to all users. In embodiments, an application system is provided having a multi-user infrastructure that allows the editor to edit a scene tree for an application simultaneously with other users of the editor or users of the runtime of the application such that rendered simulations appear the same to all users and having a user interface for simulation of an application that shares the infrastructure and engine for the code that implements the application. In embodiments, an application system is provided having a multi-user infrastructure that allows the editor to edit a scene tree for an application simultaneously with other users of the editor or users of the runtime of the application such that rendered simulations appear the same to all users and having a visual code editing environment that uses the same engine for editing and running an application. In embodiments, an application system is provided having a multi-user infrastructure that allows the editor to edit a scene tree for an application simultaneously with other users of the editor or users of the runtime of the application such that rendered simulations appear the same to all users and having a visual code editing environment wherein a developer can code high-level application functions and can code how an application will use the CPU/GPU of an endpoint device that runs the application to enable optimization of application performance. In embodiments, an application system is provided having a multi-user infrastructure that allows the editor to edit a scene tree for an application simultaneously with other users of the editor or users of the runtime of the application such that rendered simulations appear the same to all users and having a visual code editing environment that uses a gaming engine to handle machine code across different operating system platforms within the same editor interface. In embodiments, an application system is provided having a multi-user infrastructure that allows the editor to edit a scene tree for an application simultaneously with other users of the editor or users of the runtime of the application such that rendered simulations appear the same to all users and having a JavaScript Plug-In system, an editor, a script layer and an engine for simulation and running of code developed using the system. In embodiments, an application system is provided having a multi-user infrastructure that allows the editor to edit a scene tree for an application simultaneously with other users of the editor or users of the runtime of the application such that rendered simulations appear the same to all users and having a shared editing environment enabling real time, multi-user, simultaneous development, including shared simulation of the runtime behavior of an application that is being edited. In embodiments, an application system is provided having a multi-user infrastructure that allows the editor to edit a scene tree for an application simultaneously with other users of the editor or users of the runtime of the application such that rendered simulations appear the same to all users and having a declarative language that is used to describe a scene tree that specifies the page layout of an application and the structure of interactions among application elements in response to user input. In embodiments, an application system is provided having a multi-user infrastructure that allows the editor to edit a scene tree for an application simultaneously with other users of the editor or users of the runtime of the application such that rendered simulations appear the same to all users and having a coding environment with a declarative language in which the runtime and the editor for an application are compiled by LLVM. In embodiments, an application system is provided having a multi-user infrastructure that allows the editor to edit a scene tree for an application simultaneously with other users of the editor or users of the runtime of the application such that rendered simulations appear the same to all users and having the ability to express logic for application behavior and presentation layer layouts of visual elements for the application in the same declarative language. In embodiments, an application system is provided having a multi-user infrastructure that allows the editor to edit a scene tree for an application simultaneously with other users of the editor or users of the runtime of the application such that rendered simulations appear the same to all users and having the same domain-specific language for an editor, a runtime and file management for applications developed using the system. In embodiments, an application system is provided having a multi-user infrastructure that allows the editor to edit a scene tree for an application simultaneously with other users of the editor or users of the runtime of the application such that rendered simulations appear the same to all users and having a development language with unlimited named states that can be added to an object or object class which can encapsulate properties or methods. In embodiments, an application system is provided having a multi-user infrastructure that allows the editor to edit a scene tree for an application simultaneously with other users of the editor or users of the runtime of the application such that rendered simulations appear the same to all users and having an application development language designed to be extended with new object classes with methods, properties and events which can expose device features across devices using different operating system platforms. In embodiments, an application system is provided having a multi-user infrastructure that allows the editor to edit a scene tree for an application simultaneously with other users of the editor or users of the runtime of the application such that rendered simulations appear the same to all users and having a domain-specific language for visual experience creation. In embodiments, an application system is provided having a multi-user infrastructure that allows the editor to edit a scene tree for an application simultaneously with other users of the editor or users of the runtime of the application such that rendered simulations appear the same to all users and having a private portal within a development environment to publish applications from the development environment without requiring deployment through an app store. In embodiments, an application system is provided having a multi-user infrastructure that allows the editor to edit a scene tree for an application simultaneously with other users of the editor or users of the runtime of the application such that rendered simulations appear the same to all users and having an editing engine within a development environment that includes an avatar class operating with JavaScript, wherein the avatar class specifies parameter for speech synthesis and 3D animation for an avatar. In embodiments, an application system is provided having a multi-user infrastructure that allows the editor to edit a scene tree for an application simultaneously with other users of the editor or users of the runtime of the application such that rendered simulations appear the same to all users and having a declarative language with object classes and methods that allow a developer to specify conversational interfaces and natural language endpoints to create an emotionally responsive avatar for integration into a system that uses the avatar. In embodiments, an application system is provided having a multi-user infrastructure that allows the editor to edit a scene tree for an application simultaneously with other users of the editor or users of the runtime of the application such that rendered simulations appear the same to all users and having a user interface that enables non-technical users to specify variations of visually presented objects in an application. In embodiments, an application system is provided having a multi-user infrastructure that allows the editor to edit a scene tree for an application simultaneously with other users of the editor or users of the runtime of the application such that rendered simulations appear the same to all users and having a variations user interface layer that allows users to manage the state of one or more objects that are used to create a visual presentation for an application. In embodiments, an application system is provided having a multi-user infrastructure that allows the editor to edit a scene tree for an application simultaneously with other users of the editor or users of the runtime of the application such that rendered simulations appear the same to all users and having one or more interfaces for handling input parameters for 3D content, the input parameters selected from the group consisting of content density, hand proximity display, head proximity change density, content as a virtual window, hysteresis for content density, and content density. In embodiments, an application system is provided having a multi-user infrastructure that allows the editor to edit a scene tree for an application simultaneously with other users of the editor or users of the runtime of the application such that rendered simulations appear the same to all users and having a user interface for 3D content generation including the ability to hot key to identify the object and properties of a 3D object for an application. In embodiments, an application system is provided having a multi-user infrastructure that allows the editor to edit a scene tree for an application simultaneously with other users of the editor or users of the runtime of the application such that rendered simulations appear the same to all users and having an engine and editor for handling 3D machine vision input that manages color information and information relating to distance from a defined point in space. In embodiments, an application system is provided having a multi-user infrastructure that allows the editor to edit a scene tree for an application simultaneously with other users of the editor or users of the runtime of the application such that rendered simulations appear the same to all users and having an editor and engine for creating, editing and running an application that has 2D and 3D elements, wherein the editor uses a hybrid scene tree system that includes 2D and 3D elements that can be rendered, composited and interacted within the same visual scene.

In embodiments, an application system is provided having a user interface for simulation of an application that shares the infrastructure and engine for the code that implements the application. In embodiments, an application system is provided having a user interface for simulation of an application that shares the infrastructure and engine for the code that implements the application and having a visual code editing environment that uses the same engine for editing and running an application. In embodiments, an application system is provided having a user interface for simulation of an application that shares the infrastructure and engine for the code that implements the application and having a visual code editing environment wherein a developer can code high-level application functions and can code how an application will use the CPU/GPU of an endpoint device that runs the application to enable optimization of application performance. In embodiments, an application system is provided having a user interface for simulation of an application that shares the infrastructure and engine for the code that implements the application and having a visual code editing environment that uses a gaming engine to handle machine code across different operating system platforms within the same editor interface. In embodiments, an application system is provided having a user interface for simulation of an application that shares the infrastructure and engine for the code that implements the application and having a JavaScript Plug-In system, an editor, a script layer and an engine for simulation and running of code developed using the system.

In embodiments, creating, sharing, and managing digital content, such as for experiencing on a plurality of different digital device end points in a network may be accomplished by a system that incorporates a visual editing environment with a code execution environment that work together to enable at least one of creation, delivery, and editing of a digital asset during runtime of the asset. The combination may further enable a plurality of end users using different devices to concurrently experience the same behavior of the digital asset during its creation and its editing. In embodiments, the visual editing environment may enable a developer to create and edit code controlling a digital content asset. In embodiments, the code execution engine may operate in the visual editing environment, such as on the created code to control execution of hardware elements, such as a hardware infrastructure element that enables utilization of the digital content asset.

In embodiments, a system that combines the visual editing environment and the code execution engine to enable creation-time and editing-time consistent behavior across different devices may include the visual editing environment interacting with the code execution engine during, for example creation of digital content asset management code. In embodiments, a user interacting with the visual editing environment may, such as through graphical manipulation of a digital content asset, may effectively be producing code that the code execution engine responds to by executing it to cause visual effects in the visual editing environment, and the like. The code execution engine may be configured to respond to the produced code with data and graphic manipulation functions for each different device based, for example on device identification information, such as the type of operating system that the different devices are executing, and the like.

In embodiments, the code execution engine that works cooperatively with the visual editing environment to facilitate presenting consistent behavior of the digital content asset on different devices may be the same code execution engine that supports runtime operation of an application that uses the digital content asset control code generated with the visual editing environment. In embodiments, the code execution engine may operate in association with an executable container that may include digital content assets, such as to enable viewing the digital content assets with a viewer that, based at least in part on the code execution engine facilitates the consistent digital content asset behavior across the different devices, such as end point devices in a network and the like. In embodiments, the visual editing environment may facilitate multiple users and/or groups to simultaneously create code for controlling a digital content asset. The visual editing environment may benefit from the code execution engine managing utilization of a CPU, a GPU, or the like, for digital content asset and optionally general software code development. In embodiments, the visual editing environment may include capabilities for use of a gaming engine, including for coding gaming behavior of hardware and software components, including operating system and hardware platforms. In embodiments, the visual editing environment may enable creating and editing a digital content asset control application in declarative language that may facilitate specifying control of machine behavior of a device, the abstraction of input types across operating system types, the capability for control of visual presentation layer behavior of objects across a plurality of operating system platform types, and the like.

In embodiments, the visual editing environment may incorporate and/or be accessible through a user interface that may provide access to the functions of the visual editing environment including without limitation digital content asset functions of creating, editing, sharing, managing, publishing, and the like. The visual editing environment, such as through the user interface may facilitate presentation of the digital content asset and its behavior by interacting with the code execution engine, such as through code execution engine Application Programming Interface (API). In embodiments, the visual editing environment may facilitate the users of the different devices to simultaneously experience the same behavior of the digital content asset through a multi-user synchronization system that may operate as part of the visual editing environment to allow, among other things simultaneous experience, editing, and the like. In embodiments, multiple instances of the visual editing environment may be active on a portion of the different devices and may be synchronized via the multi-user synchronization system.

In embodiments, the visual editing environment may utilize the code execution engine as fully compiled code, which may facilitate achieving the simultaneous experience of the same behavior for different devices, such as tablets and the like that may not support runtime compilation, and the like.

In embodiments, a code execution engine of a system for creating, sharing and managing digital content may control utilization of hardware resources of the different devices, such as CPUs, GPUs and the like. Utilization of, for example, CPUs of some of the different devices, such as hardware endpoint devices and the like may be controlled to facilitate the simultaneous experience of the same behavior. In an example of CPU utilization, a code execution engine may utilize a graphic drawing capability of a CPU on the devices so that the behavior of the digital asset is experienced the same on the different devices. By controlling CPU utilization as in this example, differences that may be experienced when using a CPU on a first device and a GPU on a second device to perform a graphic display operation may be avoided. In embodiments, CPU and GPU utilization control may further facilitate simultaneous experience of users on different devices by, for example, allowing for rapid deployment of digital content asset behavior code across the devices without having to customize the deployment to utilize a CPU on a first device that does not have a GPU and an available GPU on a second device.

In embodiments, the code execution engine may operate with the visual editing environment during creation, editing, and the like as well as during runtime of digital content asset code generated by use of the visual editing environment. With the same code execution engine operating during visual editing and during runtime, visual editing may result in generating code, such as digital content asset control code that can control utilization of a CPU and/or GPU, such as by generating code execution control statements. Code execution control statements may include hardware resource utilization statements that may directly control utilization of different device hardware resources, such as a CPU, GPU, and the like. In embodiments, a language used in the visual editing environment, such as a declarative language that may be described herein, may include hardware resource utilization statements that the code execution engine may execute or that may affect how the code execution engine executes code, such as executing a graphic function with a CPU even when a GPU is available on the device, and the like.

In embodiments, the code execution engine of the system for creating, sharing and managing digital content may further control utilization of hardware resources for different aspects of hardware performance, including thermal performance, battery management, and the like. In embodiments, the system may have access to instruction-level execution power and thermal performance information for different devices. Device-specific instances of the code execution engine, for example, may be represented at the instruction-level so that the impact on at least one of thermal and power performance may be determined for each instruction that may be executed by the code execution engine on the devices. The digital content asset control code created and/or edited, such as by a developer with the visual editing environment that the code execution engine will perform can be analyzed based on the power and/or thermal impact of each corresponding device-specific instruction. The result of this analysis may be a measure of the thermal and/or power (e.g., battery demand) impact on the device so that the impact may be controlled. In embodiments, the analysis of the digital content asset control code that the code execution engine may execute may suggest specific code and/or execution control of that code, such as a specific sequence of instructions, a rate of execution of instructions, or the like that may reduce or optimize thermal performance of the device. In embodiments, optimizing thermal performance for a hardware resource of one or more different devices for which utilization may be controlled, such as a CPU, a GPU and the like may be based on computation of a thermal impact of executing a digital content asset control code set by a code execution engine. This thermal impact computation may include CPU utilization (e.g., execution rate and the like), GPU utilization, memory utilization, and the like and may be determined by the thermal impact of instructions, such as CPU instructions from the digital content asset control code, generated by a compiler. In embodiments, the thermal impact computation may include compiled instructions generated from a code execution engine performing the digital content asset control code on the device. In embodiments, thermal optimization may include minimizing temperature rise of hardware resources of a device, such as the CPU for a portion of the digital content asset control code generated by, for example, a developer in the visual editing environment, and the like. In embodiments, thermal optimization may include achieving an average temperature rise during execution of a portion of the digital content asset control code by the code execution engine. This may include allowing portions of the digital content asset control code being executed by the code execution engine to result in a temperature that exceeds an optimized average temperature, while ensuring that an average temperature rise while executing a specific portion of the digital content asset control code does not exceed the average. In embodiments, thermal optimization may include limiting a temperature rise of one or more hardware resources of a device, such as CPU, GPU, and the like from exceeding an optimized maximum temperature. This may include reducing a frequency of execution by the code execution engine where a higher frequency of execution would result in a temperature increase beyond the optimized maximum temperature.

In embodiments, a code execution engine of the system for creating, sharing and managing digital content may further ensure consistent user experience with the digital content asset, such as a consistent user experience of the common behavior, over a plurality of operating systems. In embodiments, the code execution engine may govern execution of the digital content asset control code to provide the consistent user experience. A consistent user experience may include a look and feel of a user interface, a speed of control of a digital content asset, interaction elements in the user interface, and the like. A code execution engine may perform a runtime check of the operating system of a device on which the code execution engine is executing the digital content asset control code and adjust a sequence of instructions, a selection of instructions, and the like based on a result of the runtime operating system check. A code execution engine may limit selection of instructions to be generated by a compiler for each of a plurality of different operating systems so that instructions being executed on different operating systems result in a consistent user experience. In embodiments, a code execution engine may take an abstraction of a visual element from a digital content asset control code and convert it into a set of instructions that ensure a consistent user experience across different operating systems. This may take the form of graphic primitives, and the like to generate a consistent visual element for each operating system. In embodiments, an operating system native icon that is used to activate an operating system function, such as rotating a digital content asset in a graphical user interface may appear differently on different operating systems. One operating system may show a curved arrow along an edge of the digital content asset; yet another operating system may show a circular icon along a central axis of the digital content asset. The code execution engine may, instead of executing instructions that generate the native icon, may execute instructions that generate a digital content asset rotation icon that is consistent across different operating systems, independent of the native icon for this purpose that each operating system uses.

In embodiments, a code execution engine of the system for creating, sharing and managing digital content may ensure simultaneous user experience of the same behavior of the digital content asset by, for example, decoupling the language from target system-specific resources, such as a device and/or operating system specific rendering engine and the like. In embodiments, rendering actions, as may be represented by a rendering layer of functionality, may be encoded into a language used in the visual editing environment to generate digital content asset control code and the like. In this way, a digital content asset may perform the same behavior on different devices, different operating systems, and combinations thereof. In embodiments, the code execution engine may function similarly to a gaming engine in that the combination of visual editing environment language and code output therefrom with the code execution engine define behaviors at a rendering level of the digital content asset, such as 3D movements, and the like. In embodiments, this combination facilitates coding the users experience (e.g., how the digital content asset will behave) with respect to the digital content asset behavior at the time that the digital content asset control code is generated in the visual editing environment. In this way, the code execution engine, which may function similarly to a gaming engine for this specific aspect, may do the underlying work of making the behavior consistent, without a developer having to consider how any target device and/or operating system may need to be controlled to generate the desired behavior.

In embodiments, a code execution engine of the system for creating, sharing and managing digital content may govern execution of the code for a consistent user experience, such as is described herein, across a plurality of mobile operating systems, including, without limitation operating systems such as IOS™, ANDROID™, WINDOWS™, and the like. Mobile operating systems may include their own look and feel, including how fundamental user interactions are performed. Governing execution of code across mobile operating systems may include adapting execution of digital content asset control code and the like so that, while the user experience may not be the same across mobile operating systems, a user of an IOS™ based device may experience the digital content asset with a look and feel that a user experiences when using other mobile applications on the device. In this way, a consistent user experience may be tailored to each individual mobile operating system so that the digital content asset may effectively appear to have the same behavior, while the underlying user interface and mobile operating system native controls may be preserved for each mobile operating system. This may involve, for example, distinguishing digital content asset control code that should be executed consistently on each mobile operating system from code that should be directed to a mobile operating system specific user experience. In embodiments, rotational behavior of a digital content asset may be consistent across mobile operating systems, whereas the controls for rotation may be operating system specific.

In embodiments, a code execution engine of the system for creating, sharing and managing digital content may govern execution of the code for a consistent user experience, such as is described herein, across a plurality of computer operating systems, including, without limitation operating systems such as MAC™, LINUX™, WINDOWS™, and the like. Computer operating systems may include their own look and feel, including how fundamental user interactions are performed. Governing execution of code across computer operating systems may include adapting execution of digital content asset control code and the like so that, while the user experience may not be the same across computer operating systems, a user of an IOS™ based device may experience the digital content asset with a look and feel that a user experiences when using other computer applications on the device. In this way, a consistent user experience may be tailored to each individual computer operating system so that the digital content asset may effectively appear to have the same behavior, while the underlying user interface and computer operating system native controls may be preserved for each computer operating system. This may involve, for example, distinguishing digital content asset control code that should be executed consistently on each computer operating system from code that should be directed to a computer operating system specific user experience. In embodiments, rotational behavior of a digital content asset may be consistent across computer operating systems, whereas the controls for rotation may be operating system specific.

In embodiments, a code execution engine of the system for creating, sharing and managing digital content may govern execution of the code for a consistent user experience, such as is described herein, in deployments that include combinations of mobile operating systems (e.g., an IPHONE™) and a computer (e.g., a WINDOWS™ LAPTOP). In embodiments, a combination of the code execution engine and the visual editing environment may facilitate this consistent user experience across mobile, computer, and other operating systems, such as by enabling creation, delivery and editing of the digital content asset during runtime (e.g., when the code execution engine is executing digital content asset control code, and the like). In embodiments, the code execution engine may be executing code, effectively in a runtime mode, during visual editing environment operations, such as creation, delivery, editing and the like. Operation of the code execution engine on each operating system type during, for example editing of a digital content asset, may be execution of a compiled combination of the digital content asset control code that is generated during the editing action and a portion of the code execution engine that executes the generated digital content asset control code. This may contrast with generating a set of graphic manipulation commands that are delivered, optionally in real-time, from a device on which a user is editing a digital content asset, to a corresponding digital content asset viewer executing on the different operating systems. In embodiments, LLVM compilation may facilitate generation of operating system-specific sets of compiled instructions that may include a portion of the digital content asset control code and a portion of the code execution engine to perform one or more digital content asset control actions consistently across a plurality of operating systems, including mobile operating systems, computer operating systems, and the like.

In embodiments, a code execution engine of the system for creating, sharing and managing digital content may enable control of network layer interactions for the digital content asset. In embodiments, the code execution engine may be structured with a layer that may facilitate controlling network layer interactions, such as a network layer 192 of the code execution engine. In embodiments, the code execution engine may gain control of network layer interactions for the digital content asset via network layer interaction control statements that may be output from editing and digital content asset control code generation actions within the visual editing environment. The visual editing environment may make available to a developer and/or other user of the environment network layer interaction statements that may be coded into digital content asset behavior and the like so that when executed by the code execution engine, network layer interactions and the like may be controlled. In embodiments, a network layer interaction that may be controlled may include a mirroring function of the network so that network actions on a portion of the digital content asset or the like may result in mirroring of a result of a network action, such as having a portion of the digital content asset or the like being mirrored to one or more different devices that may be connected to the network and may, optionally be rendering the digital content asset in a way that ensures a consistent user interface across the different devices. In embodiments, network layer interaction and other network functions that may be controlled by the code execution engine, such as is described herein and the like, may include control of wireless device interactions. In embodiments, wireless device interactions may include wireless network layer interactions. In embodiments, wireless device interactions that may be controlled by the code execution engine and the like may include Bluetooth interactions, wireless access point interactions, wireless beacon interactions, near-field communication interactions, and any other wireless device interaction, and the like.

In embodiments, similarly to control of network layer interactions, the code execution engine may, such as through execution of statements that may be output from developer activity in the visual editing environment, control communication protocol interactions for the digital content asset. In embodiments, the code execution engine may be structured with a layer that may facilitate controlling communication protocol interactions, such as a communication protocol layer of the code execution engine.

In embodiments, the code execution engine may gain control of communication protocol interactions for the digital content asset via communication protocol interaction control statements that may be output from editing and digital content asset control code generation actions within the visual editing environment. The visual editing environment may make available to a developer and/or other user of the environment communication protocol interaction statements that may be coded into digital content asset behavior and the like so that when executed by the code execution engine, communication protocol interactions and the like may be controlled. In embodiments, communication protocol interactions that may be controlled may include secure protocol interactions, secure socket interactions, HTTPS interactions, serial protocol interactions, and the like. Communication protocol interactions that may be controlled may facilitate communicating with one or more different devices that may be connected to the network and may, optionally be rendering the digital content asset in a way that ensures a consistent user interface across the different devices.

In embodiments, the code execution engine may gain control of browser interactions for the digital content asset via browser interaction control statements that may be output from editing and digital content asset control code generation actions within the visual editing environment. The visual editing environment may make available to a developer and/or other user of the environment browser interaction statements that may be coded into digital content asset behavior and the like so that when executed by the code execution engine, browser interactions and the like may be controlled. In embodiments, browser interactions that may be controlled may include Comet interactions, HTTP streaming interactions, Ajax push interactions, reverse Ajax interactions, secure socket interactions, and HTTP server push interactions, and the like. Browser interactions that may be controlled may facilitate browser interactions of one or more different devices that may be connected via a network and may, optionally be rendering the digital content asset in a way that ensures a consistent user interface across the different devices.

In embodiments, the code execution engine may gain control of networking middleware for the digital content asset via networking middleware control statements that may be output from editing and digital content asset control code generation actions within the visual editing environment. The visual editing environment may make available to a developer and/or other user of the environment networking middleware statements that may be coded into digital content asset behavior and the like so that when executed by the code execution engine, networking middleware and the like may be controlled. In embodiments, networking middleware that may be controlled may facilitate network interaction and the like of Raknet middleware, a gaming engine, a transport layer interaction, a UDP interaction, a TCP interaction, a 3D rendering engine, a gestural engine, a physics engine, a sound engine, an animation engine, and the like. Networking middleware that may be controlled may facilitate network interactions and the like of one or more different devices that may be connected via a network and may, optionally be rendering the digital content asset in a way that ensures a consistent user interface across the different devices.

In embodiments, the system for creating, sharing and managing digital content may further include functions that facilitate orchestrating components, events, response to triggers and the like for a digital content asset. In embodiments, orchestrating may include without limitation automated arrangement, coordination, and management of components, events and the like. Such orchestrating may facilitate control of aspects of the system to accomplish goals of the system, such as control of hardware infrastructure elements of different devices, delivery and editing of a digital content asset during runtime, simultaneous user experience for a plurality of users of different devices, such users experiencing the same behavior of the digital content asset and the like. In embodiments, orchestrating functionality may be enabled by a plug-in capability of the system, where an orchestrating capability may be plugged-in to the system. In embodiments, the plug-in capability of the system may be a JAVASCRIPT™ compatible plug-in system.

In embodiments, a system for creating, sharing and managing digital content may include a visual editing environment, a code execution engine, and a domain-specific declarative language. The system may enable a user, such as a developer to create and edit code controlling a digital content asset using the domain-specific declarative language. The developer may use a visual editing environment of the system to create and edit the digital content asset controlling code with the domain-specific declarative language. The domain-specific declarative language may be used to generate a script for operating the digital content asset in a computing environment, such as a host computing environment. In embodiments, the script may be specified according to which the digital content asset is serialized in the host computing environment. In embodiments, the script may be specified according to which the digital content asset is de-serialized in the host computing environment. In embodiments, the code execution engine may operate on the code controlling the digital content asset generated in the visual editing environment to, for example, control execution of the code to enable utilization of the digital content asset, and the like. The code execution engine may operate cooperatively with the visual editing environment to facilitate controlling the digital content asset while the domain-specific declarative language is being used to create and edit the digital content asset controlling code. In embodiments, the visual editing environment and the code execution engine may enable creation, delivery and editing of the digital content asset. The visual editing environment and the code execution engine may work cooperatively to enable a plurality of versions of runtime code, such as a compiled output of the digital content asset control code created and/or edited in the visual editing environment using the domain-specific declarative language. In embodiments, the visual editing environment may be written using the domain-specific declarative language as is used to create and/or edit the plurality of runtime versions of the digital content asset.

In embodiments, the system may support producing different types of runtime versions, such as preview versions, portal versions, and the like. A preview runtime version generated with the system may enable a user to preview one or more behaviors of the digital content asset. A preview version may be a limited functionality version that, when the runtime is executed, exhibits a portion of the behaviors of the digital content asset based on, for example, a subset of available statements of the domain-specific declarative language. A preview runtime version may be suitable for use by a preview viewer executing on a computing system, such as a server computing system, and the like. In embodiments, a preview viewer may communicate with the visual editing environment of the system to facilitate previewing behaviors of a digital content asset for which control code is being generated from the domain-specific declarative language. The generated code may be shared with different runtime versions, such as the preview runtime version and the portal runtime version. The preview runtime version may be compiled with an LLVM compiler and the like.

A portal runtime version generated with the system described herein may enable a user to use the digital content asset, such as on a plurality of different devices and the like. A runtime portal version may be shared among users of different devices. A runtime portal version may be accessed by users, such as users of different devices, different operating systems, and the like. A runtime portal version may be configured as a container that enables publication and consumption of the digital content asset across endpoint devices, platforms, and the like. In embodiments, a portal viewer may access the configured runtime portal version and process the content of the container thereby facilitating use of the published digital content asset runtime version. In embodiments, a portal viewer may communicate with the visual editing environment of the system to facilitate viewing behaviors of a digital content asset for which control code is being generated from the domain-specific declarative language. The generated code may be shared with different runtime versions, such as the portal runtime version. The portal runtime version may be compiled with an LLVM compiler and the like.

In embodiments, a system for creating, sharing and managing digital content may facilitate serializing a digital content asset script. Serializing a digital content asset script may enable running the script within a host computing environment without the need for compiling. Serializing may allow access to the digital content asset control code generated with the domain-specific declarative language to operate the digital content asset, such as an active object without the need for compiling. In embodiments, serializing a digital content asset script may allow editing and loading of digital content, such as a digital content asset and the like at runtime into the code execution engine. In embodiments, the domain-specific declarative language may be statically compiled for execution and may be dynamically modified at runtime without compilation. In embodiments, code, such as a script for a digital content asset may be serialized by a serialization engine 112. In embodiments, the domain-specific declarative language may be compiled for execution and may alternatively be executed as a serialized description (e.g., at a text level).

In embodiments, the system for creating, sharing and managing digital content, such as digital content assets, may facilitate serialization of scripts based on a domain-specific declarative language that may be used to describe a visual editing environment through with the domain-specific declarative language may be used to generate digital content asset control code and the like. Serialization may occur by converting tokens, such as words and operators of the domain-specific declarative language, into bytecodes. Serialization may facilitate producing bytecodes that may be associated with literals, such as strings, numbers, object names and the like. An associated literal and the like may be stored with a corresponding bytecode for serialization. In embodiments, a literal may be stored following a bytecode and literal length to facilitate smaller and faster transmission than similar actions involving parsing and the like without serialization. In embodiments, serialized digital content, such as a digital content asset and/or a script for a digital content asset as described herein may include object event logic. In embodiments, such object event logic within a serialized digital content asset and the like may be constrained to consist of a list of parameterized methods. In embodiments, when object event logic for a serialized digital content asset and the like are constrained to the list of parameterized methods, states for the serialized digital content asset may be specified in the domain-specific declarative language. Specified states in the domain-specific declarative language may enable conditional logic for the digital content asset by a combination of the parameterized methods and state-based code execution.

In embodiments, a script for a digital content asset may be de-serialized through use of elements of the system for creating, sharing and managing digital content. A script maybe de-serialized for running within a host computing environment without the need for compiling.

In embodiments, a system that enables generation of a plurality of runtime versions of domain-specific declarative language-based digital content assets may enable creation-time and editing-time consistent behavior across different devices. This may include the visual editing environment interacting with the code execution engine during, for example creation of digital content assets from the domain-specific declarative language, and the like. In embodiments, a user interacting with the visual editing environment may effectively be producing code that the code execution engine responds to by executing it to cause visual effects in the visual editing environment, and the like. In embodiments, the visual editing environment may facilitate the users of the different devices to simultaneously experience the same behavior of the digital content asset through a multi-user synchronization system that may operate as part of the visual editing environment to allow, among other things simultaneous experience of the same behavior of a digital content asset while creating and editing in the visual editing environment, and the like.

In embodiments, the visual editing environment and the code execution engine that enables a plurality of runtime versions of digital content asset control code generated from, for example a domain-specific declarative language, may control utilization of hardware resources, such as CPUs, GPUs and the like of different computing devices. Utilization of, for example, CPUs of some of the different devices, such as hardware endpoint devices and the like may be controlled to facilitate the simultaneous experience of the same behavior.

In embodiments, the code execution engine of the system for creating, sharing and managing digital content that users a domain-specific declarative language to generate a plurality of runtime versions may further control utilization of hardware resources for different aspects of hardware performance, including thermal performance, battery management, and the like. The code execution engine may control utilization based on aspects such as thermal performance, and the like. A domain-specific declarative language used for digital content asset control code and the like may include statements that facilitate managing execution on target devices to optimize hardware aspects, such as thermal performance and the like. In embodiments, the domain-specific declarative language may provide access to instruction-level execution power and thermal performance information for different devices. By targeting a portion of the plurality of runtime versions toward specific devices, the digital content asset control code may be represented at the device instruction-level so that the impact on at least one of thermal and power performance may be determined for each instruction that may be executed by the code execution engine on the target device. The digital content asset control code created and/or edited, such as by a developer using the declarative language in the visual editing environment can be analyzed based on the power and/or thermal impact of each corresponding device-specific instruction. Actions to facilitate optimization of thermal performance, such as specific sequences of code and the like may be made available to the developer in the visual editing environment, and the like.

In embodiments, a code execution engine of the system for creating, sharing and managing digital content, in conjunction with a domain-specific declarative language used for generating digital content assets and the like may further ensure consistent user experience with the digital content asset, such as a consistent user experience of the common behavior, over a plurality of operating systems. In embodiments, the code execution engine may govern execution of the digital content asset to provide the consistent user experience. In embodiments, the domain-specific declarative language may facilitate coding a target users experience (e.g., how the digital content asset will behave) with respect to the digital content asset behavior at the time that the digital content asset control code is generated through use of the domain-specific declarative language in the visual editing environment. In this way, the code execution engine may do the underlying work of making the behavior consistent across different operating systems, without a developer having to adjust the use of the domain-specific declarative language for a digital content asset for each target operating system that may need to be controlled to generate the desired behavior.

In embodiments, a code execution engine that works cooperatively with a plurality of runtime versions generated from domain-specific declarative language may operation on different operating systems for a consistent user experience across a plurality of mobile operating systems, including, without limitation operating systems such as IOS™, ANDROID™, WINDOWS™, and the like.

In embodiments, a code execution engine of a system that uses a domain-specific declarative language for digital content asset creation and editing may govern execution of the code for a consistent user experience across a plurality of computer operating systems, including, without limitation operating systems such as MAC™, LINUX™, WINDOWS™, and the like. Likewise, the code execution engine, optionally in association with runtime versions generated from a domain-specific declarative language may govern execution of the code for a consistent user experience in deployments that include combinations of mobile operating systems (e.g., an IPHONE™) and a computer (e.g., a WINDOWS™ LAPTOP).

In embodiments, a code execution engine as described herein that works cooperatively with a plurality of runtime versions of a digital content asset generated from domain-specific declarative language may enable control of network layer interactions for the digital content asset. In embodiments, the code execution engine may gain control of network layer interactions for the digital content asset via network layer interaction control statements that may be available to a developer in the domain-specific declarative language during editing. The visual editing environment may make available to a developer and/or other user of the environment network layer interaction domain-specific declarative language statements that may be coded into digital content asset behavior and the like so that when executed by the code execution engine, network layer interactions and the like may be controlled.

In embodiments, a code execution engine, such as a code execution engine that executes one or more versions of a digital content asset generated from a domain-specific declarative language as described herein, may gain control of browser interactions for the digital content asset via browser interaction control statements that may be part of digital content asset editing in the visual editing environment. The visual editing environment may make available to a developer and/or other user of the environment browser interaction statements of the domain-specific declarative language that may be coded into digital content asset behavior and the like so that when executed by the code execution engine browser interactions and the like may be controlled. In embodiments, browser interactions that may be controlled may include Comet interactions, HTTP streaming interactions, Ajax push interactions, reverse Ajax interactions, secure socket interactions, and HTTP server push interactions, and the like. Browser interactions that may be controlled may facilitate browser interactions of one or more different devices that may be connected via a network and may, optionally be rendering the digital content asset in a way that ensures a consistent user interface across the different devices.

In embodiments, the code execution engine may gain control of networking middleware for the digital content asset via networking middleware control statements of the domain-specific declarative language. The visual editing environment may make available to a developer and/or other user of the environment networking middleware statements of the domain-specific declarative language that may be coded into digital content asset behavior and the like so that when executed by the code execution engine, networking middleware and the like may be controlled. In embodiments, networking middleware that may be controlled may facilitate network interaction and the like of Raknet middleware, a gaming engine, a transport layer interaction, a UDP interaction, a TCP interaction, a 3D rendering engine, a gestural engine, a physics engine, a sound engine, an animation engine, and the like. Networking middleware that may be controlled may facilitate network interactions and the like of one or more different devices that may be connected via a network and may, optionally be rendering the digital content asset in a way that ensures a consistent user interface across the different devices.

In embodiments, the system that enables digital content asset control code creation from domain-specific declarative language and the like may further include functionality that facilitate orchestrating components, events, response to triggers and the like for a digital content asset. In embodiments, orchestrating functionality may be enabled by a plug-in capability of the system, where an orchestrating capability may be plugged-in to the system. In embodiments, the plug-in capability of the system may be a JAVASCRIPT™ compatible plug-in system.

As used herein, a "computer process" may refer to the performance of a described function in a computer using computer hardware (such as a processor, field-programmable gate array or other electronic combinatorial logic, or similar device), which may be operating under control of software or firmware or a combination of any of these or operating outside control of any of the foregoing. All or part of the described function may be performed by active or passive electronic components, such as transistors or resistors. In using the term "computer process," a schedulable entity, or operation of a computer program or a part thereof is not necessarily required; although, in some embodiments, a computer process may be implemented by such a schedulable entity, or operation of a computer program or a part thereof. Furthermore, unless the context otherwise requires, a "process" may be implemented using more than one processor or more than one (single- or multi-processor) computer.

As used herein, an "operating system" is an environment of a host computer system, which may be a conventional operating system, but alternatively may be any computing environment that can cause execution of computer instructions, receive input and provide output, including, for example, a web browser, a Java runtime environment, a Microsoft common language runtime environment, etc.

As used herein, a "simulator" in an application system environment engine is an object-oriented system for managing the scheduling of asynchronous and synchronous behaviors of objects, relationships between objects, and changes to properties of objects.

A first computer system is in communication "in real time" over a network with a second computer system when information is exchanged bidirectionally between the computer systems according to scheduling determined by the first and second computer systems and without dependency on polling.

As used herein, "Linear logic" may refer to a set of procedures that can be executed strictly from left to right, or top to bottom, without looping or branching, and that can be defined with zero, one, or more parameters.

Detailed embodiments of the present disclosure are disclosed herein; however, it is to be understood that the disclosed embodiments are merely exemplary of the disclosure, which may be embodied in various forms. Therefore, specific structural and functional details disclosed herein are not to be interpreted as limiting, but merely as a basis for the claims and as a representative basis for teaching one skilled in the art to variously employ the present disclosure in virtually any appropriately detailed structure.

The terms "a" or "an," as used herein, are defined as one or more than one. The term "another," as used herein, is defined as at least a second or more. The terms "including" and/or "having", as used herein, are defined as comprising (i.e., open transition).

While only a few embodiments of the present disclosure have been shown and described, it will be obvious to those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

The methods and systems described herein may be deployed in part or in whole through a machine that executes computer software, program codes, and/or instructions on a processor. The present disclosure may be implemented as a method on the machine, as a system or apparatus as part of or in relation to the machine, or as a computer program product embodied in a computer readable medium executing on one or more of the machines. In embodiments, the processor may be part of a server, cloud server, client, network infrastructure, mobile computing platform, stationary computing platform, or another computing platform. A processor may be any kind of computational or processing device capable of executing program instructions, codes, binary instructions and the like. The processor may be or may include a signal processor, digital processor, embedded processor, microprocessor or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more thread. The thread may spawn other threads that may have assigned priorities associated with them; the processor may execute these threads based on priority or any other order based on instructions provided in the program code. The processor, or any machine utilizing one, may include non-transitory memory that stores methods, codes, instructions and programs as described herein and elsewhere. The processor may access a non-transitory storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer software on a server, client, firewall, gateway, hub, router, or other such computer and/or networking hardware. The software program may be associated with a server that may include a file server, print server, domain server, internet server, intranet server, cloud server, and other variants such as secondary server, host server, distributed server and the like. The server may include one or more of memories, processors, computer readable media, storage media, ports (physical and virtual), communication devices, and interfaces capable of accessing other servers, clients, machines, and devices through a wired or a wireless medium, and the like. The methods, programs, or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers, social networks, and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs, or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements. The methods and systems described herein may be adapted for use with any kind of private, community, or hybrid cloud computing network or cloud computing environment, including those which involve features of software as a service (SaaS), platform as a service (PaaS), and/or infrastructure as a service (IaaS).

The methods, program codes, and instructions described herein and elsewhere may be implemented on a cellular network having multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, EVDO, mesh, or other networks types.

The methods, program codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer-to-peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g., USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or intangible items from one state to another. The methods and systems described herein may also transform data representing physical and/or intangible items from one state to another.

The elements described and depicted herein, including in flow charts and block diagrams throughout the Figures, imply logical boundaries between the elements. However, according to software or hardware engineering practices, the depicted elements and the functions thereof may be implemented on machines through computer executable media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps associated therewith, may be realized in hardware, software or any combination of hardware and software suitable for a particular application. The hardware may include a general-purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine-readable medium.

The computer executable code may be created using a structured programming language such as C, an object-oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, methods described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law.

The use of the terms "a" and "an" and "the" and similar referents in the context of describing the disclosure (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitations of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure. The use of the term "set" includes a group of one or more members.

While the foregoing written description enables one of ordinary skill to make and use what is considered presently to be the best mode thereof, those of ordinary skill will understand and appreciate the existence of variations, combinations, and equivalents of the specific embodiments, method, and examples herein. The disclosure should therefore not be limited by the above described embodiments, method, and examples, but by all embodiments and methods within the scope and spirit of the disclosure.

Any element in a claim that does not explicitly state "means for" performing a specified function, or "step for" performing a specified function, is not to be interpreted as a "means" or "step" clause as specified in 35 U.S.C. § 112(f). In particular, any use of "step of" in the claims is not intended to invoke the provision of 35 U.S.C. § 112(f).

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

What is claimed is:

1. A system for providing digital twin-enabled applications comprising:
an application system executed by a first set of processors of the system that cause the application system to:
receive first digital twin data from a first digital twin data source, the first digital twin data pertaining to a first aspect of an environment to be represented by a digital twin;
receive second digital twin data from a second digital twin data source, the second digital twin data pertaining to a second aspect of the environment;
generate the digital twin representing the environment based on the first digital twin data and the second digital twin data;
receive coding statements via a user interface of the application system from one or more developers, wherein the coding statements define one or more actions to be performed with respect to the digital twin;
generate an application that leverages the digital twin based on the coding statements; and
publish the application; and
a server kit executed by a second set of processors that cause the server kit to:
receive real-time data from one or more real-time data sources, wherein the real-time data source corresponds to the environment represented by the digital twin, and
provide an instance of the application with the real-time data, wherein the instance of the application receives the real-time data and updates an instance of the digital twin with the real-time data.

2. The system of claim 1, wherein providing the instance of the application with the real-time data includes:
receiving a nested API request from the instance of the application;
retrieving the real-time data from a cache of the server kit; and
providing the real-time data to the instance of the application.

3. The system of claim 1, wherein providing the instance of the application with the real-time data includes:
receiving a nested API request from the instance of the application;
retrieving the real-time data from a cache of the server kit; and
providing the real-time data to the instance of the application.

4. The system of claim 1, wherein:
receiving the real-time data includes receiving a data stream containing the real-time data from the real-time data source; and
providing the instance of the application with the real-time data includes streaming the real-time data to the instance of the application via a socket to which the instance of the application is subscribed.

5. The system of claim 1, wherein generating the application includes:
generating a set of objects representing the environment; and
generating a scene tree based on the set of objects.

6. The system of claim 5, wherein the instance of the application updates one or more objects of the scene tree based on the real-time data.

7. The system of claim 1, wherein the second set of processors further cause the server kit to execute a digital twin workflow with respect to an instance of the digital twin.

8. The system of claim 7, wherein the digital twin workflow defines a data fusion process that produces fused data based on the real-time data.

9. The system of claim 8, wherein in response to the workflow being triggered, the server kit executes the data fusion process and provides the fused data to the instance of the application.

10. The system of claim 1, wherein the real-time data source is a set of Internet of Things sensors.

11. The system of claim 1, wherein the real-time data source is a hub-and-spoke classification system.

12. The system of claim 1, wherein the real-time data source is a location-based services application.

13. The system of claim 1, wherein the first set of processors further cause the application system to:
receive third digital twin data from a third digital twin data source, the third digital twin data pertaining to an item within the environment; and
generate an embedded digital twin based on the third digital twin data.

14. The system of claim 13, wherein the environment is a city and the item is a building located in the city, and wherein the digital twin represents the city and the embedded digital twin represents the building in the city.

15. The system of claim 13, wherein the environment is a building and a subsection of the building, and wherein the digital twin represents the building and the embedded digital twin represents the subsection of the building.

16. The system of claim 1, wherein generating the application includes:
generating a set of objects representing the environment based on the first digital twin data, the second digital twin data, and the coding statements; and
generating a scene tree based on the set of objects.

17. A system for providing digital twin-enabled applications comprising:
an application system executed by a first set of processors of the system that cause the application system to:
receive first digital twin data from a first digital twin data source, the first digital twin data pertaining to a first aspect of an environment to be represented by a digital twin;
receive second digital twin data from a second digital twin data source, the second digital twin data pertaining to a second aspect of the environment;
generate the digital twin representing the environment based on the first digital twin data and the second digital twin data;

receive coding statements via a user interface of the application system from one or more developers, wherein the coding statements define one or more actions to be performed with respect to the digital twin;

generate an application that leverages the digital twin based on the coding statements; and publish the application, wherein generating the application includes:

generating a set of objects representing the environment based on the first digital twin data, the second digital twin data, and the coding statements; and generating a scene tree based on the set of objects.

18. The system of claim 17, wherein the first set of processors further cause the application system to:

receive third digital twin data from a third digital twin data source, the third digital twin data pertaining to an item within the environment; and generate an embedded digital twin based on the third digital twin data.

19. The system of claim 18, wherein the environment is a city and the item is a building located in the city, and wherein the digital twin represents the city and the embedded digital twin represents the building in the city.

20. The system of claim 18, wherein the environment is a building and a subsection of the building, and wherein the digital twin represents the building and the embedded digital twin represents the subsection of the building.

\* \* \* \* \*